US012805182B2

(12) United States Patent
Kang et al.

(10) Patent No.: US 12,805,182 B2
(45) Date of Patent: Nov. 17, 2026

(54) ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Byungjoon Kang, Suwon-si (KR); Kum Hee Lee, Suwon-si (KR); Banglin Lee, Suwon-si (KR); Yong Joo Lee, Suwon-si (KR); Byoungki Choi, Suwon-si (KR); Sunghun Hong, Suwon-si (KR); Youngki Hong, Suwon-si (KR); Kyuyoung Hwang, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 838 days.

(21) Appl. No.: 18/328,324

(22) Filed: Jun. 2, 2023

(65) Prior Publication Data

US 2023/0397487 A1 Dec. 7, 2023

(30) Foreign Application Priority Data

Jun. 3, 2022 (KR) ........................ 10-2022-0068503

(51) Int. Cl.

*H10K 85/30* (2023.01)
*C07F 15/00* (2006.01)

(Continued)

(52) U.S. Cl.

CPC ....... *H10K 85/342* (2023.02); *C07F 15/0033* (2013.01); *C09K 11/06* (2013.01);

(Continued)

(58) Field of Classification Search

CPC .............. H10K 85/40; C09K 2211/185; C09K 2211/1055; C07F 11/06; C07F 15/0033

See application file for complete search history.

(56) References Cited

U.S. PATENT DOCUMENTS 6,687,266 B1 2/2004 Ma et al.
9,478,756 B2 10/2016 Lee et al.

(Continued)

FOREIGN PATENT DOCUMENTS

KR 20160064955 A 6/2016
KR 20160109909 A 9/2016

(Continued)

OTHER PUBLICATIONS

Extended European Search Report mailed Oct. 12, 2023 of EP Patent Application No. 23175981.2.

*Primary Examiner* — Vu A Nguyen

(74) *Attorney, Agent, or Firm* — CANTOR COLBURN LLP

(57) ABSTRACT

An organometallic compound represented by Formula 1:

$$M(L_1)_{n1}(L_2)_{n2} \quad \text{Formula 1}$$

wherein M is a transition metal, $L_1$ is a ligand represented by Formula 2-1, $L_2$ is a ligand represented by Formula 2-2 or a ligand represented by Formula 2-3, n1 and n2 are each independently 1 or 2, when n1 is 2, two $L_1$ are identical to or different from each other, and when n2 is 2, two $L_2$ are identical to or different from each other, and $L_1$ and $L_2$ are different from each other, (Continued)

Formula 2-1

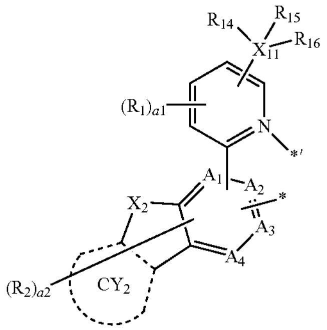

Formula 2-2

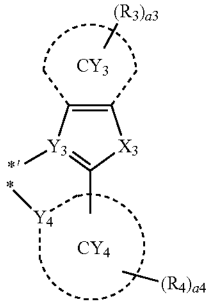

Formula 2-3

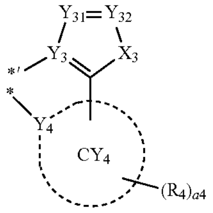

wherein the groups in Formulae 2-1, 2-2, and 2-3 are each independently as described herein.

20 Claims, 1 Drawing Sheet

(51) Int. Cl.

| | |
|---|---|
| ***C09K 11/06*** | (2006.01) |
| ***H10K 50/12*** | (2023.01) |
| ***H10K 85/40*** | (2023.01) |

(52) U.S. Cl.

CPC ...... *H10K 85/40* (2023.02); *C09K 2211/1055* (2013.01); *C09K 2211/185* (2013.01); *H10K 50/12* (2023.02)

(56) References Cited

U.S. PATENT DOCUMENTS

| | | | | |
|---|---|---|---|---|
| 2012/0292601 | A1* | 11/2012 | Kottas .................. | H10K 85/342 546/4 |
| 2016/0155962 | A1* | 6/2016 | Hwang .................. | H10K 85/40 546/4 |
| 2016/0268519 | A1 | 9/2016 | Choi et al. | |
| 2017/0346025 | A1* | 11/2017 | Hwang ................ | C07D 401/14 |
| 2021/0104691 | A1 | 4/2021 | Lee et al. | |
| 2023/0389409 | A1 | 11/2023 | Hwang et al. | |

FOREIGN PATENT DOCUMENTS

| | | |
|---|---|---|
| KR | 20210036829 A | 4/2021 |
| KR | 20230165587 | 12/2023 |

* cited by examiner

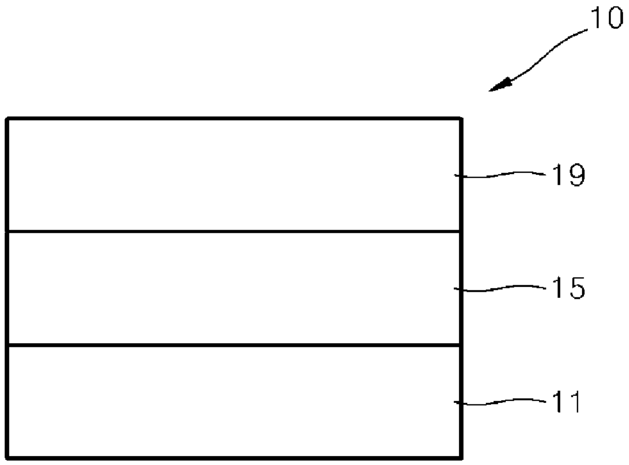
10
19
15
11

ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

CROSS-REFERENCE TO RELATED APPLICATION

This application claims priority to and the benefit of Korean Patent Application No. 10-2022-0068503, filed on Jun. 3, 2022, in the Korean Intellectual Property Office, and all the benefits accruing therefrom under 35 U.S.C. § 119, the content of which is incorporated by reference herein in its entirety.

BACKGROUND

1. Field

The subject matter relates to organometallic compounds, organic light-emitting devices including the same, and electronic apparatuses including the organic light-emitting devices.

2. Description of the Related Art

Organic light-emitting devices (OLEDs) are self-emissive devices, which have improved characteristics in terms of viewing angles, response time, luminance, driving voltage, and response speed. In addition, OLEDs can produce full-color images.

In an example, an organic light-emitting device typically includes an anode, a cathode, and an organic layer arranged between the anode and the cathode, wherein the organic layer includes an emission layer. A hole transport region may be arranged between the anode and the emission layer, and an electron transport region may be arranged between the emission layer and the cathode. Holes provided from the anode may move toward the emission layer through the hole transport region, and electrons provided from the cathode may move toward the emission layer through the electron transport region. The holes and the electrons may recombine in the emission layer to produce excitons. These excitons may transition from an excited state to the ground state to thereby generate light.

SUMMARY

Provided are organometallic compounds, organic light-emitting devices including the same, and electronic apparatuses including the organic light-emitting devices.

Additional aspects will be set forth in part in the detailed description, which follows and, in part, will be apparent from the detailed description, or may be learned by practice of the presented exemplary embodiments.

According to an aspect, provided is an organometallic compound represented by Formula 1:

$M(L_1)_{n1}(L_2)_{n2}$. Formula 1

In Formula 1,

M is a transition metal, $L_1$ is a ligand represented by Formula 2-1, $L_2$ is a ligand represented by Formula 2-2 or a ligand represented by Formula 2-3, n1 and n2 are each independently 1 or 2, when n1 is 2, two $L_1$ are identical to or different from each other, and when n2 is 2, two $L_2$ are identical to or different from each other, and $L_1$ and $L_2$ are different from each other, Formula 2-1

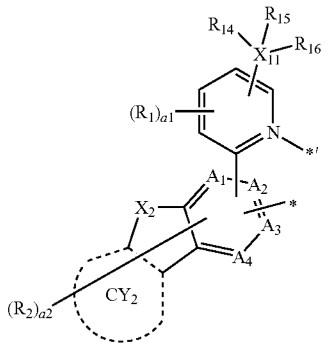

Formula 2-2

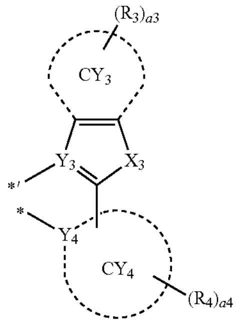

Formula 2-3

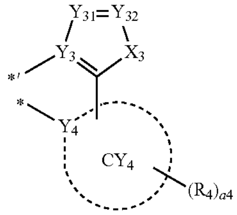

wherein, in Formulae 2-1 to 2-3, $X_{11}$ is Si or Ge, $X_2$ is O, S, Se, $N(R_{29})$, $C(R_{29a})(R_{29b})$, or $Si(R_{29a})(R_{29b})$, $A_1$ to $A_4$ are each independently C or N, wherein one of $A_1$ to $A_4$ is C bonded to a neighboring pyridine group, and another of $A_1$ to $A_4$ is C bonded to M in Formula 1, $Y_3$ is N, $Y_{31}$ is $C(R_{31})$ or N, and $Y_{32}$ may be $C(R_{32})$ or N, $X_3$ is O, S, or $N-(T_3-Z_3)$, $T_3$ is a single bond, a $C_1$-$C_{20}$ alkylene group that is unsubstituted or substituted with at least one $R_{10a}$, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $Y_4$ is C or N, ring $CY_2$ to ring $CY_4$ are each independently a $C_5$-$C_{30}$ carbocyclic group or a $C_1$-$C_{30}$ heterocyclic group, wherein ring $CY_2$ is a $C_3$-$C_{30}$ heterocyclic group including at least one N as a ring-forming atom, at least one of $A_1$ to $A_4$ is N, or ring $CY_2$ is a $C_3$-$C_{30}$ heterocyclic group including at least one N as a ring-forming atom, and at least one of $A_1$ to $A_4$ is N, $R_1$ to $R_4$, $R_{14}$ to $R_{16}$, $R_{29}$, $R_{29a}$, $R_{29b}$, $R_{31}$, $R_{32}$, and $Z_3$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, a1 is an integer from 0 to 3, a2 is an integer from 0 to 6, a3 and a4 are each independently an integer from 0 to 20, two or more of a plurality of $R_1$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_2$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_3$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_4$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of $R_1$ to $R_4$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $R_{10a}$ is as described in connection with $R_2$,

* and *' each indicates a binding site to M in Formula 1, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or a combination thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with at least one of deuterium, —F, —Cl, —Br, —I, $—SF_5$, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(=O)(Q_{28})(Q_{29})$, $P(Q_{28})(Q_{29})$, or a combination thereof, $—N(Q_{31})(Q_{32})$, $—Si(Q_{33})(Q_{34})(Q_{35})$, $—Ge(Q_{33})(Q_{34})(Q_{35})$, $—B(Q_{36})(Q_{37})$, $—P(=O)(Q_{38})(Q_{39})$, or $—P(Q_{38})(Q_{39})$, or a combination thereof, and $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, $—SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

According to another aspect, provided is an organic light-emitting device including a first electrode, a second electrode, and an organic layer arranged between the first electrode and the second electrode, wherein the organic layer includes an emission layer, and wherein the organic layer includes at least one organometallic compound represented by Formula 1.

The emission layer may include the at least one organometallic compound, and the at least one organometallic compound included in the emission layer may act as a dopant.

According to still another aspect, provided is an electronic apparatus including the organic light-emitting device as described herein.

BRIEF DESCRIPTION OF THE DRAWING

The above and other aspects, features, and advantages of certain exemplary embodiments of the disclosure will be more apparent from the following detailed description taken in conjunction with the FIGURE, which is a schematic cross-sectional view of an organic light-emitting device according to one or more embodiments.

DETAILED DESCRIPTION

Reference will now be made in detail to exemplary embodiments, examples of which are illustrated in the accompanying drawing, wherein like reference numerals refer to like elements throughout the specification. In this regard, the present exemplary embodiments may have different forms and should not be construed as being limited to the detailed descriptions set forth herein. Accordingly, the exemplary embodiments are merely described in further detail below by referring to the FIGURE, to explain aspects. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing one or more exemplary embodiments only and is not intended to be limiting. As used herein, the singular forms "a," "an," and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Hereinafter, a work function or a highest occupied molecular orbital (HOMO) energy level is expressed as an absolute value from a vacuum level. In addition, when the work function or the HOMO energy level is referred to be "deep," "high" or "large," the work function or the HOMO energy level has a large absolute value based on "0 electron Volts (eV)" of the vacuum level, while when the work function or the HOMO energy level is referred to be "shallow," "low," or "small," the work function or HOMO energy level has a small absolute value based on "0 eV" of the vacuum level.

An organometallic compound according to an aspect is represented by Formula 1:

$$M(L_1)_{n1}(L_2)_{n2} \quad \text{Formula 1}$$

wherein M in Formula 1 is a transition metal.

In one or more embodiments, M may be a first-row transition metal of the Periodic Table of Elements, a second-row transition metal of the Periodic Table of Elements, or a third-row transition metal of the Periodic Table of Elements.

In one or more embodiments, M may be iridium, platinum, osmium, titanium, zirconium, hafnium, europium, terbium, thulium, or rhodium.

In one or more embodiments, M may be iridium, platinum, osmium, or rhodium.

In Formula 1, $L_1$ is a ligand represented by Formula 2-1, and $L_2$ is a ligand represented by Formula 2-2 or a ligand represented by Formula 2-3:

Formula 2-1

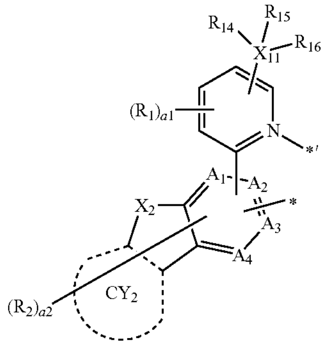

Formula 2-2

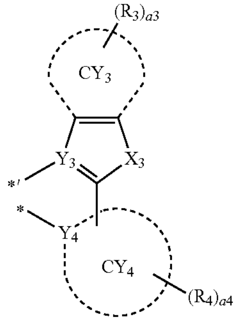

Formula 2-3

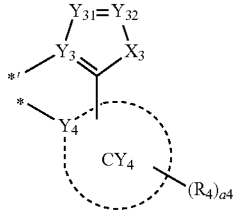

wherein Formulae 2-1 to 2-3 are each independently as described herein.

In one or more embodiments, $L_2$ may be a ligand represented by Formula 2-2.

n1 and n2 in Formula 1 indicate numbers of $L_1$ groups and $L_2$ groups, respectively, and may each independently be 1 or 2. When n1 is 2, two $L_1$ are identical to or different from each other, and when n2 is 2, two $L_2$ are identical to or different from each other.

In one or more embodiments, in Formula 1, i) n1 may be 2, and n2 may be 1; or ii) n1 may be 1, and n2 may be 2.

In one or more embodiments, in Formula 1, i) M may be iridium or osmium, and a sum of n1 and n2 may be 3; or ii) M may be platinum, and a sum of n1 and n2 may be 2.

$L_1$ and $L_2$ in Formula 1 are different from each other. In other words, the organometallic compound represented by Formula 1 is a heteroleptic complex.

$X_{11}$ in Formula 2-1 is Si or Ge.

In one or more embodiments, $X_{11}$ may be Si.

In one or more embodiments, $X_{11}$ may be Ge.

In Formula 2-1, $X_2$ is O, S, Se, $N(R_{29})$, $C(R_{29a})(R_{29b})$, or $Si(R_{29a})(R_{29b})$. $R_{29}$, $R_{29a}$, and $R_{29b}$ are each independently as described herein.

In one or more embodiments, $X_2$ may be O or S.

In Formula 2-1, $A_1$ to $A_4$ are each independently C or N, wherein one of $A_1$ to $A_4$ is C bonded to a neighboring pyridine group, and another one among $A_1$ to $A_4$ is C bonded to M in Formula 1.

In one or more embodiments, in Formula 2-1, i) $A_1$ may be C bonded to a neighboring pyridine group, $A_2$ may be C bonded to M in Formula 1, and $A_3$ and $A_4$ may each independently be C or N, ii) $A_2$ may be C bonded to a neighboring pyridine group, $A_3$ may be C bonded to M in Formula 1, and $A_1$ and $A_4$ may each independently be C or N, iii) $A_3$ may be C bonded to a neighboring pyridine group, $A_4$ may be C bonded to M in Formula 1, and $A_1$ and $A_2$ may each independently be C or N, iv) $A_2$ may be C bonded to a neighboring pyridine group, $A_1$ may be C bonded to M in Formula 1, and $A_3$ and $A_4$ may each independently be C or N, v) $A_3$ may be C bonded to a neighboring pyridine group, $A_2$ may be C bonded to M in Formula 1, and $A_1$ and $A_4$ may each independently be C or N, or vi) $A_4$ may be C bonded to a neighboring pyridine group, $A_3$ may be C bonded to M in Formula 1, and $A_1$ and $A_2$ may each independently be C or N.

In one or more embodiments, a group represented by

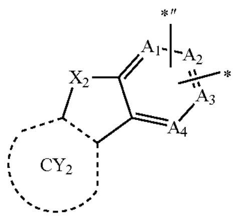

in Formula 2-1 may be a group represented by one of Formulae CY2-A to CY2-F:

CY2-A

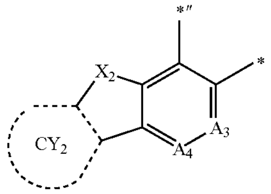

CY2-B

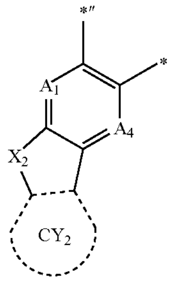

CY2-C

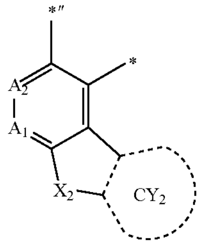

-continued

CY2-D

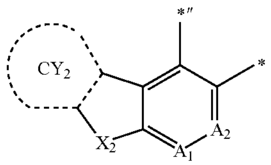

CY2-E

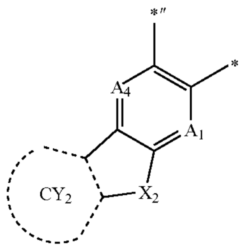

CY2-F

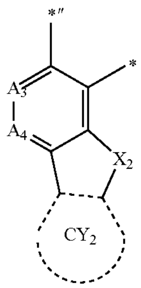

wherein, in Formulae CY2-A to CY2-F, $X_2$ and ring $CY_2$ may each independently as described herein, $A_1$ to $A_4$ may each independently be C or N,

*" may indicate a binding site to a neighboring pyridine group in Formula 2-1, and

* may indicate a binding site to M in Formula 1.

$Y_3$ in Formulae 2-2 and 2-3 is N.

In Formula 2-3, $Y_{31}$ is $C(R_{31})$ or N, and $Y_{32}$ is $C(R_{32})$ or N. $R_{31}$ and $R_{32}$ are each independently as described herein.

$X_3$ in Formulae 2-2 and 2-3 is O, S, or N-($T_3$-$Z_3$), wherein $T_3$ and $Z_3$ are each as defined herein.

In one or more embodiments, $X_3$ may be N-($T_3$-$Z_3$), wherein $T_3$ and $Z_3$ are each as defined herein.

$T_3$ is a single bond, a $C_1$-$C_{20}$ alkylene group that is unsubstituted or substituted with at least one $R_{10a}$, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$.

In one or more embodiments, $T_3$ may be:

a single bond; or a $C_1$-$C_{20}$ alkylene group, a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, or benzothiadiazole group, each unsubstituted or substituted with at least one $R_{10a}$.

In one or more embodiments, $T_3$ may be:

a single bond; or a benzene group that is unsubstituted or substituted with at least one $R_{10a}$.

In one or more embodiments, $T_3$ may be:

a single bond; or a $C_1$-$C_{20}$ alkylene group, a benzene group, a naphthalene group, a dibenzofuran group, or a dibenzothiophene group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or a combination thereof.

$Y_4$ in Formulae 2-2 and 2-3 is C or N.

In one or more embodiments, $Y_4$ may be C.

In Formulae 2-1 to 2-3, ring $CY_2$ to ring $CY_4$ are each independently a $C_5$-$C_{30}$ carbocyclic group or a $C_1$-$C_{30}$ heterocyclic group, wherein ring $CY_2$ is a $C_3$-$C_{30}$ heterocyclic group comprising at least one N as a ring-forming atom (for example, including a group represented by one *═N—*', two *═N—*', or three *═N—*' as a ring-forming atom); at least one of $A_1$ to $A_4$ is N; or ring $CY_2$ is a $C_3$-$C_{30}$ heterocyclic group including at least one N as a ring-forming atom (for example, including a group represented by one *═N—*', two *═N—*', or three *═N—*' as a ring-forming atom), and at least one of $A_1$ to $A_4$ is N.

For example, ring $CY_2$ to ring $CY_4$ may each independently be i) a first ring, ii) a second ring, iii) a condensed ring system in which at least two first rings are condensed to each other, iv) a condensed ring system in which at least two second rings are condensed with each other, or v) a condensed ring system in which at least one first ring and at least one second ring are condensed with each other, the first ring may be a cyclopentane group, a cyclopentadiene group, a furan group, a thiophene group, a pyrrole group, a silole group, a germole group, a borole group, a selenophene group, a phosphole group, an oxazole group, an oxadiazole group, an oxatriazole group, a thiazole group, a thiadiazole group, a thiatriazole group, a pyrazole group, an imidazole group, a triazole group, a tetrazole group, an azasilole group, an azagermole group, an azaborole group, an azaselenophene group, or an azaphosphole group, and the second ring may be an adamantane group, a norbornane group (i.e., a bicyclo[2.2.1]heptane group), a norbornene group, a bicyclo[1.1.1]pentane group, a bicyclo[2.1.1]hexane group, a bicyclo[2.2.2]octane group, a cyclohexane group, a cyclohexene group, a benzene group, a pyridine group, a pyrimidine group, a pyrazine group, a pyridazine group, or a triazine group.

In one or more embodiments, rings $CY_2$ to $CY_4$ may each independently be a cyclopentane group, a cyclohexane group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, a benzocarbazole group, a benzofluorene group, a naphthobenzosilole group, a naphthobenzothiophene group, a naphthobenzofuran group, a naphthobenzoselenophene group, a dibenzocarbazole group, a dibenzofluorene group, a dinaphthosilole group, a dinaphthothiophene group, a dinaphthofuran group, a dinaphthoselenophene group, a naphthocarbazole group, a naphthofluorene group, a phenanthrobenzosilole group, a phenanthrobenzothiophene group, a phenanthrobenzofuran group, a phenanthrobenzoselenophene group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, an azacarbazole group, an azafluorene group, an azadibenzosilole group, an azadibenzothiophene group, an azadibenzofuran group, an azadibenzoselenophene group, an azabenzocarbazole group, an azabenzofluorene group, an azanaphthobenzosilole group, an azanaphthobenzothiophene group, an azanaphthobenzofuran group, an azanaphthobenzoselenophene group, an azadibenzocarbazole group, an azadibenzofluorene group, an azadinaphthosilole group, an azadinaphthothiophene group, an azadinaphthofuran group, an azadinaphthoselenophene group, an azanaphthocarbazole group, an azanaphthofluorene group, an azaphenanthrobenzosilole group, an azaphenanthrobenzothiophene group, an azaphenanthrobenzofuran group, an azaphenanthrobenzoselenophene group, a pyridine group, a pyrimidine group, a pyrazine group, a pyridazine group, a triazine group, a quinoline group, an isoquinoline group, a quinoxaline group, a quinazoline group, a phenanthridine group, a phenanthroline group, a benzoquinoline group, a benzoisoquinoline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, a norbornene group, a benzene group condensed with an adamantane group, a benzene group condensed with a norbornane group, a benzene group condensed with a norbornene group, a pyridine group condensed with an adamantane group, a pyridine group condensed with a norbornane group, or a pyridine group condensed with a norbornene group.

In one or more embodiments, ring $CY_2$ may be a benzene group, a naphthalene group, a phenanthrene group, an anthracene group, a carbazole group, a fluorene group, a dibenzosilole group, a dibenzothiophene group, a dibenzofuran group, a dibenzoselenophene group, a pyridine group, a pyrimidine group, a pyridazine group, a pyrazine group, a quinoline group, an isoquinoline group, a quinoxaline group, a quinazoline group, a phenanthridine group, a phenanthroline group, a benzoquinoline group, a benzoisoquinoline group, an azacarbazole group, an azafluorene group, an azadibenzosilole group, an azadibenzothiophene group, an azadibenzofuran group, an azadibenzoselenophene group, an azabenzocarbazole group, an azabenzofluorene group, an azanaphthobenzosilole group, an azanaphthobenzothiophene group, an azanaphthobenzofuran group, an azanaphthobenzoselenophene group, an azadibenzocarbazole group, an azadibenzofluorene group, an azadinaphthosilole group, an azadinaphthothiophene group, an azadinaphthofuran group, an azadinaphthoselenophene group, an azanaphthocarbazole group, an azanaphthofluorene group, an azaphenanthrobenzosilole group, an azaphenanthrobenzothiophene group, an azaphenanthrobenzofuran group, or an azaphenanthrobenzoselenophene group.

In one or more embodiments, ring $CY_2$ may be a pyridine group, a pyrimidine group, a pyridazine group, a pyrazine group, a quinoline group, an isoquinoline group, a quinoxaline group, a quinazoline group, a phenanthridine group, a phenanthroline group, a benzoquinoline group, a benzoisoquinoline group, an azacarbazole group, an azafluorene group, an azadibenzosilole group, an azadibenzothiophene group, an azadibenzofuran group, or an azadibenzoselenophene group.

In one or more embodiments, ring $CY_2$ may be a benzene group, a naphthalene group, a phenanthrene group, an anthracene group, a carbazole group, a fluorene group, a dibenzosilole group, a dibenzothiophene group, a dibenzofuran group, or a dibenzoselenophene group, and at least one of $A_1$ to $A_4$ in Formula 2-1 may be N.

In one or more embodiments, ring $CY_2$ may be a pyridine group, a pyrimidine group, a pyridazine group, a pyrazine group, a quinoline group, an isoquinoline group, a quinoxaline group, a quinazoline group, a phenanthridine group, a phenanthroline group, a benzoquinoline group, a benzoisoquinoline group, an azacarbazole group, an azafluorene group, an azadibenzosilole group, an azadibenzothiophene group, an azadibenzofuran group, or an azadibenzoselenophene group, and at least one of $A_1$ to $A_4$ in Formula 2-1 may be N.

In one or more embodiments, ring $CY_3$ may be a benzene group, a naphthalene group, an anthracene group, a phenanthrene group, a pyridine group, a pyrimidine group, a pyridazine group, a pyrazine group, a quinoline group, or an isoquinoline group.

In one or more embodiments, ring $CY_4$ may be a benzene group, a naphthalene group, an anthracene group, a phenanthrene group, a 1,2,3,4-tetrahydronaphthalene group, a benzene group condensed with a norbornane group, a carbazole group, a fluorene group, a dibenzosilole group, a dibenzothiophene group, a dibenzofuran group, a dibenzoselenophene group, a benzocarbazole group, a benzofluorene group, a naphthobenzosilole group, a naphthobenzothiophene group, a naphthobenzofuran group, a naphthobenzoselenophene group, a dibenzocarbazole group, a dibenzofluorene group, a dinaphthosilole group, a dinaphthothiophene group, a dinaphthofuran group, a dinaphthoselenophene group, a naphthocarbazole group, a naphthofluorene group, a phenanthrobenzosilole group, a phenanthrobenzothiophene group, a phenanthrobenzofuran group, a phenanthrobenzoselenophene group, an azacarbazole group, an azafluorene group, an azadibenzosilole group, an azadibenzothiophene group, an azadibenzofuran group, an azadibenzoselenophene group, an azabenzocarbazole group, an azabenzofluorene group, an azanaphthobenzosilole group, an azanaphthobenzothiophene group, an azanaphthobenzofuran group, an azanaphthobenzoselenophene group, an azadibenzocarbazole group, an azadibenzofluorene group, an azadinaphthosilole group, an azadinaphthothiophene group, an azadinaphthofuran group, an azadinaphthoselenophene group, an azanaphthocarbazole group, an azanaphthofluorene group, an azaphenanthrobenzosilole group, an azaphenanthrobenzothiophene group, an azaphenanthrobenzofuran group, or an azaphenanthrobenzoselenophene group.

$R_1$ to $R_4$, $R_{14}$ to $R_{16}$, $R_{29}$, $R_{29a}$, $R_{29b}$, $R_{31}$, $R_{32}$, and $Z_3$ in Formulae 2-1 to 2-3 are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$. $Q_1$ to $Q_9$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

In one or more embodiments, $R_1$ to $R_4$, $R_{14}$ to $R_{16}$, $R_{29}$, $R_{29a}$, $R_{29b}$, $R_{31}$, $R_{32}$, and $Z_3$ may each not be —Ge($Q_3$)($Q_4$)($Q_5$).

In one or more embodiments, $R_1$ to $R_4$, $R_{14}$ to $R_{16}$, $R_{29}$, $R_{29a}$, $R_{29b}$, $R_{31}$, $R_{32}$, and $Z_3$ may each not include germanium.

In one or more embodiments, $R_1$ to $R_4$, $R_{14}$ to $R_{16}$, $R_{29}$, $R_{29a}$, $R_{29b}$, $R_{31}$, $R_{32}$, and $Z_3$ may each not be —Si($Q_3$)($Q_4$)($Q_5$).

In one or more embodiments, $R_1$ to $R_4$, $R_{14}$ to $R_{16}$, $R_{29}$, $R_{29a}$, $R_{29b}$, $R_{31}$, $R_{32}$, and $Z_3$ may each not include silicon.

In one or more embodiments, $R_1$ to $R_4$, $R_{14}$ to $R_{16}$, $R_{29}$, $R_{29a}$, $R_{29b}$, $R_{31}$, $R_{32}$, and $Z_3$ may each independently be:

hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, or a $C_1$-$C_{20}$ alkylthio group;

a $C_1$-$C_{20}$ alkyl group, a $C_1$-$C_{20}$ alkoxy group, or a $C_1$-$C_{20}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a cyclopentyl group, a cyclohexyl group, a cycloheptyl group, a cyclooctyl group, an adamantanyl group, a norbornanyl group(bicyclo[2.2.1]heptyl group), a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or azadibenzothiophenyl group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a $C_1$-$C_{20}$ alkoxy group, a $C_1$-$C_{20}$ alkylthio group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, —$Si(Q_{33})(Q_{34})(Q_{35})$, —$Ge(Q_{33})(Q_{34})(Q_{35})$, or a combination thereof; or —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, and $Q_1$ to $Q_9$ and $Q_{33}$ to $Q_{35}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, a $C_1$-$C_{20}$ alkyl group, a phenyl group, or a combination thereof.

In one or more embodiments, $R_1$ to $R_4$, $R_{29}$, $R_{29a}$, $R_{29b}$, $R_{31}$, $R_{32}$, and $Z_3$ may each independently be:

hydrogen, deuterium, —F, or a cyano group; or a $C_1$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, —$Si(Q_{33})(Q_{34})(Q_{35})$, —$Ge(Q_{33})(Q_{34})(Q_{35})$, or a combination thereof.

In one or more embodiments, $R_{14}$ to $R_{16}$ may each independently be a $C_1$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or a combination thereof.

In one or more embodiments, $R_{14}$ to $R_{16}$ in Formula 2-1 may each independently be —$CH_3$, —$CH_2CH_3$, —$CD_3$, —$CD_2H$, —$CDH_2$, —$CH_2CD_3$, —$CD_2CH_3$, or a phenyl group.

In one or more embodiments, $R_{14}$ to $R_{16}$ in Formula 2-1 may be identical to or different from each other.

In one or more embodiments, $R_1$ to $R_4$, $R_{14}$ to $R_{16}$, $R_{29}$, $R_{29a}$, $R_{29b}$, $R_{31}$, $R_{32}$, and $Z_3$ in Formulae 2-1 to 2-3 may each independently be hydrogen, deuterium, —F, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, —$CH_3$, —$CD_3$, —$CD_2H$, —$CDH_2$, —$CF_3$, —$CF_2H$, —$CFH_2$, —$OCH_3$, —$OCDH_2$, —$OCD_2H$, —$OCD_3$, —$SCH_3$, —$SCDH_2$, —$SCD_2H$, —$SCD_3$, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-230, a group represented by one of Formulae 9-201 to 9-230 in which at least one hydrogen is substituted with deuterium, a group represented by one of Formulae 9-201 to 9-230 in which at least one hydrogen is substituted with —F, a group represented by one of Formulae 10-1 to 10-145, a group represented by one of Formulae 10-1 to 10-145 in which at least one hydrogen is substituted with deuterium, a group represented by one of Formulae 10-1 to 10-145 in which at least one hydrogen is substituted with —F, a group represented by one of Formulae 10-201 to 10-354, a group represented by one of Formulae 10-201 to 10-354 in which at least one hydrogen is substituted with deuterium, a group represented by one of Formulae 10-201 to 10-354 in which at least one hydrogen is substituted with —F, —$Si(Q_3)(Q_4)(Q_5)$, or —$Ge(Q_3)(Q_4)(Q_5)$, wherein $Q_3$ to $Q_5$ may each independently be as described herein.

In one or more embodiments, at least one of $R_1$(s) in the number of a1 in Formula 2-1 (for example, $R_{11}$ in Formula CY1-1) may be a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-230, a group represented by one of Formulae 9-201 to 9-230 in which at least one hydrogen is substituted with deuterium, a group represented by one of Formulae 9-201 to 9-230 in which at least one hydrogen is substituted with —F, a group represented by one of Formulae 10-1 to 10-145, a group represented by one of Formulae 10-1 to 10-145 in which at least one hydrogen is substituted with deuterium, a group represented by one of Formulae 10-1 to 10-145 in which at least one hydrogen is substituted with —F, a group represented by one of Formulae 10-201 to 10-354, a group represented by one of Formulae 10-201 to 10-354 in which at least one hydrogen is substituted with deuterium, or a group represented by one of Formulae 10-201 to 10-354 in which at least one hydrogen is substituted with —F:

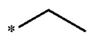
9-1

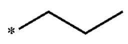
9-2

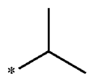
9-3

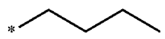
9-4

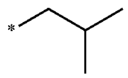
9-5

-continued
9-6
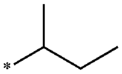
9-7
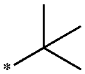
9-8
9-9
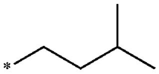
9-10
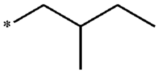
9-11
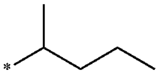
9-12
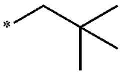
9-13
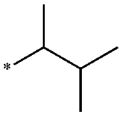
9-14
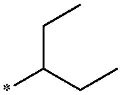
9-15
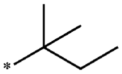
9-16
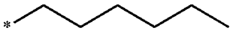
9-17
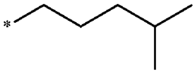
9-18
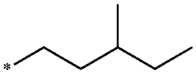
9-19
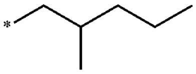
9-20
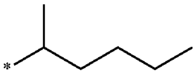
9-21
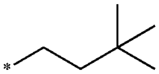
9-22
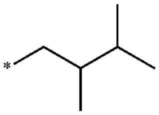
-continued
9-23
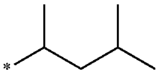
9-24
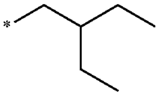
9-25
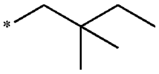
9-26
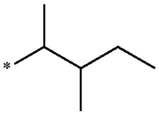
9-27
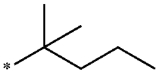
9-28
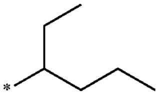
9-29
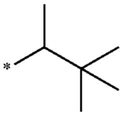
9-30
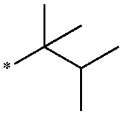
9-31
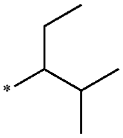
9-32
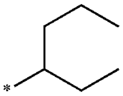
9-33
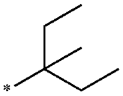
9-34
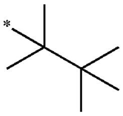
9-35
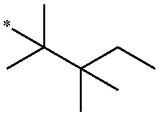

-continued
9-36
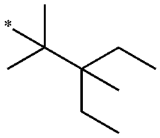
9-37
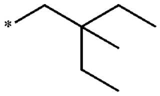
9-38
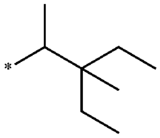
9-39
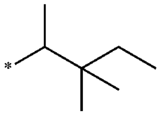
9-201
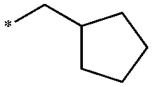
9-202
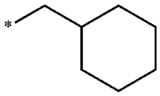
9-203
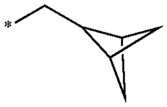
9-204
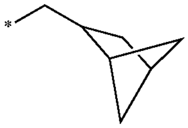
9-205
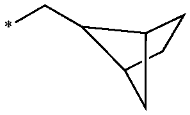
9-206
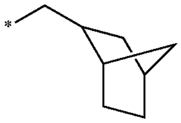
9-207
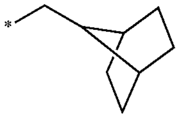
9-208
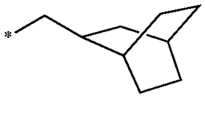
-continued
9-209
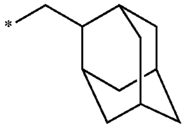
9-210
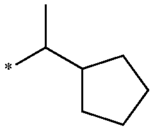
9-211
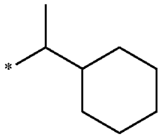
9-212
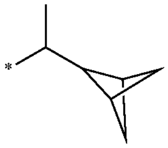
9-213
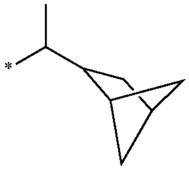
9-214
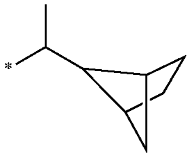
9-215
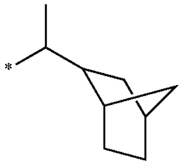
9-216
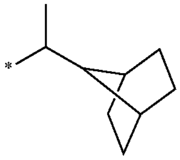
9-217
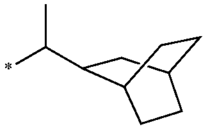
9-218
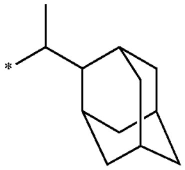

-continued
9-219
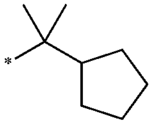
9-220
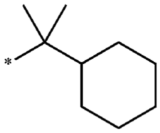
9-221
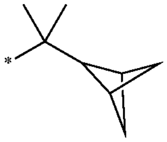
9-222
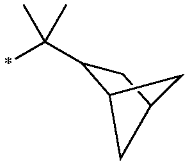
9-223
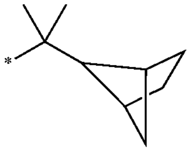
9-224
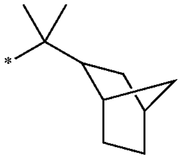
9-225
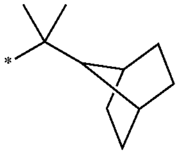
9-226
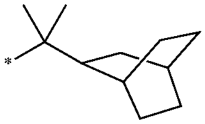
9-227
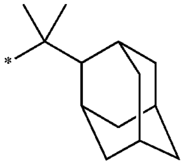
9-228
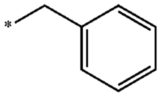
-continued
9-229
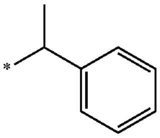
9-230
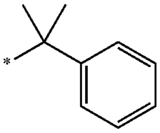
10-1
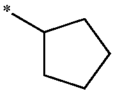
10-2
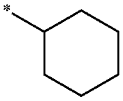
10-3
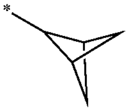
10-4
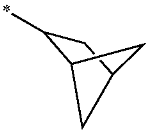
10-5
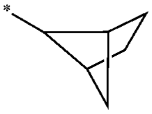
10-6
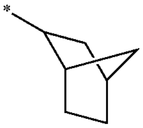
10-7
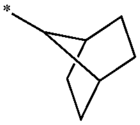
10-8
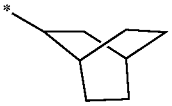
10-9
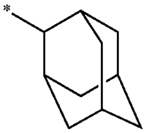
10-10
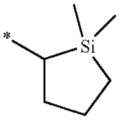

-continued
10-11
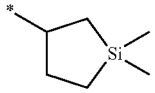
10-12
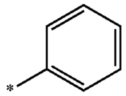
10-13
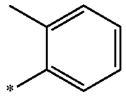
10-14
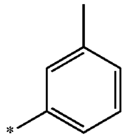
10-15
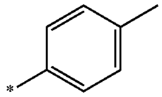
10-16
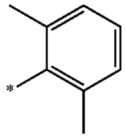
10-17
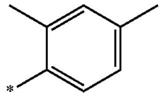
10-18
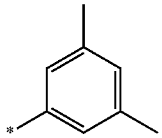
10-19
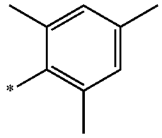
10-20
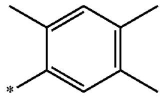
10-21
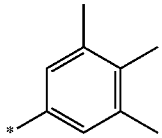
10-22
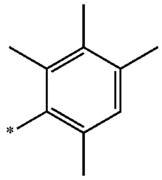
-continued
10-23
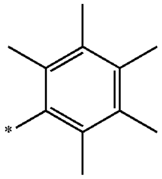
10-24
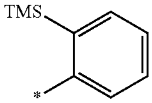
10-25
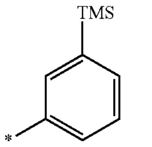
10-26
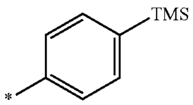
10-27
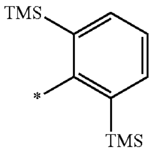
10-28
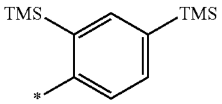
10-29
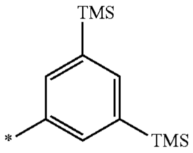
10-30
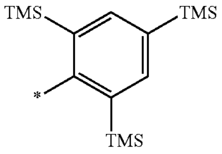
10-31
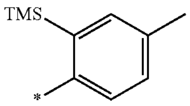
10-32
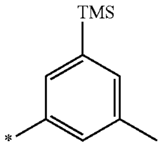
10-33
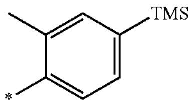

-continued
10-34
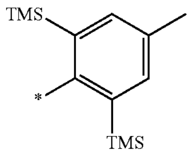
10-35
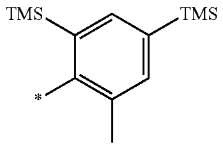
10-36
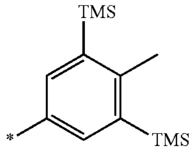
10-37
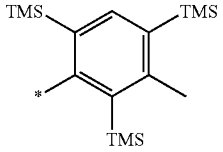
10-38
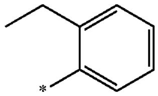
10-39
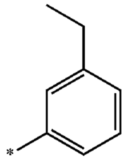
10-40
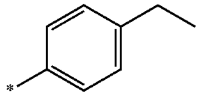
10-41
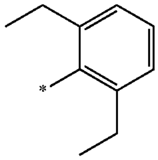
10-42
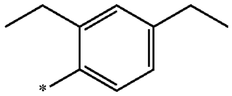
10-43
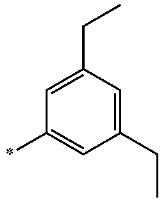
-continued
10-44
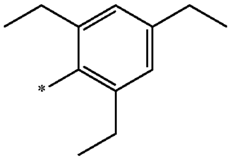
10-45
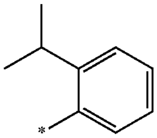
10-46
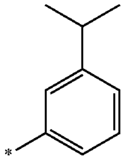
10-47
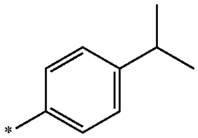
10-48
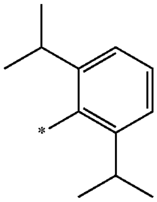
10-49
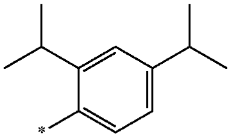
10-50
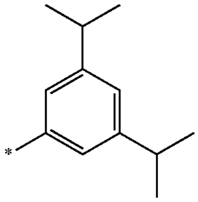
10-51
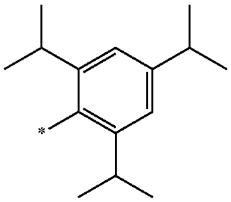
10-52
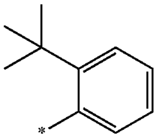

-continued
10-53
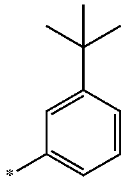
10-54
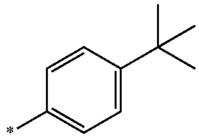
10-55
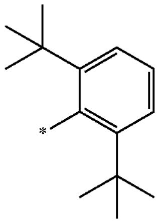
10-56
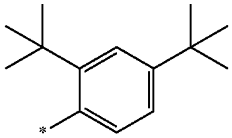
10-57
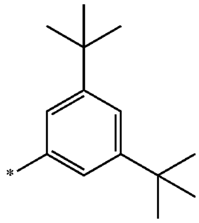
10-58
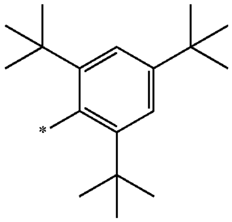
10-59
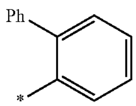
10-60
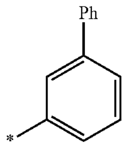
10-61
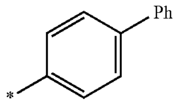
-continued
10-62
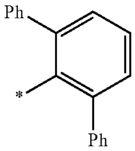
10-63
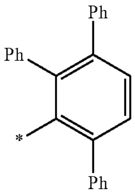
10-64
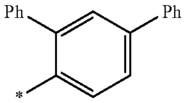
10-65
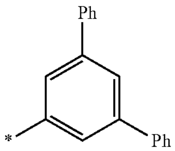
10-66
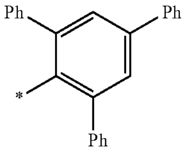
10-67
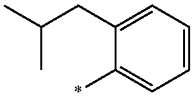
10-68
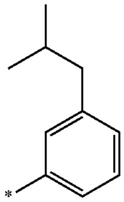
10-69
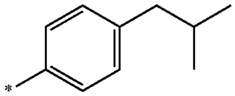
10-70
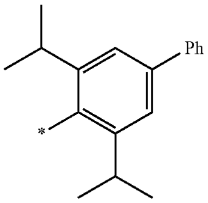
10-71
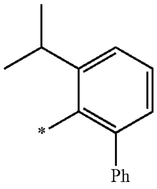

-continued
10-72
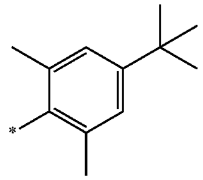
10-73
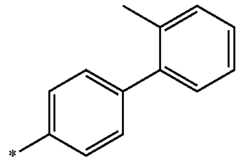
10-74
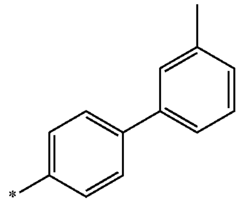
10-75
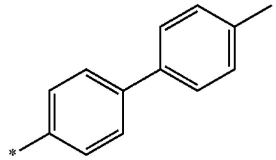
10-76
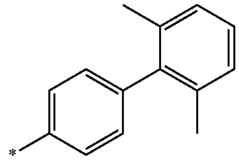
10-77
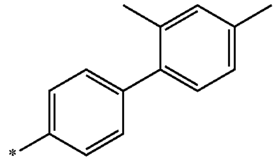
10-78
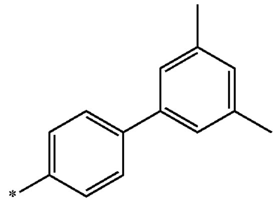
10-79
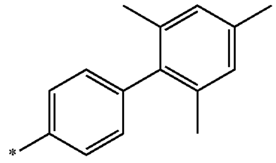
-continued
10-80
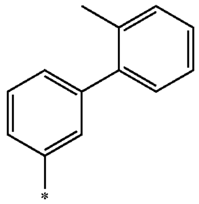
10-81
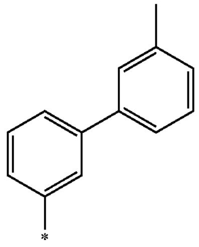
10-82
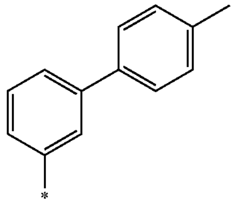
10-83
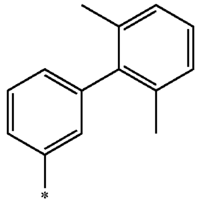
10-84
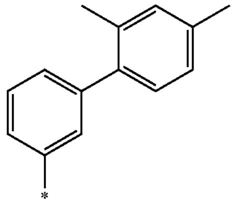
10-85
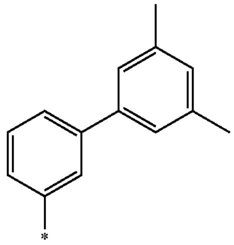
10-86
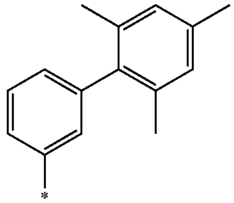

-continued
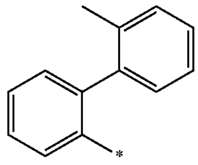
10-87
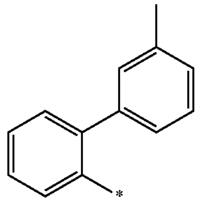
10-88
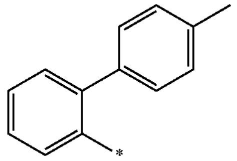
10-89
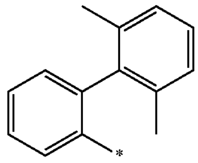
10-90
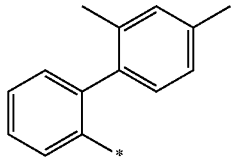
10-91
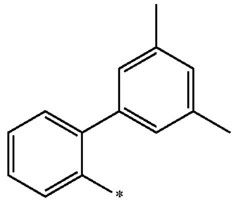
10-92
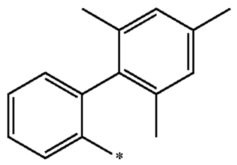
10-93
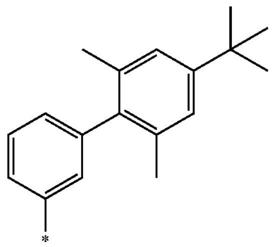
10-94
-continued
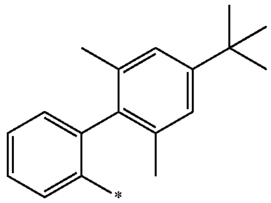
10-95
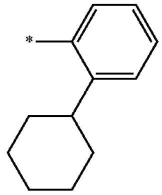
10-96
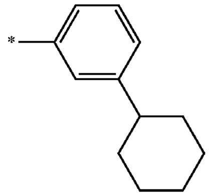
10-97
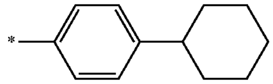
10-98
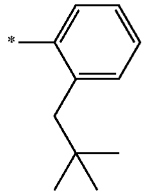
10-99
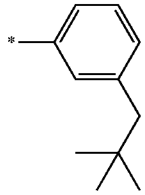
10-100
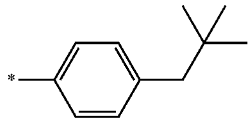
10-101
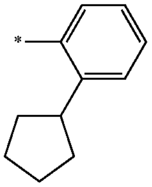
10-102

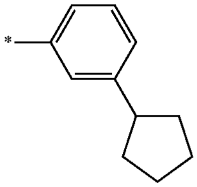
10-103
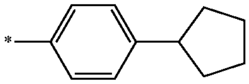
10-104
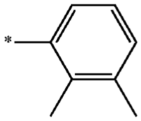
10-105
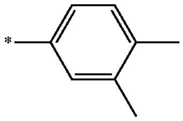
10-106
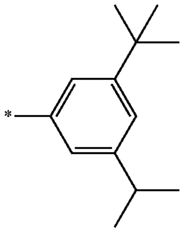
10-107
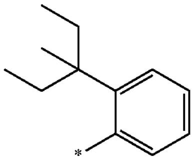
10-108
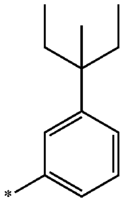
10-109
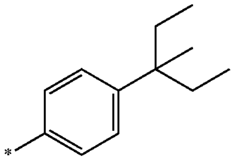
10-110
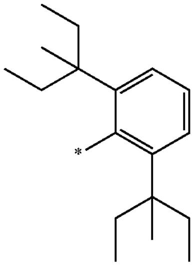
10-111
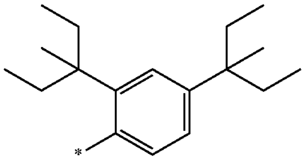
10-112
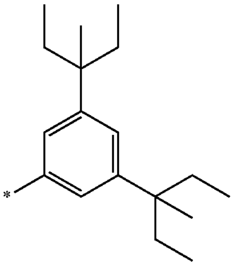
10-113
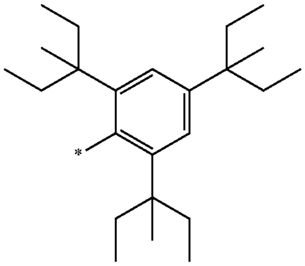
10-114
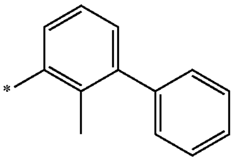
10-115
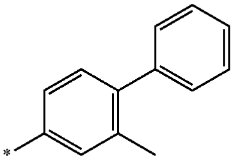
10-116
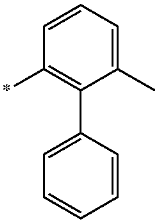
10-117
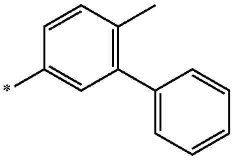
10-118

-continued
10-119
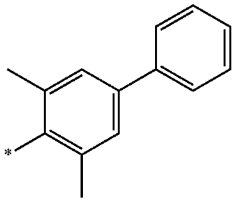
10-120
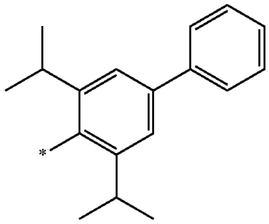
10-121
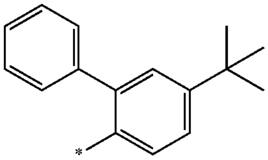
10-122
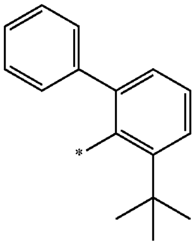
10-123
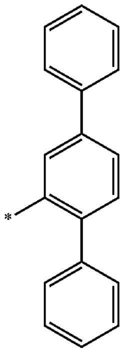
10-124
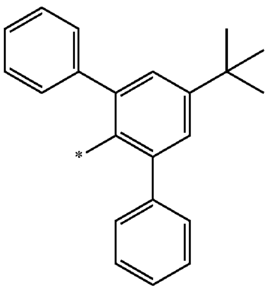
-continued
10-125
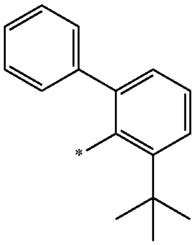
10-126
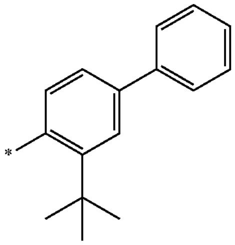
10-127
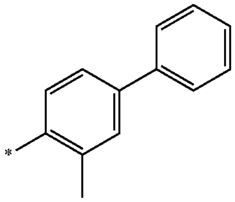
10-128
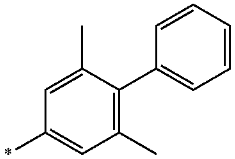
10-129
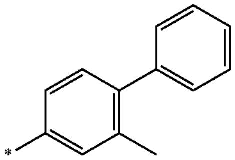
10-130
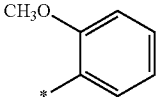
10-131
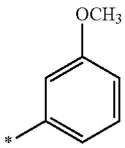
10-132
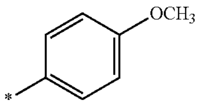
10-133
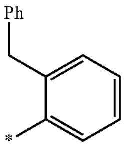

-continued
10-134
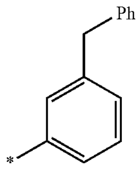
10-135
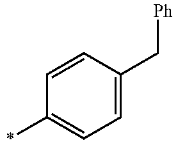
10-136
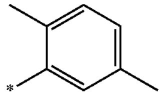
10-137
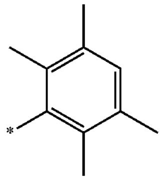
10-138
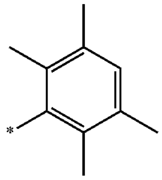
10-139
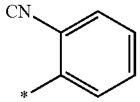
10-140
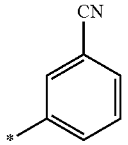
10-141
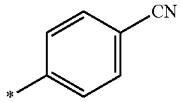
10-142
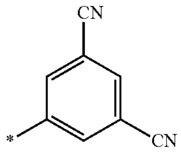
10-143
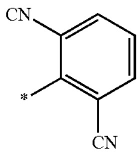
-continued
10-144
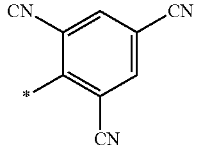
10-145
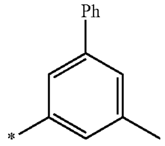
10-201
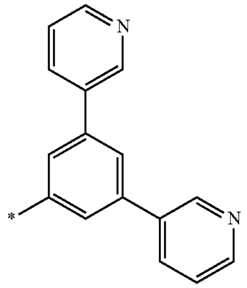
10-202
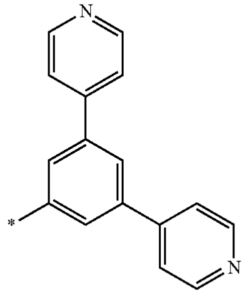
10-203
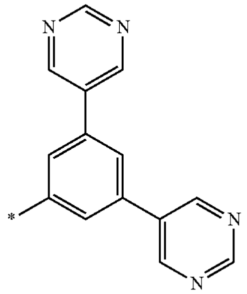
10-204
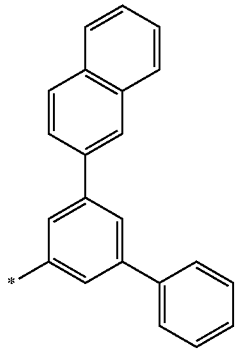

10-205
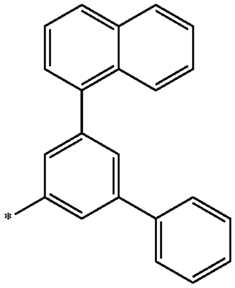
10-206
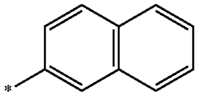
10-207
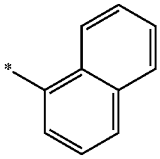
10-208
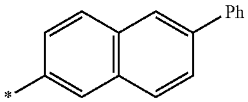
10-209
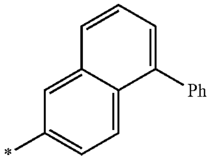
10-210
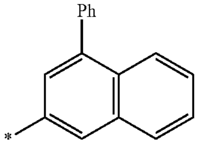
10-211
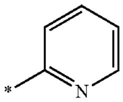
10-212
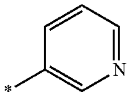
10-213
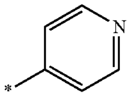
10-214
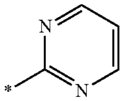
10-215
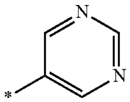
10-216
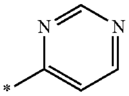
10-217
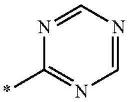
10-218
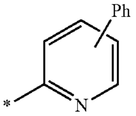
10-219
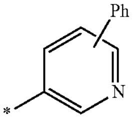
10-220
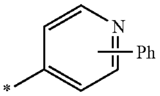
10-221
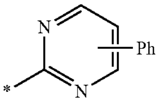
10-222
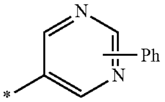
10-223
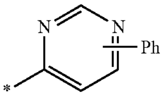
10-224
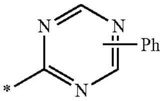
10-225
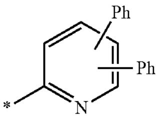
10-226
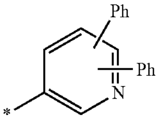
10-227
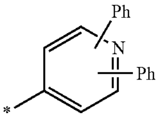
10-228
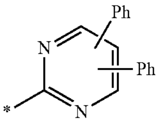

-continued
10-229
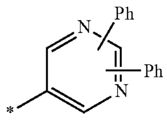
10-230
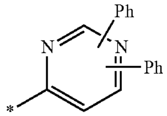
10-231
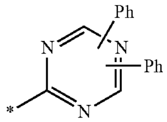
10-232
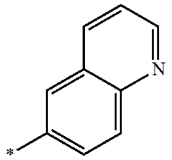
10-233
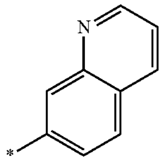
10-234
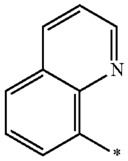
10-235
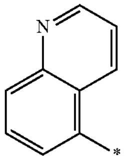
10-236
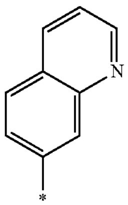
10-237
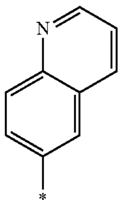
-continued
10-238
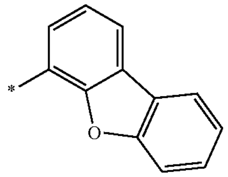
10-239
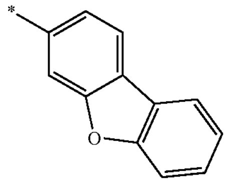
10-240
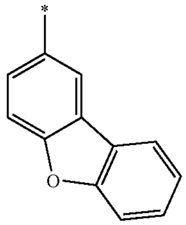
10-241
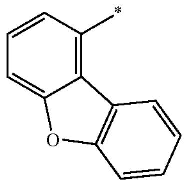
10-242
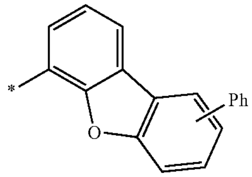
10-243
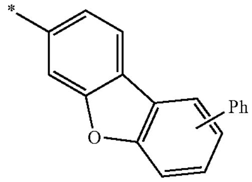
10-244
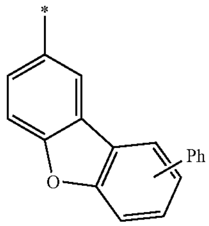
10-245
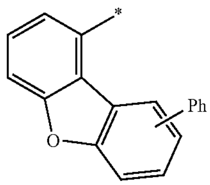

-continued
10-246
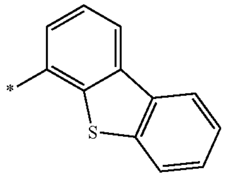
10-247
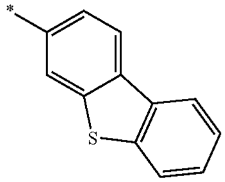
10-248
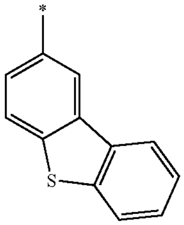
10-249
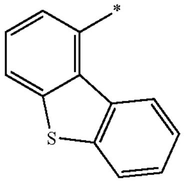
10-250
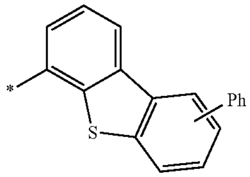
10-251
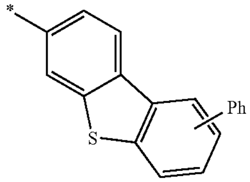
10-252
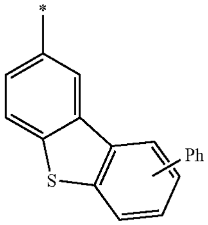
10-253
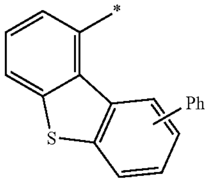
-continued
10-254
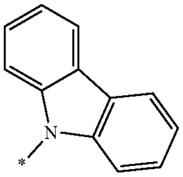
10-255
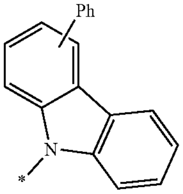
10-256
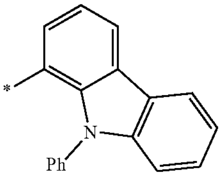
10-257
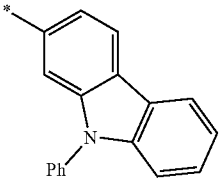
10-258
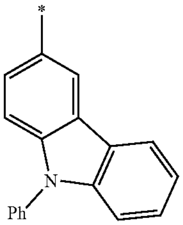
10-259
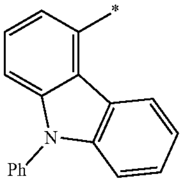
10-260
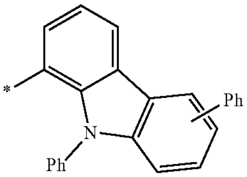
10-261
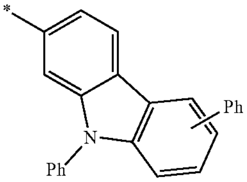

-continued
10-262
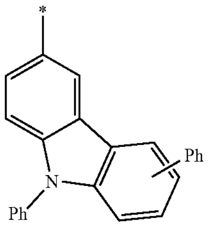
10-263
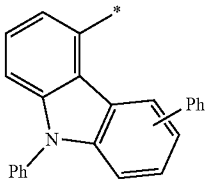
10-264
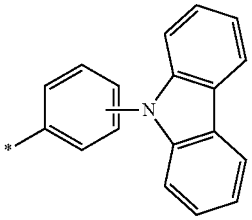
10-265
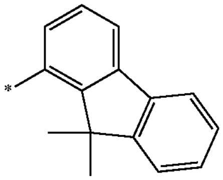
10-266
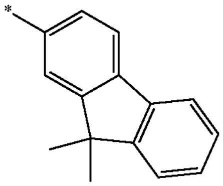
10-267
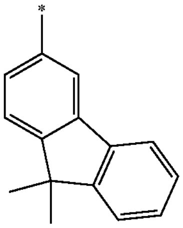
10-268
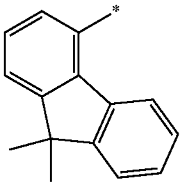
-continued
10-269
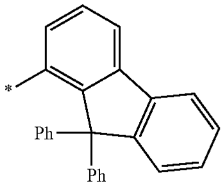
10-270
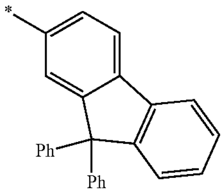
10-271
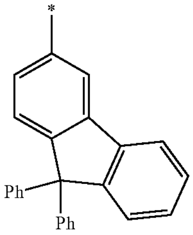
10-272
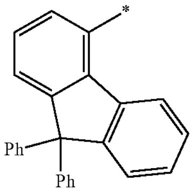
10-273
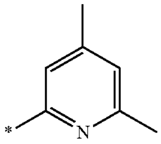
10-274
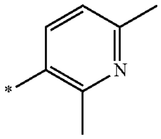
10-275
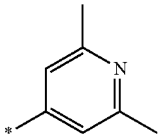
10-276
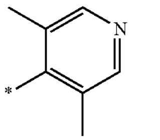
10-277
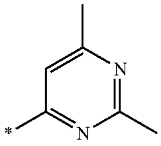

-continued
10-278
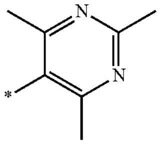
10-279
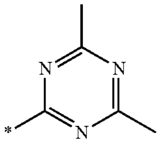
10-280
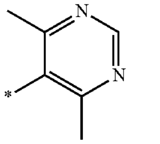
10-281
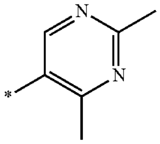
10-282
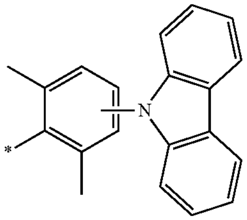
10-283
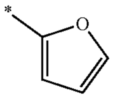
10-284
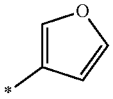
10-285
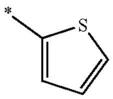
10-286
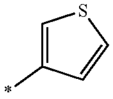
10-287
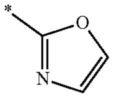
10-288
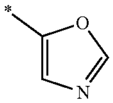
-continued
10-289
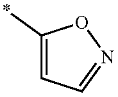
10-290
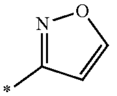
10-291
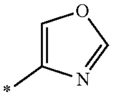
10-292
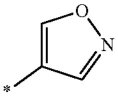
10-293
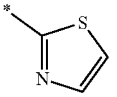
10-294
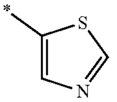
10-295
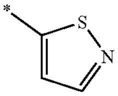
10-296
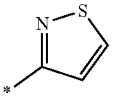
10-297
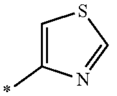
10-298
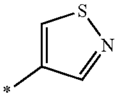
10-299
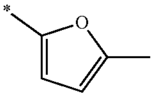
10-300
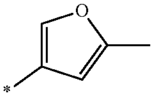
10-301
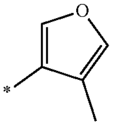
10-302
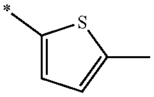

-continued
10-303
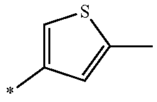
10-304
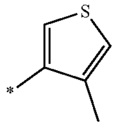
10-305
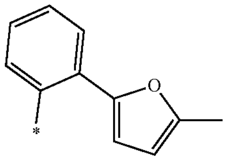
10-306
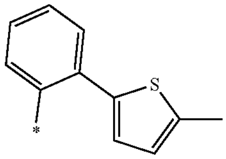
10-307
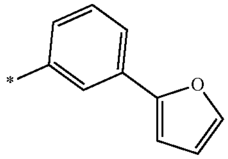
10-308
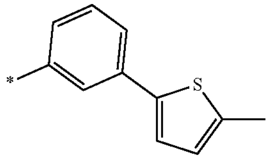
10-309
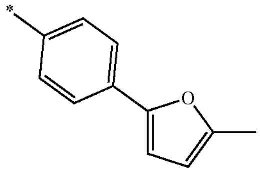
10-310
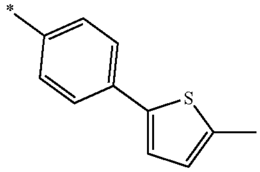
10-311
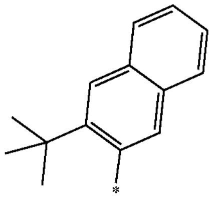
-continued
10-312
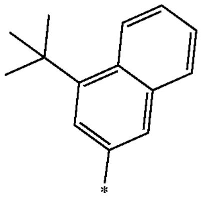
10-313
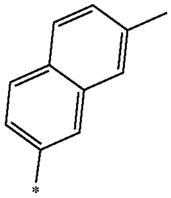
10-314
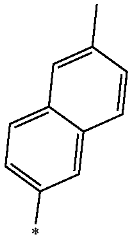
10-315
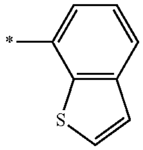
10-316
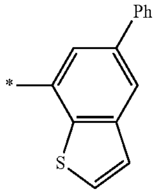
10-317
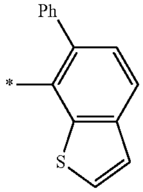
10-318
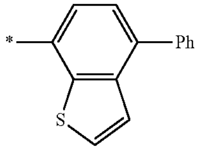
10-319
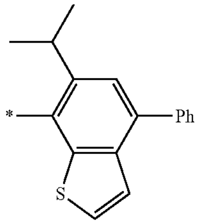

-continued
10-320
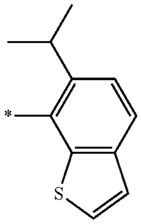
10-321
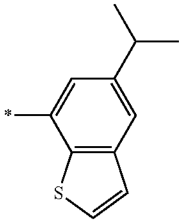
10-322
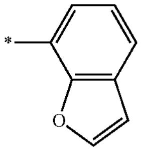
10-323
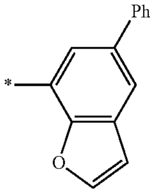
10-324
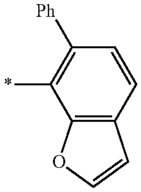
10-325
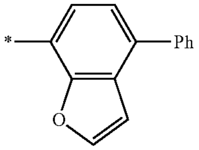
10-326
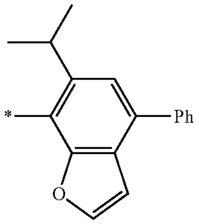
-continued
10-327
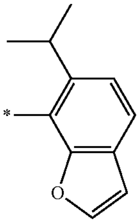
10-328
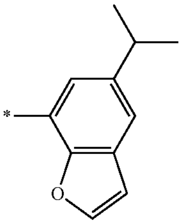
10-329
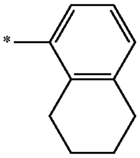
10-330
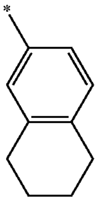
10-331
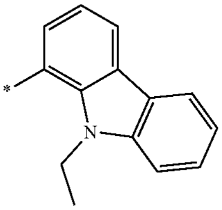
10-332
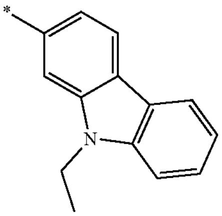
10-333
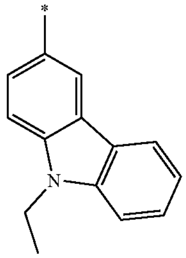

-continued
10-334
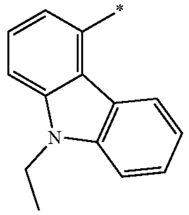
10-335
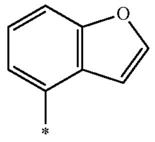
10-336
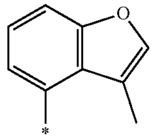
10-337
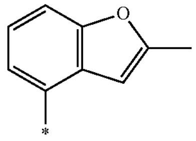
10-338
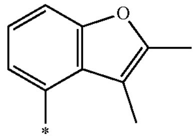
10-339
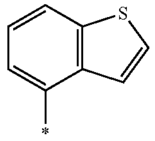
10-340
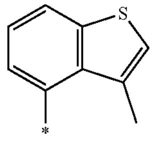
10-341
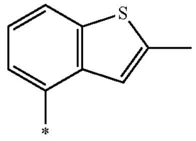
10-342
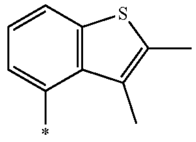
-continued
10-343
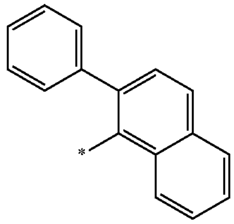
10-344
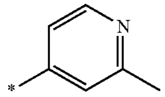
10-345
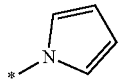
10-346
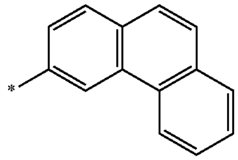
10-347
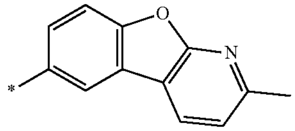
10-348
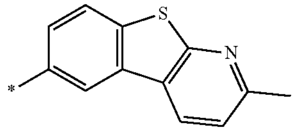
10-349
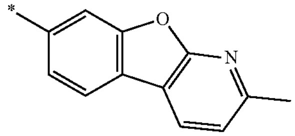
10-350
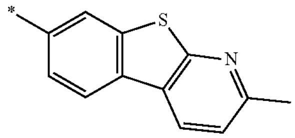
10-351
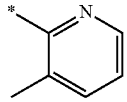
10-352
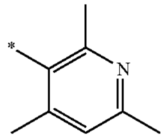
10-353
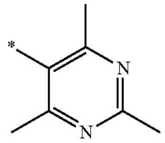

-continued 10-354

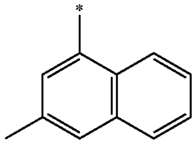

wherein, in Formulae 9-1 to 9-39, 9-201 to 9-230, 10-1 to 10-145, and 10-201 to 10-354, * indicates a binding site to a neighboring atom, “Ph” indicates a phenyl group, “TMS” indicates a trimethylsilyl group, and “TMG” indicates a trimethylgermyl group.

The “group represented by one of Formulae 9-1 to 9-39 in which at least one hydrogen is substituted with deuterium” and the “group represented by one of Formulae 9-201 to 9-230 in which at least one hydrogen is substituted with deuterium” may be, for example, a group represented by one of Formulae 9-501 to 9-514 or 9-601 to 9-637:

9-501

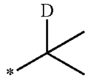

9-502

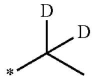

9-503

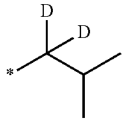

9-504

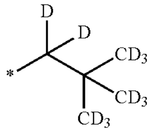

9-505

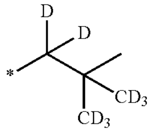

9-506

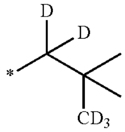

9-507

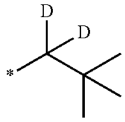

9-508

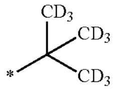

9-509

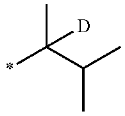

-continued 9-510

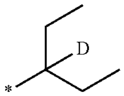

9-511

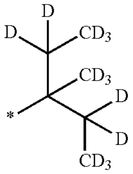

9-512

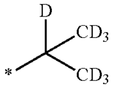

9-513

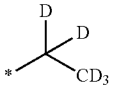

9-514

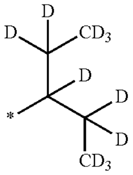

9-601

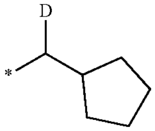

9-602

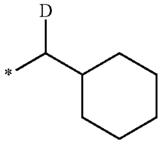

9-603

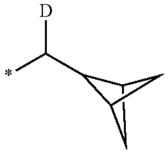

9-604

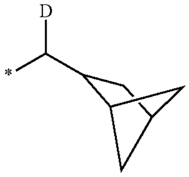

9-605

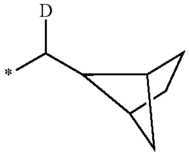

-continued
9-606
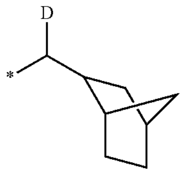
9-607
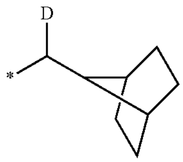
9-608
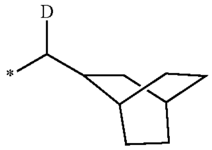
9-609
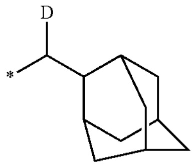
9-610
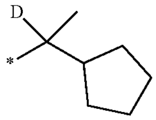
9-611
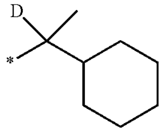
9-612
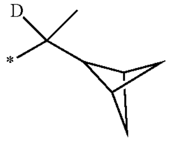
9-613
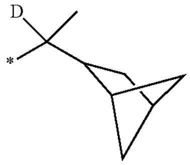
9-614
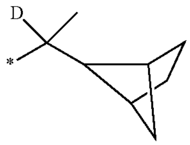
9-615
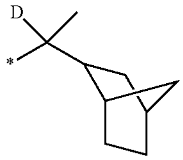
-continued
9-616
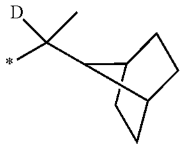
9-617
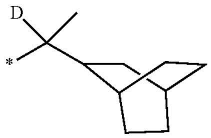
9-618
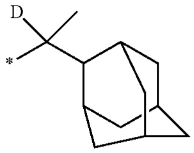
9-619
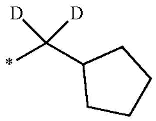
9-620
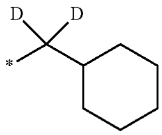
9-621
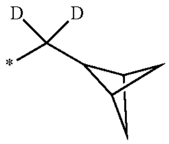
9-622
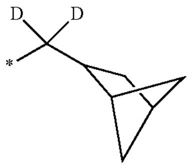
9-623
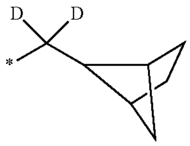
9-624
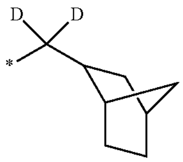
9-625
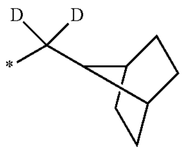

-continued 9-626

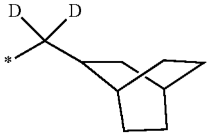

9-627

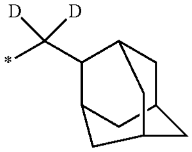

9-628

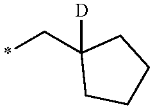

9-629

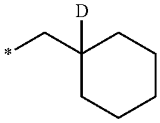

9-630

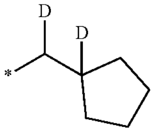

9-631

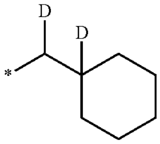

9-632

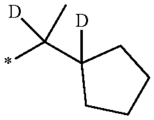

9-633

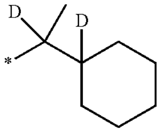

9-634

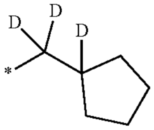

9-635

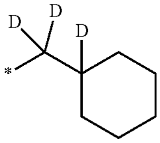

9-636

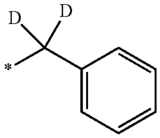

-continued 9-637

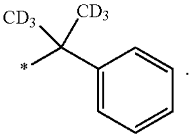

The “group represented by one of Formulae 9-1 to 9-39 in which at least one hydrogen is substituted with —F” and the “group represented by one of Formulae 9-201 to 9-230 in which at least one hydrogen is substituted with —F” may be, for example, a group represented by one of Formulae 9-701 to 9-710:

9-701

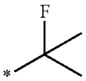

9-702

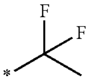

9-703

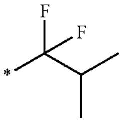

9-704

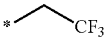

9-705

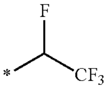

9-706

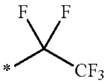

9-707

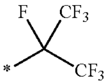

9-708

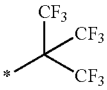

9-709

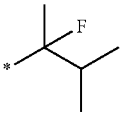

9-710

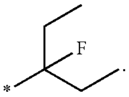

The “group represented by one of Formulae 10-1 to 10-145 in which at least one hydrogen is substituted with deuterium” and the “group represented by one of Formulae 10-201 to 10-354 in which at least one hydrogen is substituted with deuterium” may be, for example, a group represented by one of Formulae 10-501 to 10-553:

10-501
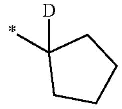
10-502
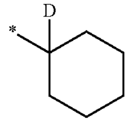
10-503
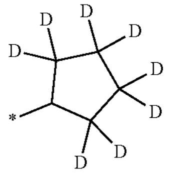
10-504
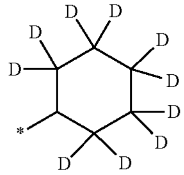
10-505
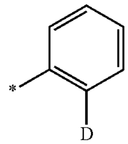
10-506
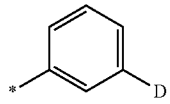
10-507
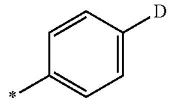
10-508
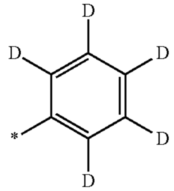
10-509
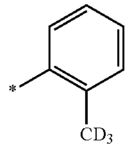
10-510
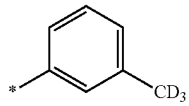
10-511
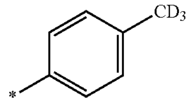
-continued
10-512
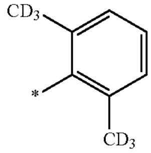
10-513
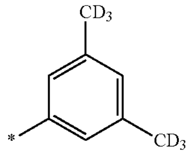
10-514
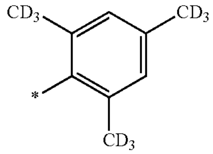
10-515
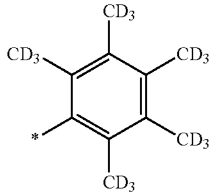
10-516
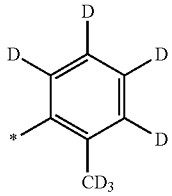
10-517
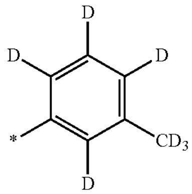
10-518
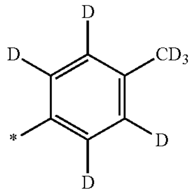
10-519
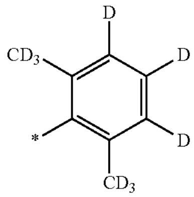

-continued
10-520
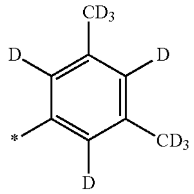
10-521
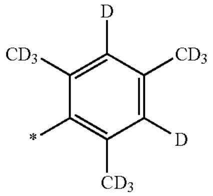
10-522
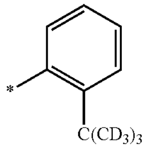
10-523
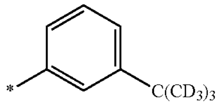
10-524
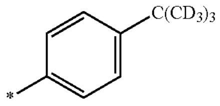
10-525
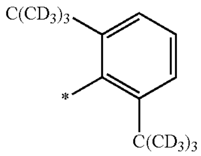
10-526
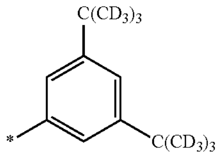
10-527
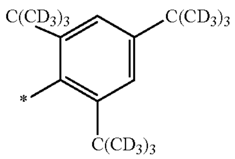
10-528
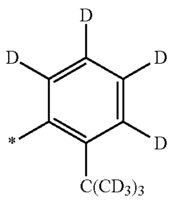
-continued
10-529
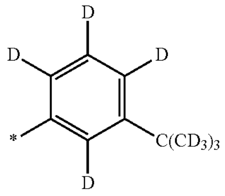
10-530
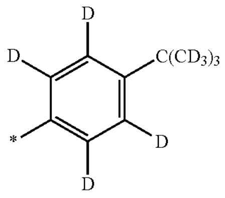
10-531
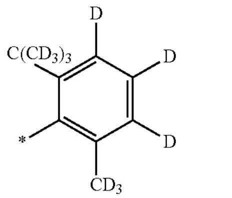
10-532
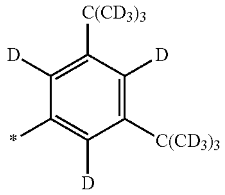
10-533
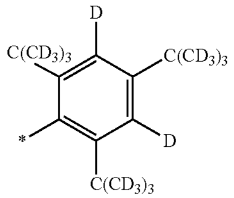
10-534
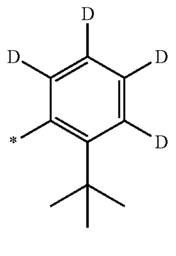
10-535
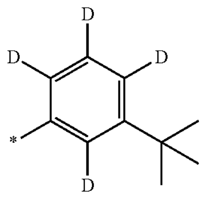

-continued
10-536
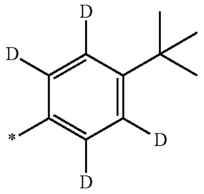
10-537
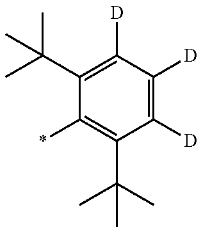
10-538
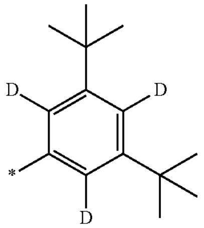
10-540
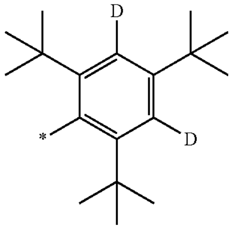
10-541
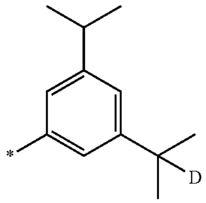
10-542
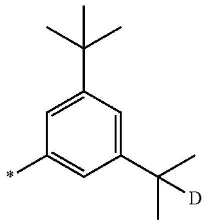
10-543
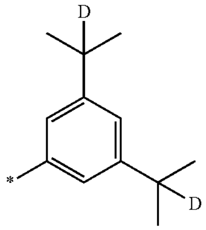
-continued
10-544
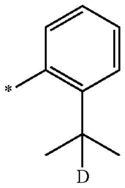
10-545
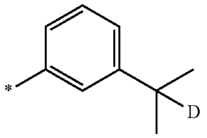
10-546
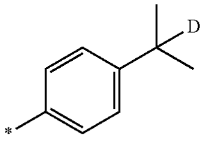
10-547
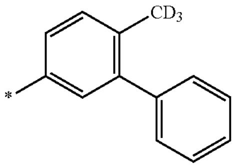
10-548
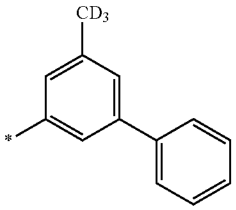
10-549
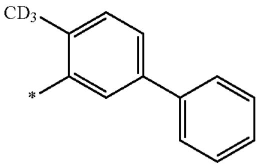
10-550
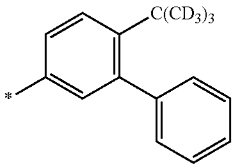
10-551
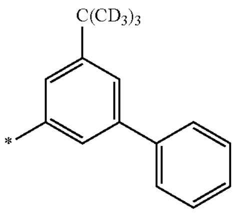
10-552
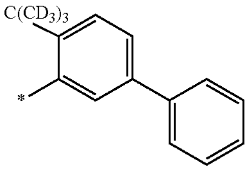

-continued
10-553
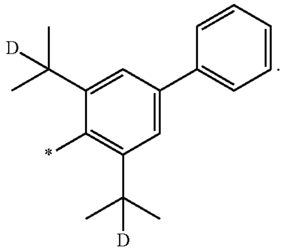
The "group represented by one of Formulae 10-1 to 10-145 in which at least one hydrogen is substituted with —F" and the "group represented by one of Formulae 10-201 to 10-354 in which at least one hydrogen is substituted with —F" may be, for example, a group represented by one of Formulae 10-601 to 10-636:
10-601
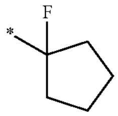
10-602
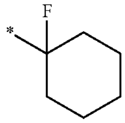
10-603
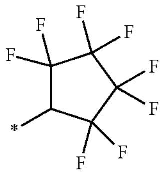
10-604
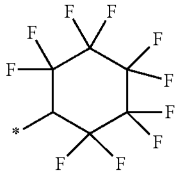
10-605
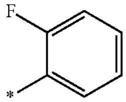
10-606
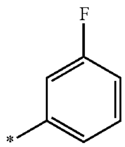
10-607
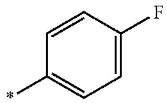
-continued
10-608
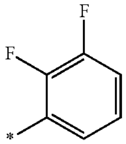
10-609
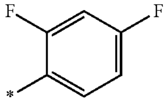
10-610
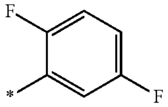
10-611
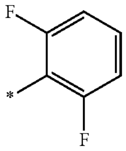
10-612
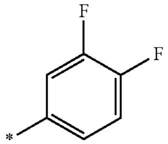
10-613
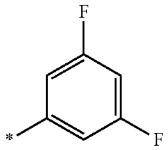
10-614
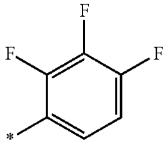
10-615
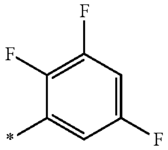
10-616
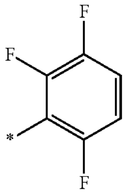
10-617
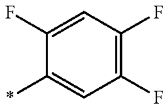

-continued
10-618
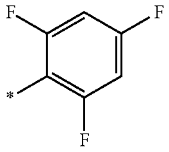
10-619
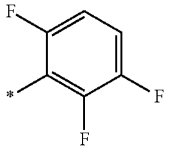
10-620
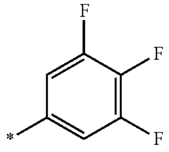
10-621
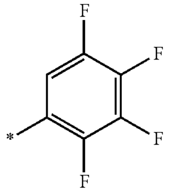
10-622
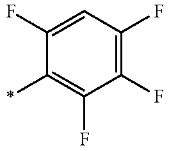
10-623
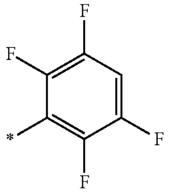
10-624
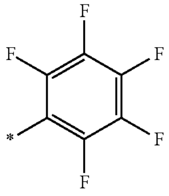
10-625
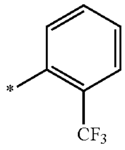
10-626
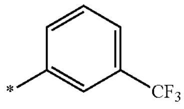
-continued
10-627
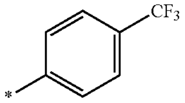
10-628
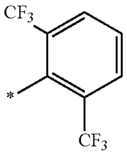
10-629
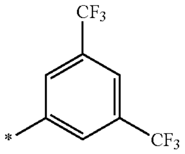
10-630
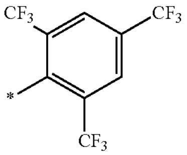
10-631
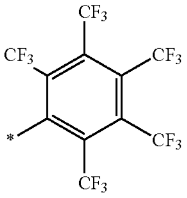
10-632
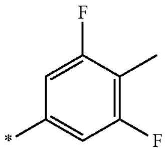
10-633
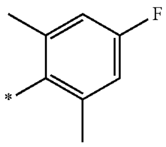
10-634
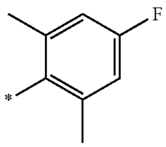
10-635
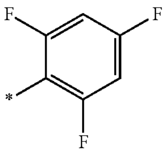

-continued 10-636

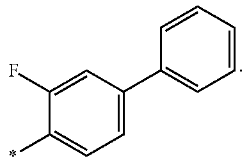

a1 to a4 in Formulae 2-1 to 2-3 each indicates the respective numbers of groups $R_1$ to $R_4$, wherein a1 is an integer from 0 to 3, a2 is an integer from 0 to 6, and a3 and a4 are each independently an integer from 0 to 20 (for example, an integer from 0 to 10). When a1 is 2 or greater, two or more $R_1$ groups may be identical to or different from each other, when a2 is 2 or greater, two or more $R_2$ groups may be identical to or different from each other, when a3 is 2 or greater, two or more $R_3$ groups may be identical to or different from each other, and when a4 is 2 or greater, two or more $R_4$ groups may be identical to or different from each other. In one or more embodiments, a1 to a4 may each independently be 0, 1, 2, or 3.

In one or more embodiments, a2 in Formula 2-1 may not be 0, and $R_2$ may not be hydrogen.

In one or more embodiments, the organometallic compound may include deuterium, a fluoro group, or a combination thereof.

In one or more embodiments, $X_3$ in Formulae 2-2 and 2-3 may be N-($T_3$-$Z_3$), and i) Condition A, ii) Condition B, iii) Condition A and Condition B, or iv) Condition A and Condition C, may be satisfied:

Condition A $T_3$ is a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$ (for example, a benzene group, a naphthalene group, a dibenzofuran group, or a dibenzothiophene group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl) phenyl group, a naphthyl group, a pyridinyl group, a furanyl group, a thiophenyl group, a benzofuranyl group, a benzothiophenyl group, a dibenzofuranyl group, a dibenzothiophenyl group, or a combination thereof);

Condition B $Z_3$ is a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group (for example, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, —Si($Q_{33}$)($Q_{34}$)($Q_{35}$), —Ge($Q_{33}$)($Q_{34}$)($Q_{35}$), or a combination thereof);

Condition C $Z_3$ is:

hydrogen, deuterium, —F, or a cyano group; or a substituted or unsubstituted $C_1$-$C_{20}$ alkyl group, a substituted or unsubstituted $C_3$-$C_{10}$ cycloalkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group (for example, a $C_1$-$C_{20}$ alkyl group, a cyclopentyl group, a cyclohexyl group, a cycloheptyl group, a cyclooctyl group, an adamantanyl group, a norbornanyl group(bicyclo[2.2.1]heptyl group), a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, —Si($Q_{33}$)($Q_{34}$)($Q_{35}$), —Ge($Q_{33}$)($Q_{34}$)($Q_{35}$), or a combination thereof).

In one or more embodiments, the organometallic compound represented by Formula 1 may satisfy at least one of Conditions 1 to 12:

Condition 1 a1 in Formula 2-1 is not 0, and at least one of $R_1$ in the number of a1 includes deuterium;

Condition 2 a2 in Formula 2-1 is not 0, and at least one of $R_2$ in the number of a2 includes deuterium;

Condition 3

$X_3$ in Formulae 2-2 and 2-3 is N-($T_3$-$Z_3$), and a group represented by *-$T_3$-$Z_3$ includes deuterium;

Condition 4 a3 in Formula 2-2 is not 0, and at least one of $R_3$ in the number of a3 includes deuterium;

Condition 5 at least one of $R_{31}$ and $R_{32}$ in Formula 2-3 includes deuterium;

Condition 6 a4 in Formulae 2-2 and 2-3 is not 0, and at least one of $R_4$ in the number of a4 includes deuterium;

Condition 7 a1 in Formula 2-1 is not 0, and at least one of $R_1$ in the number of a1 includes a fluoro group;

Condition 8 a2 in Formula 2-1 is not 0, and at least one of $R_2$ in the number of a2 includes a fluoro group;

Condition 9

$X_3$ in Formulae 2-2 and 2-3 is N-($T_3$-$Z_3$), and a group represented by *-$T_3$-$Z_3$ includes a fluoro group;

Condition 10 a3 in Formula 2-2 is not 0, and at least one of $R_3$ in the number of a3 includes a fluoro group;

Condition 11 at least one of $R_{31}$ and $R_{32}$ in Formula 2-3 includes a fluoro group;

Condition 12 a4 in Formulae 2-2 and 2-3 is not 0, and at least one of $R_4$ in the number of a4 includes a fluoro group.

In Formulae 2-1 to 2-3, i) two or more of a plurality of $R_1$, ii) two or more of a plurality of $R_2$, iii) two or more of a plurality of $R_3$, iv) two or more of a plurality of $R_4$, and v) two or more of $R_1$ to $R_4$ are each optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$. In other words, two or more of a plurality of $R_1$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_2$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_3$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_4$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, and two or more of $R_1$ to $R_4$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$.

$R_{10a}$ is as described in connection with $R_2$. In one or more embodiments, $R_{10a}$ may be as described in connection with $R_2$, wherein $R_{10a}$ may not be hydrogen.

In Formulae 2-1 to 2-3, * and *' each indicates a binding site to M in Formula 1.

In one or more embodiments, a group represented by

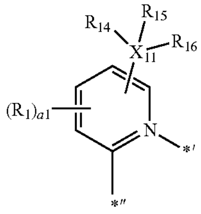

in Formula 2-1 may be a group represented by one of Formulae CY1-1 to CY1-6:

CY1-1

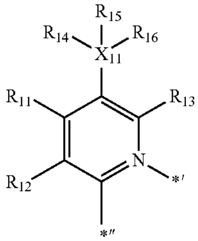

-continued

CY1-2

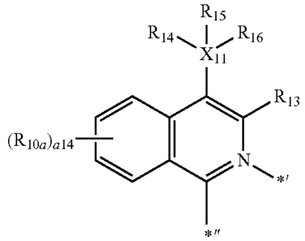

CY1-3

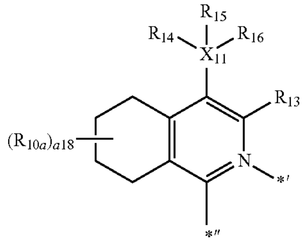

CY1-4

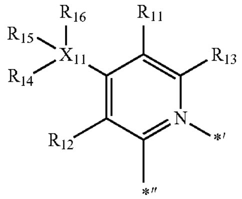

CY1-5

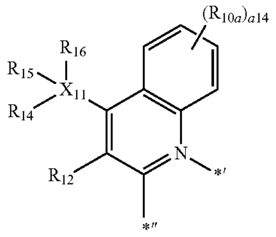

CY1-6

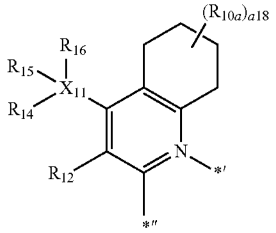

wherein, in Formulae CY1-1 to CY1-6, $X_{11}$, $R_{14}$ to $R_{16}$, and $R_{10a}$ may each independently be as described herein, $R_{11}$ to $R_{13}$ may each independently be as described in connection with $R_1$, a14 may be an integer from 0 to 4, a18 may be an integer from 0 to 8,

*' may indicate a binding site to M in Formula 1, and

*" may indicate a binding site to one of $A_1$ to $A_4$ in Formula 2-1.

In one or more embodiments, $R_{11}$ in Formulae CY1-1 and/or CY1-4 may not be hydrogen.

In one or more embodiments, $R_{11}$ in Formulae CY1-1 and/or CY1-4 may be neither hydrogen nor a methyl group.

In one or more embodiments, $R_{11}$ in Formulae CY1-1 and/or CY1-4 may not be hydrogen, a methyl group, or a cyano group.

In one or more embodiments, in Formulae CY1-1 and/or CY1-4, $R_{11}$ may not be hydrogen, and $R_{12}$ and $R_{13}$ may each be hydrogen.

In one or more embodiments, $R_{11}$ in Formulae CY1-1 and/or CY1-4 may have two or more carbon atoms, three or more carbon atoms, or four or more carbon atoms.

In one or more embodiments, $R_{11}$ in Formulae CY1-1 and/or CY1-4 may be:

a methyl group that is substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or a combination thereof; or a $C_2$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or a combination thereof. In one or more embodiments, in Formulae CY1-1 and/or CY1-4, $R_{11}$, $R_{12}$ and $R_{13}$ may each be hydrogen.

In one or more embodiments, a group represented by

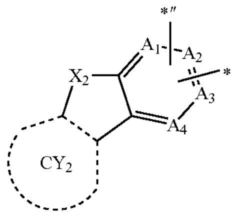

in Formula 2-1 may be a group represented by one of Formulae CY2-1 to CY2-20:

CY2-1

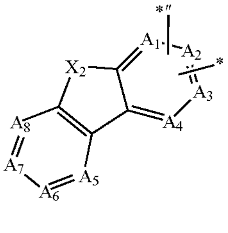

-continued

CY2-2

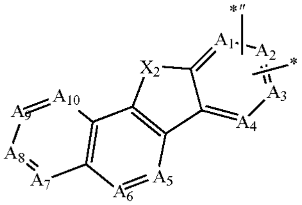

CY2-3

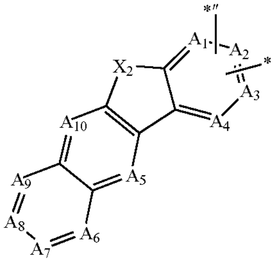

CY2-4

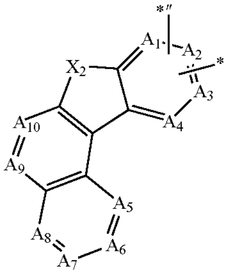

CY2-5

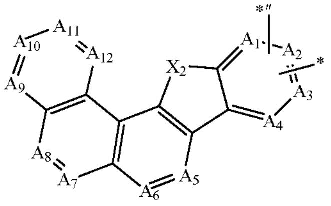

CY2-6

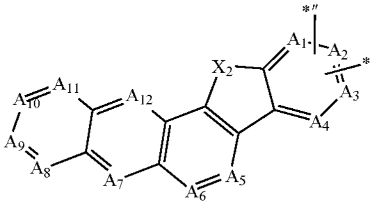

CY2-7

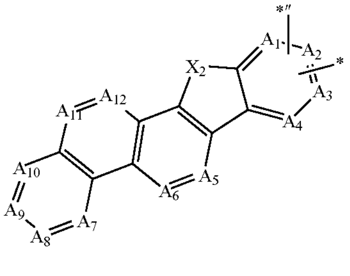

-continued
CY2-8
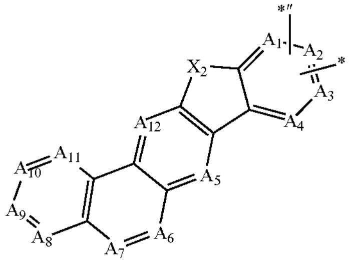
CY2-9
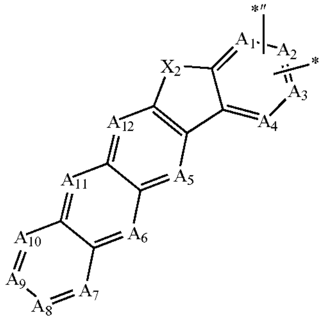
CY2-10
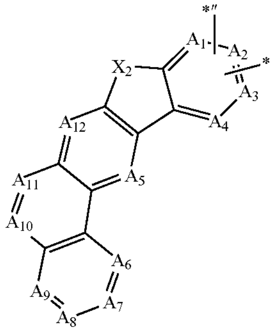
CY2-11
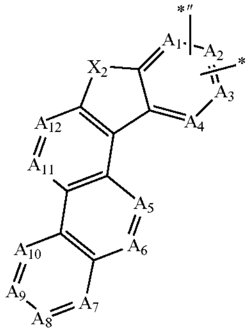
CY2-12
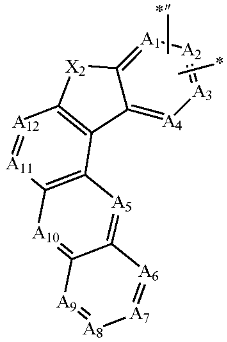
-continued
CY2-13
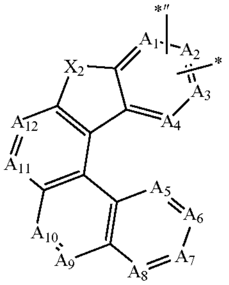
CY2-14
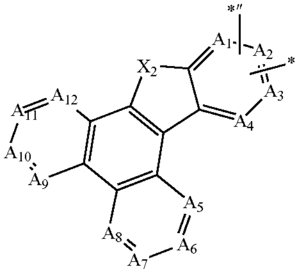
CY2-15
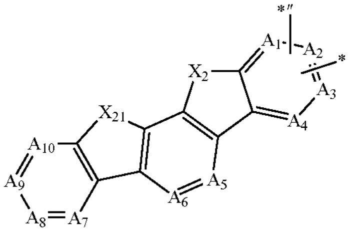
CY2-16
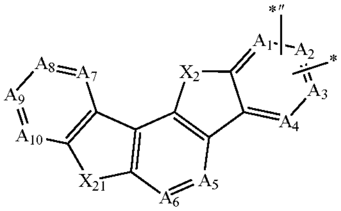
CY2-17
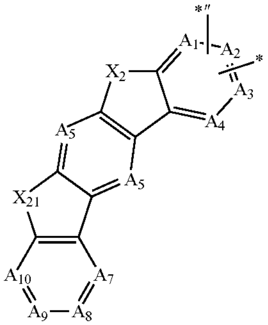

-continued

CY2-18

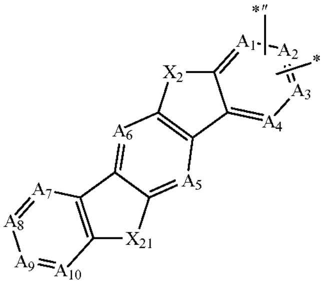

CY2-19

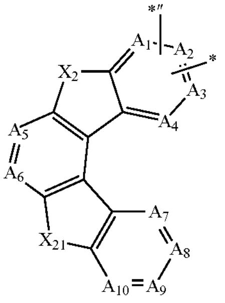

CY2-20

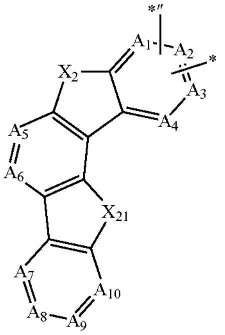

wherein, in Formulae CY2-1 to CY2-20, $X_2$ may be as described herein, $X_{21}$ may be as described in connection with $X_2$, $A_1$ to $A_{12}$ may each independently be C or N, at least one of $A_1$ to $A_8$ in Formula CY2-1 may be N, at least one of $A_1$ to $A_{10}$ in Formulae CY2-2 to CY2-4 and CY2-15 to CY2-20 may be N, and at least one of $A_1$ to $A_{12}$ in Formulae CY2-5 to CY2-14 may be N,

*' may indicate a binding site to a neighboring pyridine group in Formula 2-1, and

* may indicate a binding site to M in Formula 1.

In one or more embodiments, at least one of $A_4$ to $A_8$ in Formula CY2-1 may be N, at least one of $A_4$ to $A_{10}$ in Formulae CY2-2 to CY2-4 and CY2-15 to CY2-20 may be N, and at least one of $A_4$ to $A_{12}$ in Formulae CY2-5 to CY2-14 may be N.

In one or more embodiments, a group represented by

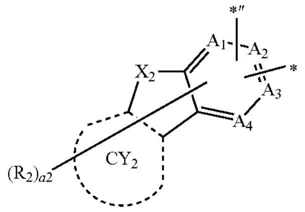

in Formula 2-1 may be a group represented by Formula CY2(1) or CY2(2):

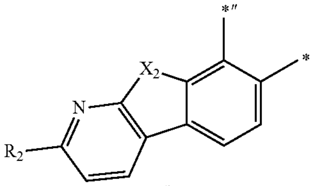

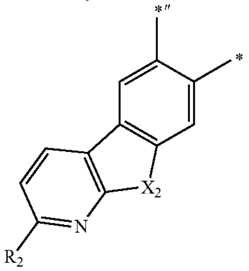

wherein, in Formulae CY2(1) and CY2(2), $X_2$ and $R_2$ may each independently be as described herein, provided that $R_2$ may not be hydrogen,

*' may indicate a binding site to a neighboring pyridine group in Formula 2-1, and

* may indicate a binding site to M in Formula 1.

In one or more embodiments, a group represented by

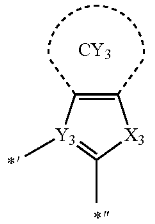

in Formula 2-2 may be a group represented by one of Formulae CY3-1 to CY3-20:

CY3-1

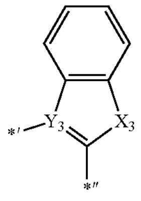

-continued
CY3-2
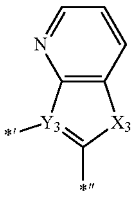
CY3-3
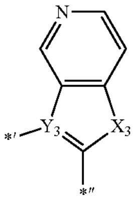
CY3-4
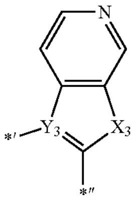
CY3-5
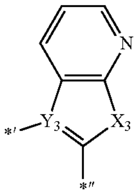
CY3-6
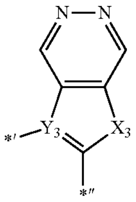
CY3-7
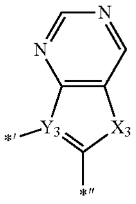
CY3-8
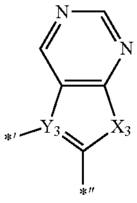
-continued
CY3-9
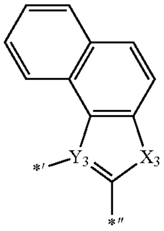
CY3-10
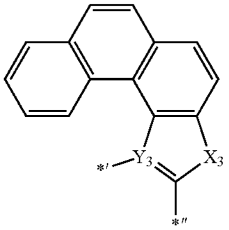
CY3-11
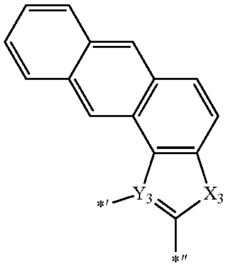
CY3-12
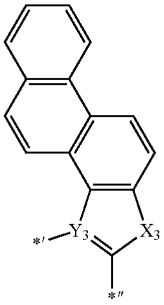
CY3-13
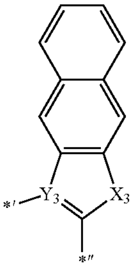
CY3-14
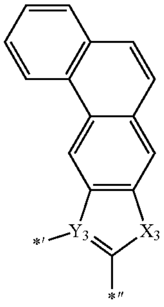

-continued
CY3-15
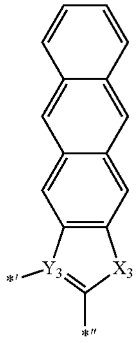
CY3-16
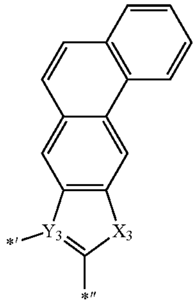
CY3-17
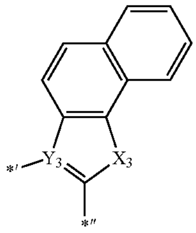
CY3-18
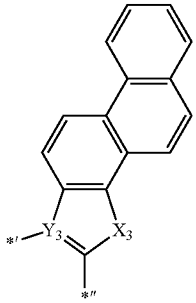
CY3-19
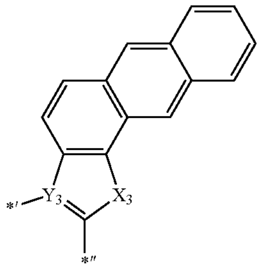
-continued
CY3-20
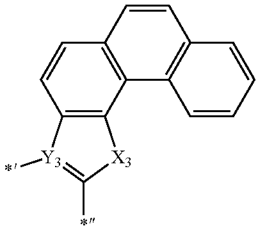
wherein, in Formulae CY3-1 to CY3-20,
$Y_3$ and $X_3$ may each independently be as described herein,
*' may indicate a binding site to M in Formula 1, and
*" may indicate a binding site to a neighboring atom in Formula 2-2.
In one or more embodiments, a group represented by
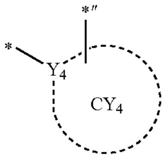
in Formulae 2-2 and 2-3 may be a group represented by one of Formulae CY4-1 to CY4-21:
CY4-1
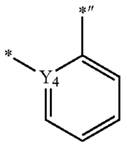
CY4-2
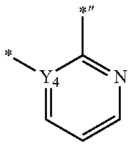
CY4-3
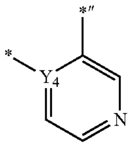
CY4-4
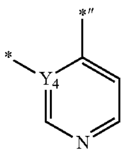
CY4-5
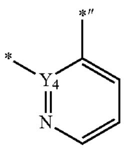

-continued
CY4-6
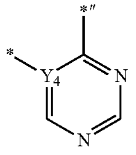
CY4-7
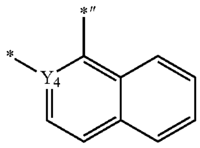
CY4-8
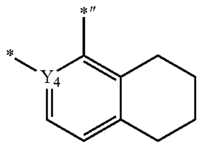
CY4-9
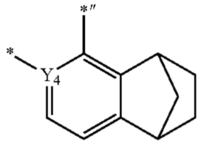
CY4-10
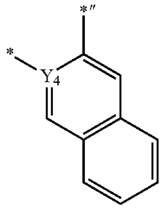
CY4-11
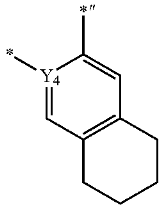
CY4-12
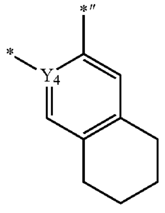
CY4-13
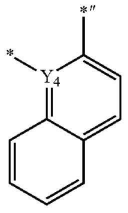
-continued
CY4-14
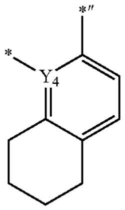
CY4-15
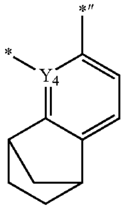
CY4-16
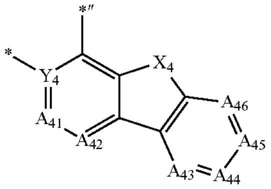
CY4-17
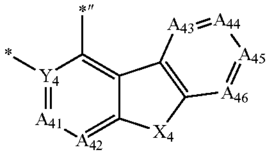
CY4-18
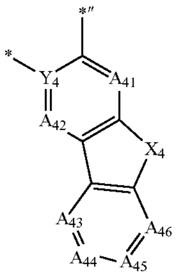
CY4-19
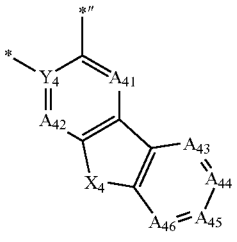
CY4-20
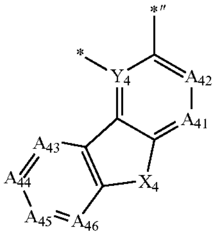

-continued

CY4-21

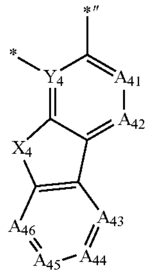

wherein, in Formulae CY4-1 to CY4-21, $Y_4$ may be C, $A_{41}$ to $A_{46}$ may each independently be C or N, $X_4$ may be O, S, Se, $N(R_{49})$, $C(R_{49a})(R_{49b})$, or $Si(R_{49a})(R_{49b})$, $R_{49}$, $R_{49a}$, and $R_{49b}$ may each independently be as described in connection with $R_4$,

* may indicate a binding site to M in Formula 1, and

*' may indicate a binding site to a neighboring atom in Formula 2-2 or 2-3.

In one or more embodiments, $A_{41}$ to $A_{46}$ in Formulae CY4-16 to CY4-21 may each be C.

In one or more embodiments, $A_{46}$ in Formulae CY4-16 to CY4-21 may be N.

In one or more embodiments, a group represented by

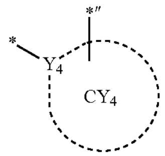

in Formula 2-2 may be a group represented by one of Formulae CY4-1 and CY4-16.

A group represented by

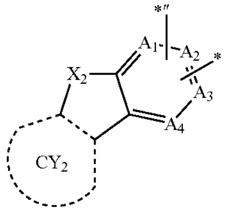

in Formula 2-1 may be substituted with at least one $R_2$, ring $CY_3$ in a group represented by

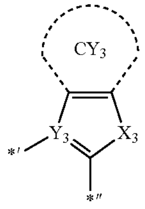

in Formula 2-2 may be substituted with at least one $R_3$, and/or a group represented by

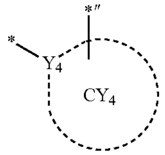

in Formula 2-3 may not be substituted or may be substituted with at least one $R_4$, wherein $R_2$, $R_3$ and $R_4$ are each not hydrogen.

In one or more embodiments, the organometallic compound represented by Formula 1 may be one of Compounds Ir1 to Ir295:

Ir1

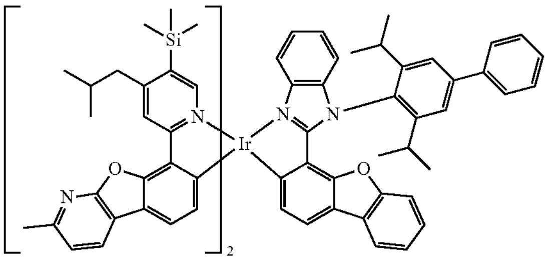

Ir2

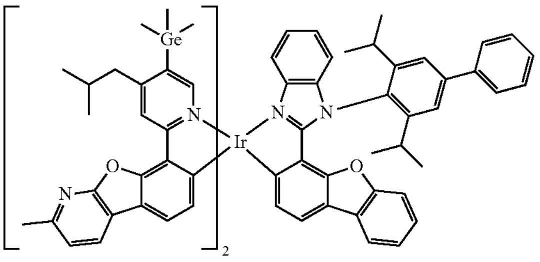

-continued
Ir3
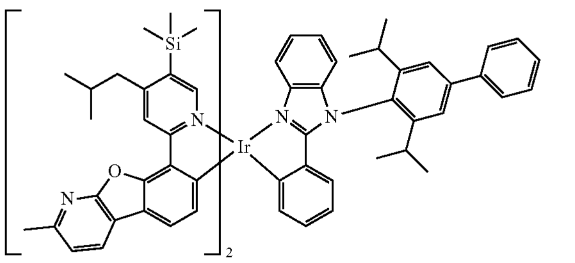
Ir4
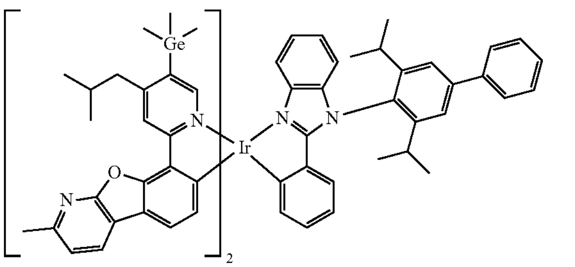
Ir5
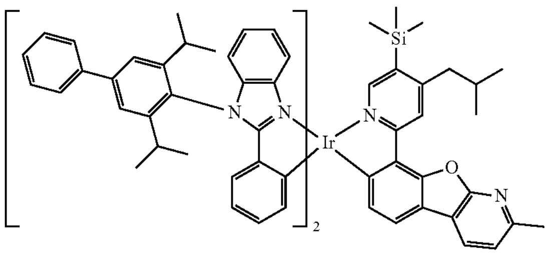
Ir6
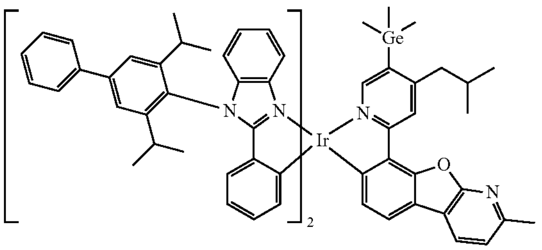
Ir7
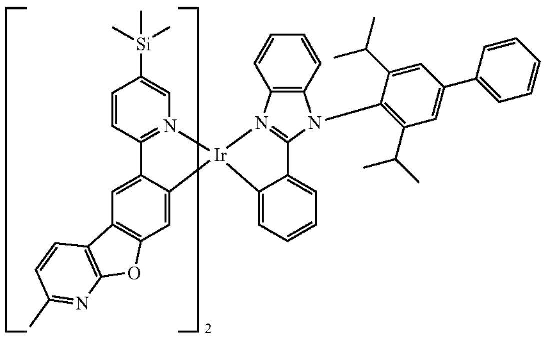
Ir8
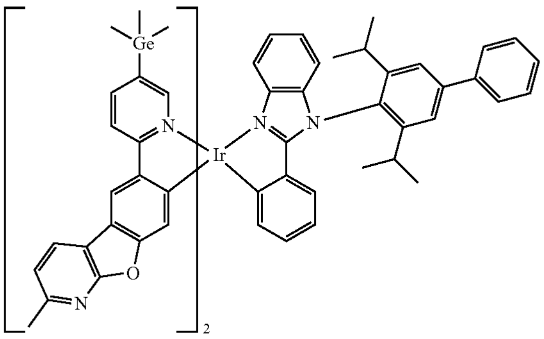
Ir9
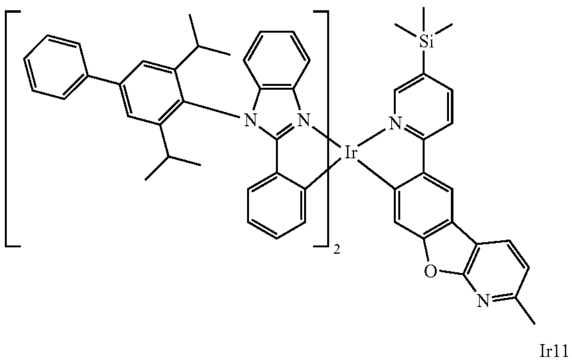
Ir10
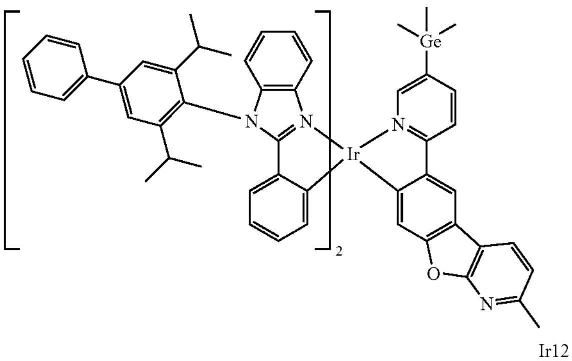
Ir11
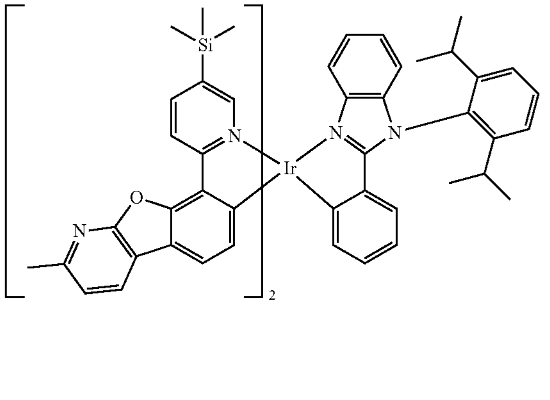
Ir12
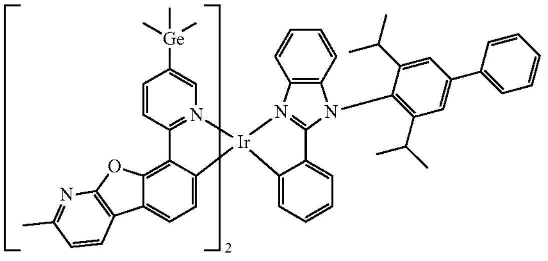

-continued
Ir13
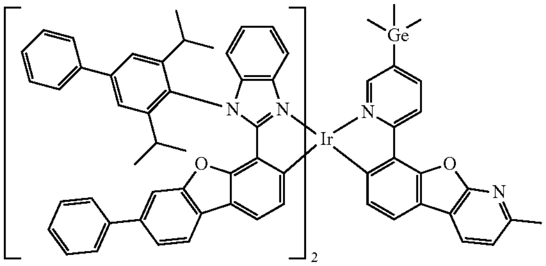
Ir14
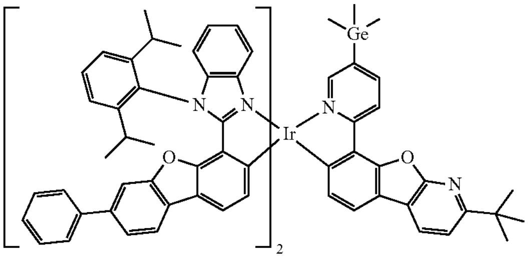
Ir15
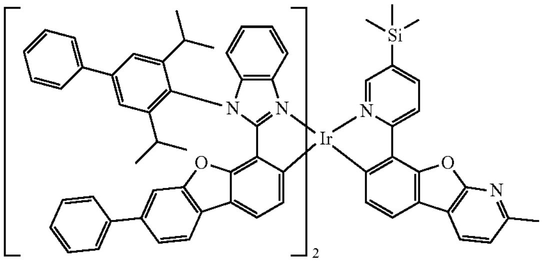
Ir16
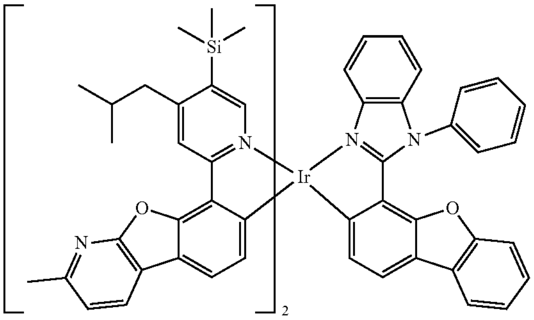
Ir17
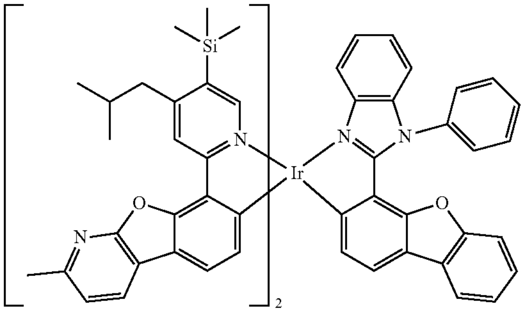
Ir18
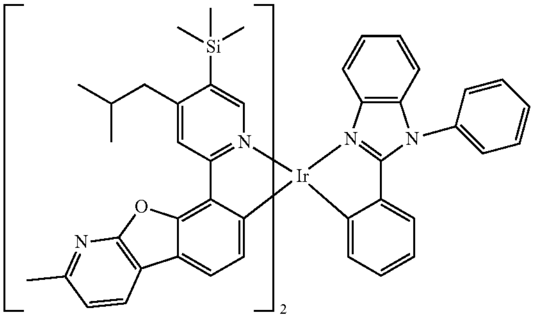
Ir19
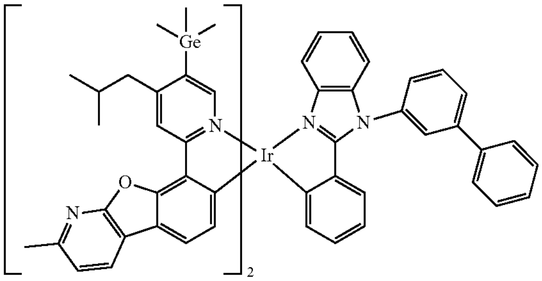
Ir20
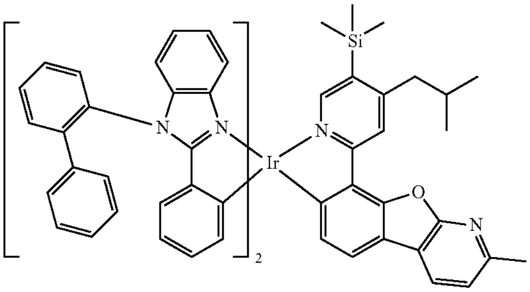

-continued
Ir21
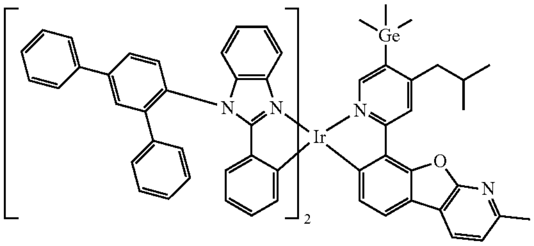
Ir22
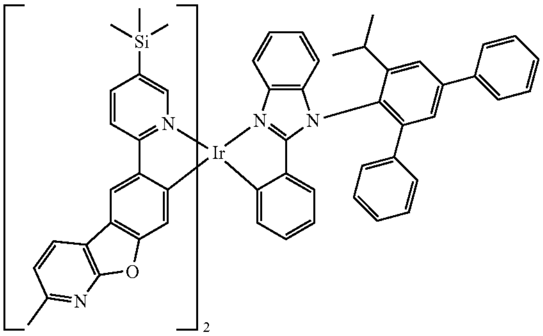
Ir23
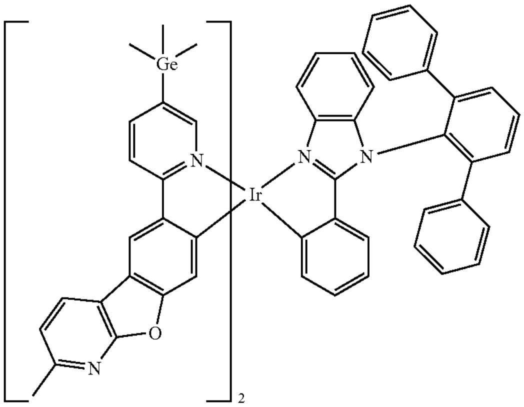
Ir24
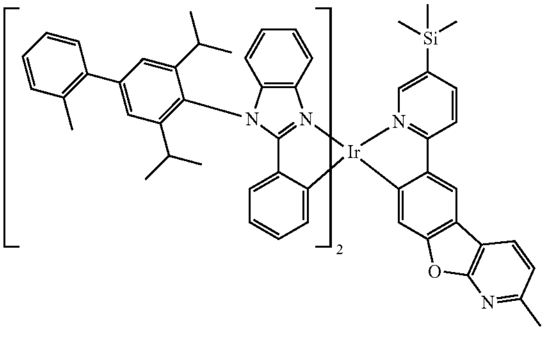
Ir25
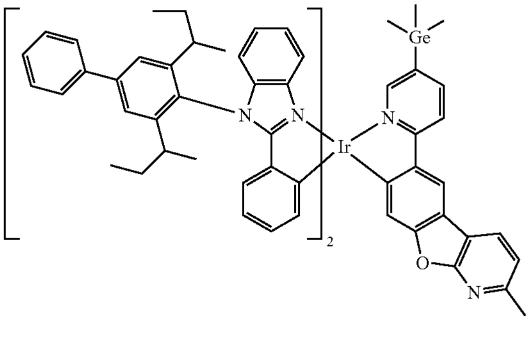
Ir26
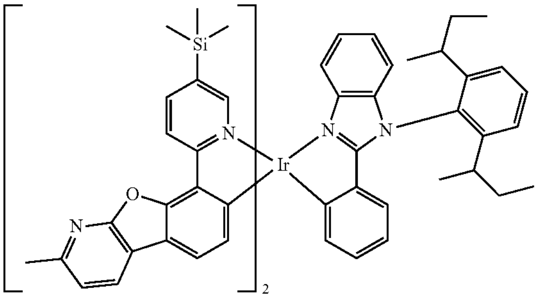
Ir27
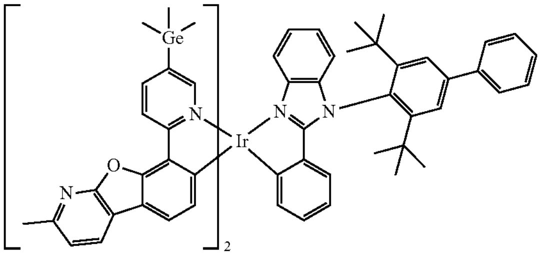
Ir28
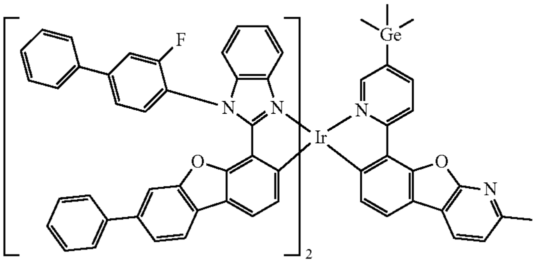

-continued
Ir29
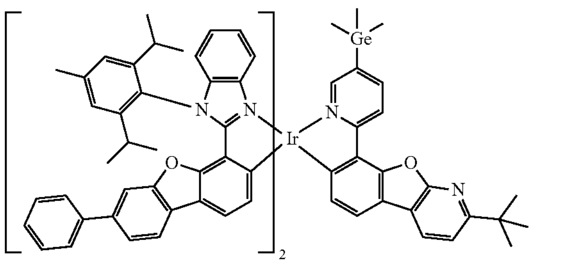
Ir30
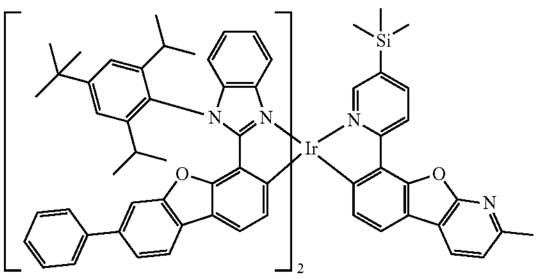
Ir31
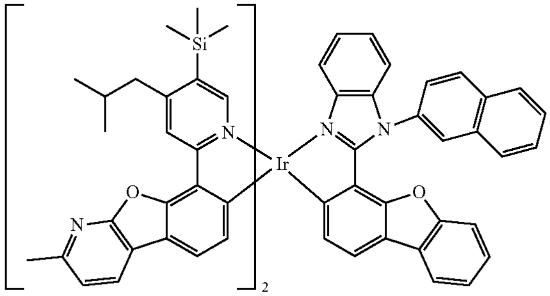
Ir32
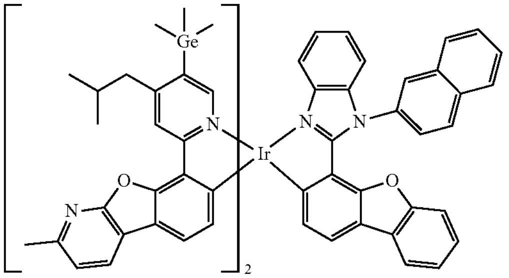
Ir33
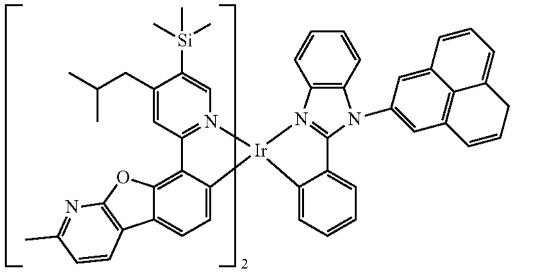
Ir34
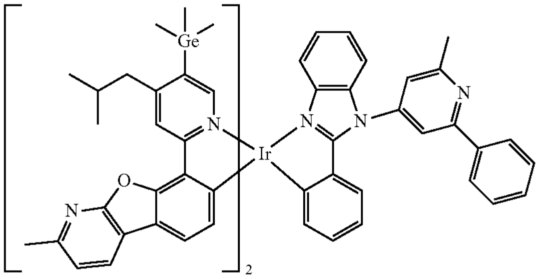
Ir35
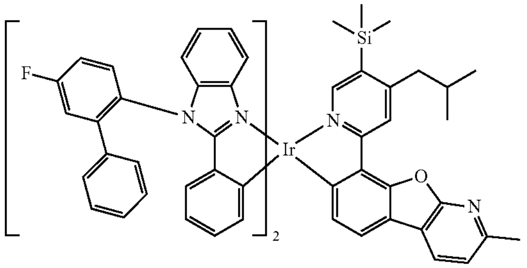
Ir36
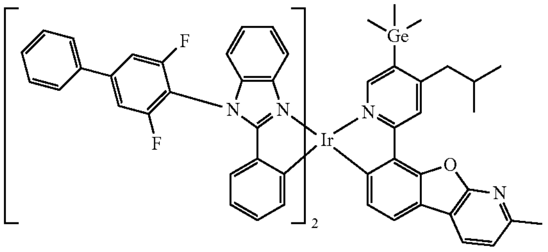
Ir37
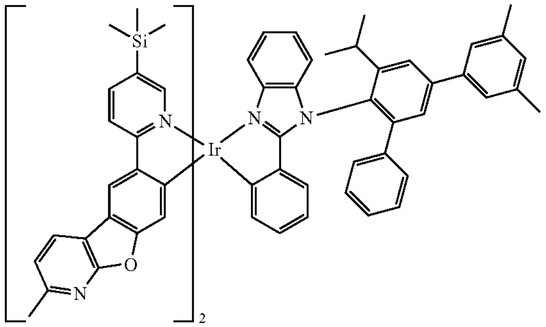
Ir38
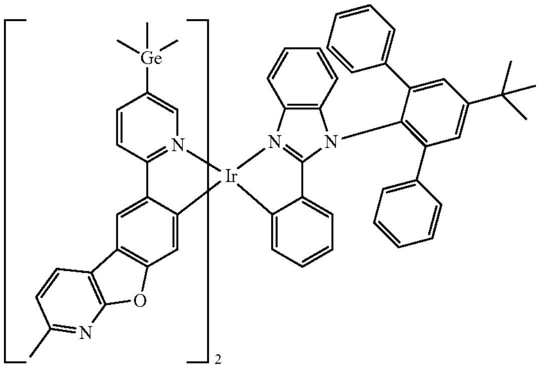

-continued
Ir39
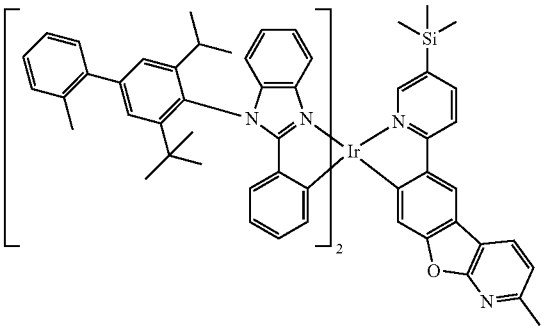
Ir40
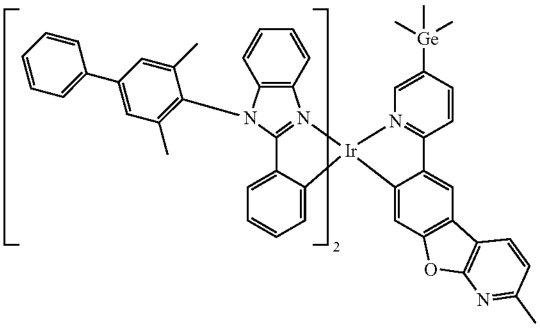
Ir41
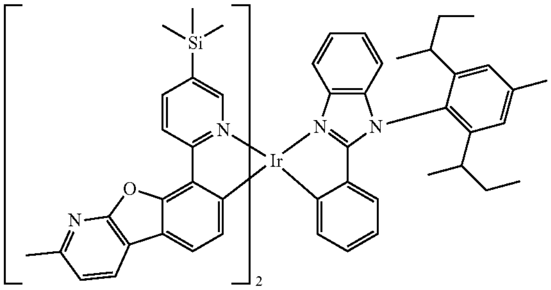
Ir42
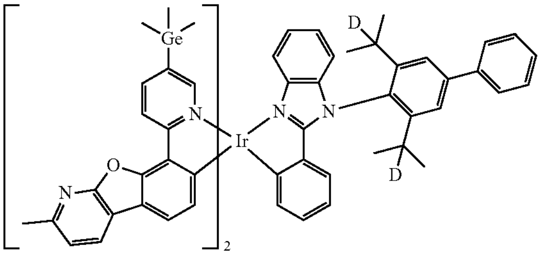
Ir43
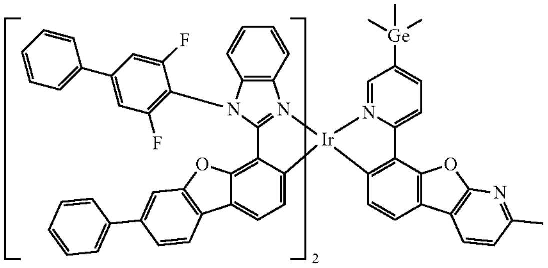
Ir44
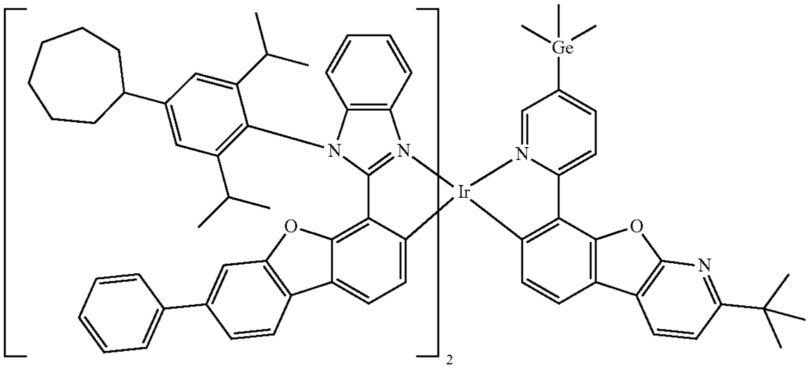

-continued
Ir45
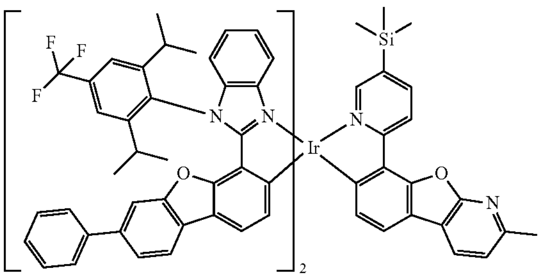
Ir46
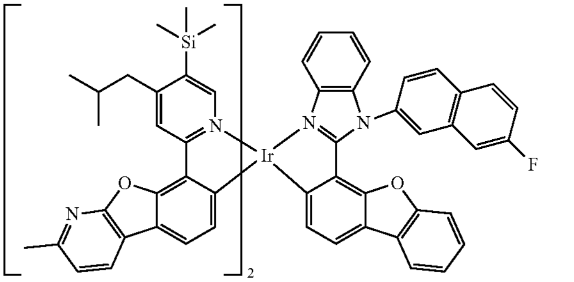
Ir47
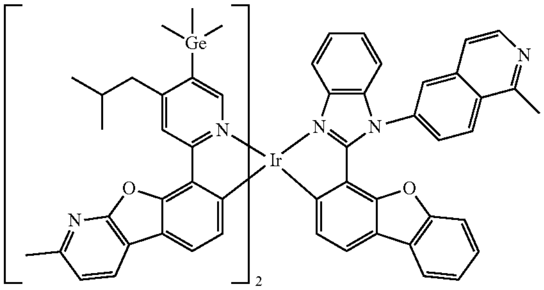
Ir48
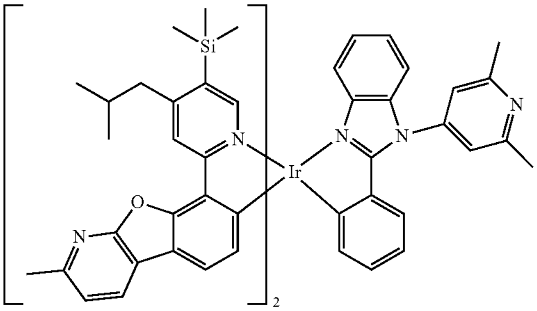
Ir49
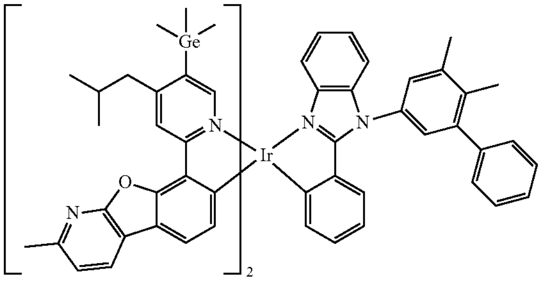
Ir50
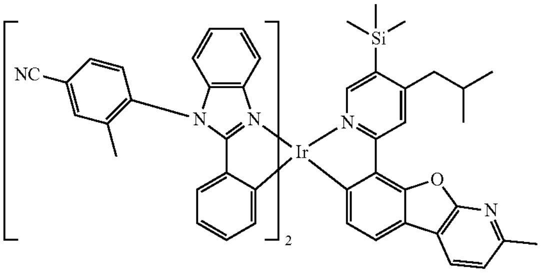
Ir51
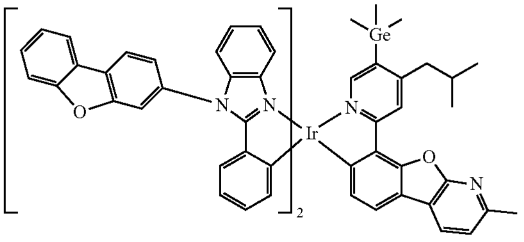
Ir52
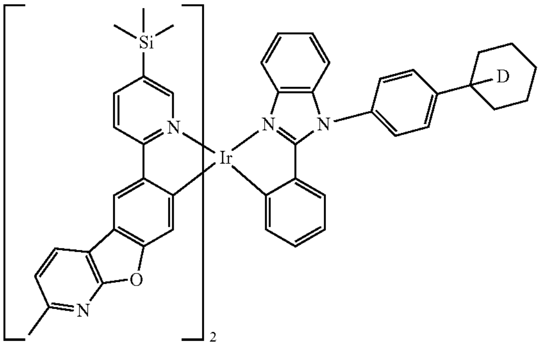

-continued
Ir53
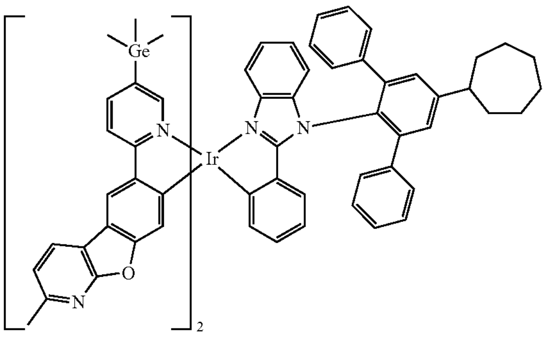
Ir54
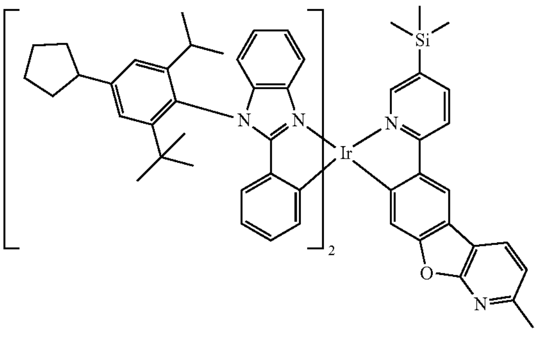
Ir55
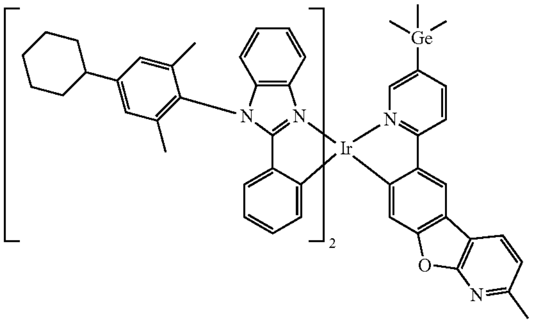
Ir56
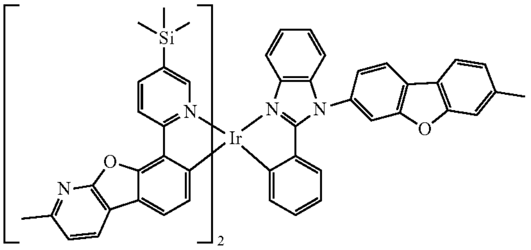
Ir57
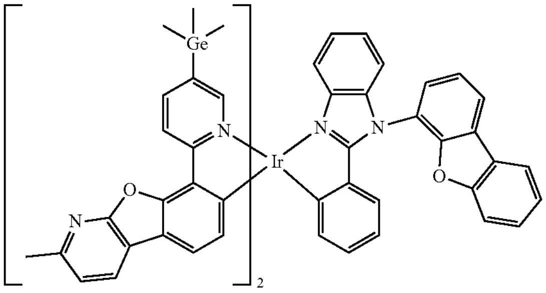
Ir58
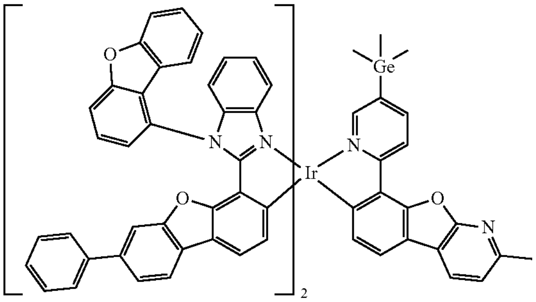
Ir59
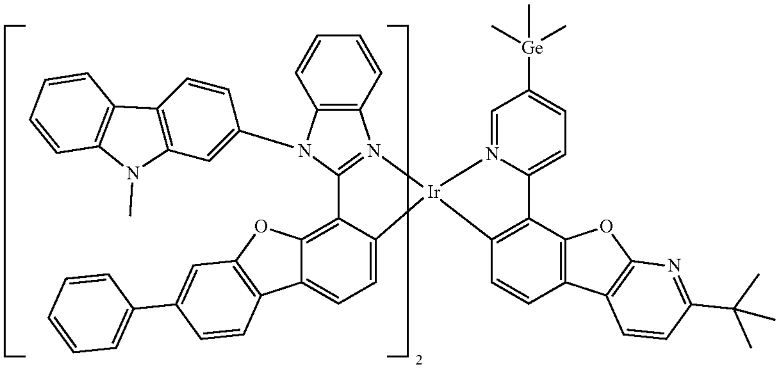

-continued
Ir60
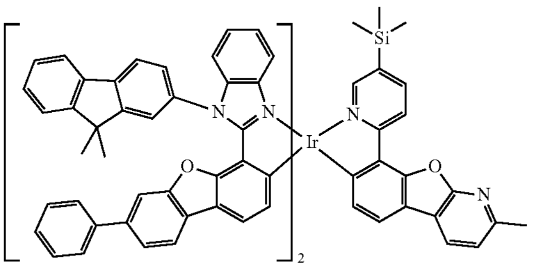
Ir61
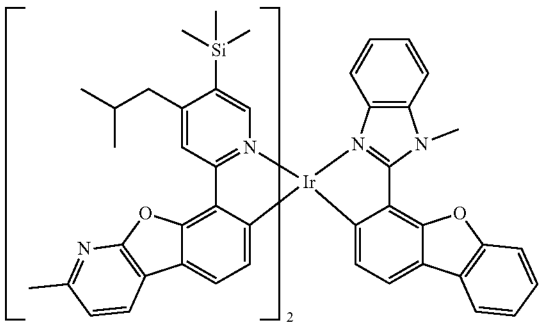
Ir62
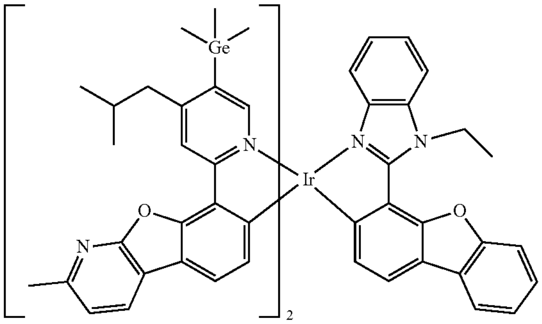
Ir63
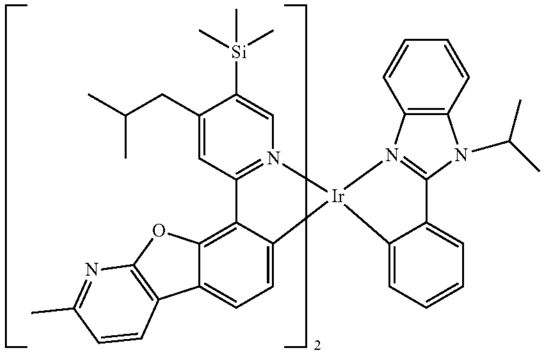
Ir64
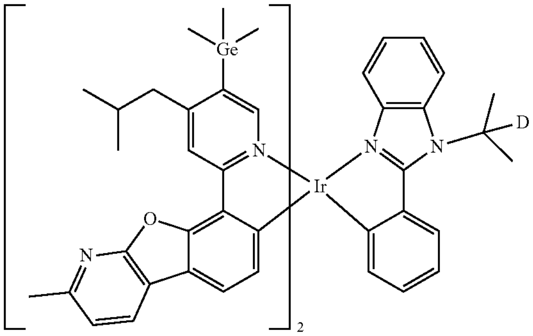
Ir65
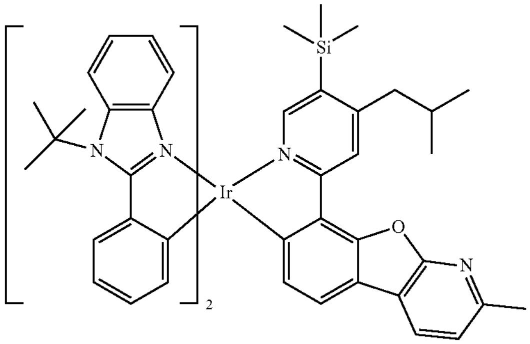
Ir66
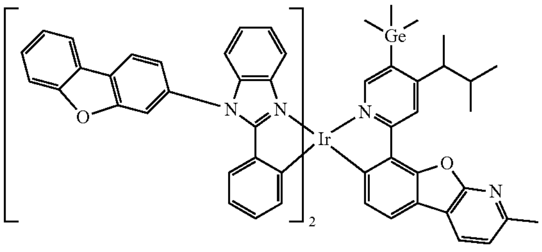
Ir67
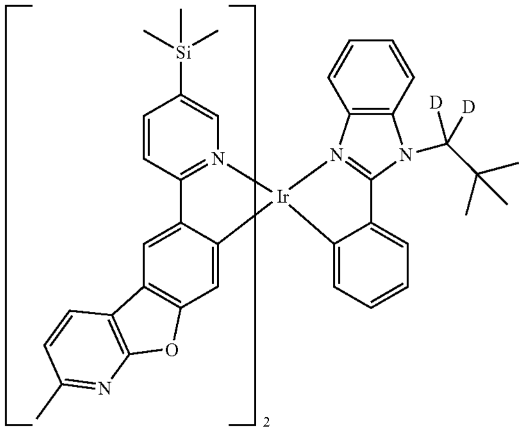

-continued
Ir68
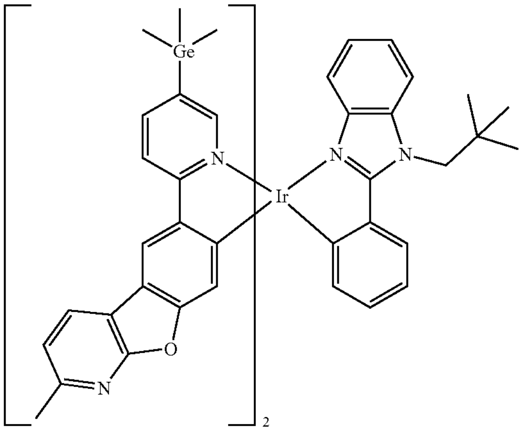
Ir69
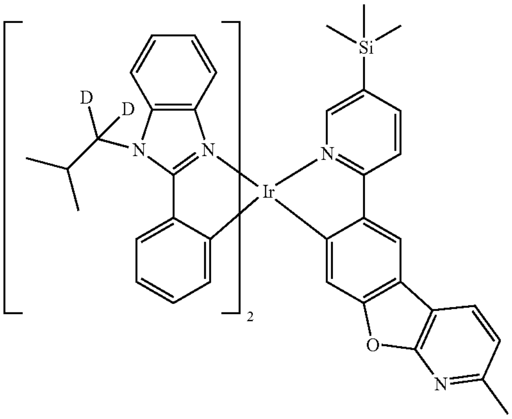
Ir70
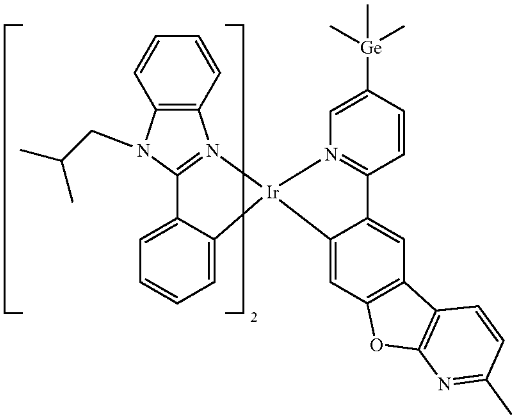
Ir71
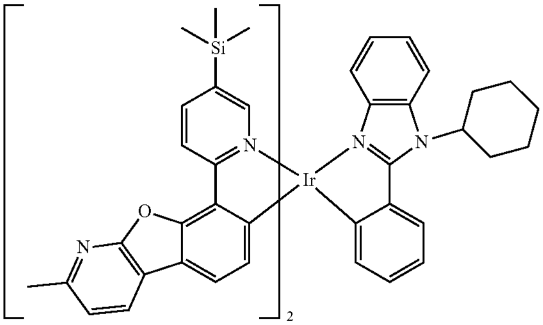
Ir72
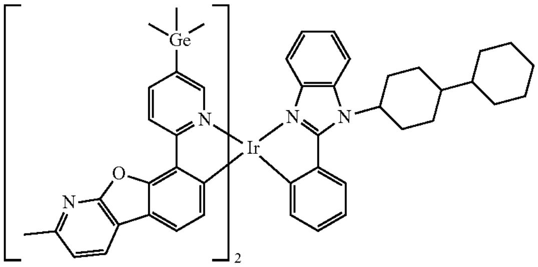
Ir73
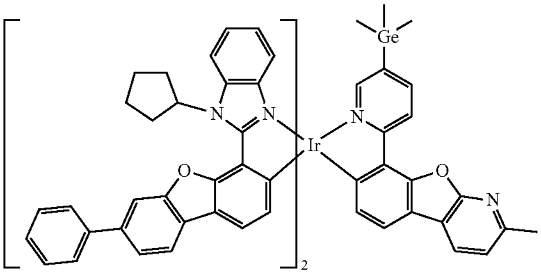
Ir74
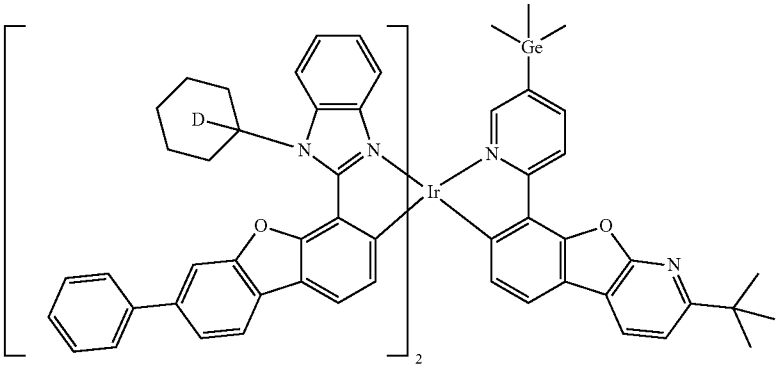

-continued
Ir75
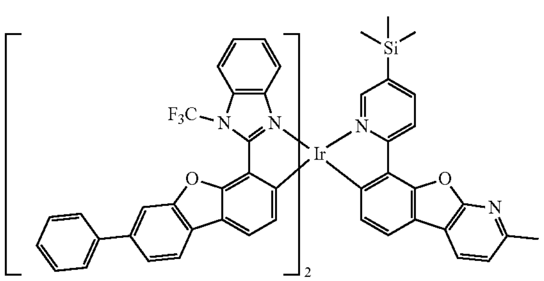
Ir76
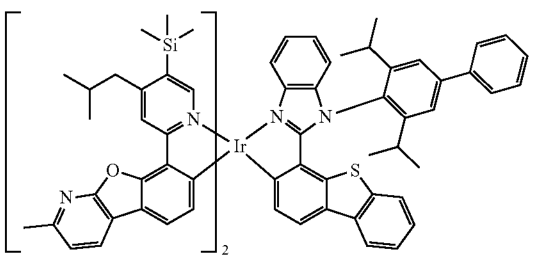
Ir77
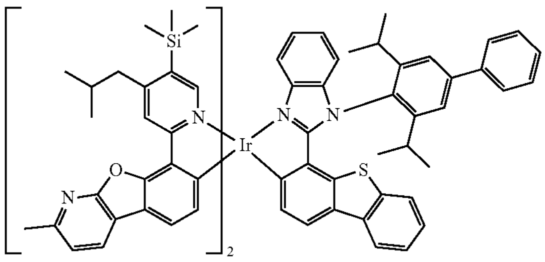
Ir78
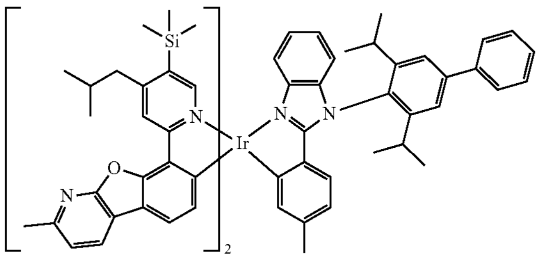
Ir79
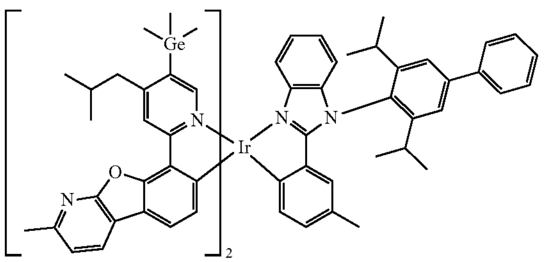
Ir80
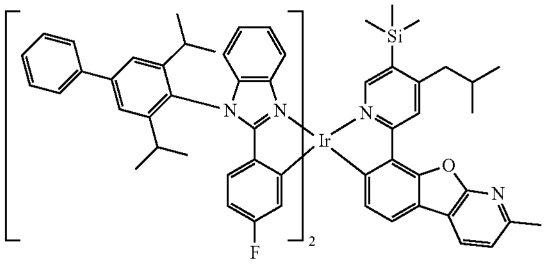
Ir81
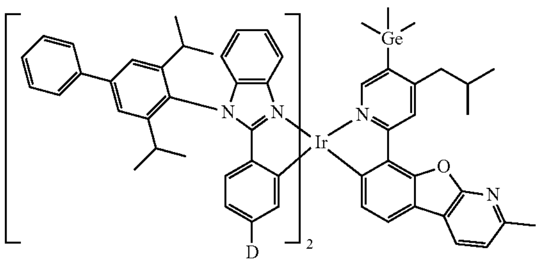
Ir82
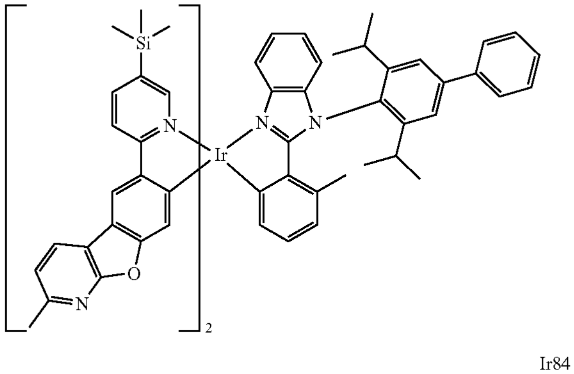
Ir83
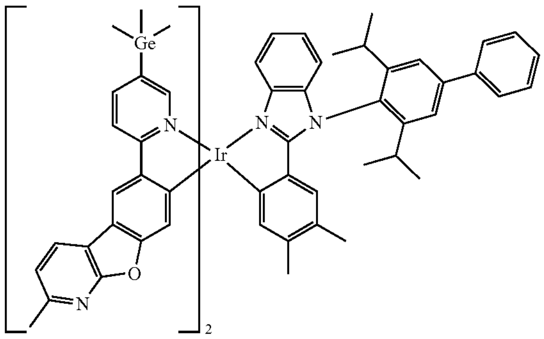
Ir84
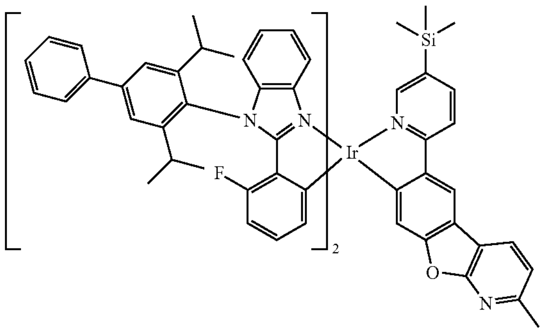

-continued
Ir85
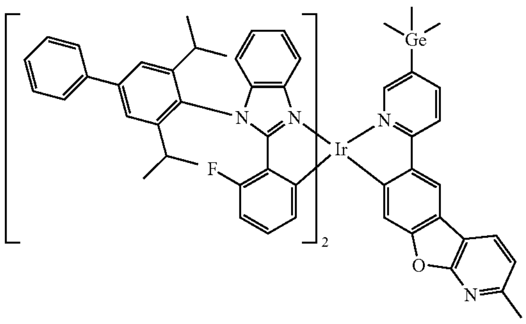
Ir86
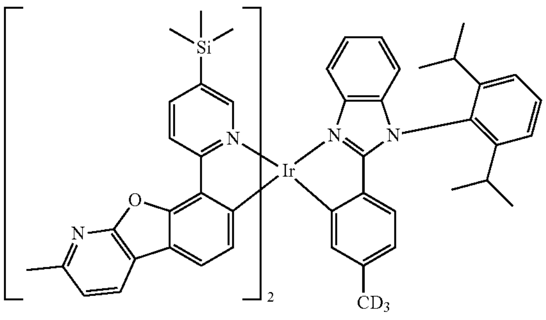
Ir87
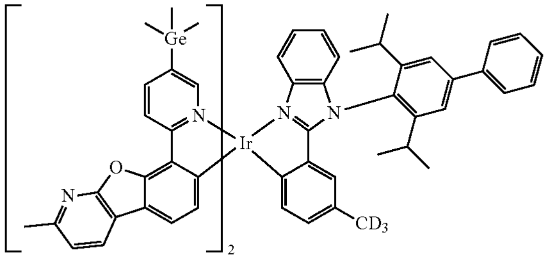
Ir88
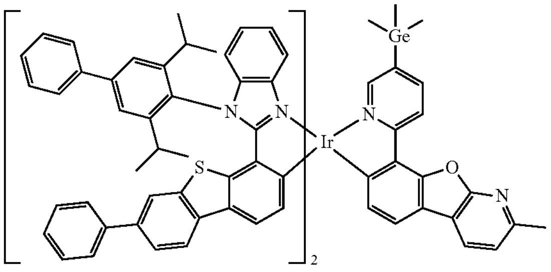
Ir89
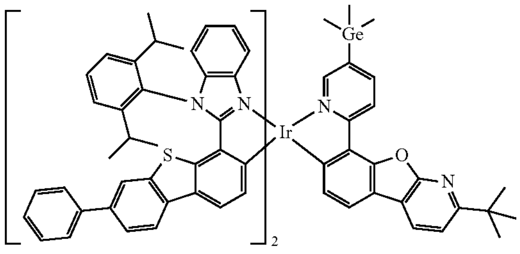
Ir90
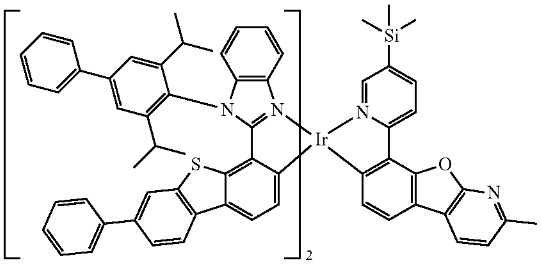
Ir91
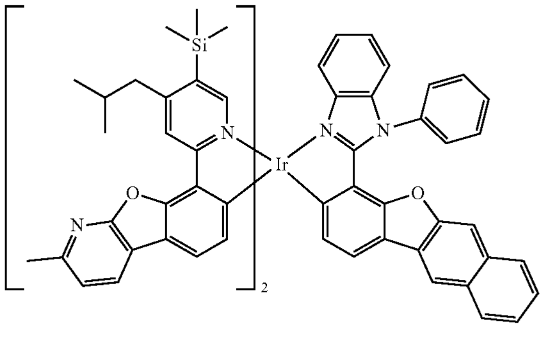
Ir92
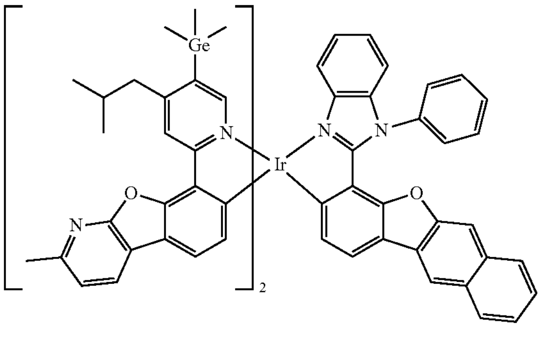

-continued
Ir93
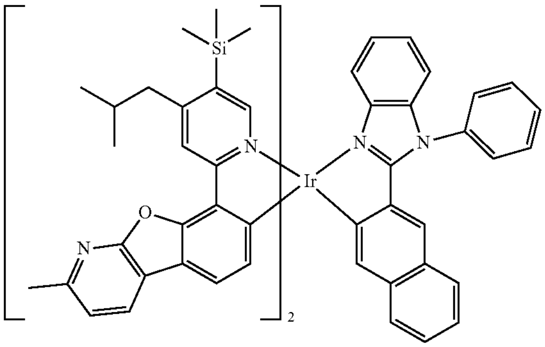
Ir94
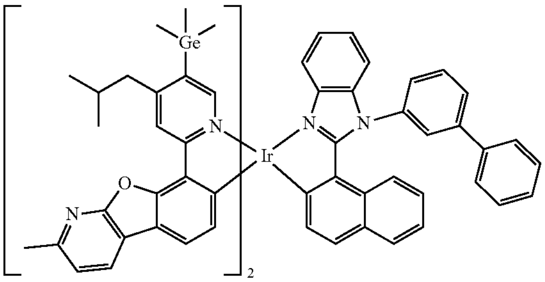
Ir95
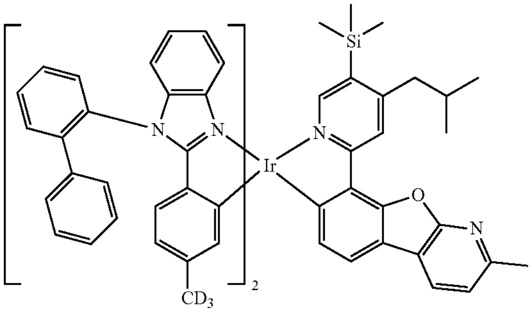
Ir95
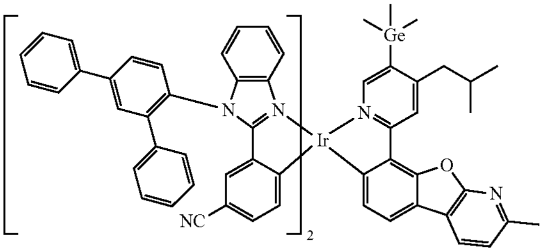
Ir97
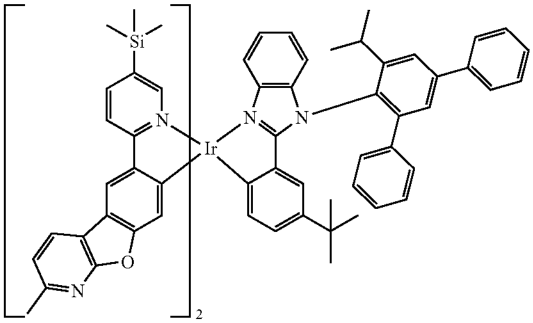
Ir98
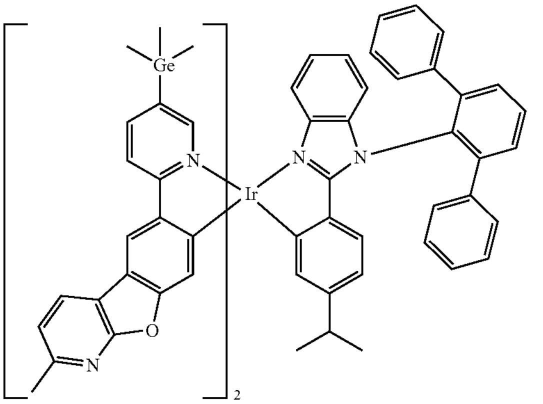
Ir99
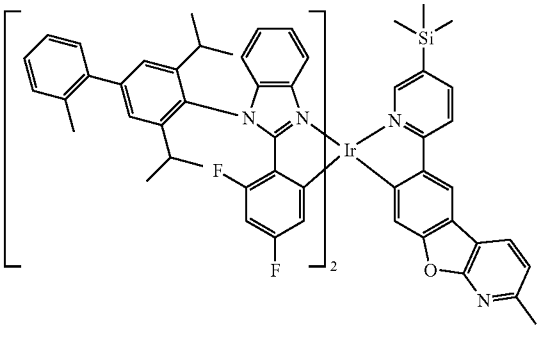

-continued
Ir100
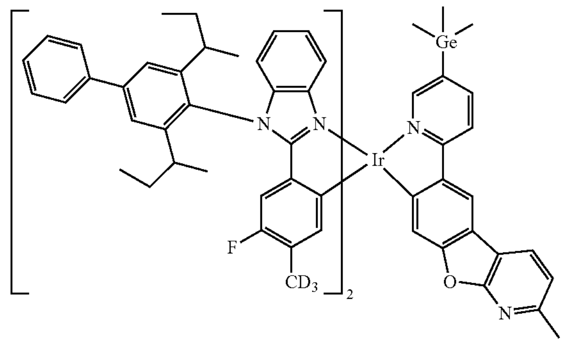
Ir101
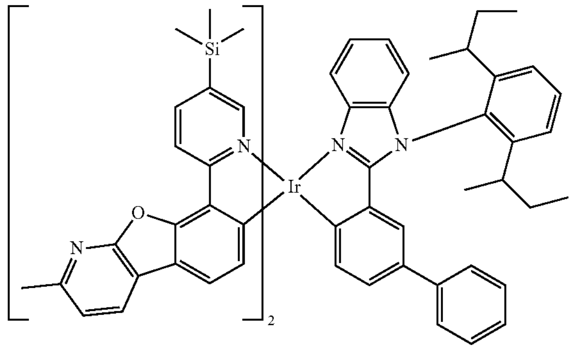
Ir102
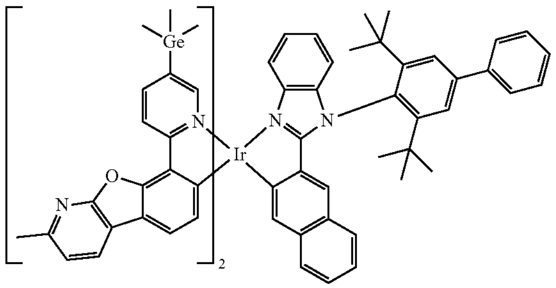
Ir103
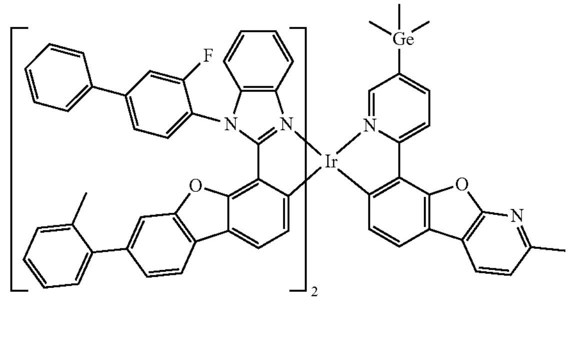
Ir104
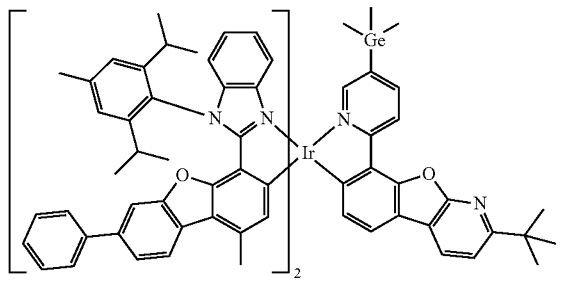
Ir105
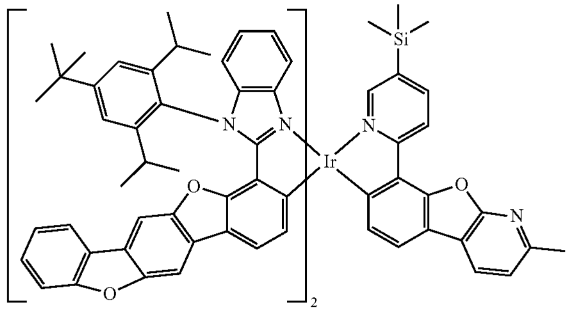
Ir106
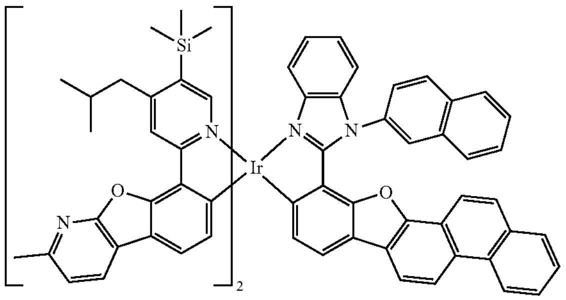
Ir107
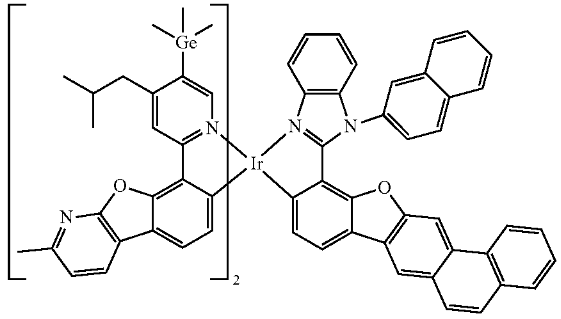

-continued
Ir108
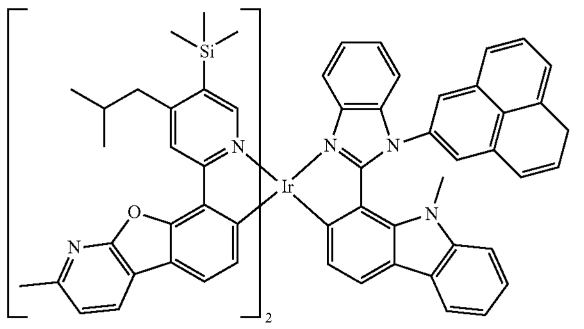
Ir109
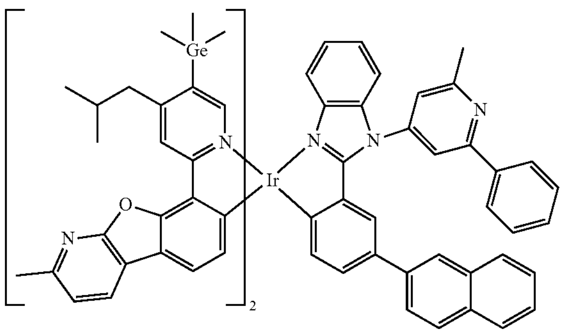
Ir110
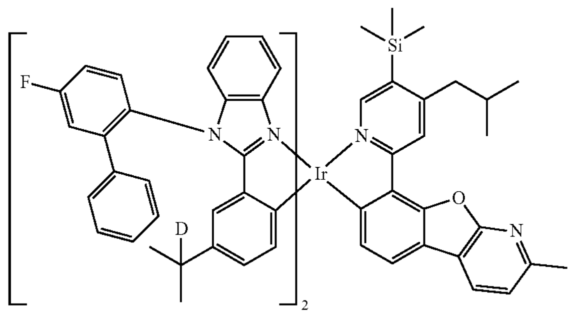
Ir111
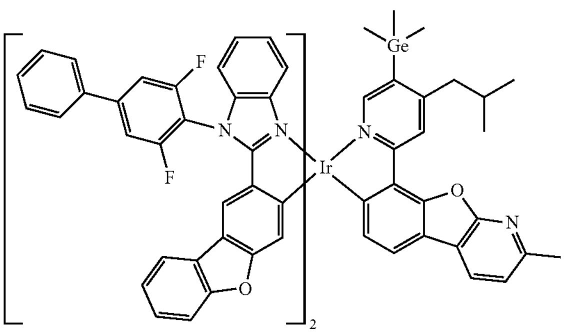
-continued
Ir112
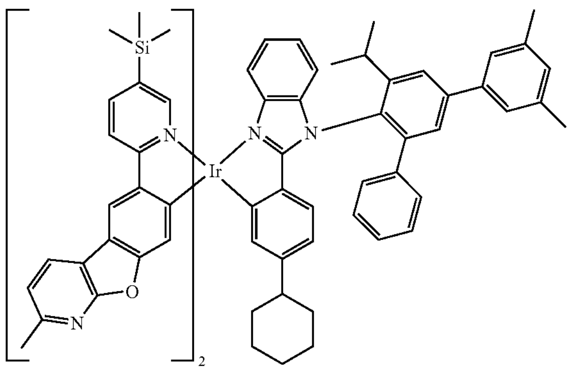
Ir113
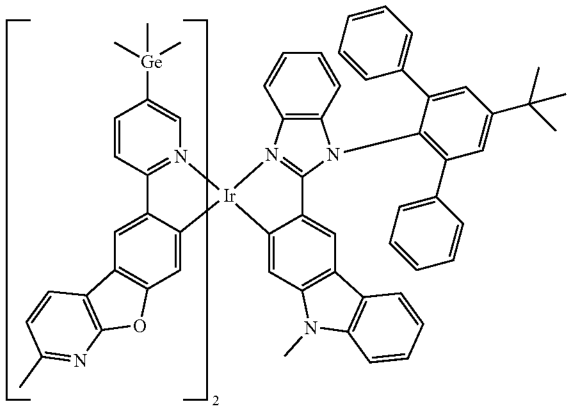
Ir114
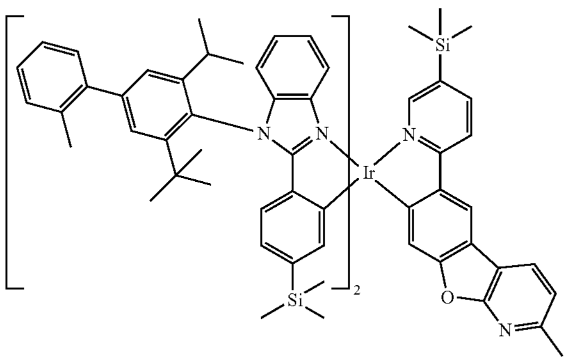
Ir115
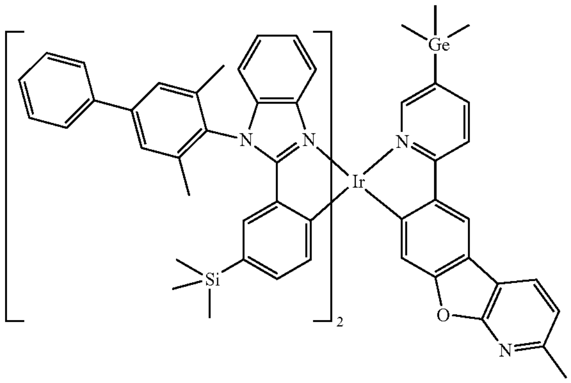

-continued
Ir116
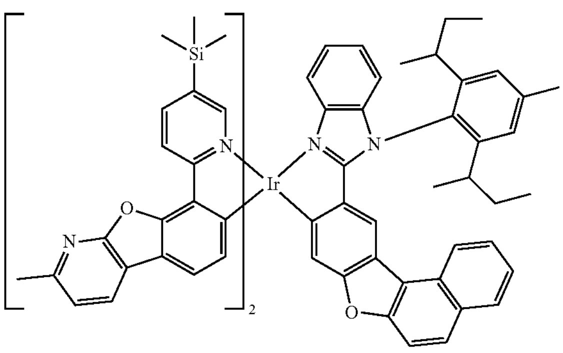
Ir117
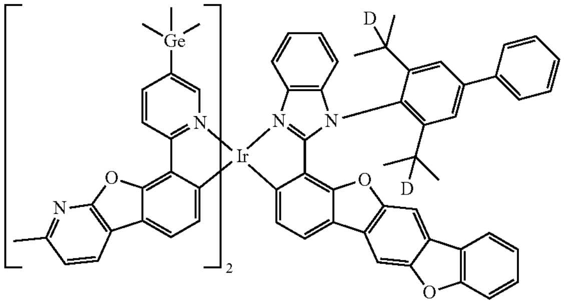
Ir118
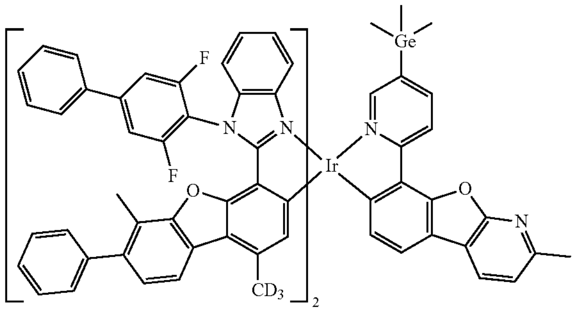
Ir119
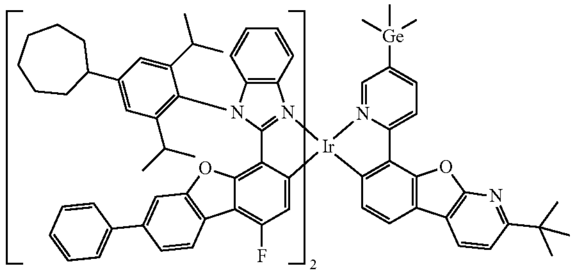
-continued
Ir120
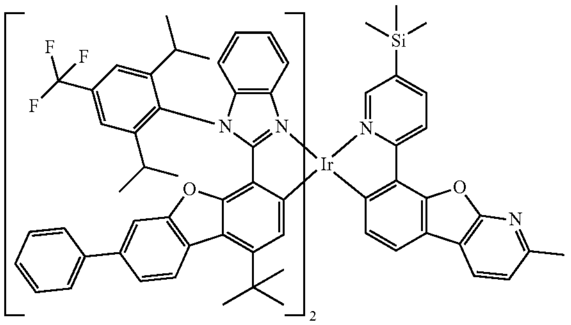
Ir121
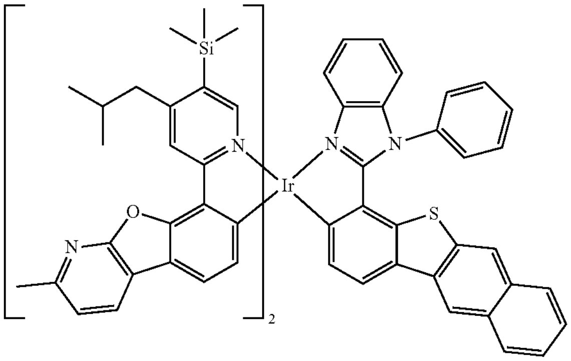
Ir122
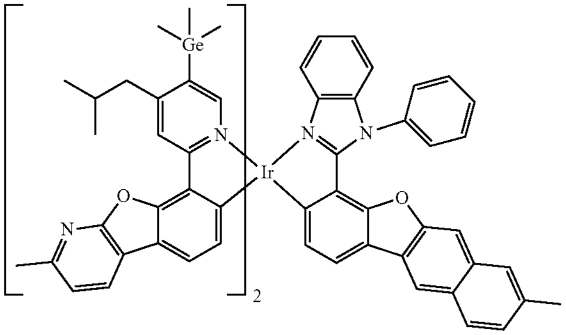
Ir123
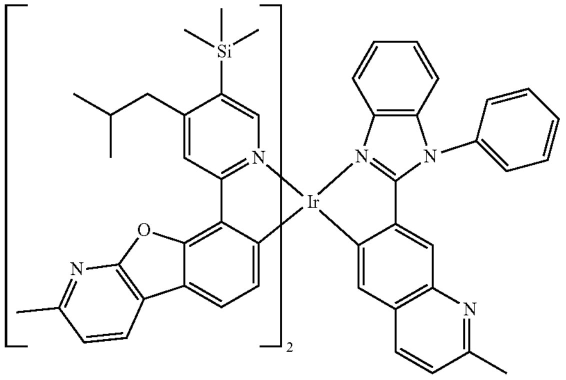

-continued
Ir124
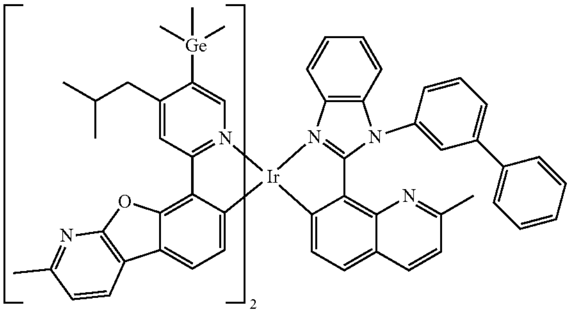
Ir125
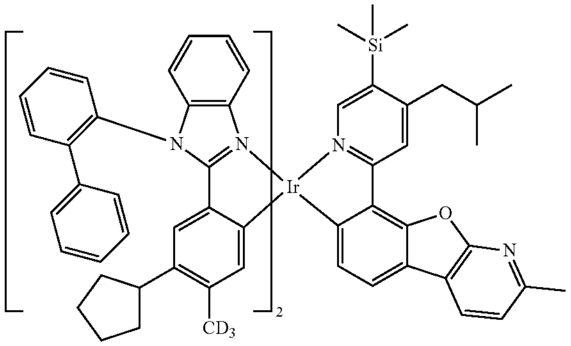
Ir126
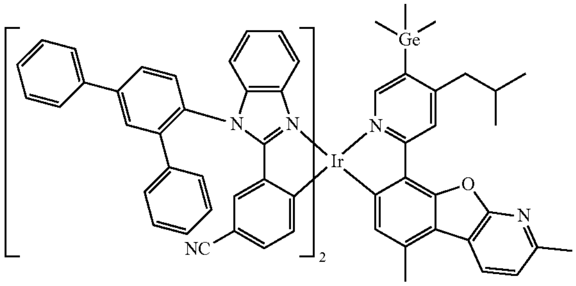
Ir127
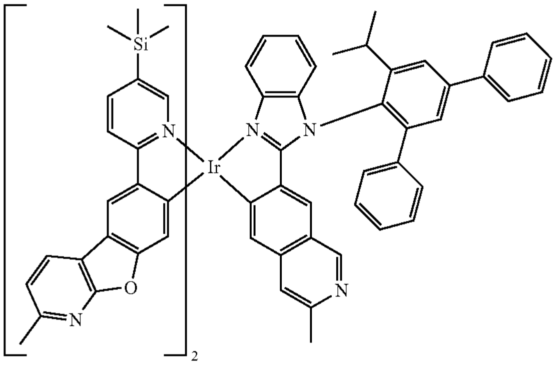
-continued
Ir128
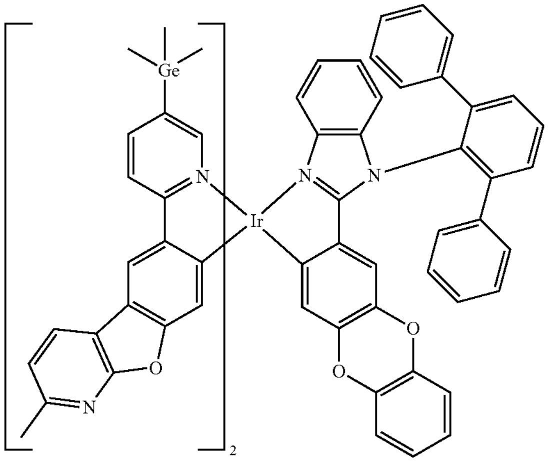
Ir129
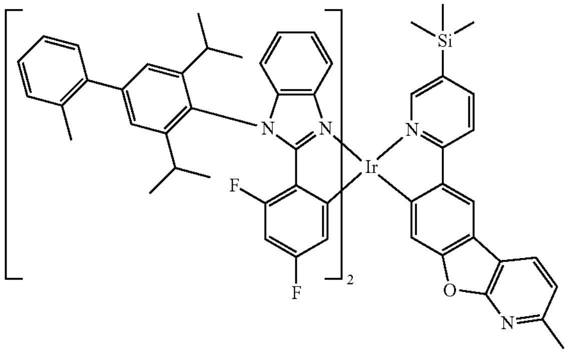
Ir130
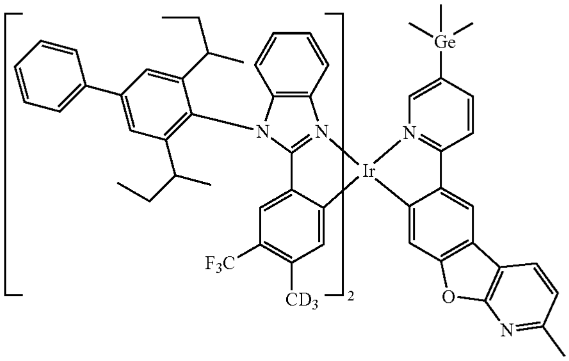
Ir131
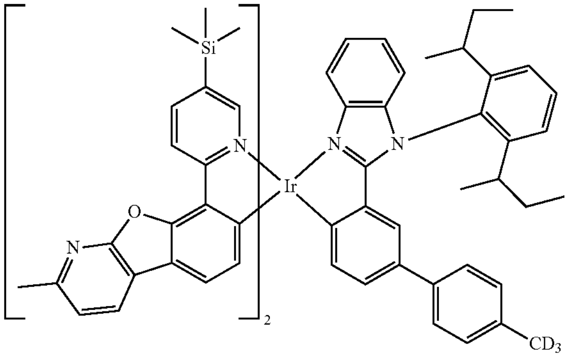

-continued
Ir132
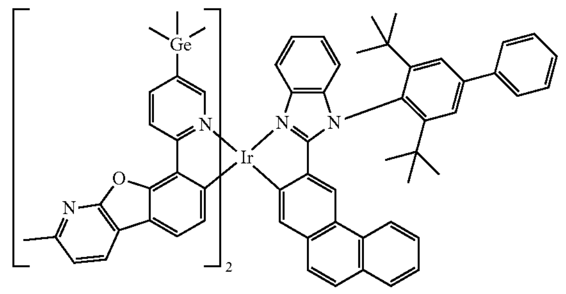
Ir133
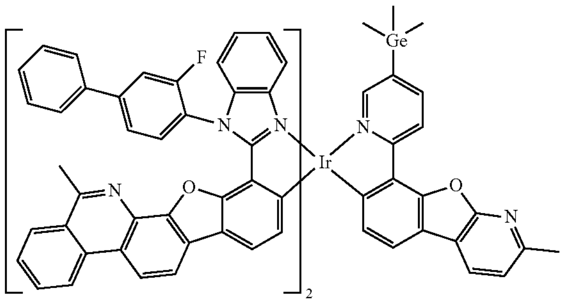
Ir134
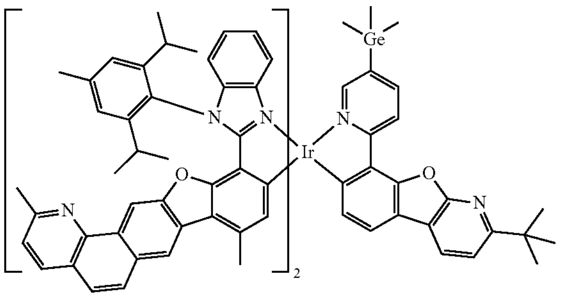
Ir135
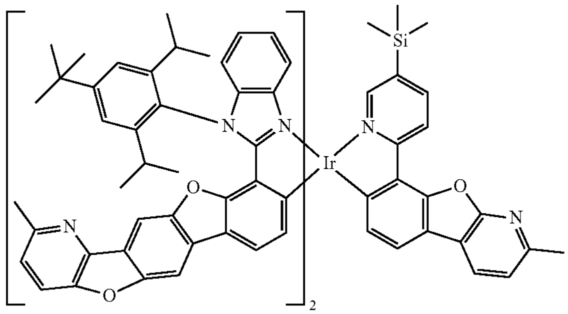
Ir136
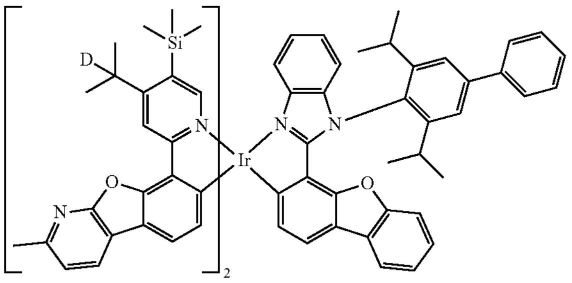
-continued
Ir137
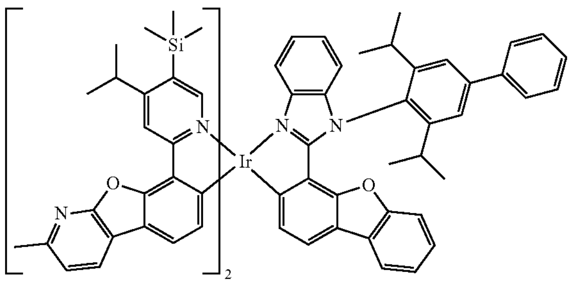
Ir138
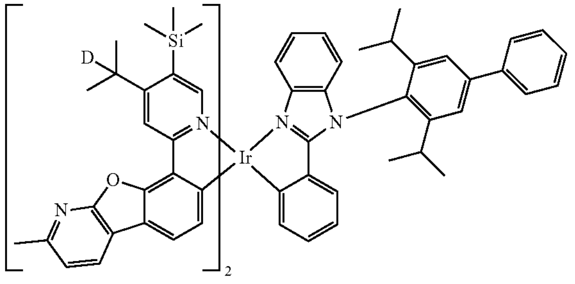
Ir139
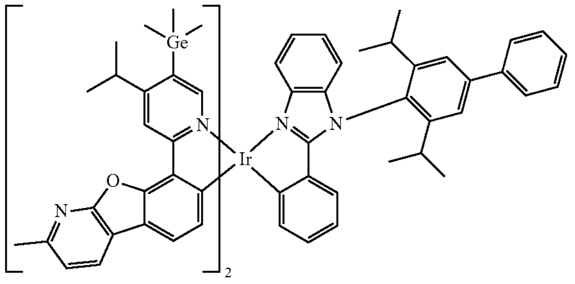
Ir140
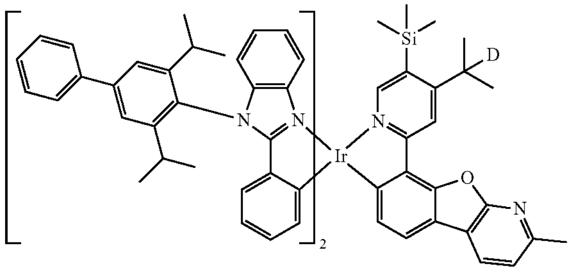
Ir141
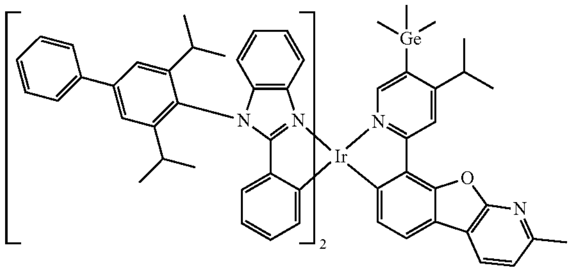

-continued
Ir142
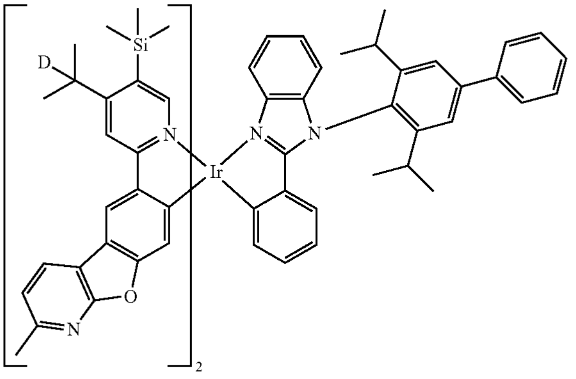
Ir143
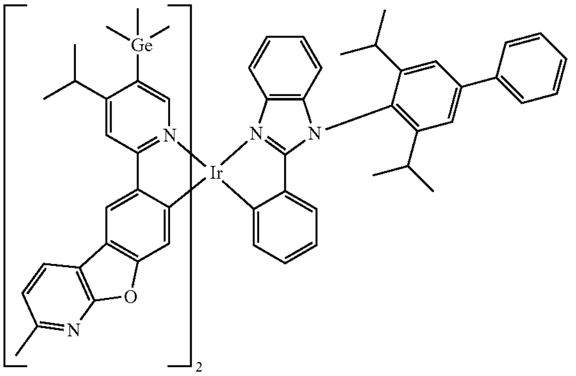
Ir144
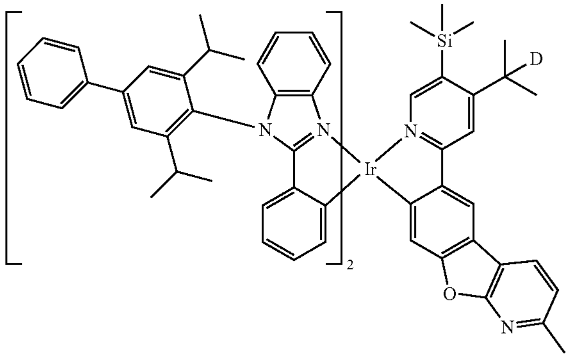
Ir145
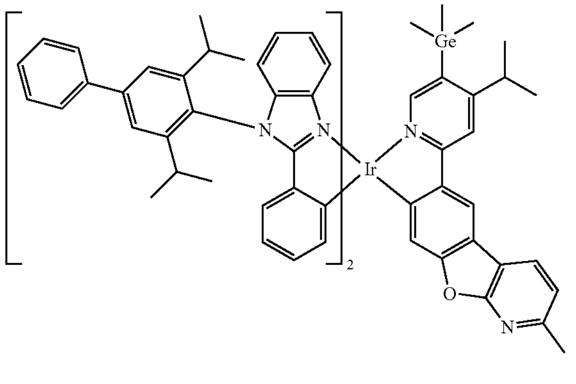
-continued
Ir146
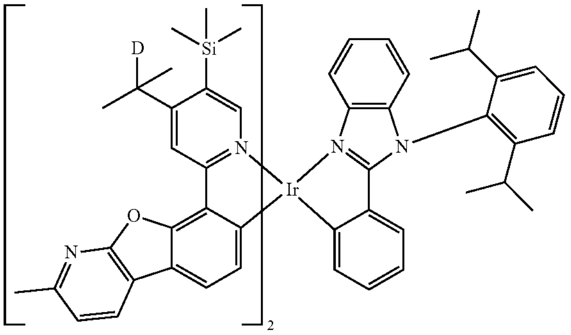
Ir147
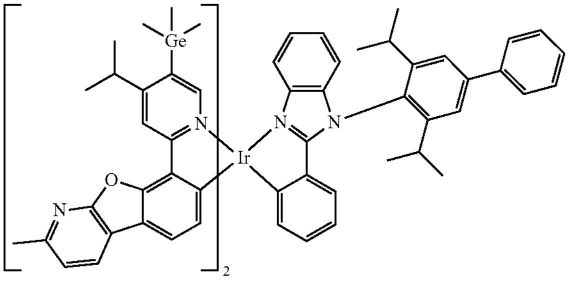
Ir148
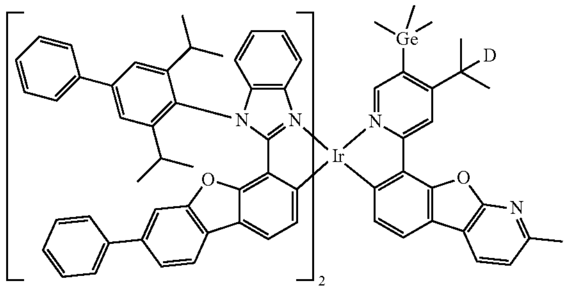
Ir149
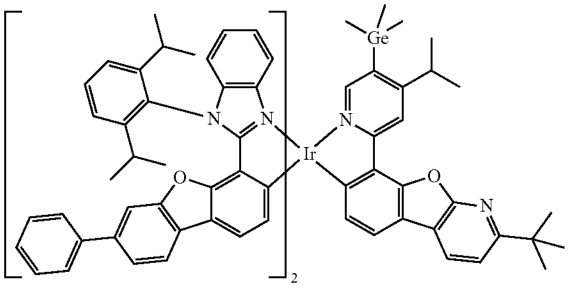
Ir150
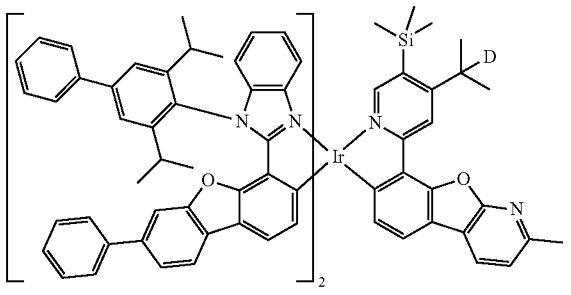

-continued
Ir151
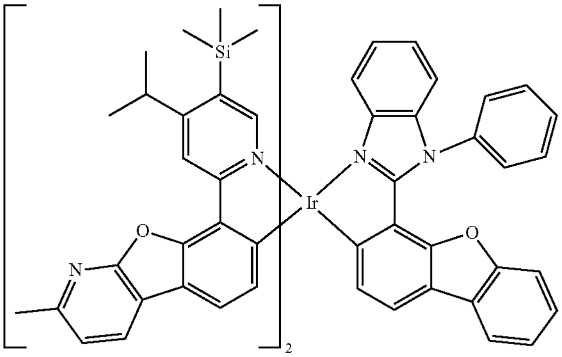
Ir152
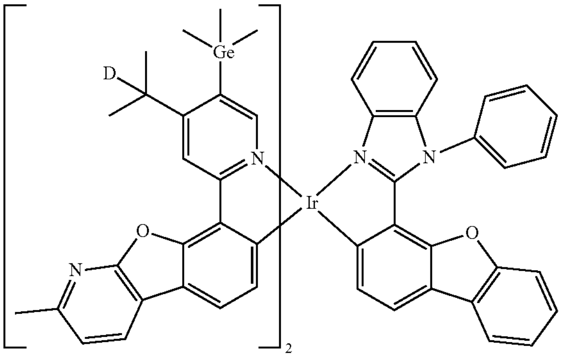
Ir153
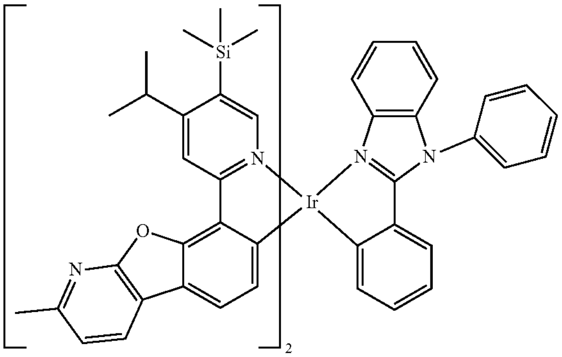
Ir154
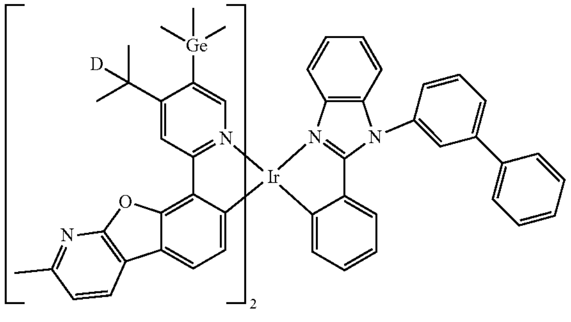
-continued
Ir155
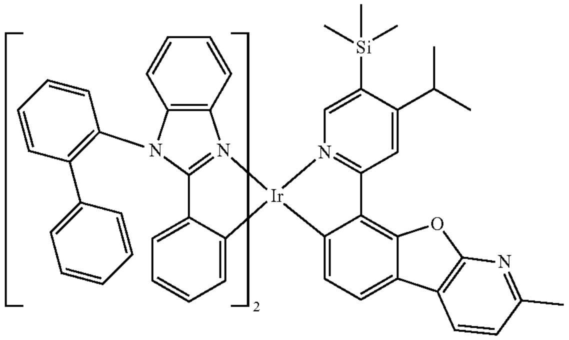
Ir156
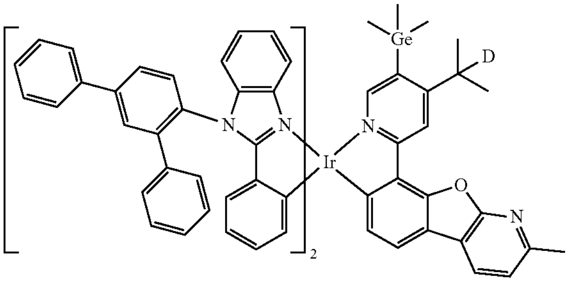
Ir157
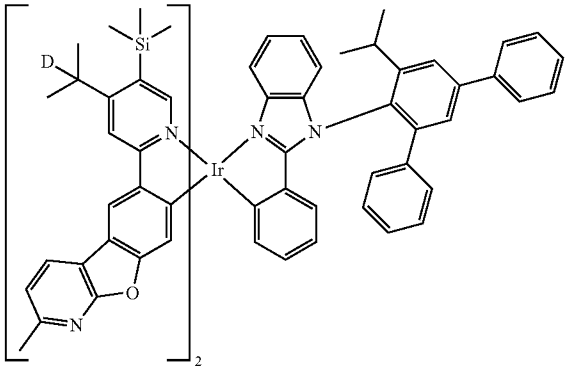
Ir158
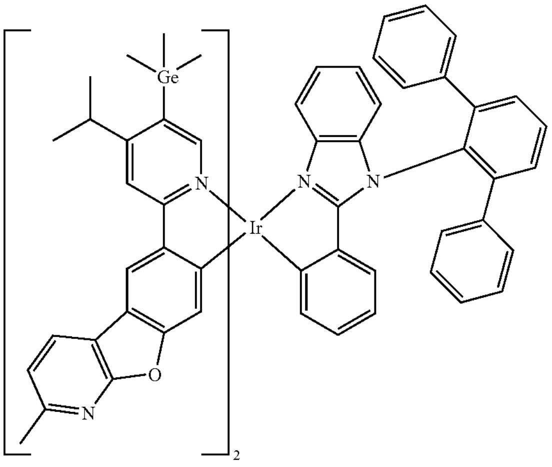

Ir159
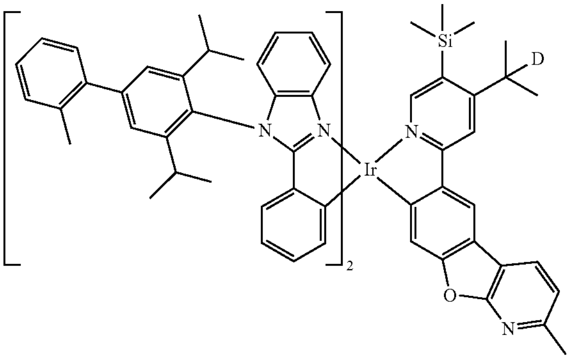
Ir1 60
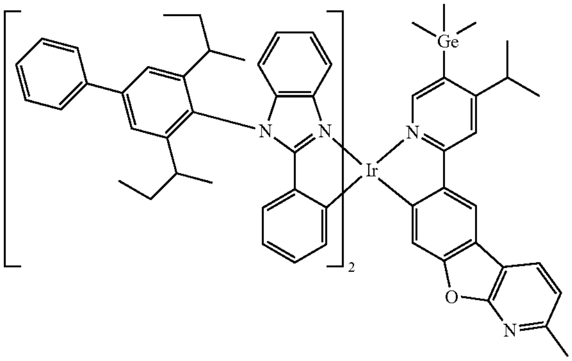
Ir161
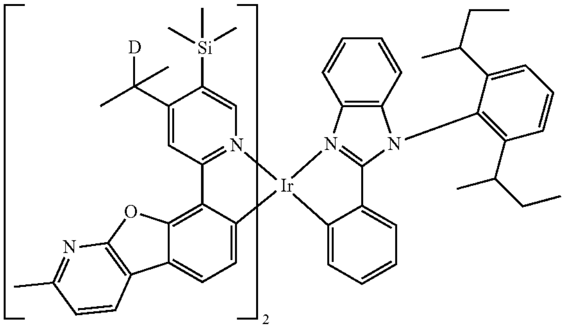
Ir162
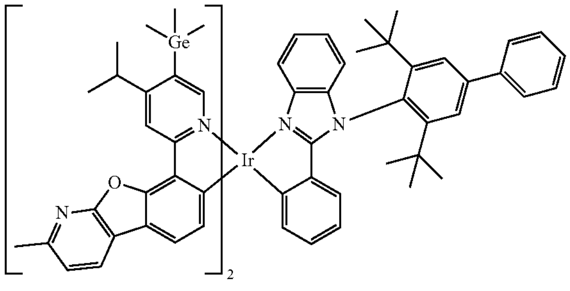
Ir163
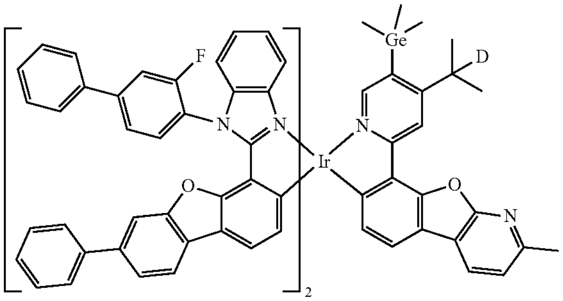
Ir164
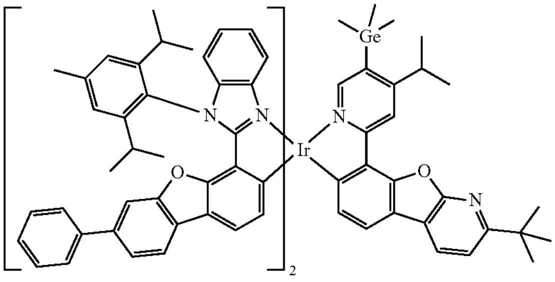
Ir165
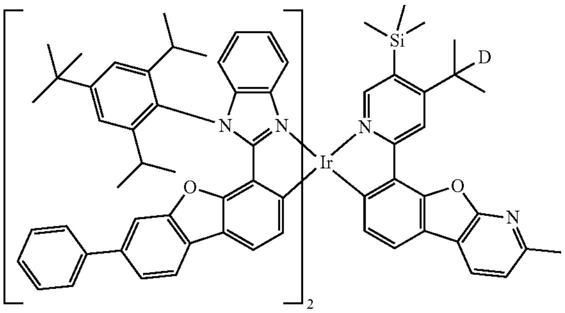
Ir166
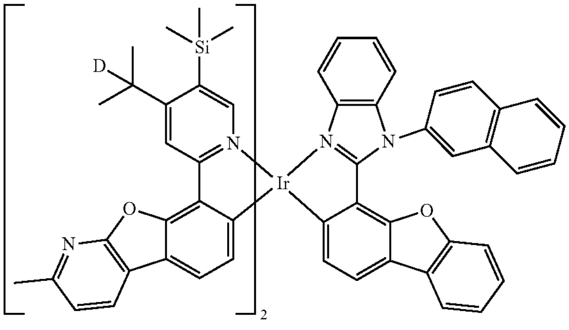

Ir167
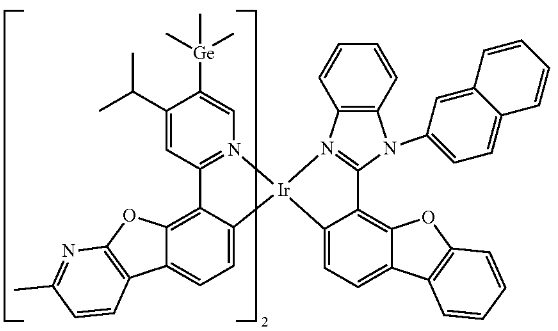
Ir168
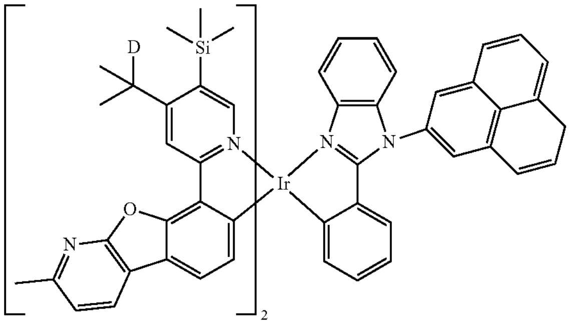
Ir169
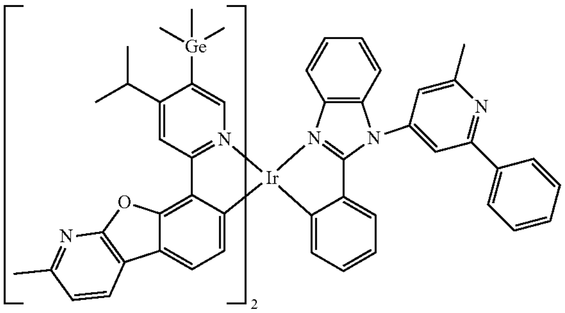
Ir170
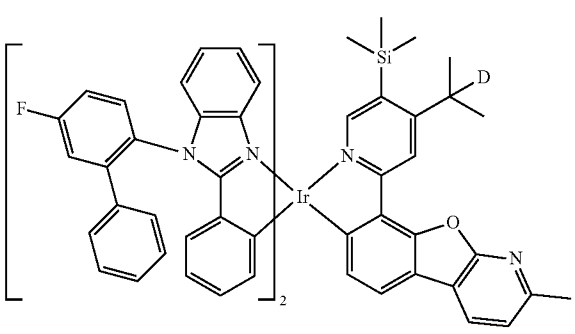
Ir171
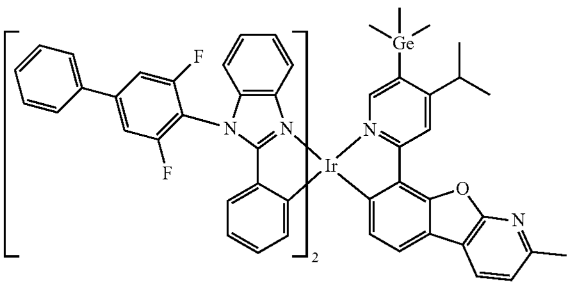
Ir172
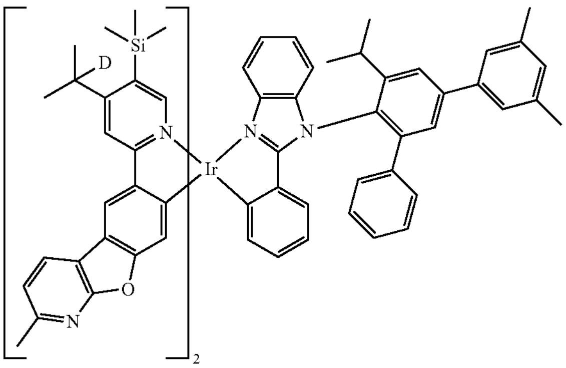
Ir173
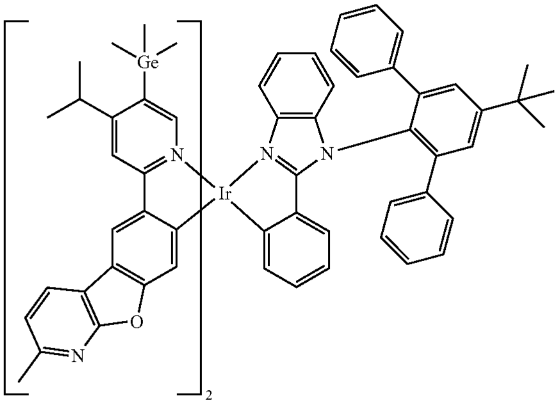
Ir174
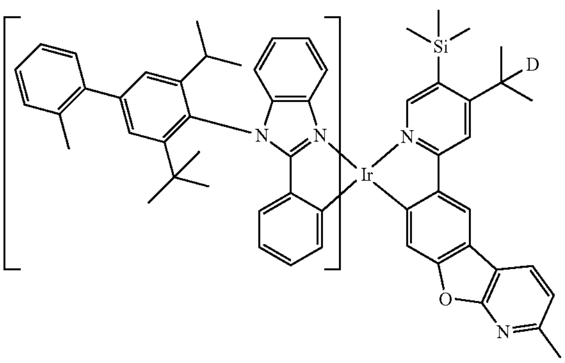

-continued
Ir175
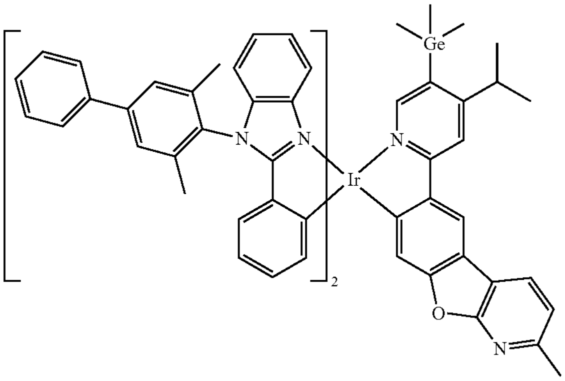
Ir176
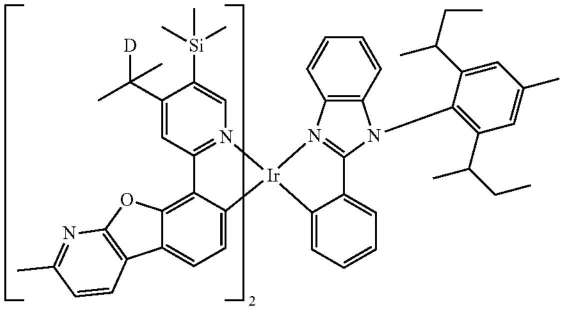
Ir177
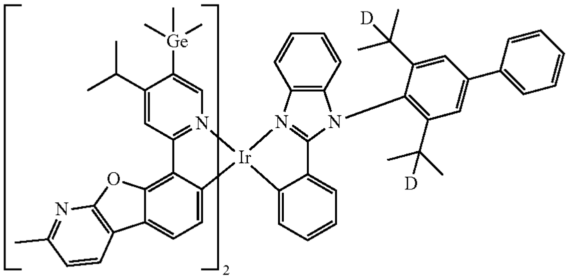
Ir178
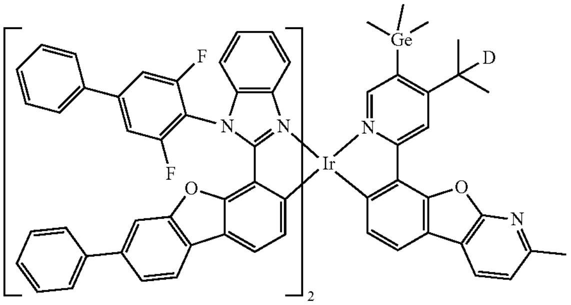
-continued
Ir179
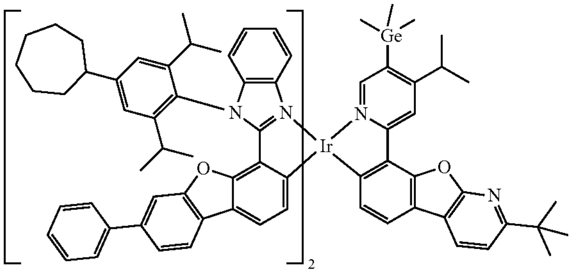
Ir180
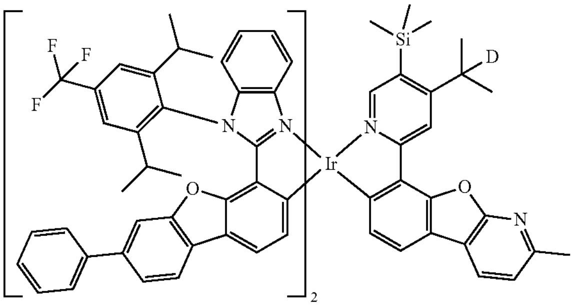
Ir181
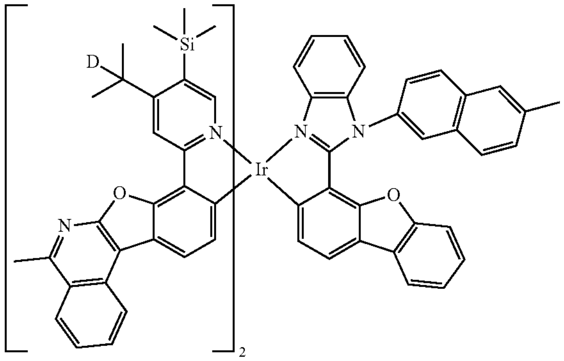
Ir182
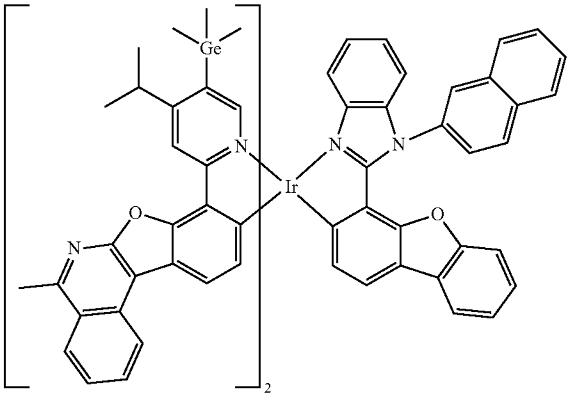

-continued
Ir183
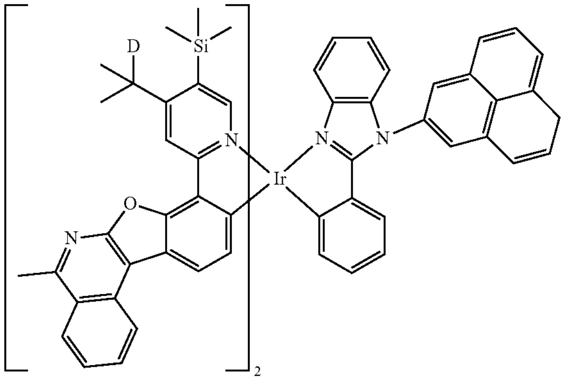
Ir184
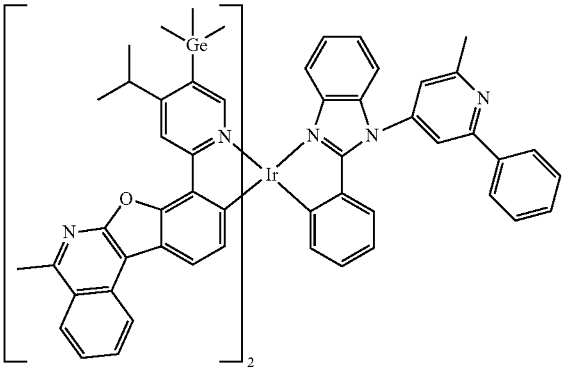
Ir185
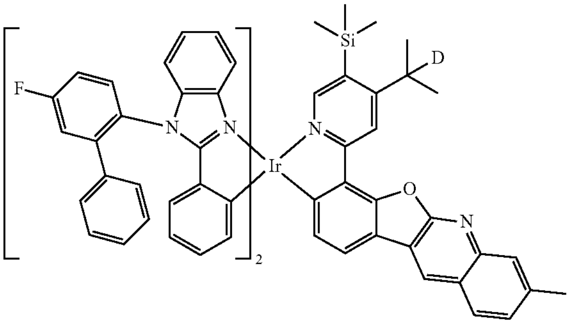
-continued
Ir186
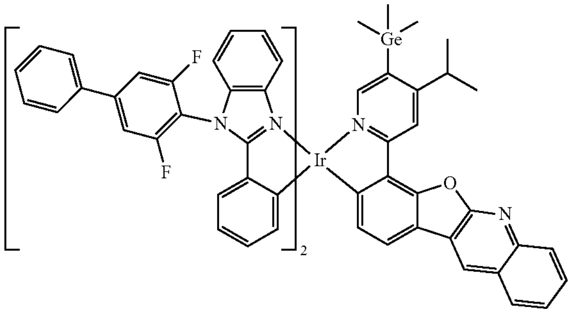
Ir187
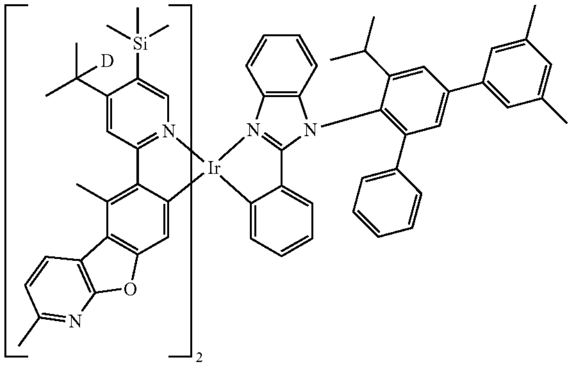
Ir188
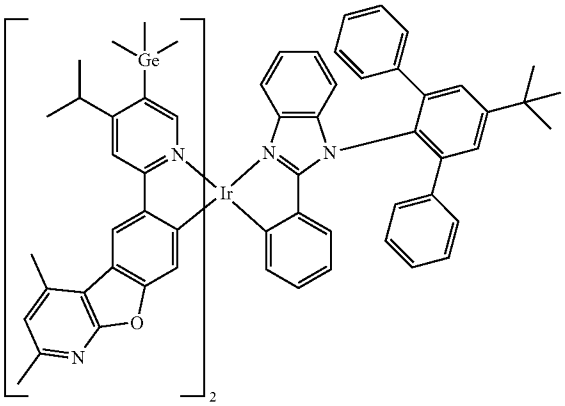
Ir189
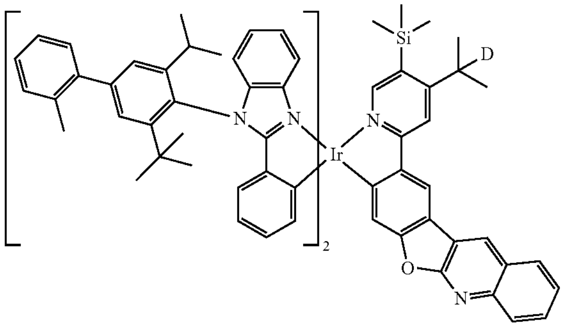

Ir190
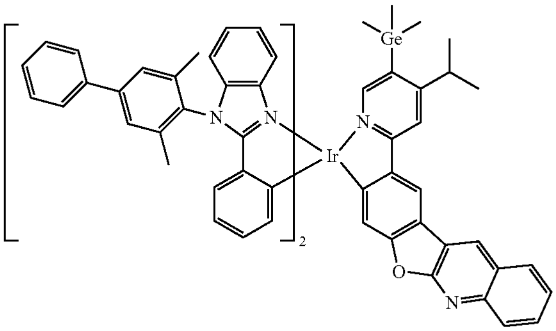
Ir191
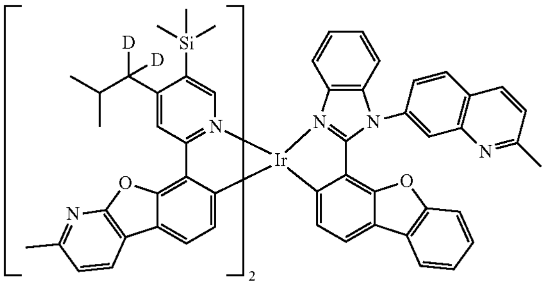
Ir192
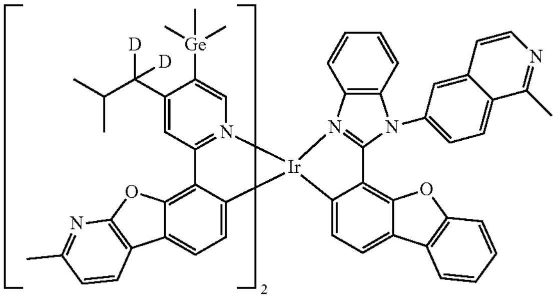
Ir193
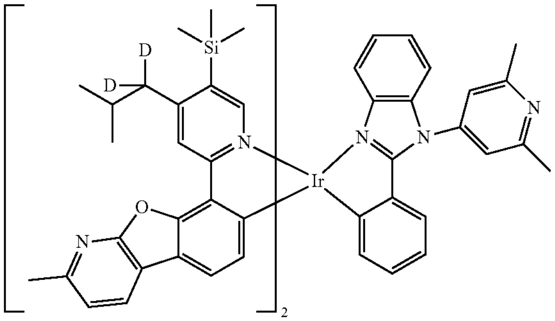
Ir194
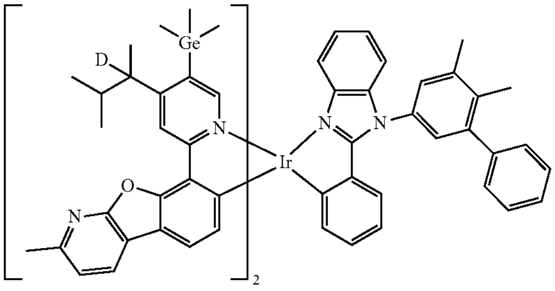
Ir195
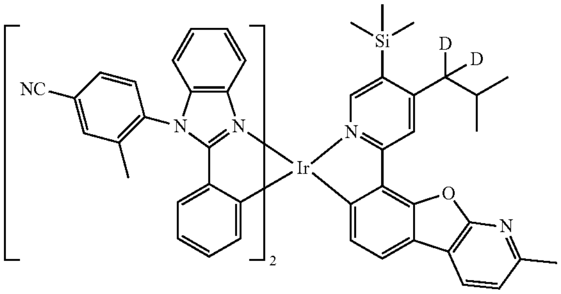
Ir196
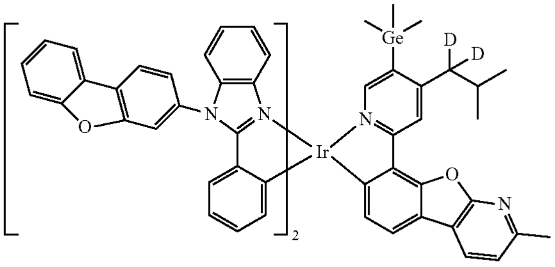
Ir197
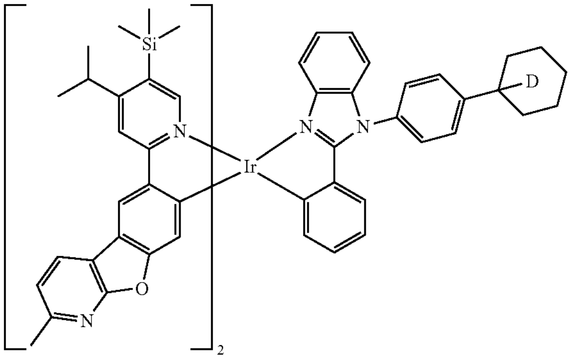

-continued
Ir198
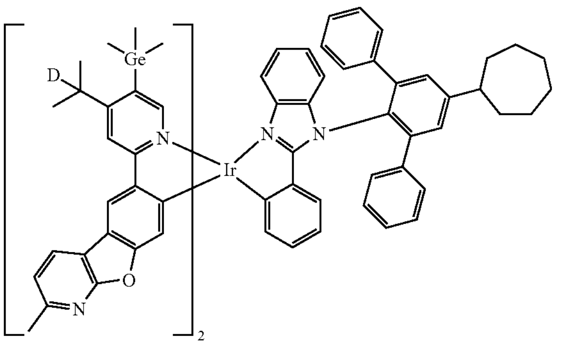
Ir199
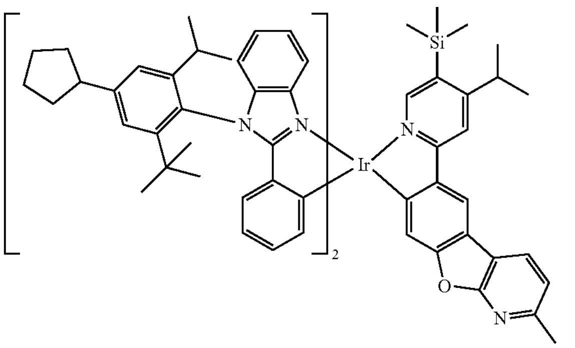
Ir200
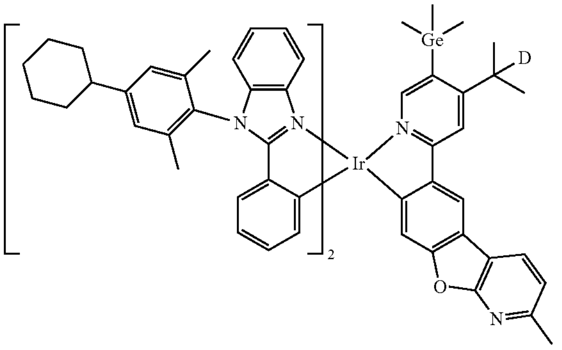
Ir201
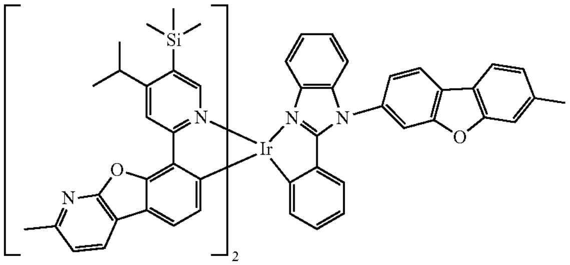
Ir202
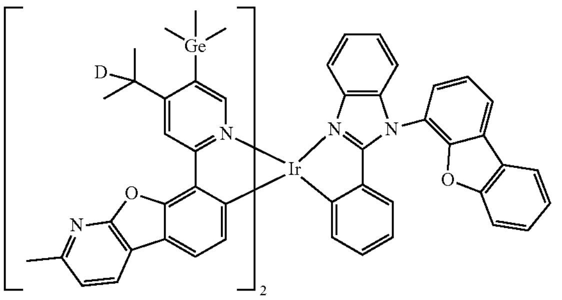
Ir203
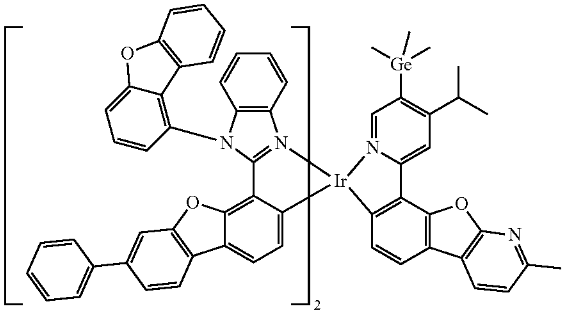
Ir204
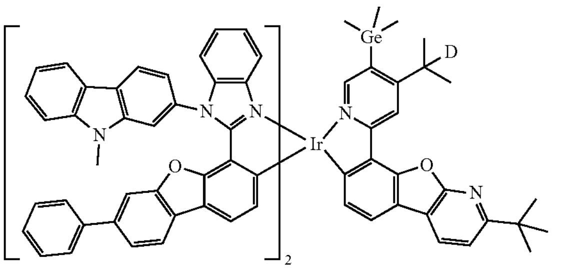
Ir205
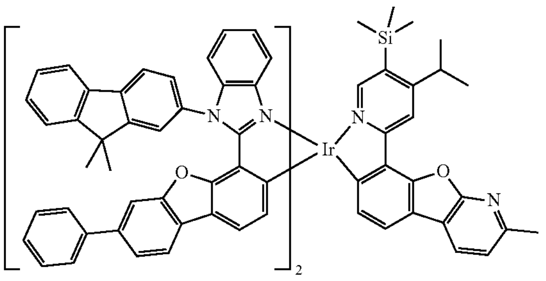

-continued
Ir206
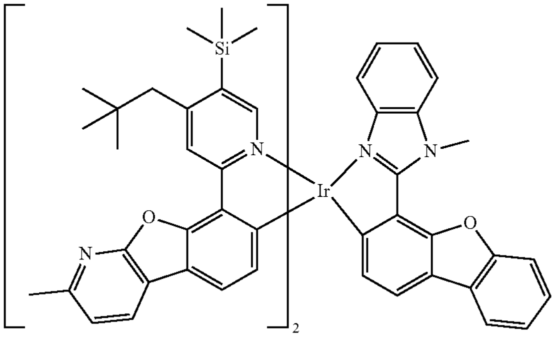
Ir207
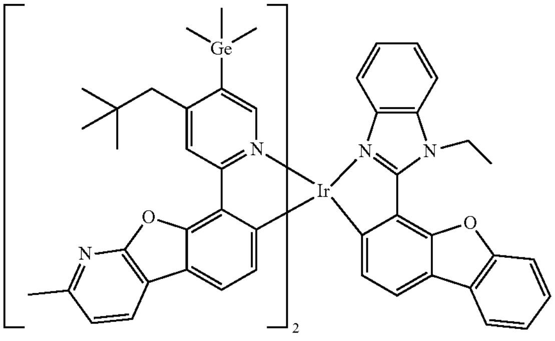
Ir208
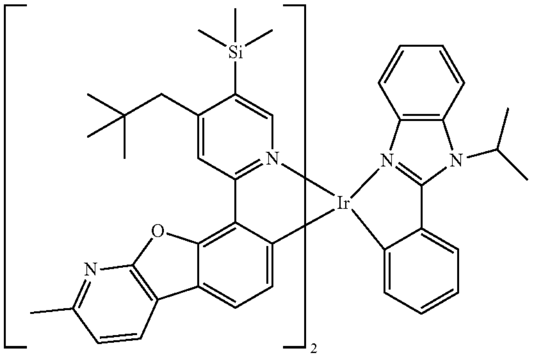
Ir209
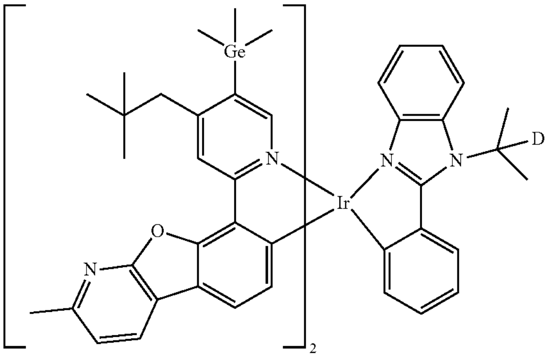
Ir210
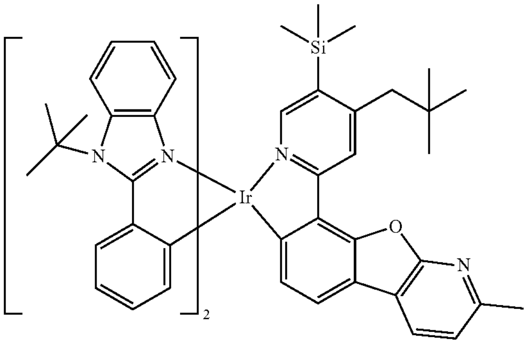
Ir211
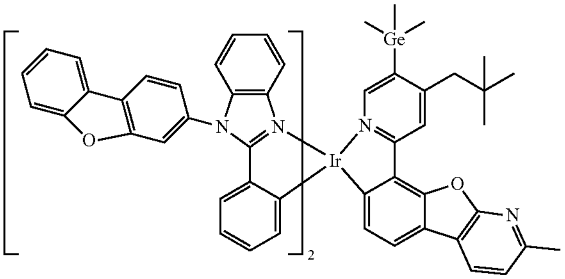
Ir212
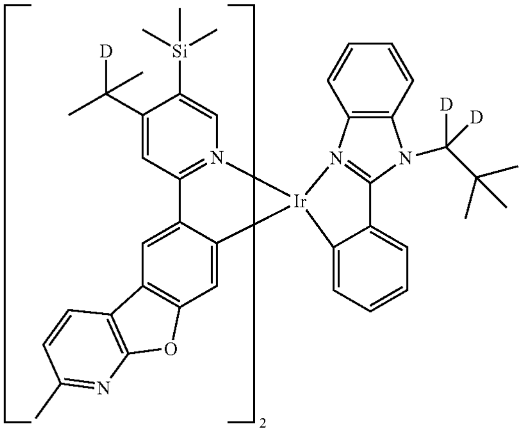
Ir213
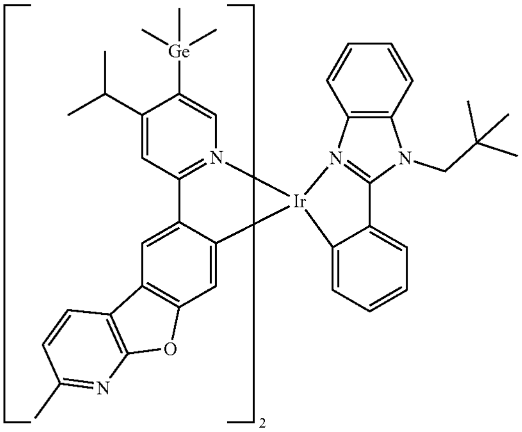

-continued
Ir214
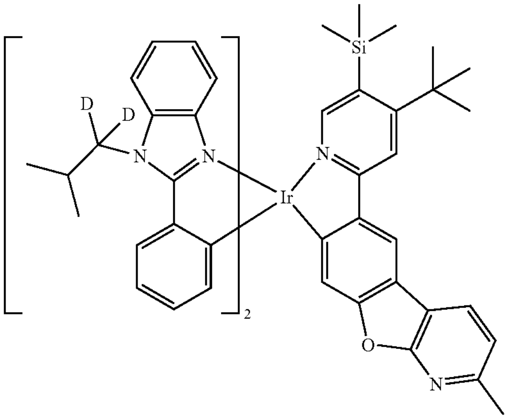
Ir215
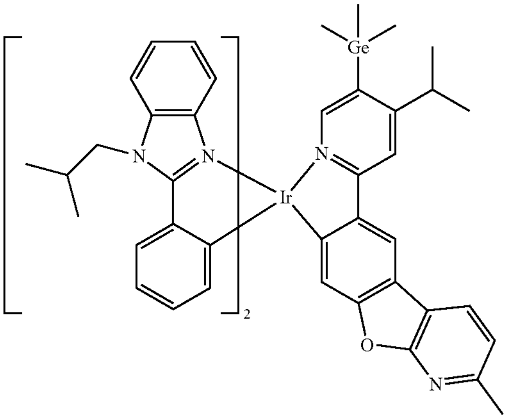
Ir216
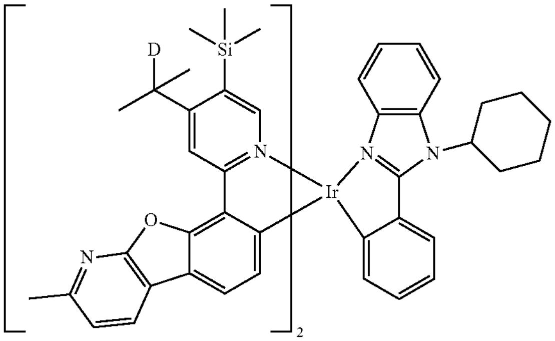
Ir217
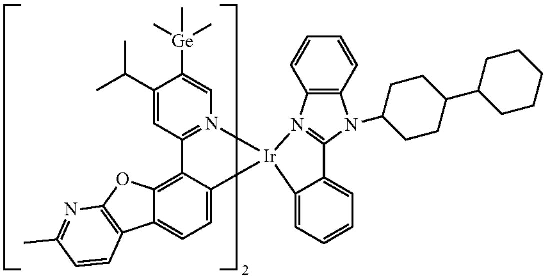
Ir218
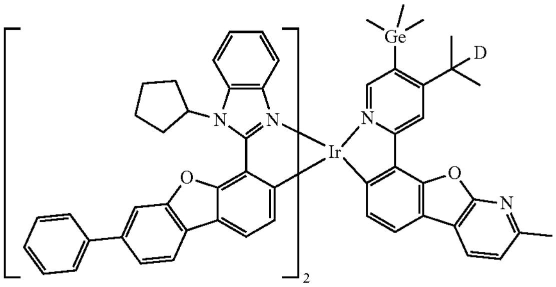
Ir219
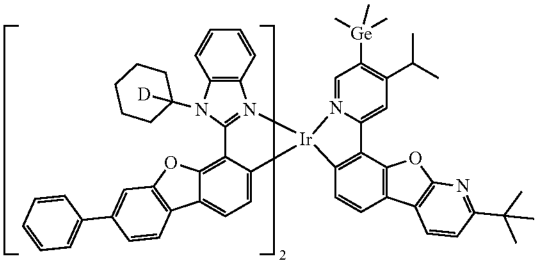
Ir220
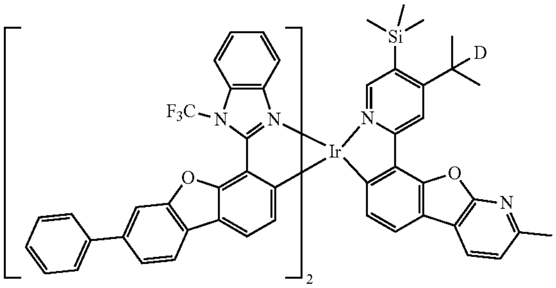
Ir221
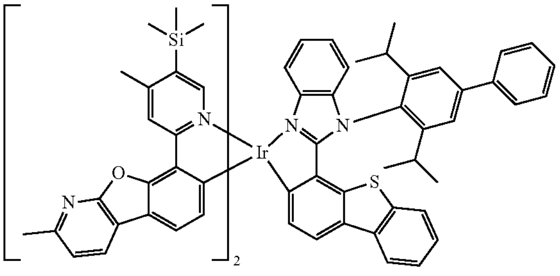

-continued
Ir222
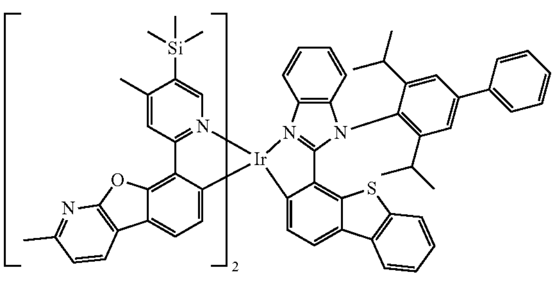
Ir223
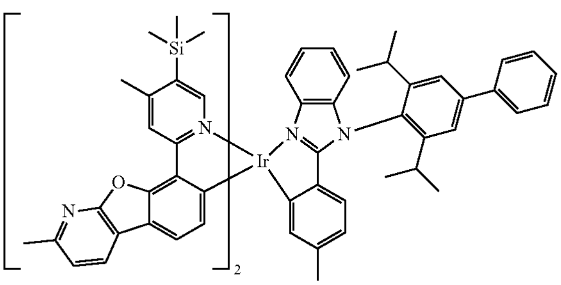
Ir224
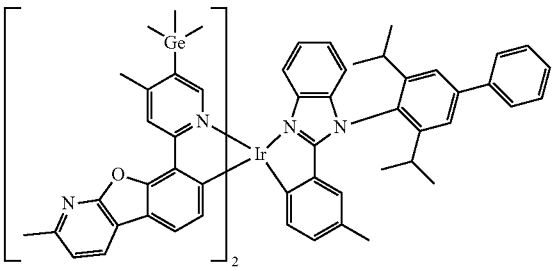
Ir225
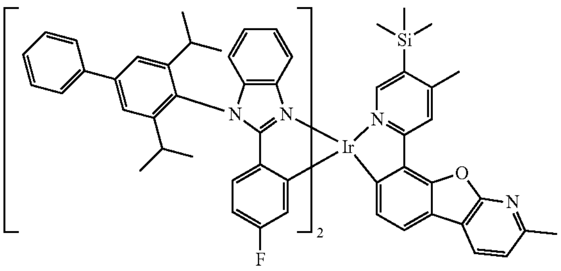
Ir226
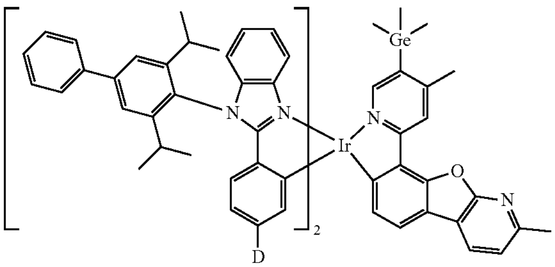
Ir227
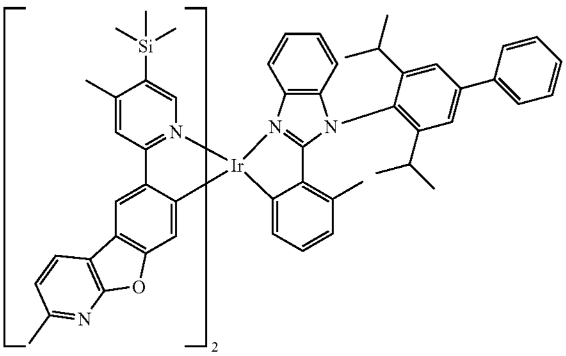
Ir228
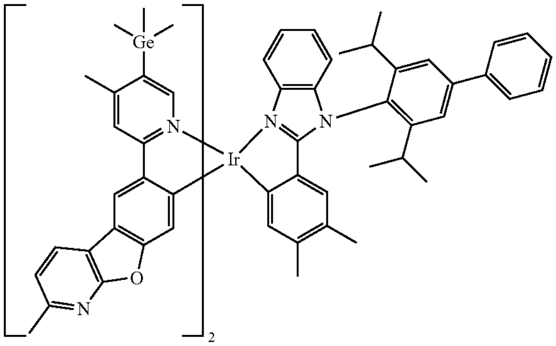
Ir229
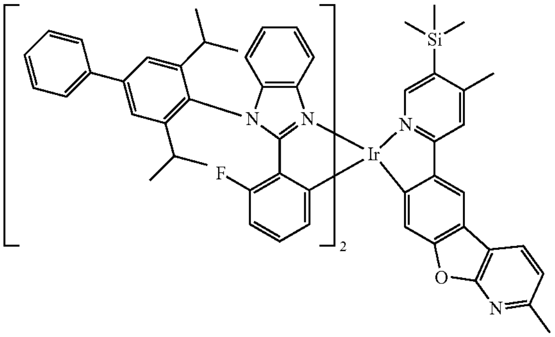

-continued
Ir230
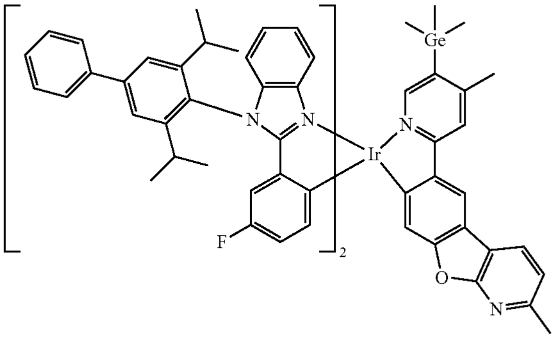
Ir231
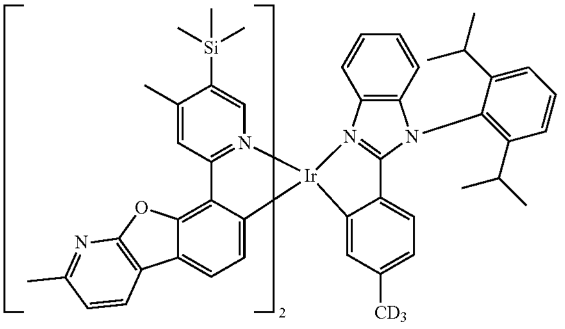
Ir232
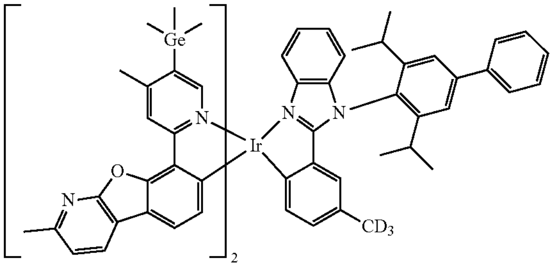
Ir233
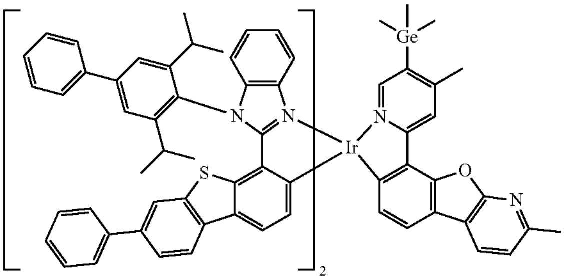
Ir234
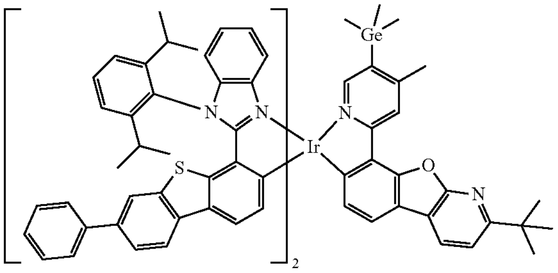
Ir235
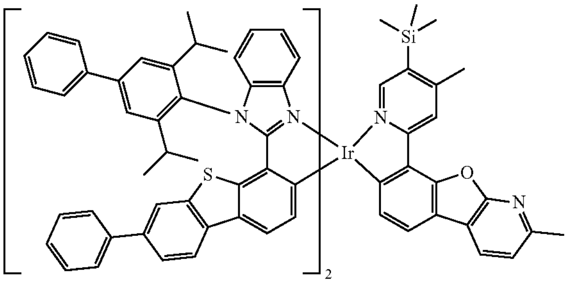
Ir236
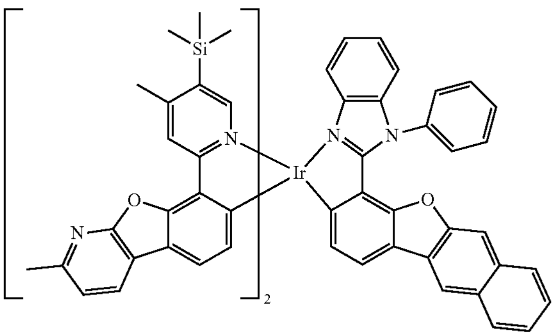
Ir237
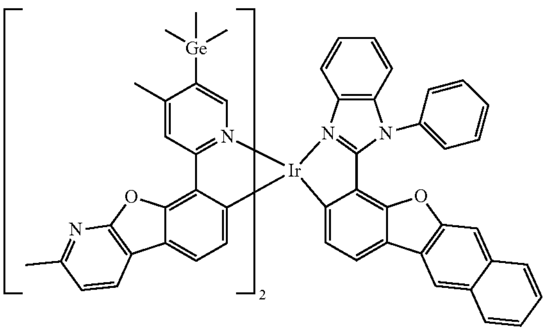

-continued
Ir238
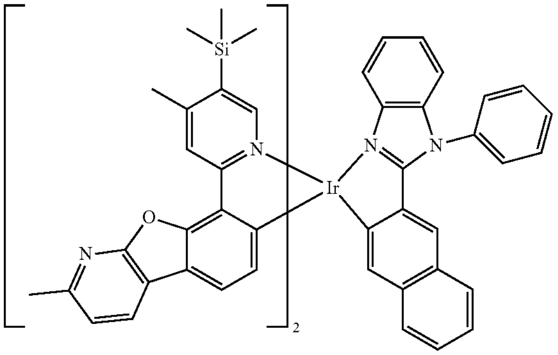
Ir239
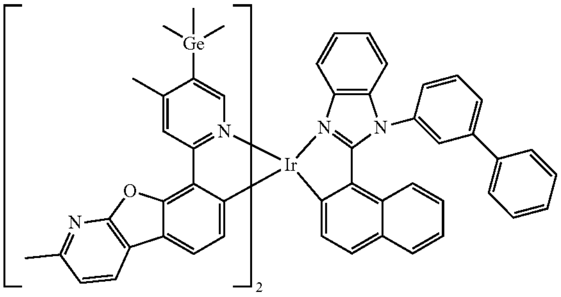
Ir240
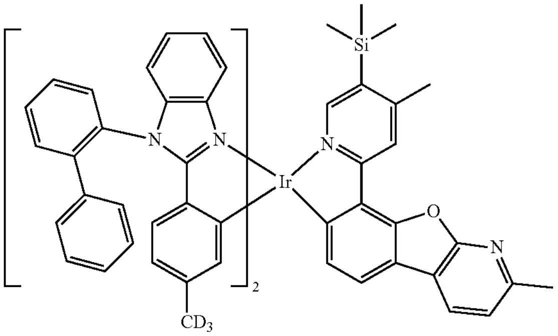
Ir241
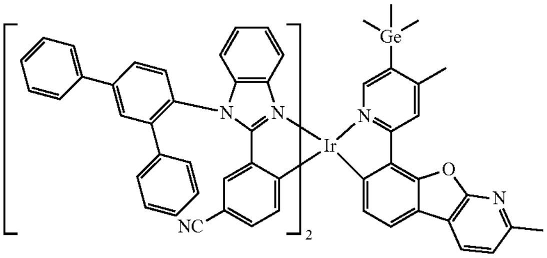
Ir242
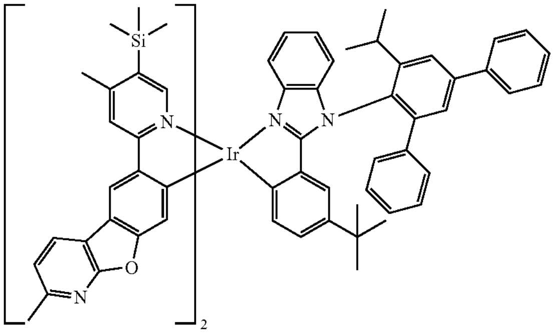
Ir243
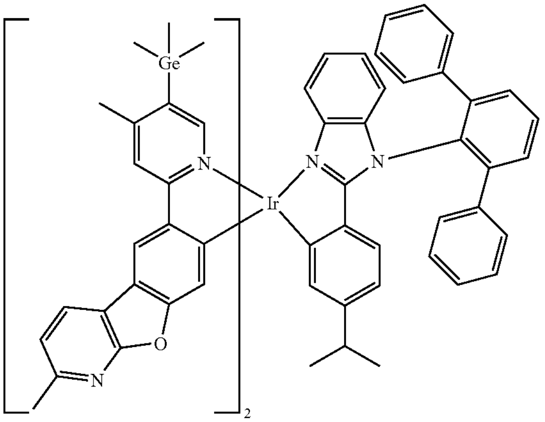
Ir244
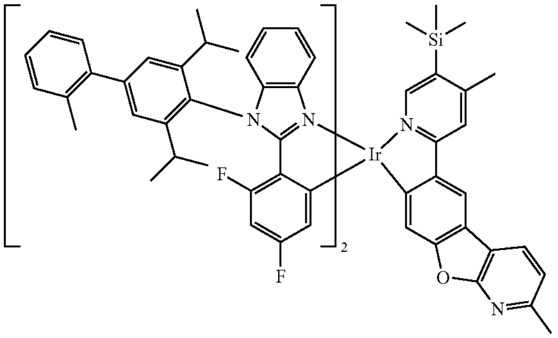
Ir245
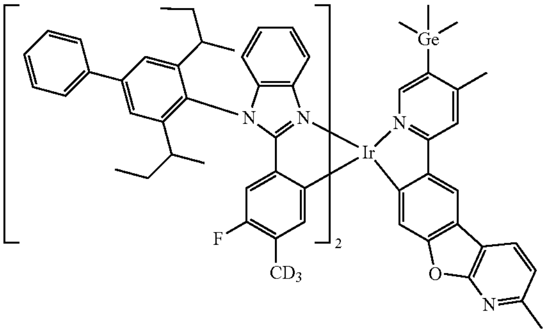

-continued
Ir246
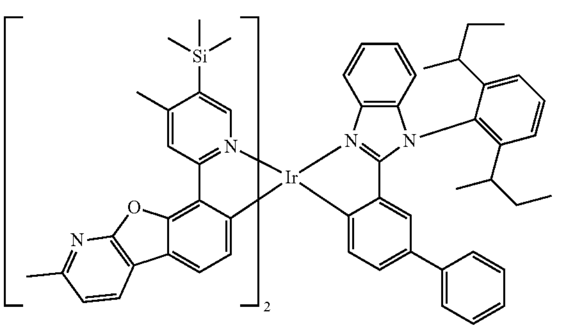
Ir247
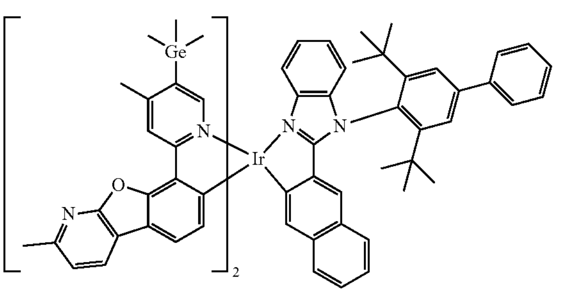
Ir248
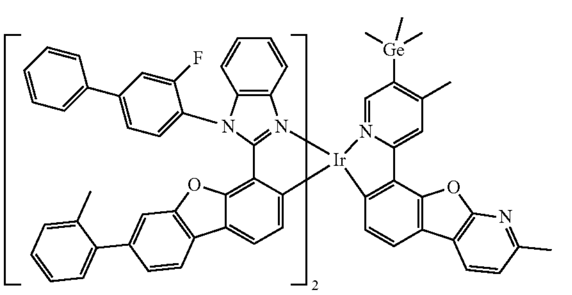
Ir249
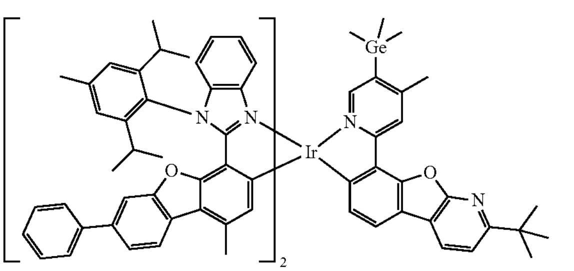
Ir250
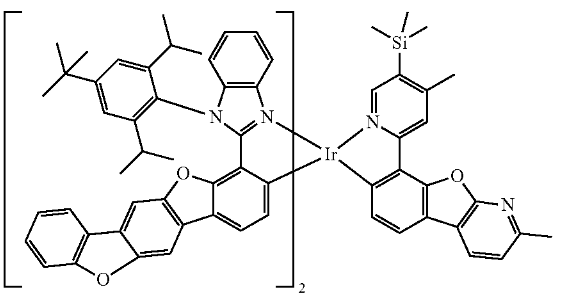
Ir251
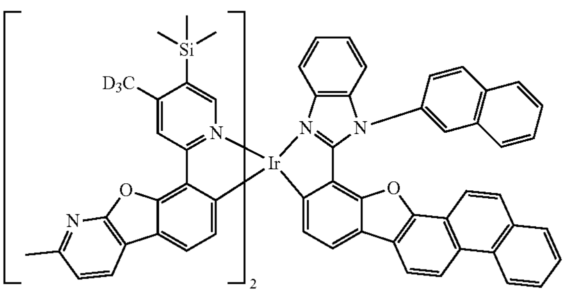
Ir252
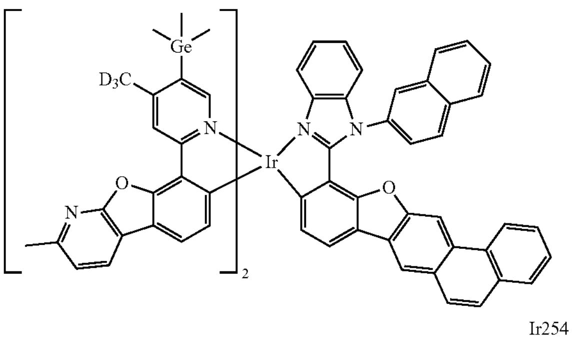
Ir253
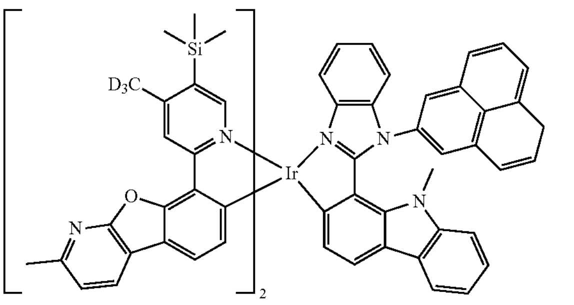
Ir254
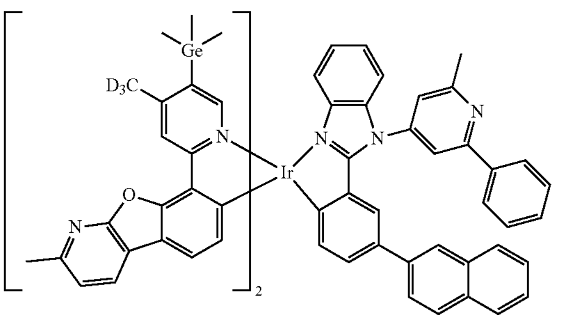
Ir255
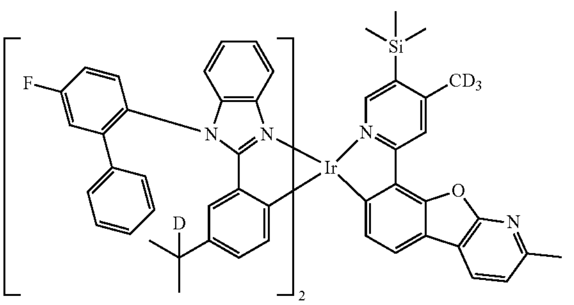

-continued
Ir256
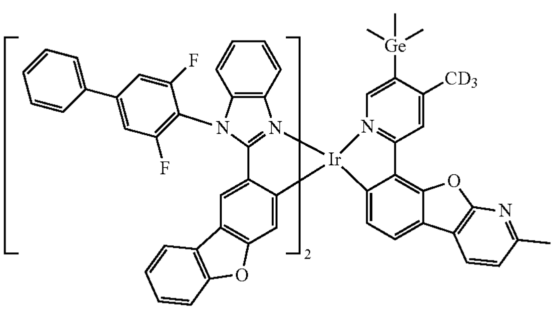
Ir257
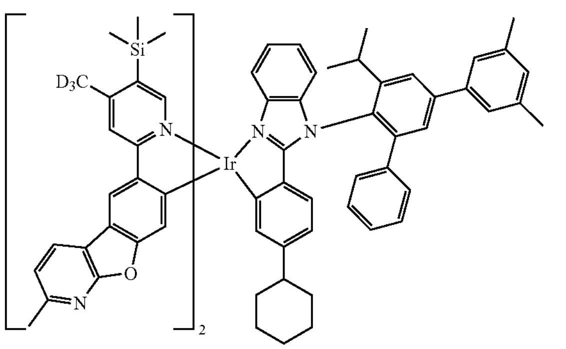
Ir258
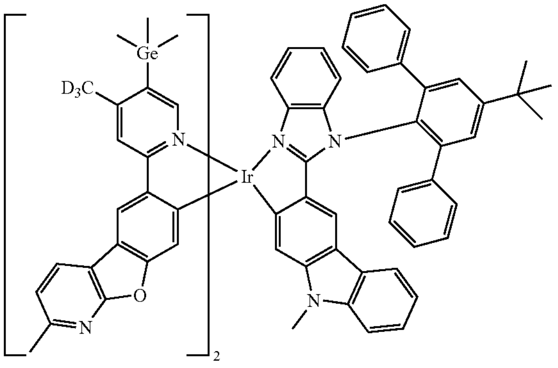
Ir259
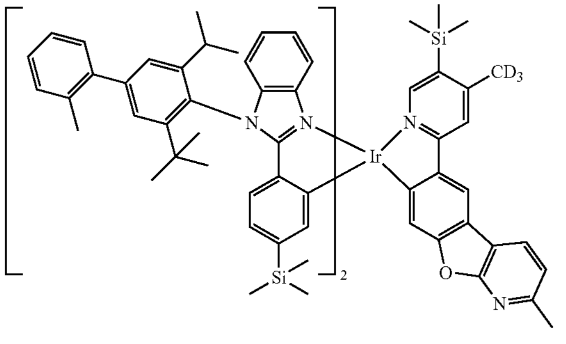
Ir260
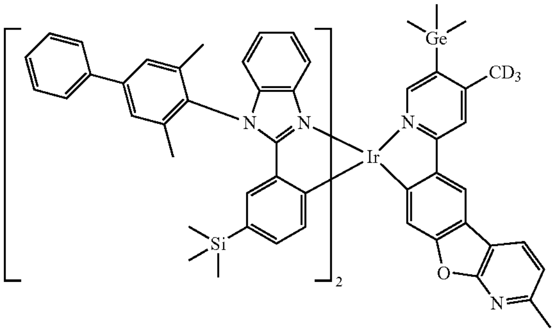
Ir261
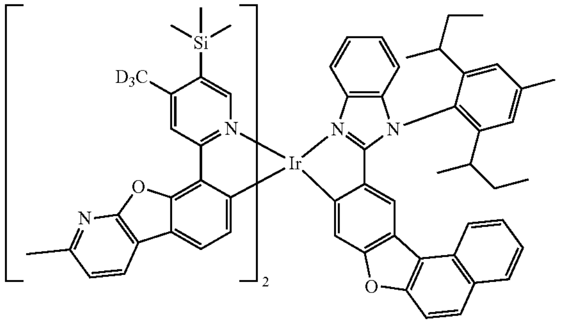
Ir262
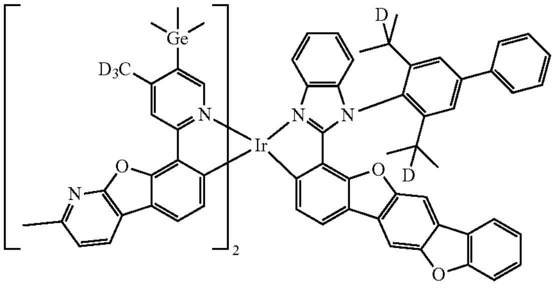
Ir263
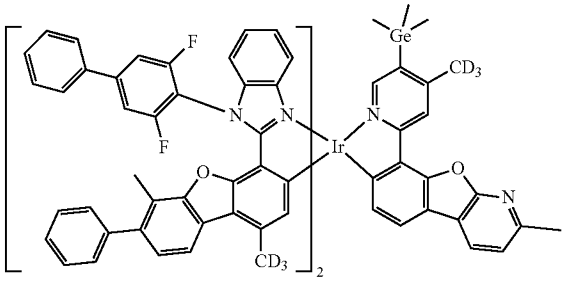

-continued
Ir264
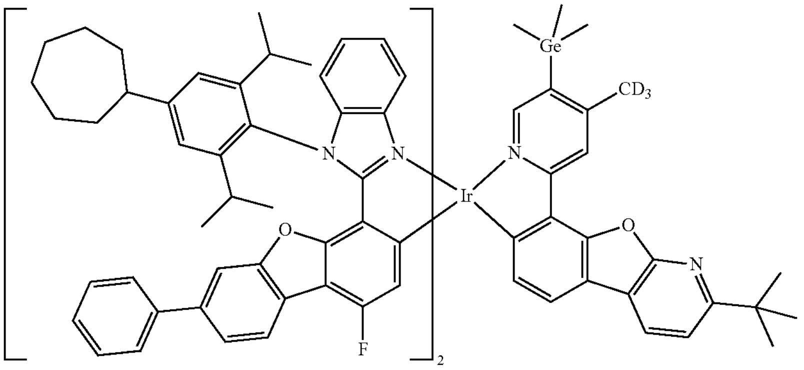
Ir265
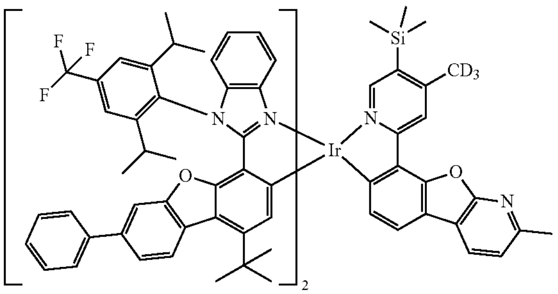
Ir266
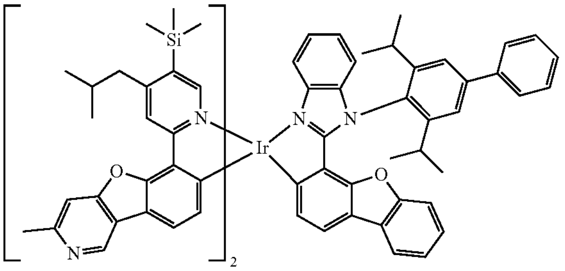
Ir267
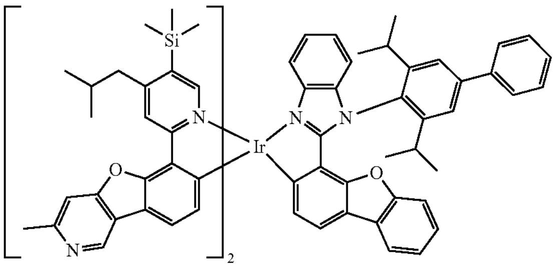
Ir268
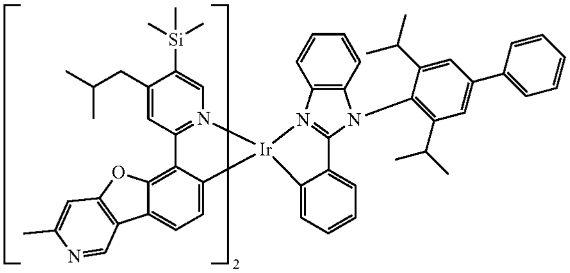
Ir269
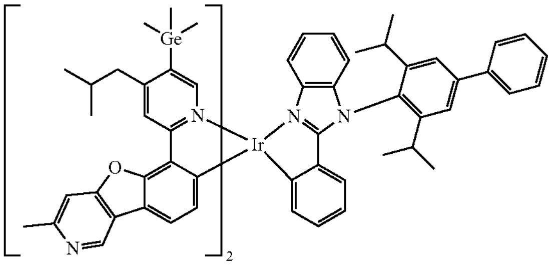
Ir270
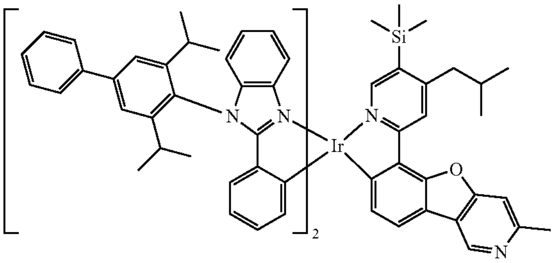
Ir271
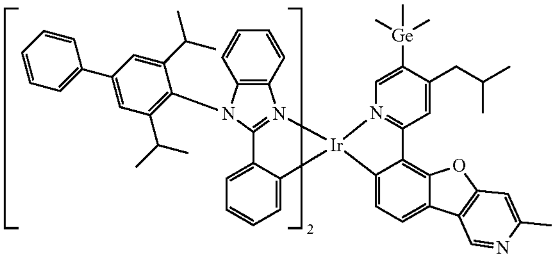
Ir272
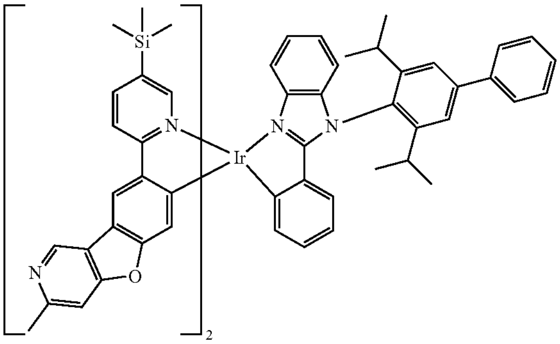

-continued
Ir273
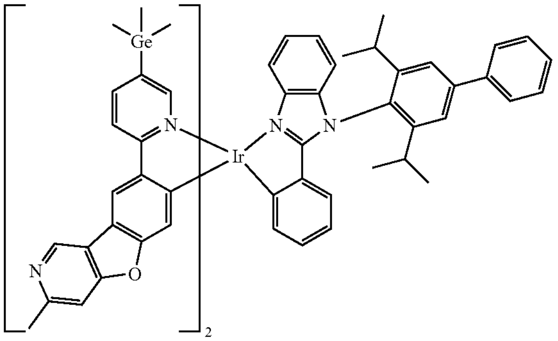
I274
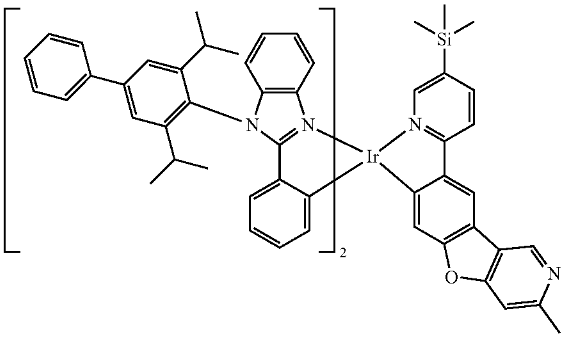
Ir275
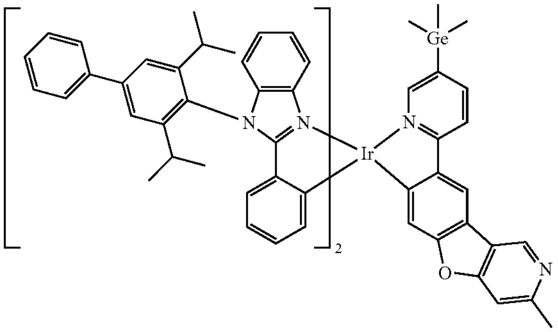
Ir276
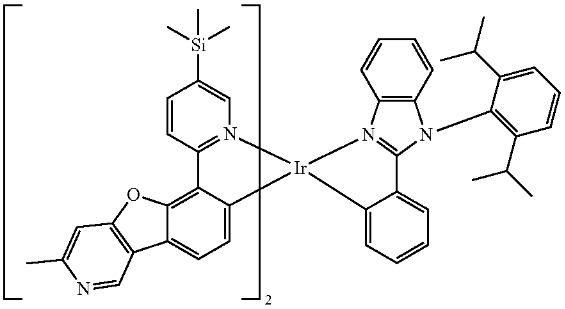
Ir277
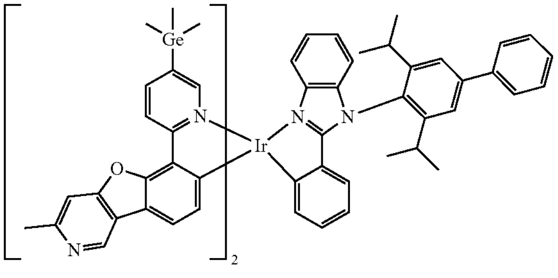
Ir278
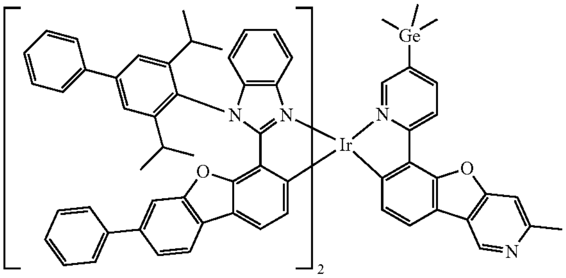
Ir279
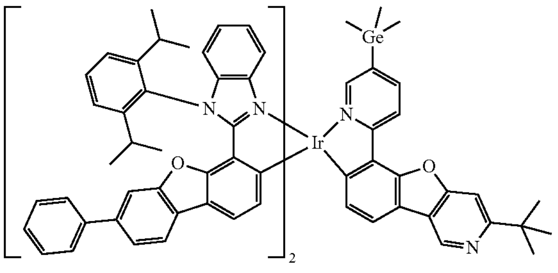
Ir280
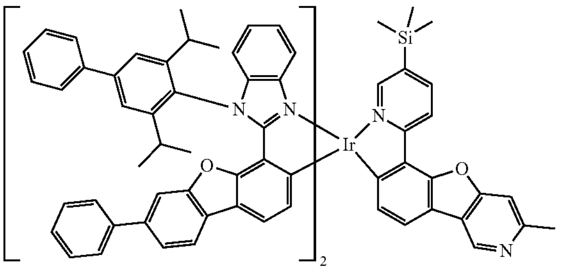

-continued
Ir281
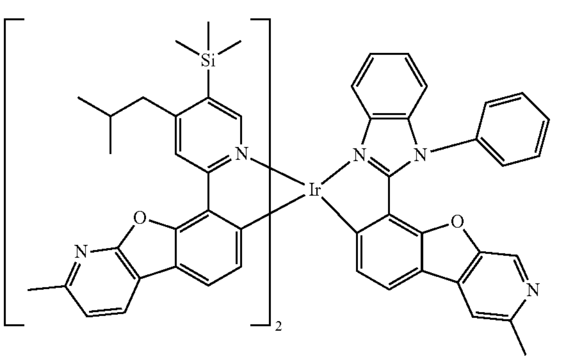
Ir282
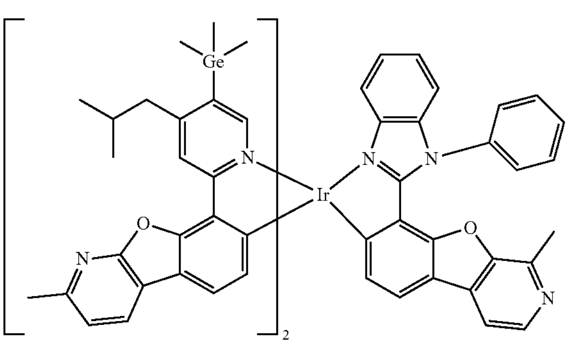
Ir283
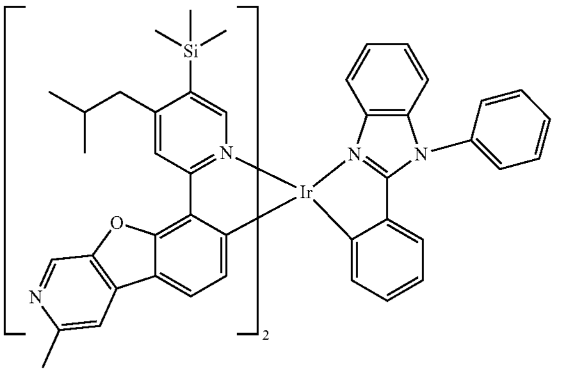
Ir284
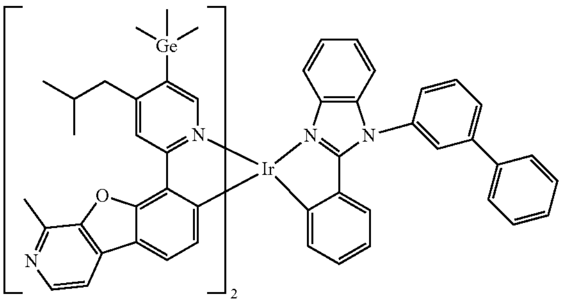
Ir285
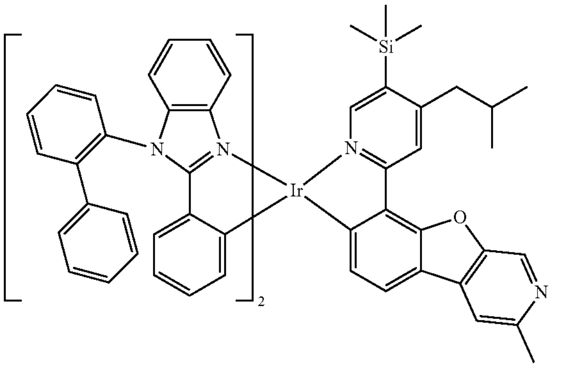
Ir286
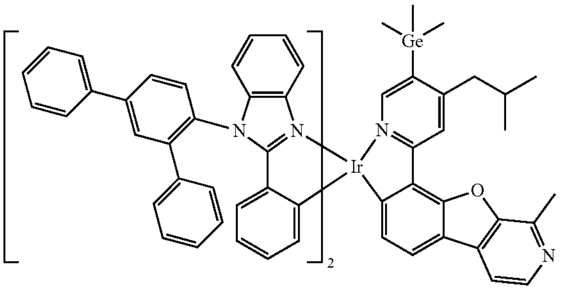
Ir287
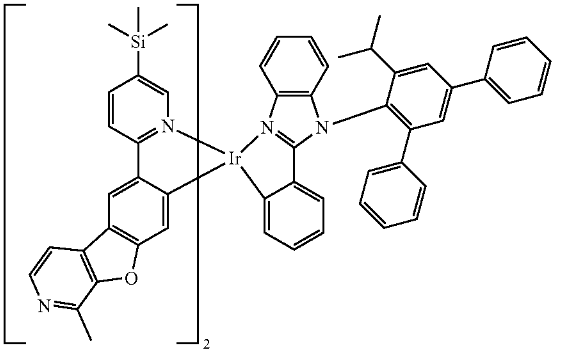
Ir288
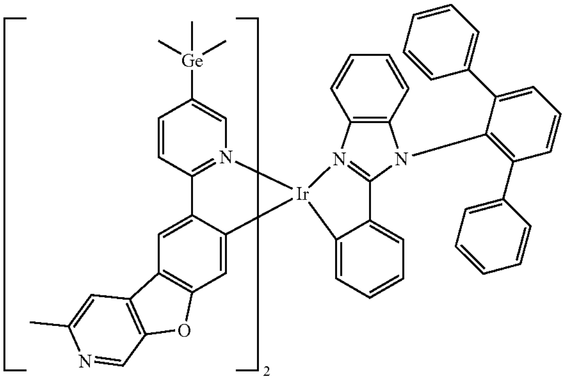

-continued

Ir289

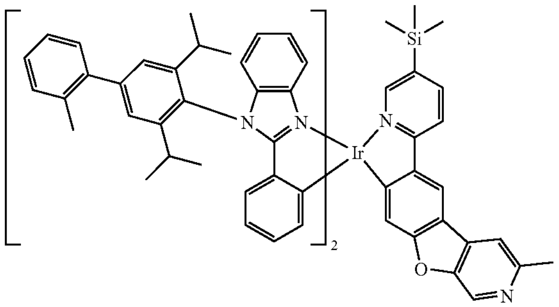

Ir290

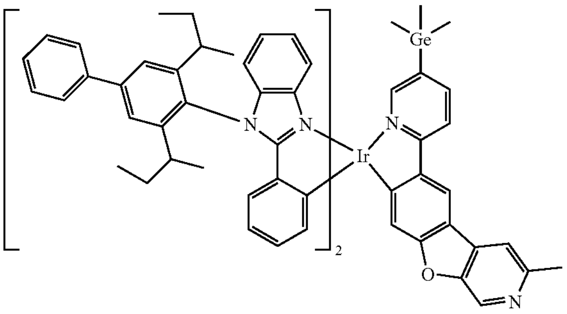

Ir21

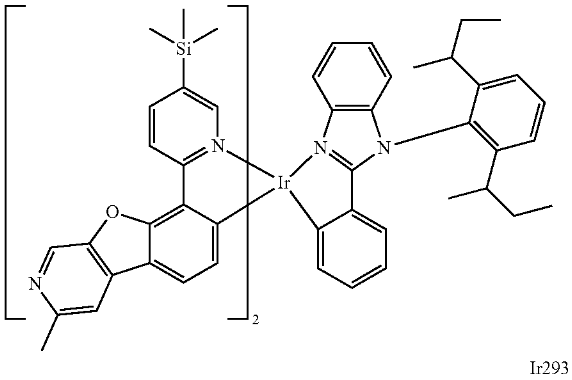

Ir292

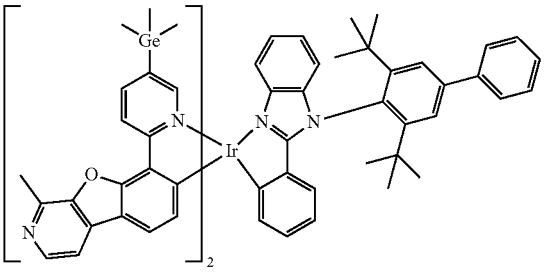

Ir293

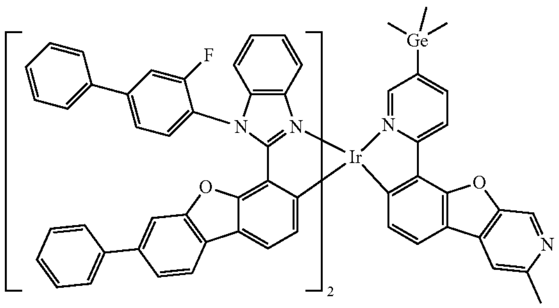

Ir294

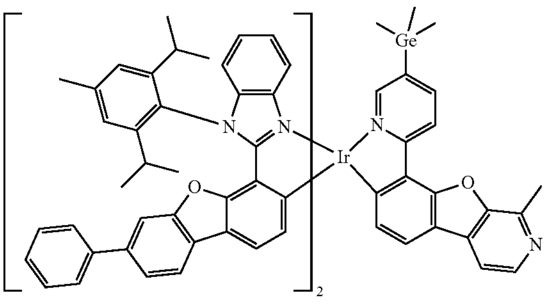

Ir295

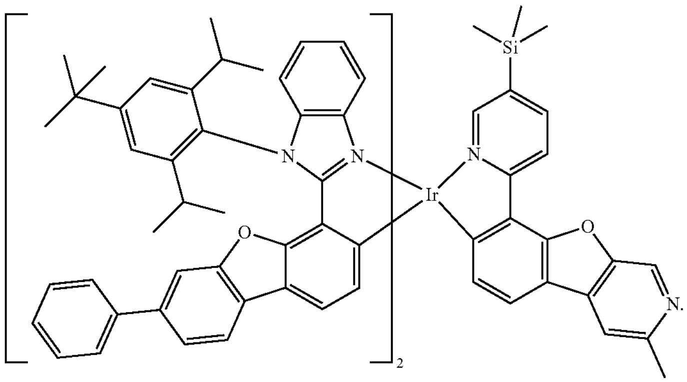

In one or more embodiments, the organometallic compound represented by Formula 1 may emit a red light or a green light, for example, a red light or a green light having a maximum emission wavelength ($\lambda_{max}$) of about 500 nanometers (nm) or greater, for example, about 500 nm to about 750 nm. In one or more embodiments, the organometallic compound may emit a green light. In one or more embodiments, the organometallic compound may emit a light (for example, a green light) having a maximum emission wavelength of about 515 nm to about 550 nm, or about 520 nm to about 540 nm.

In the organometallic compound represented by Formula 1, $L_1$ is a ligand represented by Formula 2-1, $L_2$ is a ligand represented by Formula 2-2 or a ligand represented by Formula 2-3, and n1 and n2, which are respectively the numbers of $L_1$ ligands and $L_2$ ligands, are each independently be 1 or 2. Accordingly, the organometallic compound represented by Formula 1 may have a high horizontal orientation ratio, and thus, an electronic device, for example, an organic light-emitting device, including at least one of the organometallic compounds may have an increased quantum efficiency. Also, the organometallic compound represented by Formula 1 is relatively easy to synthesize and may be efficiently synthesized with high purity.

A highest occupied molecular orbital (HOMO) energy level, a lowest unoccupied molecular orbital (LUMO) energy level, and a triplet ($T_1$) energy level of some compounds of the organometallic compound represented by Formula 1 were calculated using a density functional theory (DFT) method of the Gaussian 09 program with the molecular structure optimization at the B3LYP level, and results thereof are shown in Table 1. The energy levels are expressed in electron volts (eV).

TABLE 1

| Compound No. | HOMO (eV) | LUMO (eV) | $T_1$ (eV) |
|---|---|---|---|
| Ir11 | −5.5203 | −1.1684 | 2.3233 |
| Ir12 | −5.4719 | −1.6259 | 2.3504 |
| Ir13 | −5.4622 | −1.6994 | 2.3334 |
| Ir14 | −5.4488 | −1.6706 | 2.3354 |

Referring to Table 1, it was confirmed that the organometallic compound represented by Formula 1 had suitable electrical characteristics for use as a dopant in an electronic device, for example, an organic light-emitting device.

A method of synthesizing the organometallic compound represented by Formula 1 may be recognizable by one of ordinary skill in the art by referring to Synthesis Examples provided herein.

Therefore, the organometallic compound represented by Formula 1 may be suitable for use as a material for an organic layer of an organic light-emitting device, for example, as a dopant in an emission layer of the organic layer. Thus, according to one or more embodiments, also provided is an organic light-emitting device including a first electrode; a second electrode; and an organic layer arranged between the first electrode and the second electrode, wherein the organic layer includes an emission layer, and wherein the organic layer includes at least one organometallic compound represented by Formula 1.

The organic light-emitting device includes the organic layer including at least one organometallic compound represented by Formula 1, and thus, may have an improved external quantum efficiency and an improved lifespan.

The organometallic compound of Formula 1 may be used or arranged between a pair of electrodes of the organic light-emitting device. In one or more embodiments, the organometallic compound represented by Formula 1 may be included in the emission layer. In this regard, the organometallic compound may act as a dopant, and the emission layer may further include a host (that is, an amount of the at least one organometallic compound represented by Formula 1 in the emission layer is less than an amount of the host in the emission layer). In other words, in one or more embodiments, an amount of the host in the emission layer is greater than an amount of the at least one organometallic compound represented by Formula 1 in the emission layer.

The emission layer may emit a red light or a green light, for example, a red light or a green light having a maximum emission wavelength of 500 nm or greater, for example, about 500 nm to about 750 nm. In one or more embodiments, the organometallic compound may emit a green light. In one or more embodiments, the emission layer (or the organic light-emitting device) may emit a light (for example, a green light) having a maximum emission wavelength of about 515 nm to about 550 nm, or about 520 nm to about 540 nm.

The expression "(organic layer) includes at least one organometallic compound represented by Formula 1" as used herein may indicate that the (organic layer) may include one kind of organometallic compound represented by Formula 1 or two or more different kinds of organometallic compounds, each represented by Formula 1. In one or more embodiments, the organic layer may include, as the at least one organometallic compound, only Compound 1. In this regard, Compound 1 may be present in the emission layer of the organic light-emitting device. In one or more embodiments, the organic layer may include, as the at least one organometallic compound, Compounds 1 and 2. In this regard, Compound 1 and Compound 2 may be present in the same layer (for example, both Compound 1 and Compound 2 may be present in the emission layer), wherein Compound 1 and Compound 2 are not the same.

The first electrode may be an anode, which is a hole injection electrode, and the second electrode may be a cathode, which is an electron injection electrode. Alternatively, the first electrode may be a cathode, which is an electron injection electrode, and the second electrode may be an anode, which is a hole injection electrode.

In one or more embodiments, in the organic light-emitting device, the first electrode may be an anode, the second electrode may be a cathode, and the organic layer may further include a hole transport region arranged between the first electrode and the emission layer, and an electron transport region arranged between the emission layer and the second electrode, wherein the hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

The term "organic layer" as used herein refers to a single layer and/or a plurality of layers arranged between the first electrode and the second electrode of the organic light-emitting device. The "organic layer" may include not only organic compounds but also organometallic complexes including metals.

The FIGURE is a schematic cross-sectional view of an organic light-emitting device 10 according to one or more embodiments. Hereinafter, the structure and manufacturing method of the organic light-emitting device 10 according to one or more embodiments will be described in further detail with reference to the FIGURE, but embodiments are not limited thereto. The organic light-emitting device 10 may include a first electrode 11, an organic layer 15, and a second electrode 19, which are sequentially stacked in this stated order.

A substrate may be additionally located under the first electrode 11 or over the second electrode 19. For use as the substrate, any suitable substrate that is used in organic light-emitting devices, including those available in the art, may be used, and for example, a glass substrate or a transparent plastic substrate, each having excellent mechanical strength, thermal stability, transparency, surface smoothness, ease of handling, and/or water resistance, may be used.

The first electrode 11 may be, for example, formed by depositing or sputtering a material for forming the first electrode 11 on a surface of the substrate. The first electrode 11 may be an anode. The material for forming the first electrode 11 may include materials with a high work function to facilitate hole injection. The first electrode 11 may be a reflective electrode, a semi-transmissive electrode, or a transmissive electrode. The material for forming the first electrode 11 may be, for example, an indium tin oxide (ITO), an indium zinc oxide (IZO), a tin oxide ($SnO_2$), or a zinc oxide (ZnO). In one or more embodiments, the material for forming the first electrode 11 may be a metal, such as magnesium (Mg), aluminum (Al), silver (Ag), aluminum-lithium (Al—Li), calcium (Ca), magnesium-indium (Mg—In), or magnesium-silver (Mg—Ag).

The first electrode 11 may have a single-layered structure or a multi-layered structure including two or more layers. In one or more embodiments, the first electrode 11 may have a three-layered structure of ITO/Ag/ITO.

The organic layer 15 may be arranged on the first electrode 11.

The organic layer 15 may include the hole transport region, the emission layer, and the electron transport region.

The hole transport region may be arranged between the first electrode 11 and the emission layer.

The hole transport region may include a hole injection layer, a hole transport layer, an electron blocking layer, a buffer layer, or a combination thereof.

The hole transport region may include only a hole injection layer or only a hole transport layer. In one or more embodiments, the hole transport region may have a hole injection layer/hole transport layer structure or a hole injection layer/hole transport layer/electron blocking layer structure, wherein, for each structure, respective layers are sequentially stacked in this stated order from the first electrode 11.

When the hole transport region includes a hole injection layer, the hole injection layer may be formed on the first electrode 11 by using one or more suitable methods, such as vacuum deposition, spin coating, casting, and/or Langmuir-Blodgett (LB) deposition.

When the hole injection layer is formed by vacuum deposition, the deposition conditions may vary depending on a material that is used to form the hole injection layer, and the structure and thermal characteristics of the hole injection layer. For example, the deposition conditions may include a deposition temperature in a range of about 100° C. to about 500° C., a vacuum pressure in a range of about $10^{-8}$ torr to about $10^{-3}$ torr, and a deposition rate in a range of about 0.01 angstroms per second (Å/sec) to about 100 Å/sec.

When the hole injection layer is formed by spin coating, the coating conditions may vary depending on a material that is used to form the hole injection layer, and the structure and thermal characteristics of the hole injection layer. For example, the coating conditions may include a coating speed in a range of about 2,000 revolutions per minute (rpm) to about 5,000 rpm and a heat treatment temperature of about 80° C. to about 200° C. for removing a solvent after coating.

Conditions for forming the hole transport layer and the electron blocking layer may respectively be similar to or the same as the conditions for forming the hole injection layer.

The hole transport region may include 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), N,N'-di(1-naphthyl)-N,N'-diphenylbenzidine (NPB), β-NPB, N,N'-bis(3-methylphenyl)-N,N'-diphenyl-[1,1-biphenyl]-4,4'-diamine (TPD), spiro-TPD, spiro-NPB, methylated NPB, 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, a compound represented by Formula 202, or a combination thereof, but embodiments are not limited thereto:

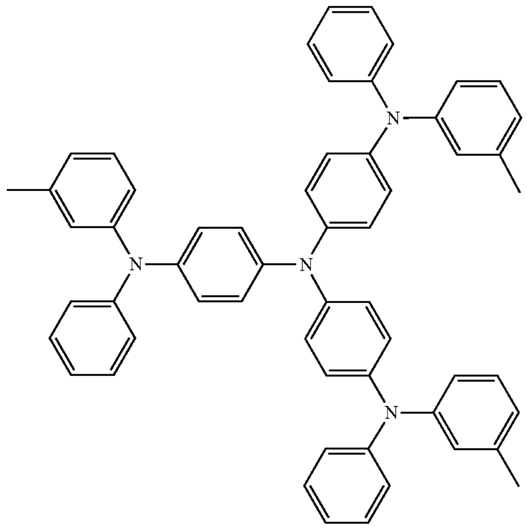

m-MTDATA

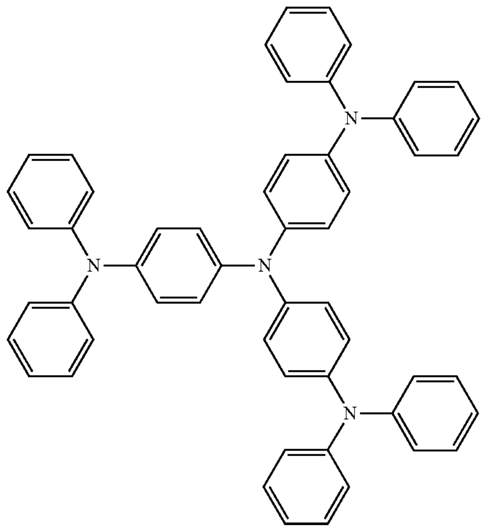

TDATA

-continued
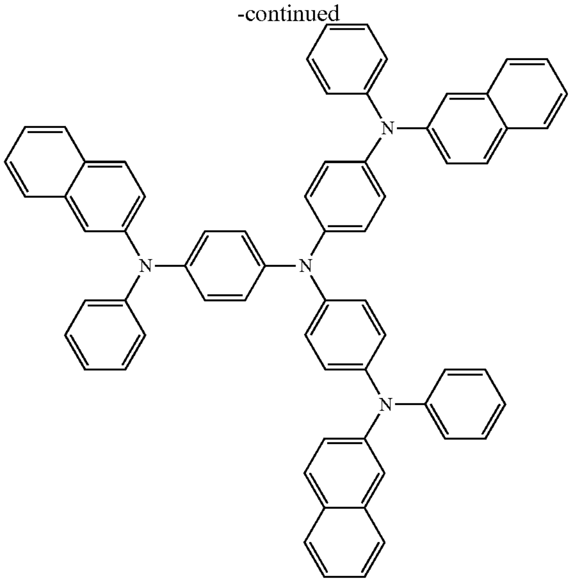
2-TNATA
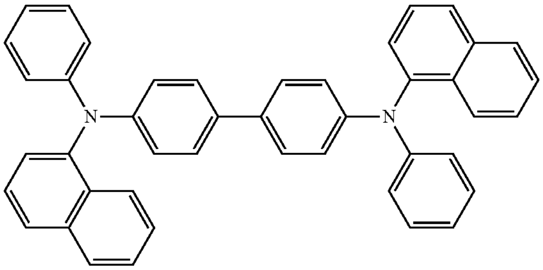
NPB
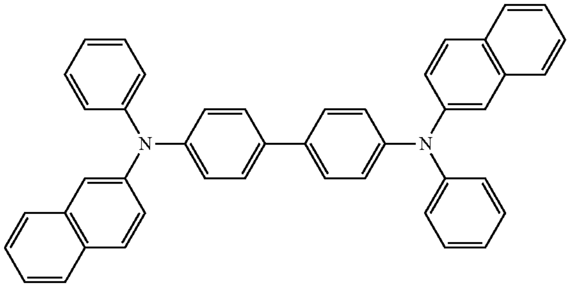
β-NPB
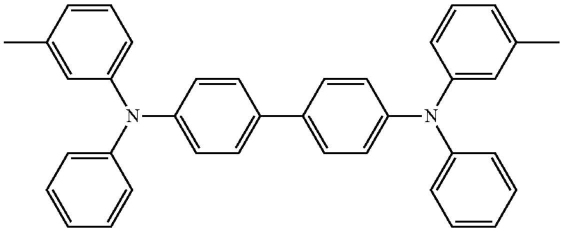
TPD
-continued
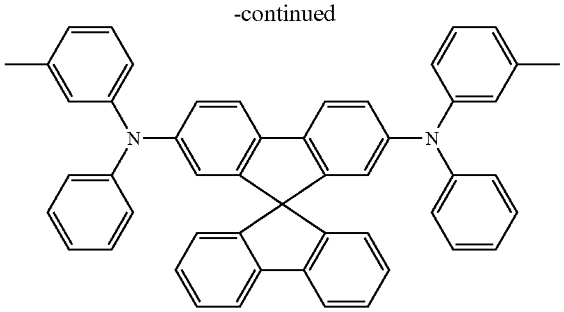
Spiro-TPD
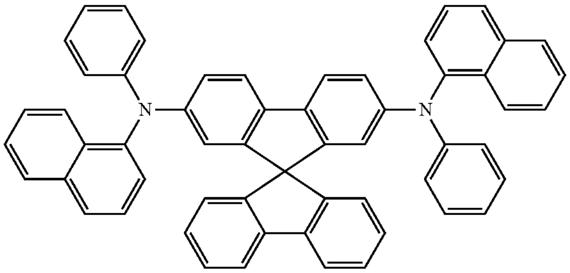
Spiro-NPB
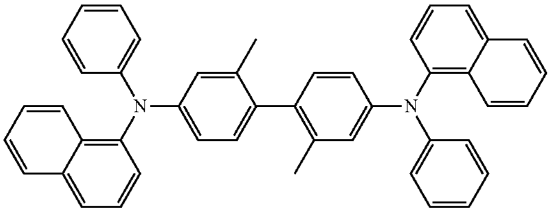
methylated NPB
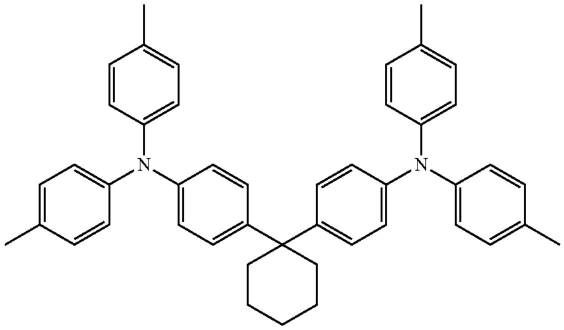
TAPC
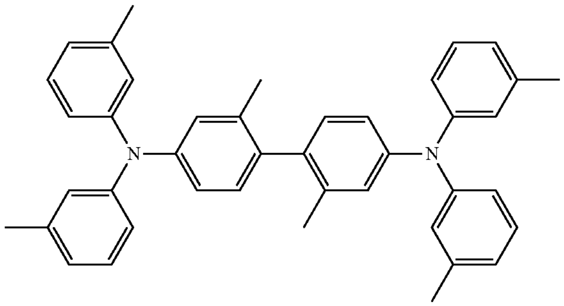
HMTPD -continued Formula 201

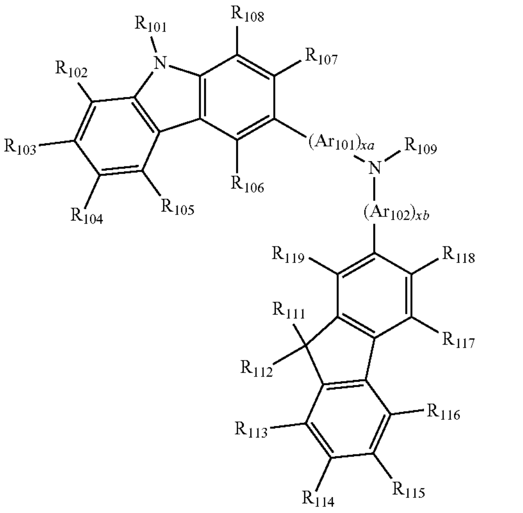

Formula 202

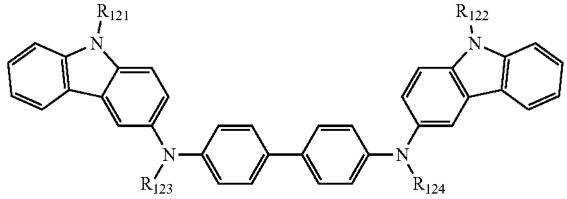

wherein, in Formula 201, $Ar_{101}$ and $Ar_{102}$ may each independently be a benzene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic, or a combination thereof.

xa and xb in Formula 201 may each independently be an integer from 0 to 5, or may each independently be 0, 1, or 2. In one or more embodiments, xa may be 1, and xb may be 0.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, or a hexyl group), a $C_1$-$C_{10}$ alkoxy group (for example, a methoxy group, an ethoxy group, a propoxy group, a butoxy group, or a pentoxy group), or a $C_1$-$C_{10}$ alkylthio group;

a $C_1$-$C_{10}$ alkyl group, a $C_1$-$C_{10}$ alkoxy group, or a $C_1$-$C_{10}$ alkylthio group, each substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a phenyl group, a naphthyl group, an anthracenyl group, a fluorenyl group, or a pyrenyl group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a $C_1$-$C_{10}$ alkylthio group, or a combination thereof.

$R_{109}$ in Formula 201 may be a phenyl group, a naphthyl group, an anthracenyl group, or a pyridinyl group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a phenyl group, a naphthyl group, an anthracenyl group, a pyridinyl group, or a combination thereof.

In one or more embodiments, the compound represented by Formula 201 may be represented by Formula 201A:

Formula 201A

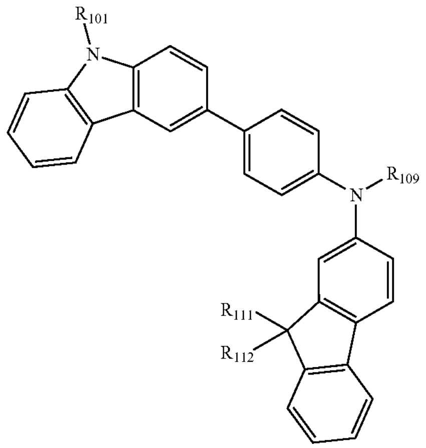

wherein, in Formula 201A, $R_{101}$, $R_{111}$, $R_{112}$, and $R_{109}$ may each independently be as described herein.

In one or more embodiments, the compound represented by Formula 201 and the compound represented by Formula 202 may include at least one of Compounds HT1 to HT20, but embodiments are not limited thereto:
HT1
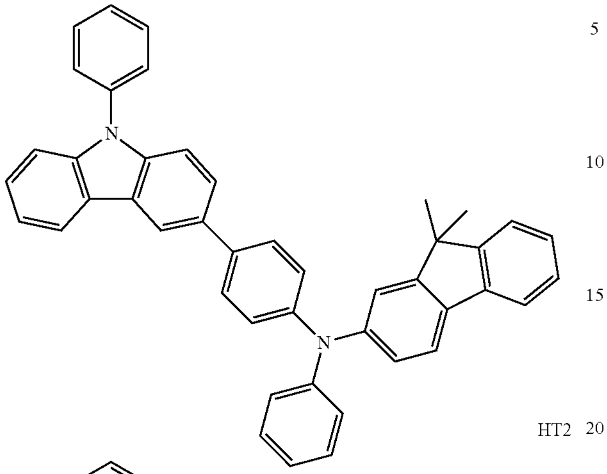
HT2
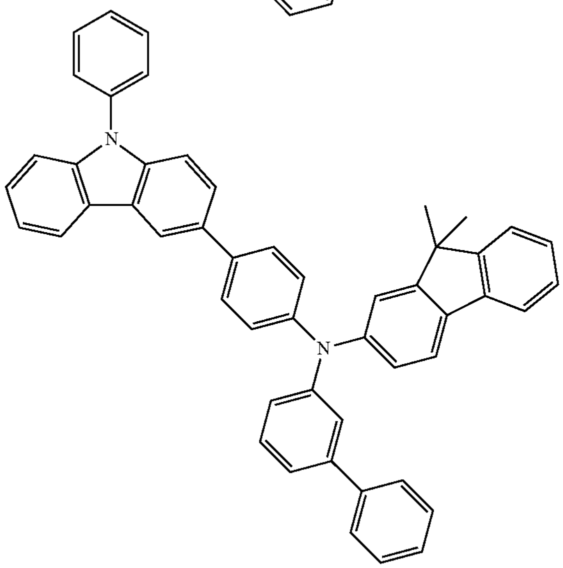
HT3
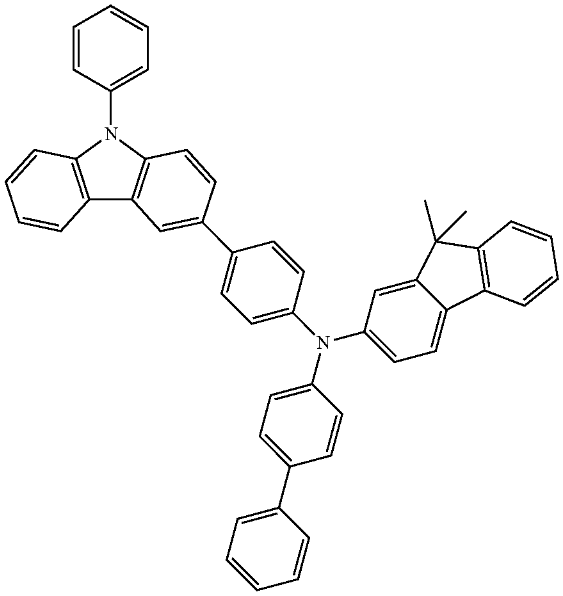
-continued
HT4
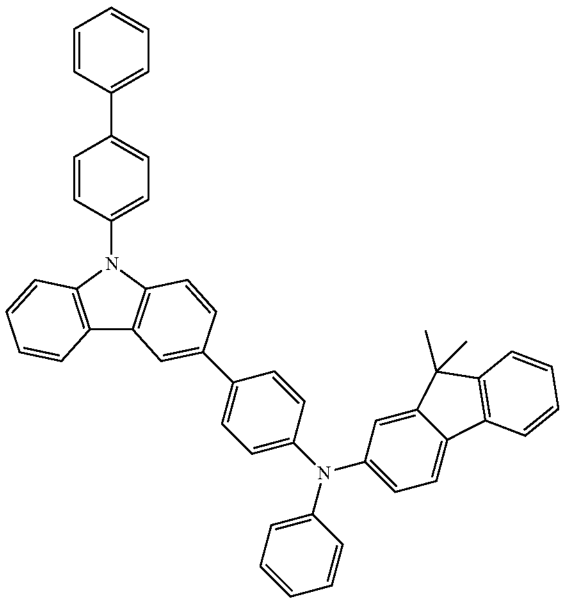
HT5
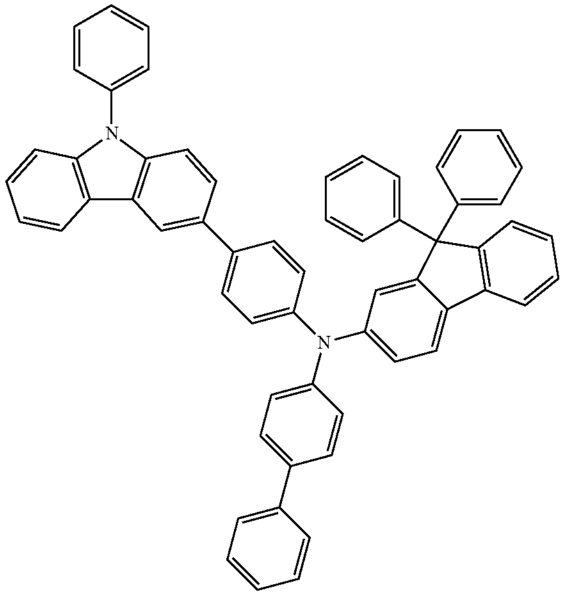

-continued
HT6
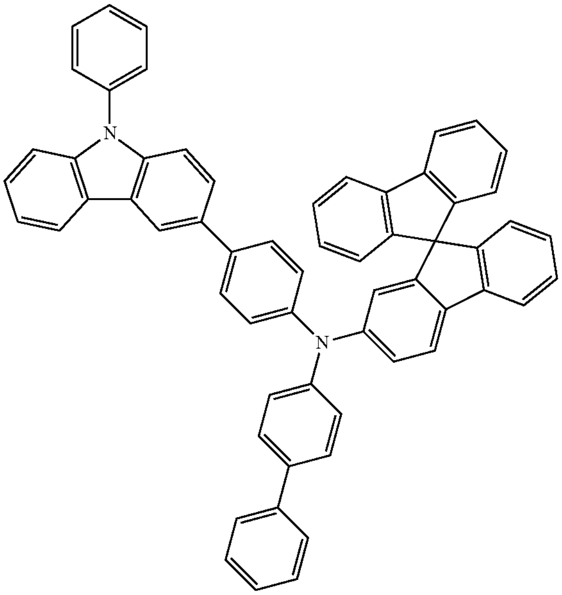
HT7
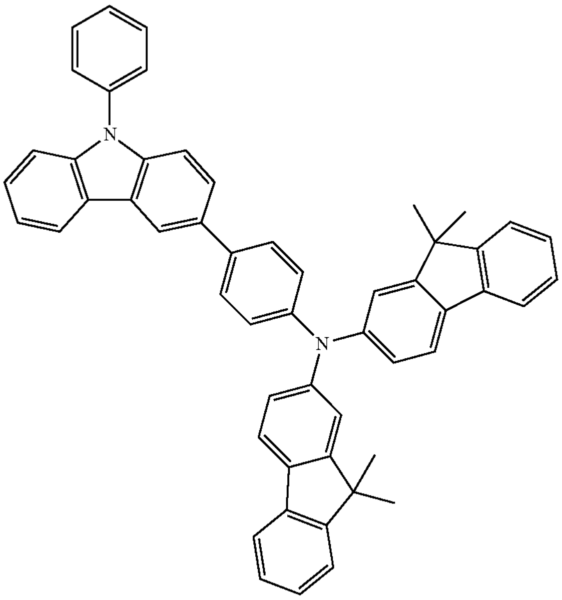
-continued
HT8
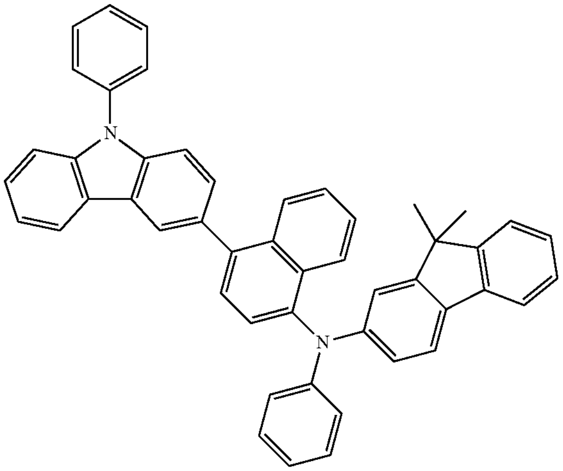
HT9
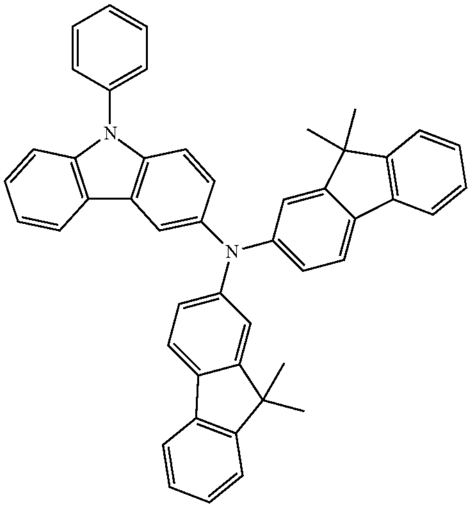
HT10
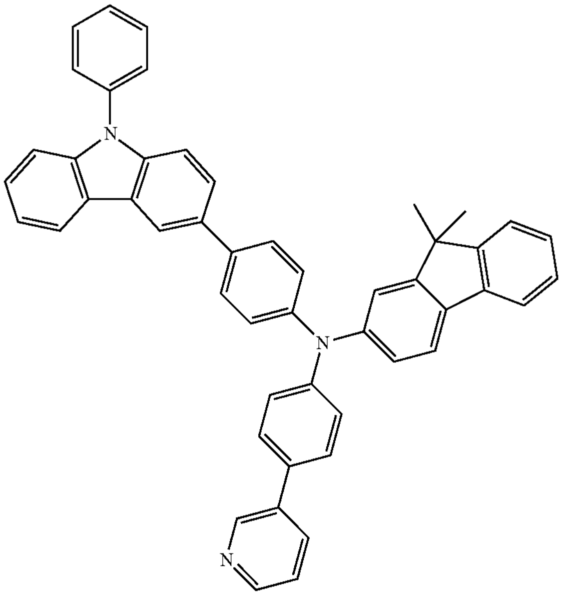

-continued
HT11
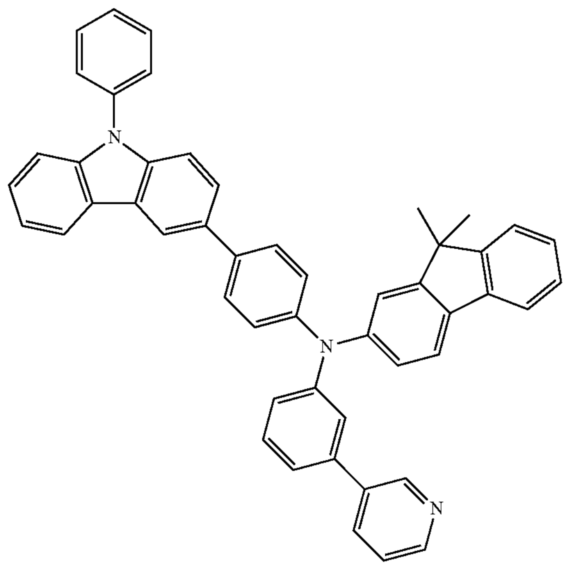
HT12
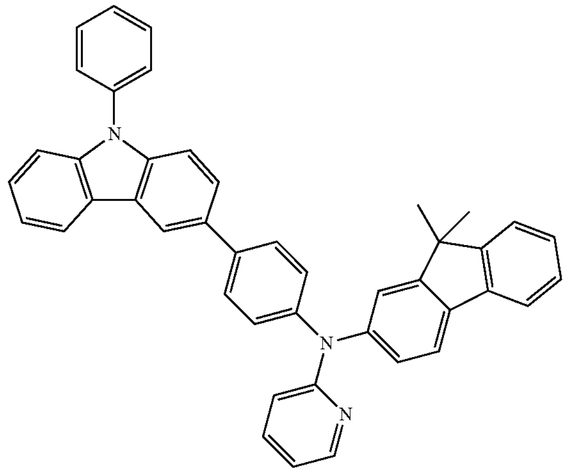
HT13
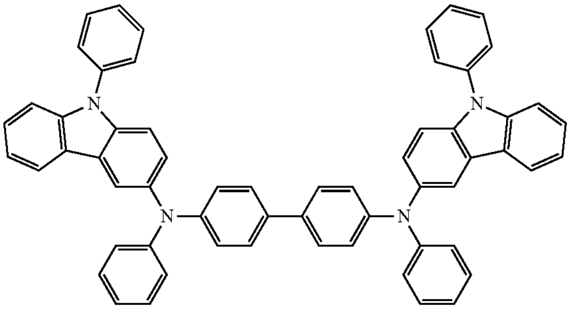
-continued
HT14
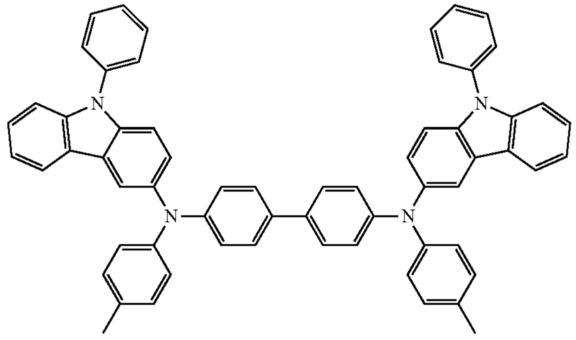
HT15
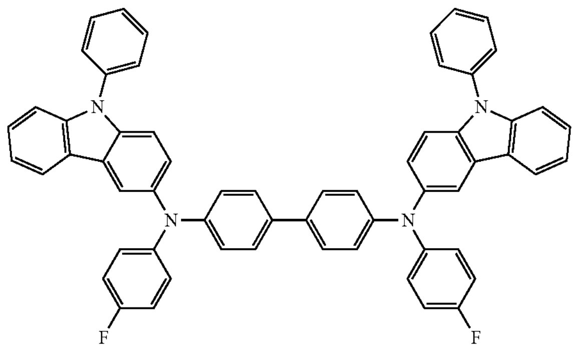
HT16
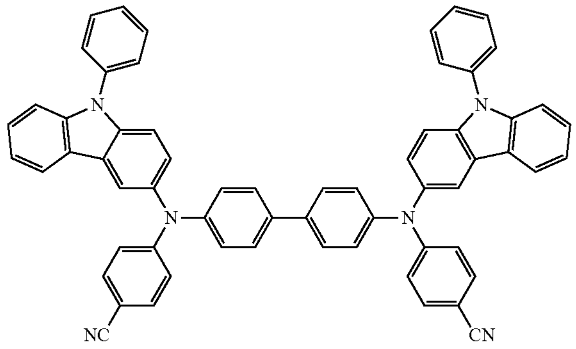
HT17
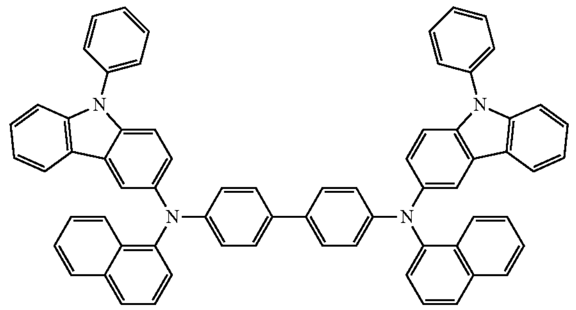

-continued

HT18

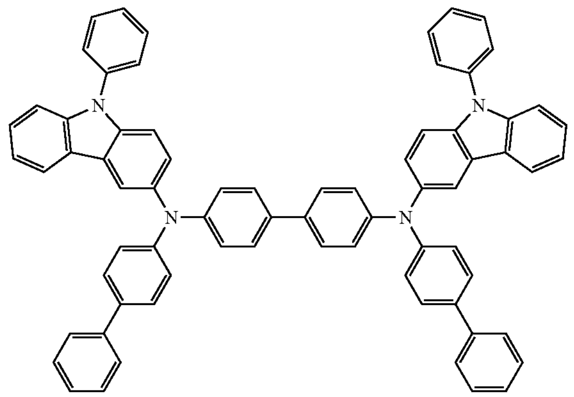

HT19

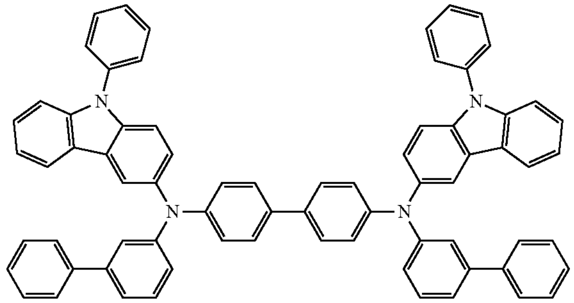

HT20

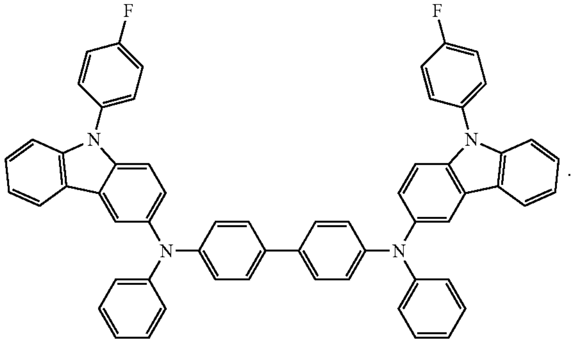

.

A thickness of the hole transport region may be about 100 Å to about 10,000 Å, for example, about 100 Å to about 1,000 Å. When the hole transport region includes at least one of a hole injection layer and a hole transport layer, a thickness of the hole injection layer may be about 100 Å to about 10,000 Å, for example, about 100 Å to about 1,000 Å, and a thickness of the hole transport layer may be about 50 Å to about 2,000 Å, for example, about 100 Å to about 1,500 Å. Without wishing to be bound to theory, when the thicknesses of the hole transport region, the hole injection layer, and/or the hole transport layer are within any of these ranges, excellent hole transport characteristics may be obtained without a substantial increase in driving voltage.

The hole transport region may further include, in addition to the materials as described herein, a charge-generation material for improving conductive properties. The charge-generation material may be homogeneously or non-homogeneously dispersed in the hole transport region.

The charge-generation material may be, for example, a p-dopant. The p-dopant may be one of a quinone derivative, a metal oxide, or a cyano group-containing compound. In one or more embodiments, examples of the p-dopant may include a quinone derivative, such as tetracyanoquinodimethane (TCNQ), 2,3,5,6-tetrafluoro-tetracyano-1,4-benzoquinonedimethane (F4-TCNQ), 1,3,4,5,7,8-hexafluorotetracyanonaphthoquinodimethane (F6-TCNNQ), or the like; a metal oxide such as a tungsten oxide, a molybdenum oxide, or the like; or a cyano group-containing compound such as Compound HT-D1, or the like, but embodiments are not limited thereto.

HT-D1

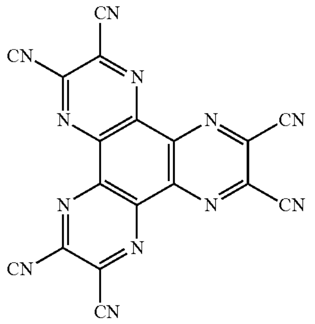

F4-TCNQ

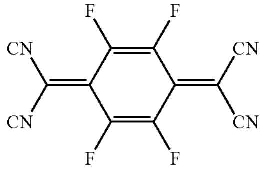

F6-TCNNQ

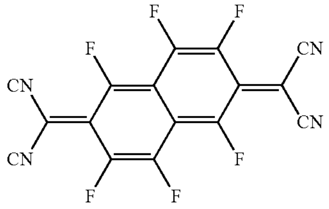

The hole transport region may further include a buffer layer.

The buffer layer may compensate for an optical resonance distance according to a wavelength of light emitted from the emission layer, and thus, efficiency may be improved.

When the hole transport region includes an electron blocking layer, a material for forming the electron blocking layer may include a material that is used in the hole transport region as described herein, a host material described herein, or a combination thereof. In one or more embodiments, when the hole transport region includes an electron blocking layer, a material for forming the electron blocking layer may include mCP or H-H1, which are described herein.

The emission layer may be formed on the hole transport region by using one or more suitable methods, such as vacuum deposition, spin coating, casting, and/or LB deposition. When the emission layer is formed by vacuum deposition or spin coating, although the deposition or coating conditions may vary according to a material that is used to form the emission layer, the deposition or coating conditions may be similar to those used in forming the hole injection layer.

The emission layer may include a host and a dopant, and the dopant may include at least one organometallic compound represented by Formula 1.

The host may include 1,3,5-tri(1-phenyl-1H-benzo[d]imidazol-2-yl)benzen (TPBi), 3-tert-butyl-9,10-di(naphth-2-yl) anthracene (TBADN), 9,10-di(naphthalen-2-yl)anthracene (ADN) (also referred to as “DNA”), 4,4'-bis(N-carbazolyl)-1,1'-biphenyl (CBP), 4,4'-bis(9-carbazolyl)-2,2'-dimethyl-biphenyl (CDBP), 1,3,5-tris(carbazol-9-yl)benzene (TCP), 1,3-bis(N-carbazolyl)benzene (mCP), Compound H50, Compound H51, Compound H52, Compound H-H1, Compound H-E43, or a combination thereof, but embodiments are not limited thereto:

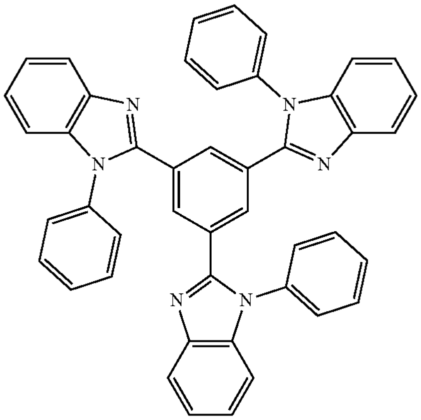

TPBi

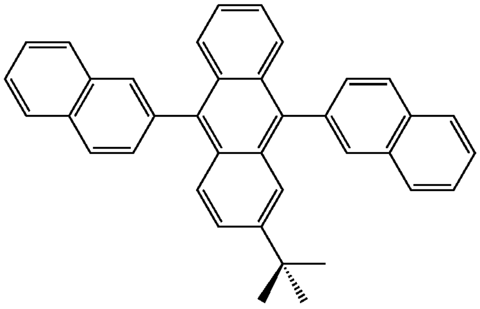

TBADN

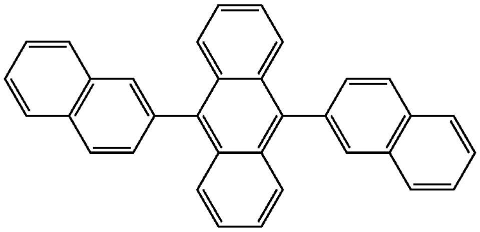

ADN

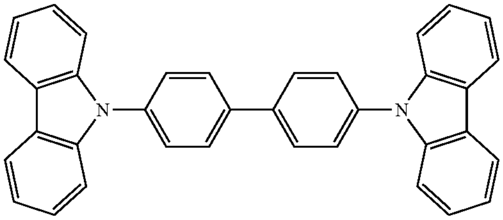

CBP

-continued

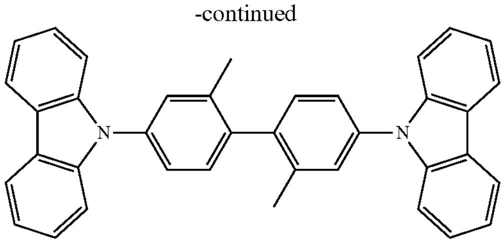

CDBP

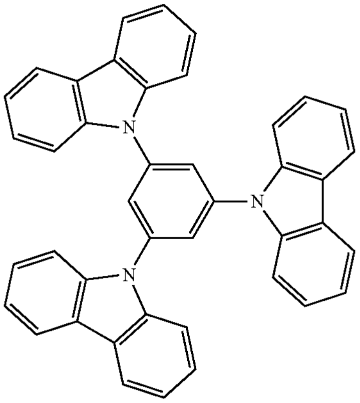

TCP

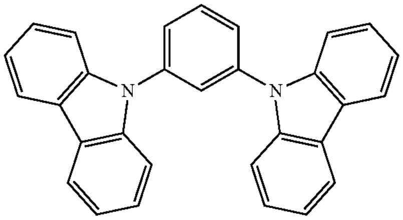

mCP

H50

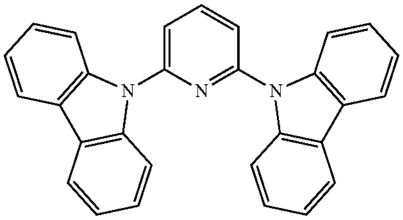

H51

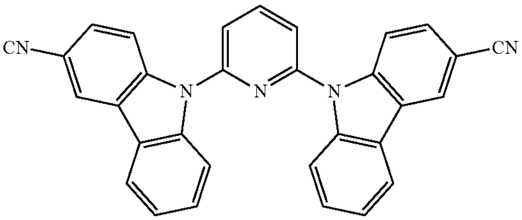

-continued

H52

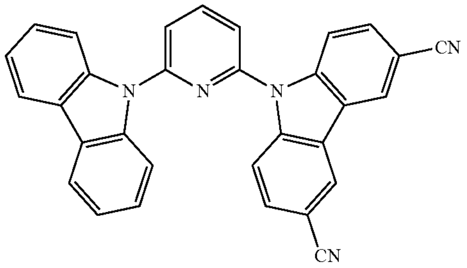

H-H1

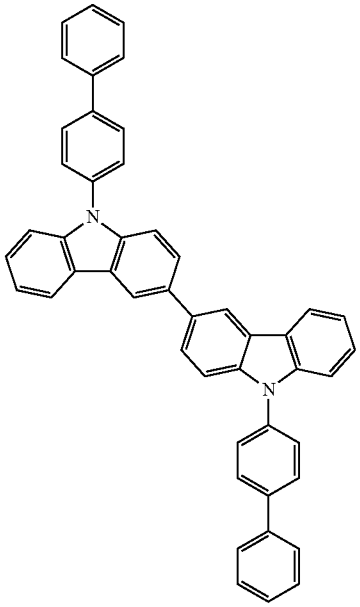

H-E43

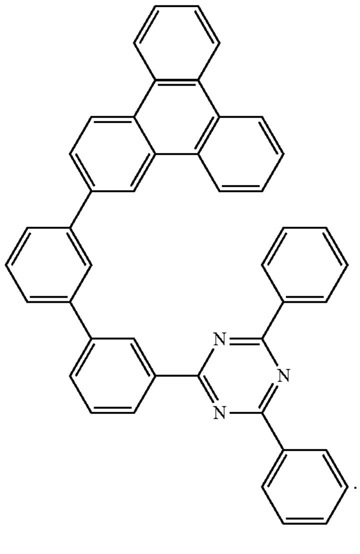

When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light, and various modifications are possible.

When the emission layer includes both a host and a dopant, an amount (for example, weight) of the dopant in the emission layer may be about 0.01 parts by weight to about 15 parts by weight, based on 100 parts by weight of the emission layer.

A thickness of the emission layer may be about 100 Å to about 1,000 Å, for example, about 200 Å to about 600 Å. Without wishing to be bound to theory, when the thickness of the emission layer is within the range, excellent light-emission characteristics may be obtained without a substantial increase in driving voltage.

Next, the electron transport region may be arranged on the emission layer.

The electron transport region may include a hole blocking layer, an electron transport layer, an electron injection layer, or a combination thereof.

In one or more embodiments, the electron transport region may have a hole blocking layer/electron transport layer/electron injection layer structure or an electron transport layer/electron injection layer structure. The electron transport layer may have a single-layered structure or a multi-layered structure including two or more different materials.

The conditions for forming a hole blocking layer, an electron transport layer, and an electron injection layer of the electron transport region may be understood by referring to the conditions for forming the hole injection layer.

When the electron transport region includes a hole blocking layer, the hole blocking layer may include, for example, at least one of 2,9-dimethyl-4,7-diphenyl-1,10-phenanthroline (BCP), 4,7-diphenyl-1,10-phenanthroline (Bphen), bis (2-methyl-8-quinolinolato-N1,O8)-(1,1'-biphenyl-4-olato) aluminum (BAlq), or a combination thereof, but embodiments are not limited thereto.

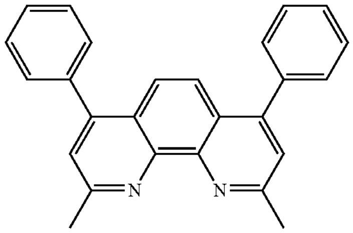

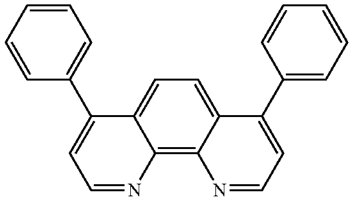

A thickness of the hole blocking layer may be about 20 Å to about 1,000 Å, for example, about 30 Å to about 300 Å. Without wishing to be bound to theory, when the thickness of the hole blocking layer is within this range, excellent hole blocking characteristics may be obtained without a substantial increase in driving voltage.

The electron transport layer may include at least one of 2,9-dimethyl-4,7-diphenyl-1,10-phenanthroline (BCP), 4,7-diphenyl-1,10-phenanthroline (Bphen), tris(8-hydroxy-quinolinato)aluminum ($Alq_3$), bis(2-methyl-8-quinolinolato-N1,O8)-(1,1'-biphenyl-4-olato)aluminum (BAlq), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), or a combination thereof, but embodiments are not limited thereto.

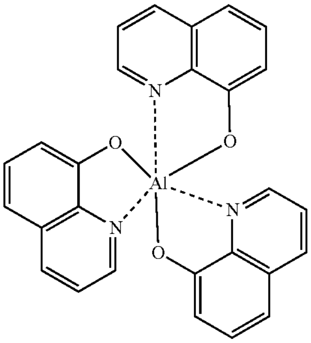
Alq3
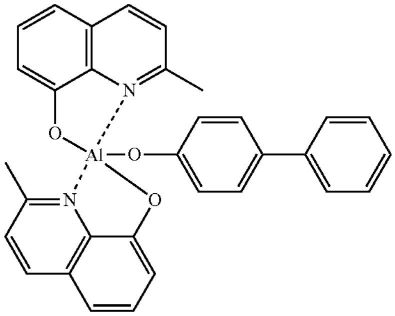
BAlq
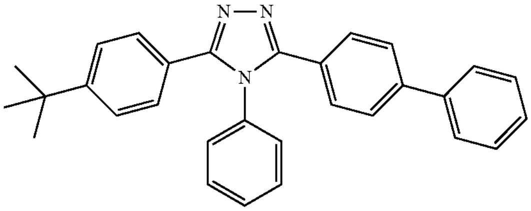
TAZ
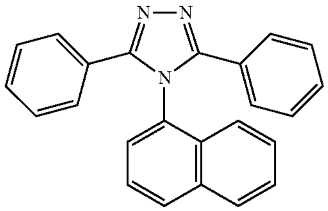
NTAZ
In one or more embodiments, the electron transport layer may include one of Compounds ET1 to ET25, or a combination thereof, but embodiments are not limited thereto.
ET1
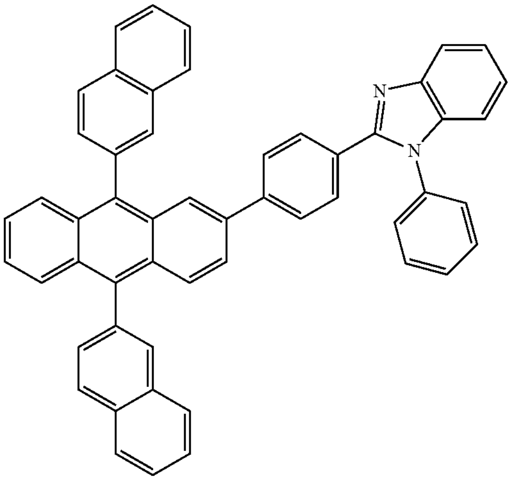
ET2
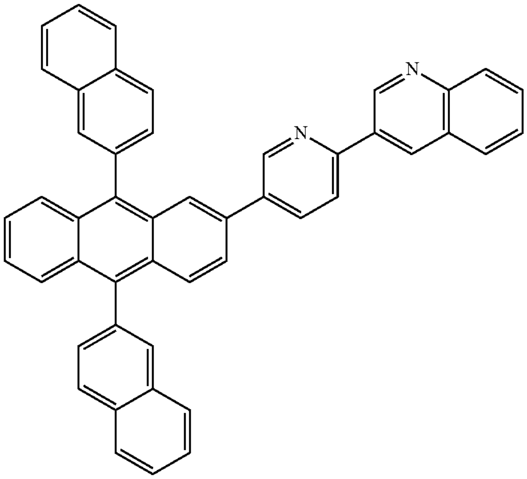
ET3
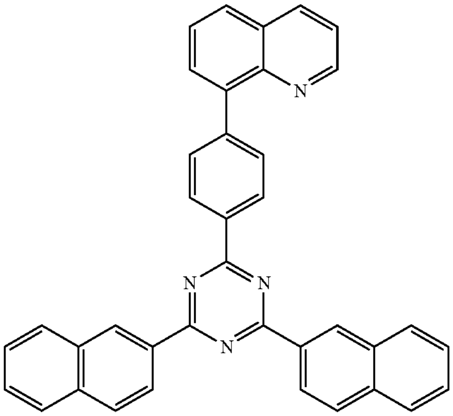

-continued
ET4
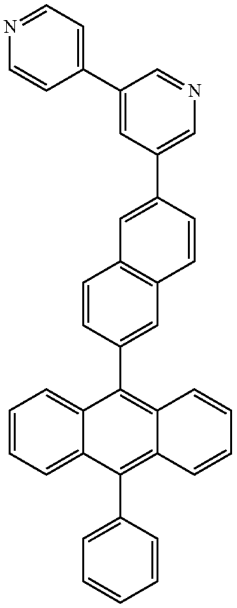
ET5
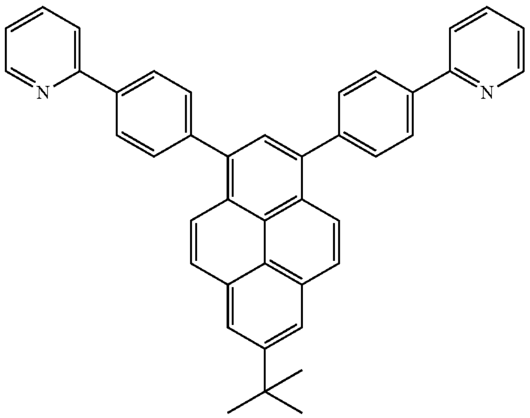
ET6
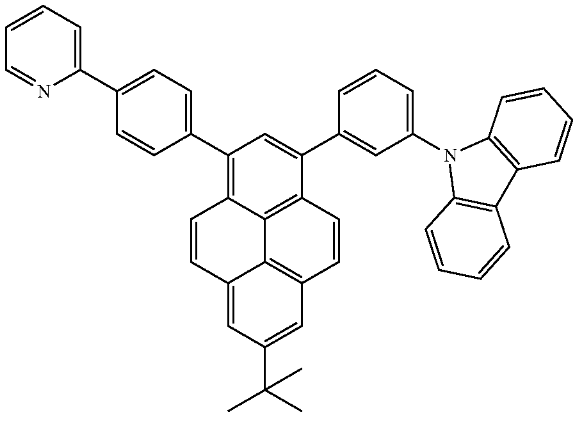
-continued
ET7
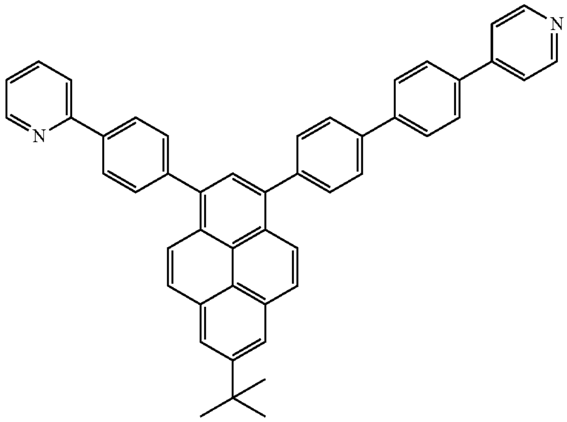
ET8
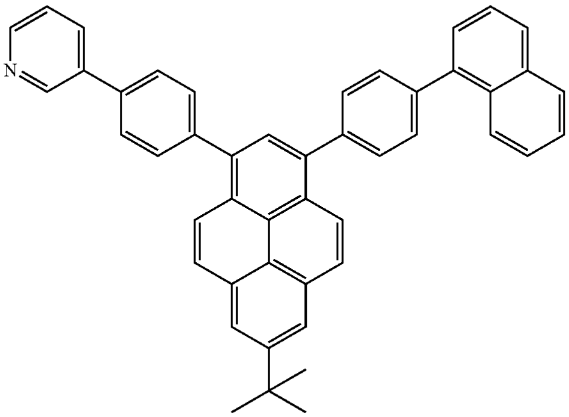
ET9
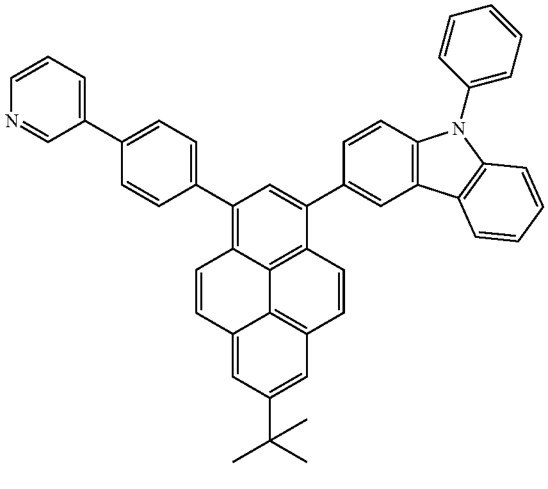

-continued
ET10
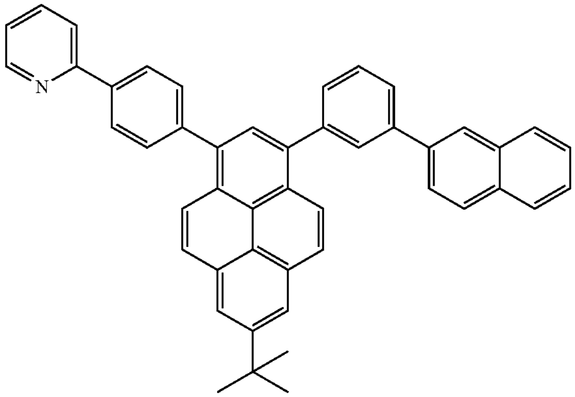
ET11
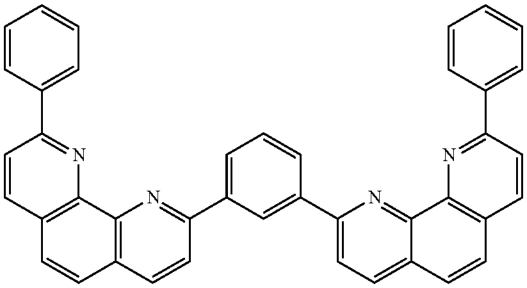
ET12
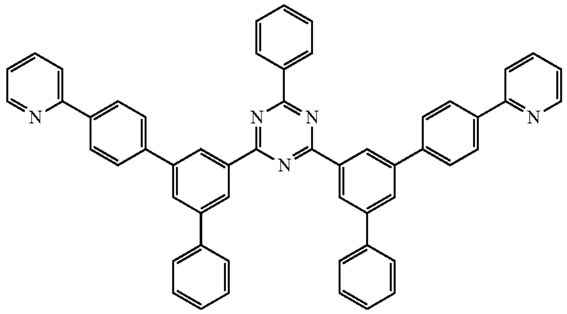
ET13
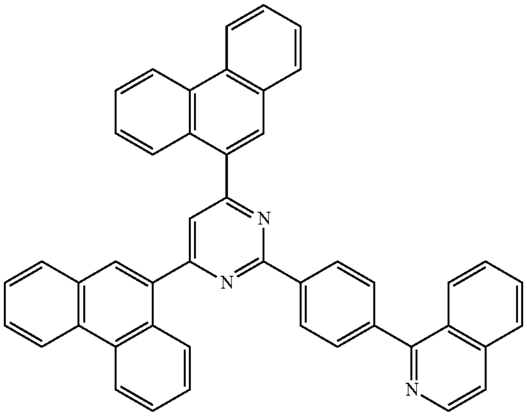
-continued
ET14
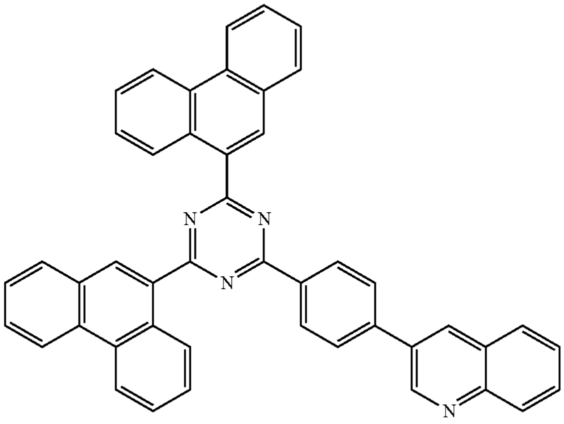
ET15
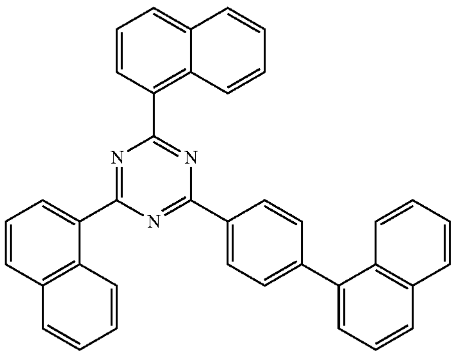
ET16
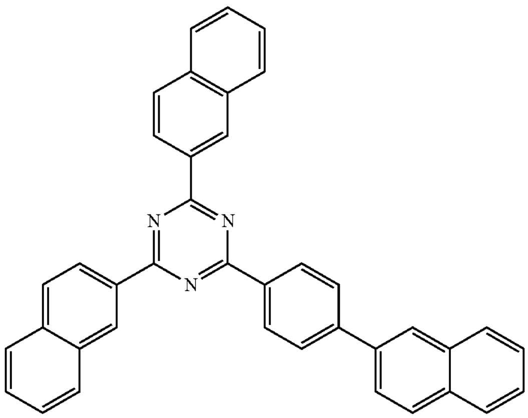

-continued
ET17
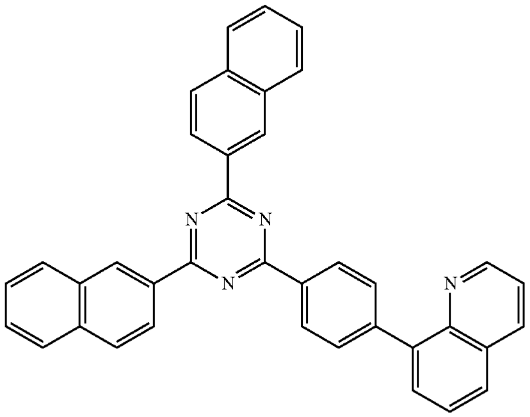
ET18
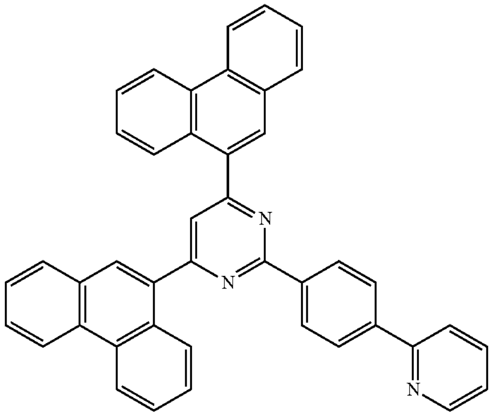
ET19
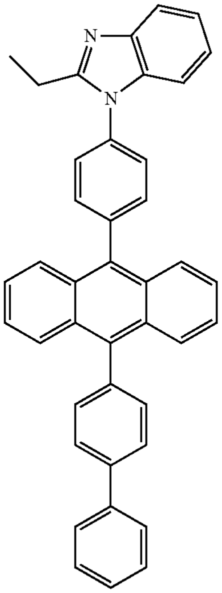
-continued
ET20
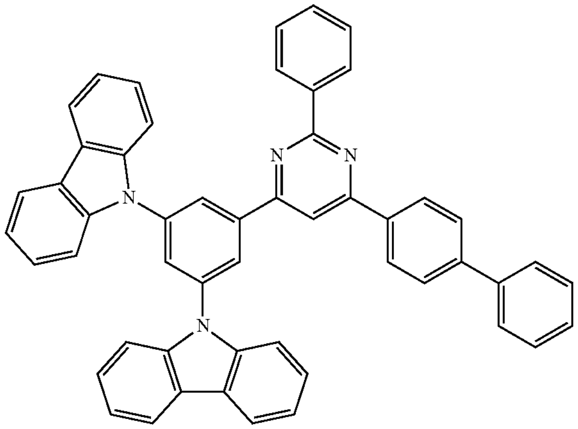
ET21
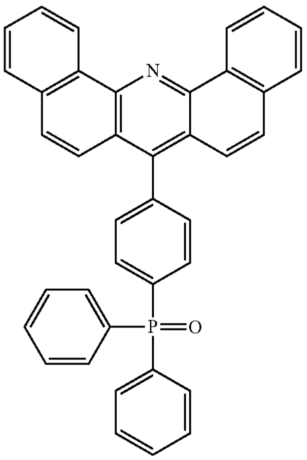
ET22
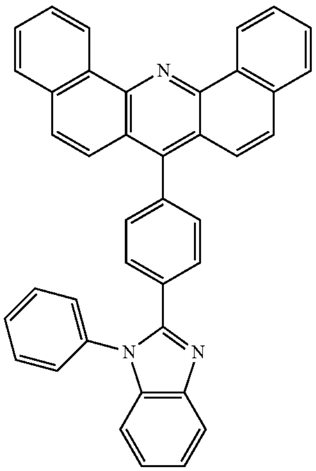

-continued

ET23

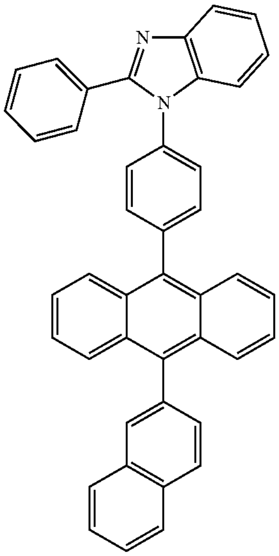

ET24

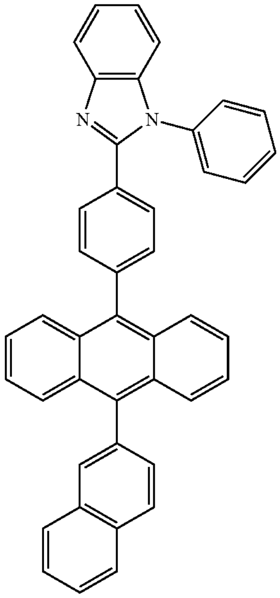

ET25

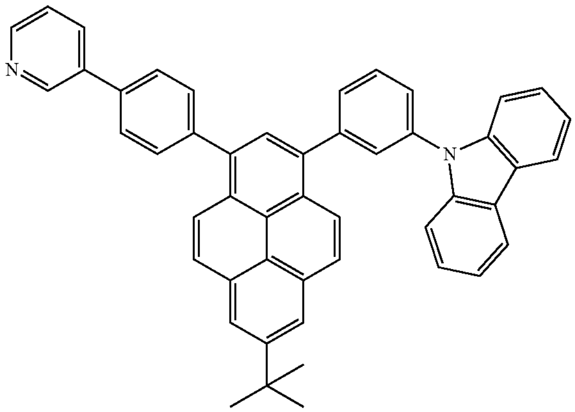

A thickness of the electron transport layer may be about 100 Å to about 1,000 Å, for example, about 150 Å to about 500 Å. Without wishing to be bound to theory, when the thickness of the electron transport layer is within these ranges, excellent electron transport characteristics may be obtained without a substantial increase in driving voltage.

The electron transport layer may include, in addition to the materials described above, a metal-containing material.

The metal-containing material may include a Li complex. The Li complex may include, for example, at least one of Compounds ET-D1 (LiQ) or ET-D2, but embodiments are not limited thereto.

ET-D1

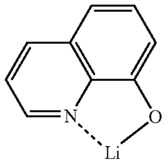

ET-D2

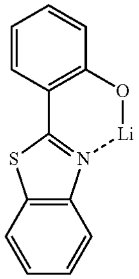

The electron transport region may include an electron injection layer that facilitates electron injection from the second electrode 19.

The electron injection layer may include at least one of LiF, NaCl, CsF, $Li_2O$, BaO, or a combination thereof, but embodiments are not limited thereto.

A thickness of the electron injection layer may be about 1 Å to about 100 Å, for example, about 3 Å to about 90 Å. Without wishing to be bound to theory, when the thickness of the electron injection layer is within the range described above, satisfactory electron injection characteristics may be obtained without a substantial increase in driving voltage.

The second electrode 19 may be located on or arranged on the organic layer 15. The second electrode 19 may be a cathode. A material for forming the second electrode 19 may be a metal, an alloy, an electrically conductive compound, or a combination thereof, which have a relatively low work function. Examples of the material for forming the second electrode 19 may include lithium (Li), silver (Ag), magnesium (Mg), aluminum (Al), aluminum-lithium (Al—Li), calcium (Ca), magnesium-indium (Mg—In), and magnesium-silver (Mg—Ag). In one or more embodiments, to manufacture a top-emission type light-emitting device, a transmissive electrode formed using ITO or IZO may be used as the second electrode 19.

Hereinbefore, the organic light-emitting device has been described with reference to the FIGURE, but embodiments are not limited thereto.

According to one or more embodiments, an electronic apparatus may include the organic light-emitting device. Therefore, also provided is an electronic apparatus including the organic light-emitting device. The electronic apparatus may include, for example, a display, lighting, a sensor, or the like, but embodiments are not limited thereto.

According to one or more embodiments, also provided is a diagnostic composition including at least one organometallic compound represented by Formula 1.

Since the organometallic compound represented by Formula 1 provides a high luminescence efficiency, the diagnostic composition including the organometallic compound may have a high diagnostic efficiency.

The diagnostic composition may be used in various applications including a diagnosis kit, a diagnosis reagent, a biosensor, a biomarker, or the like, but embodiments are not limited thereto.

The term "$C_1$-$C_{60}$ alkyl group" as used herein refers to a linear or branched saturated aliphatic hydrocarbon monovalent group having 1 to 60 carbon atoms, and the term "$C_1$-$C_{60}$ alkylene group" as used herein refers to a divalent group having the same structure as the $C_1$-$C_{60}$ alkyl group.

Non-limiting examples of the $C_1$-$C_{60}$ alkyl group, the $C_1$-$C_{20}$ alkyl group, and/or the $C_1$-$C_{10}$ alkyl group may include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, or the like, each unsubstituted or substituted with at least one of a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, or a combination thereof. In one or more embodiments, Formula 9-33 is a branched $C_6$ alkyl group, for example, a tert-butyl group that is substituted with two methyl groups.

The term "$C_1$-$C_{60}$ alkoxy group" as used herein refers to a monovalent group represented by —$OA_{101}$ (wherein $A_{101}$ is the $C_1$-$C_{60}$ alkyl group). Non-limiting examples thereof may include a methoxy group, an ethoxy group, a propoxy group, a butoxy group, a pentoxy group, or the like.

The term "$C_1$-$C_{60}$ alkylthio group" as used herein refers to a monovalent group represented by —$SA_{102}$ (wherein $A_{102}$ is the $C_1$-$C_{60}$ alkyl group).

The term "$C_2$-$C_{60}$ alkenyl group" as used herein has a structure including at least one carbon-carbon double bond in the middle or at the terminus of the $C_2$-$C_{60}$ alkyl group. Non-limiting examples thereof include an ethenyl group, a propenyl group, a butenyl group, or the like. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein has a structure including at least one carbon-carbon triple bond in the middle or at the terminus of the $C_2$-$C_{60}$ alkyl group. Non-limiting examples thereof include an ethynyl group, a propynyl group, or the like. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms, and the term "$C_3$-$C_{10}$ cycloalkylene group" as used herein refers to a divalent group having the same structure as the $C_3$-$C_{10}$ cycloalkyl group.

Non-limiting examples of the $C_3$-$C_{10}$ cycloalkyl group include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, a bicyclo[2.2.2]octyl group, or the like.

The term "$C_1$-$C_{10}$ heterocycloalkyl group" as used herein refers to a monovalent cyclic group that includes at least one heteroatom selected from N, O, P, Si, S, Se, Ge, and B as a ring-forming atom, and 1 to 10 carbon atoms, and the term "$C_1$-$C_{10}$ heterocycloalkylene group" refers to a divalent group having the same structure as the $C_1$-$C_{10}$ heterocycloalkyl group.

Non-limiting examples of the $C_1$-$C_{10}$ heterocycloalkyl group include a silolanyl group, a silinanyl group, a tetrahydrofuranyl group, a tetrahydro-2H-pyranyl group, a tetrahydrothiophenyl group, or the like.

The term "$C_3$-$C_{10}$ cycloalkenyl group" as used herein refers to a monovalent cyclic group that has 3 to 10 carbon atoms and at least one carbon-carbon double bond in its ring, and is not aromatic. Non-limiting examples thereof include a cyclopentenyl group, a cyclohexenyl group, a cycloheptenyl group, or the like. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has at least one heteroatom selected from N, O, P, Si, S, Se, Ge, and B as a ring-forming atom, 1 to 10 carbon atoms, and at least one double bond in its ring. Non-limiting examples of the $C_1$-$C_{10}$ heterocycloalkenyl group include a 2,3-dihydrofuranyl group, a 2,3-dihydrothiophenyl group, or the like. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group that includes a carbocyclic aromatic ring system having 6 to 60 carbon atoms, and the term "$C_6$-$C_{60}$ arylene group" as used herein refers to a divalent group that includes a carbocyclic aromatic ring system having 6 to 60 carbon atoms. Non-limiting examples of the $C_6$-$C_{60}$ aryl group include a phenyl group, a naphthyl group, an anthracenyl group, a phenanthrenyl group, a pyrenyl group, a chrysenyl group, or the like. When the $C_6$-$C_{60}$ aryl group and the $C_6$-$C_{60}$ arylene group each include at least two rings, the at least two rings may be fused to each other.

The term "$C_7$-$C_{60}$ alkyl aryl group" as used herein refers to a $C_6$-$C_{60}$ aryl group that is substituted with at least one $C_1$-$C_{60}$ alkyl group. The term "$C_7$-$C_{60}$ aryl alkyl group" as used herein refers to a $C_1$-$C_{60}$ alkyl group that is substituted with at least one $C_6$-$C_{60}$ aryl group.

The term "$C_1$-$C_{60}$ heteroaryl group" as used herein refers to a monovalent group that includes a cyclic aromatic system having at least one heteroatom selected from N, O, P, Si, S, Se, Ge, and B as a ring-forming atom, and 1 to 60 carbon atoms. The term "$C_1$-$C_{60}$ heteroarylene group" as used herein refers to a divalent group that includes a cyclic aromatic system having at least one heteroatom selected from N, O, P, Si, S, Se, Ge, and B as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, an isoquinolinyl group, or the like. When the $C_1$-$C_{60}$ heteroaryl group and the $C_1$-$C_{60}$ heteroarylene group each include at least two rings, the at least two rings may be fused to each other.

The term "$C_2$-$C_{60}$ alkyl heteroaryl group" as used herein refers to a $C_1$-$C_{60}$ heteroaryl group that is substituted with at least one $C_1$-$C_{60}$ alkyl group. The term "$C_2$-$C_{60}$ heteroaryl alkyl group" as used herein refers to a $C_1$-$C_{60}$ alkyl group that is substituted with at least one $C_1$-$C_{60}$ aryl group.

The term "$C_6$-$C_{60}$ aryloxy group" as used herein indicates —$OA_{104}$ (wherein $A_{104}$ is the $C_6$-$C_{60}$ aryl group), and the term "$C_6$-$C_{60}$ arylthio group" as used herein indicates —$SA_{105}$ (wherein $A_{105}$ is the $C_6$-$C_{60}$ aryl group).

The term "$C_1$-$C_{60}$ heteroaryloxy group" as used herein indicates —$OA_{106}$ (wherein $A_{106}$ is the $C_1$-$C_{60}$ heteroaryl group), and the term "$C_1$-$C_{60}$ heteroarylthio group" as used herein indicates —$SA_{107}$ (wherein $A_{107}$ is the $C_1$-$C_{60}$ heteroaryl group).

The term "monovalent non-aromatic condensed polycyclic group" as used herein refers to a monovalent group having two or more rings condensed with each other, only carbon atoms (for example, 8 to 60 carbon atoms) as ring-forming atoms, and no aromaticity in its molecular structure. Non-limiting examples of the monovalent non-aromatic condensed polycyclic group include a fluorenyl group or the like. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group having two or more rings condensed with each other, at least one heteroatom selected from N, O, P, Si, S, Se, Ge, and B, other than carbon atoms (for example, having 1 to 60 carbon atoms) as ring-forming atoms, and no aromaticity in its molecular structure. Non-limiting examples of the monovalent non-aromatic condensed heteropolycyclic group include a carbazolyl group or the like. The term "divalent non-aromatic condensed heteropolycyclic group" as used herein refers to a divalent group having the same structure as a monovalent non-aromatic condensed heteropolycyclic group.

The term "$C_5$-$C_{30}$ carbocyclic group" as used herein refers to a saturated or unsaturated cyclic group including 5 to 30 carbon atoms only as ring-forming atoms. The $C_5$-$C_{30}$ carbocyclic group may be a monocyclic group or a polycyclic group. The "$C_5$-$C_{30}$ carbocyclic group (that is unsubstituted or substituted with at least one $R_{10a}$)" as used herein may include, for example, an adamantane group, a norbornene group, a bicyclo[1.1.1]pentane group, a bicyclo[2.1.1]hexane group, a bicyclo[2.2.1]heptane group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a fluorene group, or the like (each unsubstituted or substituted with at least one $R_{10a}$).

The term "$C_1$-$C_{30}$ heterocyclic group" as used herein refers to a saturated or unsaturated cyclic group having at least one heteroatom selected from N, O, P, Si, S, Se, Ge, and B, other than 1 to 30 carbon atoms, as ring-forming atoms. The $C_1$-$C_{30}$ heterocyclic group may be a monocyclic group or a polycyclic group. The "$C_1$-$C_{30}$ heterocyclic group (that is unsubstituted or substituted with at least one $R_{10a}$)" may include, for example, a thiophene group, a furan group, a pyrrole group, a silole group, a borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, or the like (each unsubstituted or substituted with at least one $R_{10a}$).

In one or more embodiments, examples of the "$C_5$-$C_{30}$ carbocyclic group" and the "$C_1$-$C_{30}$ heterocyclic group" include i) a first ring, ii) a second ring, iii) a condensed ring system in which two or more first rings are condensed with each other, iv) a condensed ring system in which two or more second rings are condensed with each other, or v) a condensed ring system in which at least one first ring and at least one second ring are condensed with each other, the first ring may be a cyclopentane group, a cyclopentene group, a furan group, a thiophene group, a pyrrole group, a silole group, a borole group, a phosphole group, a germole group, a selenophene group, an oxazole group, an isoxazole group, an oxadiazole group, an oxatriazole group, a thiazole group, an isothiazole group, a thiadiazole group, a thiatriazole group, a pyrazole group, an imidazole group, a triazole group, a tetrazole group, an azasilole group, a diazasilole group, or a triazasilole group, and the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

The terms "fluorinated $C_1$-$C_{60}$ alkyl group" (or, a fluorinated $C_1$-$C_{20}$ alkyl group or the like), "fluorinated $C_3$-$C_{10}$ cycloalkyl group", "fluorinated $C_1$-$C_{10}$ heterocycloalkyl group," and "fluorinated phenyl group" as used herein respectively refer to a $C_1$-$C_{60}$ alkyl group (or, a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group. In one or more embodiments, the term "fluorinated $C_1$ alkyl group" (that is, a fluorinated methyl group) includes —$CF_3$, —$CF_2H$, and —$CFH_2$. The "fluorinated $C_1$-$C_{60}$ alkyl group" (or, a fluorinated $C_1$-$C_{20}$ alkyl group or the like), the "fluorinated $C_3$-$C_{10}$ cycloalkyl group", the "fluorinated $C_1$-$C_{10}$ heterocycloalkyl group", or the "fluorinated phenyl group" may be i) a fully fluorinated $C_1$-$C_{60}$ alkyl group (or, a fully fluorinated $C_1$-$C_{20}$ alkyl group or the like), a fully fluorinated $C_3$-$C_{10}$ cycloalkyl group, a fully fluorinated $C_1$-$C_{10}$ heterocycloalkyl group, or a fully fluorinated phenyl group, wherein, in each group, all hydrogen atoms included therein are substituted with a fluoro group, or ii) a partially fluorinated $C_1$-$C_{60}$ alkyl group (or, a partially fluorinated $C_1$-$C_{20}$ alkyl group or the like), a partially fluorinated $C_3$-$C_{10}$ cycloalkyl group, a partially fluorinated $C_1$-$C_{10}$ heterocycloalkyl group, or a partially fluorinated phenyl group, wherein, in each group, at least one but not all of the hydrogen atoms included therein are substituted with a fluoro group.

The terms "deuterated $C_1$-$C_{60}$ alkyl group" (or, a deuterated $C_1$-$C_{20}$ alkyl group or the like), "deuterated $C_3$-$C_{10}$ cycloalkyl group", "deuterated $C_1$-$C_{10}$ heterocycloalkyl group," and "deuterated phenyl group" as used herein respectively refer to a $C_1$-$C_{60}$ alkyl group (or, a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one deuterium atom. In one or more embodiments, the "deuterated $C_1$ alkyl group" (that is, a deuterated methyl group) may include —$CD_3$, —$CD_2H$, and —$CDH_2$, and non-limiting examples of the "deuterated $C_3$-$C_{10}$ cycloalkyl group" include Formula 10-501 or the like. The "deuterated $C_1$-$C_{60}$ alkyl group" (or, the deuterated $C_1$-$C_{20}$ alkyl group or the like), the "deuterated $C_3$-Cia cycloalkyl group", the "deuterated $C_1$-$C_{10}$ heterocycloalkyl group", or the "deuterated phenyl group" may be i) a fully deuterated $C_1$-$C_{60}$ alkyl group (or, a fully deuterated $C_1$-$C_{20}$ alkyl group or the like), a fully deuterated $C_3$-$C_{10}$ cycloalkyl group, a fully deuterated $C_1$-$C_{10}$ heterocycloalkyl group, or a fully deuterated phenyl group, in which, in each group, all hydrogen atoms included therein are substituted with deuterium, or ii) a partially deuterated $C_1$-$C_{60}$ alkyl group (or, a partially deuterated $C_1$-$C_{20}$ alkyl group or the like), a partially deuterated $C_3$-$C_{10}$ cycloalkyl group, a partially deuterated $C_1$-$C_{10}$ heterocycloalkyl group, or a partially deuterated phenyl group, in which, in each group, at least one hydrogen atom but not all hydrogen atoms included therein are substituted with a deuterium atom.

The term "($C_1$-$C_{20}$ alkyl)'X' group" as used herein refers to a 'X' group that is substituted with at least one $C_1$-$C_{20}$ alkyl group. In one or more embodiments, the term "($C_1$-$C_{20}$ alkyl)$C_3$-$C_{10}$ cycloalkyl group" as used herein refers to a $C_3$-$C_{10}$ cycloalkyl group that is substituted with at least one $C_1$-$C_{20}$ alkyl group, and the term "($C_1$-$C_{20}$ alkyl)phenyl group" as used herein refers to a phenyl group that is substituted with at least one $C_1$-$C_{20}$ alkyl group. Non-limiting examples of the ($C_1$ alkyl)phenyl group include a toluyl group or the like.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene 5,5-dioxide group" as used herein respectively refer to hetero rings having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group", in which, in each group, at least one ring-forming carbon atom thereof is substituted with N.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be:

deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, $P(Q_{28})(Q_{29})$, or a combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or a combination thereof.

$Q_1$ to $Q_9$, $Q_{11}$ to $Q_{19}$, $Q_{21}$ to $Q_{29}$, and $Q_{31}$ to $Q_{39}$ as used herein may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

In one or more embodiments, $Q_1$ to $Q_9$, $Q_{11}$ to $Q_{19}$, $Q_{21}$ to $Q_{29}$, and $Q_{31}$ to $Q_{39}$ as used herein may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, a $C_1$-$C_{20}$ alkyl group, a phenyl group, or a combination thereof.

Hereinafter, compounds and organic light-emitting devices according to one or more embodiments will be described in further detail with reference to Synthesis Examples and Examples, but embodiments are not limited thereto. The wording "B was used instead of A" used in describing Synthesis Examples means that an amount of B used was identical to an amount of A used based on molar equivalence.

EXAMPLES

Synthesis Example 1 (Compound Ir1)

Synthesis of Compound Ir1-C

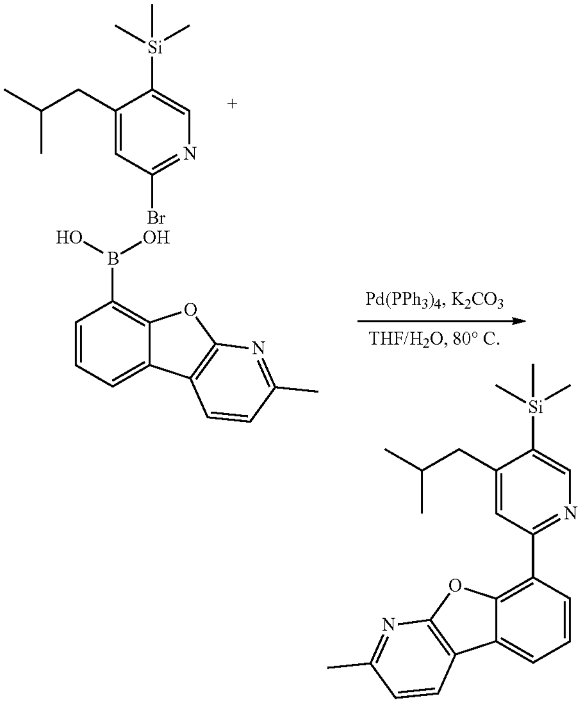

Ir1-C 2-bromo-4-isobutyl-5-(trimethylsilyl)pyridine (5.00 grams (g), 17.54 millimoles (mmol)), (2-methylbenzofuro[2,3-b]pyridin-8-yl)boronic acid (3.98 g, 17.54 mmol), tetrakis(triphenylphosphine)palladium(0) ($Pd(PPh_3)_4$) (1.01 g, 0.88 mmol), and $K_2CO_3$ (7.27 g, 52.62 mmol) were mixed with 90 milliliters (mL) of tetrahydrofuran (THF) and 30 mL of deionized (DI) water, and then stirred while heating at reflux for 18 hours. The temperature was then allowed to lower to room temperature and methylene chloride (MC) was used to extract an organic layer from the reaction mixture. The organic layer was separated and dried with anhydrous magnesium sulfate ($MgSO_4$), filtered to remove the solids, and the solvent was removed under a reduced pressure. The residue was purified by column chromatography using ethyl acetate (EA):hexane (1:4, v/v) a eluents to obtain 5.50 g (81%) of Compound Ir1-C.

Synthesis of Compound Ir1-B

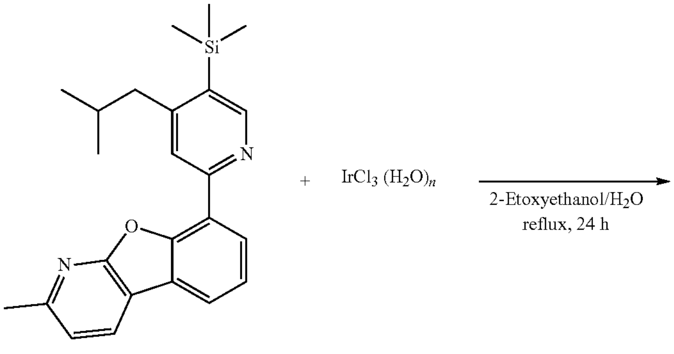

Ir1-C

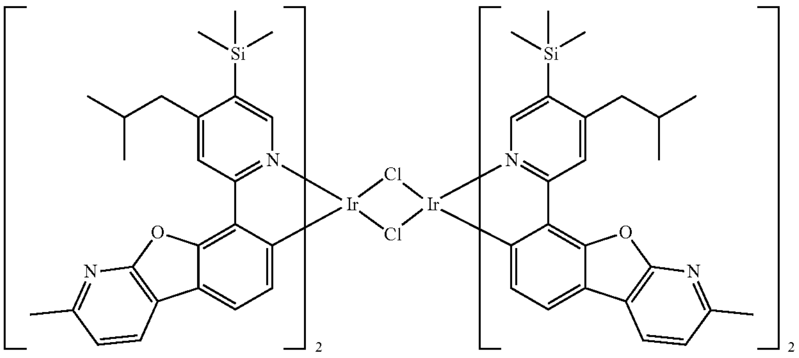

Ir1-B

Compound Ir1-C (5.5 g, 14.15 mmol) and iridium chloride trihydrate ($IrCl_3(H_2O)$, n=3) (2.50 g, 7.08 mmol) were mixed with 90 mL of 2-ethoxyethanol and 30 mL of DI water, and then stirred while heating at reflux for 24 hours. The temperature was then allowed to lower to room temperature. A solid thus produced was separated by filtration, washed sufficiently with water, methanol, and hexane, in this stated order, and then dried in a vacuum oven to obtain 5.61 g (44%) of Compound Ir1-B.

Synthesis of Compound Ir1-A

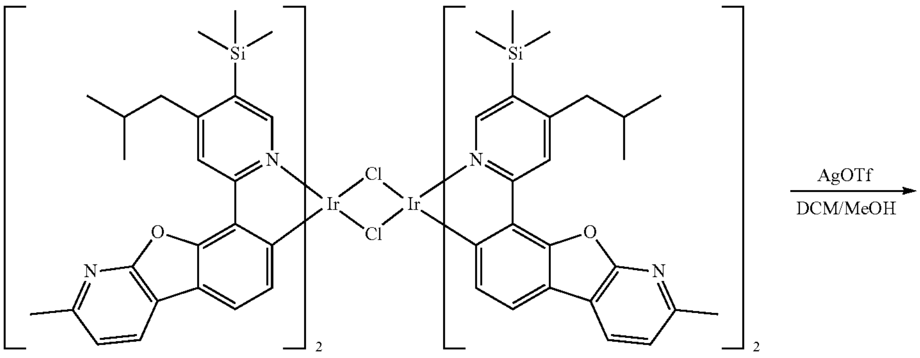

Ir1-B

-continued

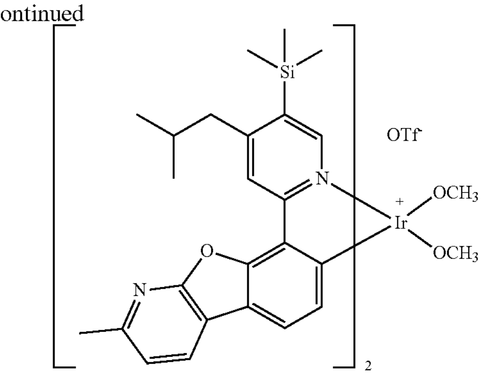

Ir1-A

Compound Ir1-B (5.61 g, 2.80 mmol) was mixed with 90 mL of MC, and a separate mixture of silver trifluoromethanesulfonate (AgOTf) (6.86 g, 5.89 mmol) dissolved in 30 mL of methanol (MeOH) was added thereto. Afterwards, the reaction mixture was stirred for 18 hours at room temperature while light was blocked by an aluminum foil, followed by filtration through a Celite plug to remove a resultant solid from the reaction. A solid (Compound Ir1-A) was obtained by removing the solvents under reduced pressure from a filtrate and was used in the next reaction step without an additional purification process.

Synthesis of Compound L1

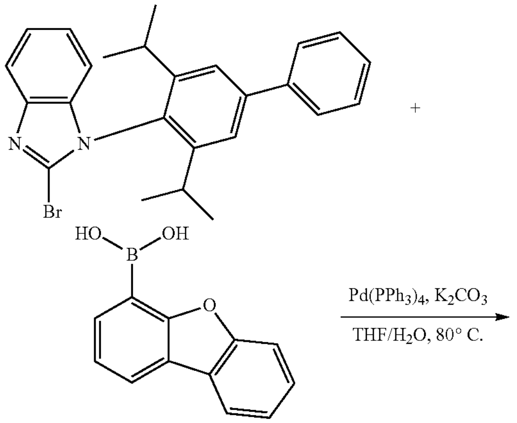

-continued

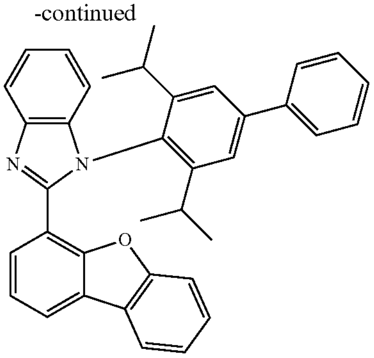

L1

2-bromo-1-(3,5-diisopropyl-[1,1'-biphenyl]-4-yl)-1H-benzo[d]imidazole (5.00 g, 11.54 mmol), dibenzo[b,d]furan-4-ylboronic acid (2.47 g, 11.54 mmol), $Pd(PPh_3)_4$ (0.67 g, 0.58 mmol), and $K_2CO_3$ (4.78 g, 34.61 mmol) were mixed with 90 mL of THF and 30 mL of DI water, and then stirred and heated at reflux for 18 hours. The temperature was then allowed to lower to room temperature, MC was used to extract an organic layer, and the organic layer was dried with anhydrous $MgSO_4$. Following filtration, the solvent was removed under a reduced pressure to provide a residue that was purified by column chromatography using EA:hexane (1:2 v/v) as eluents to obtain 4.65 g (73%) of Compound L1.

Synthesis of Compound Ir1

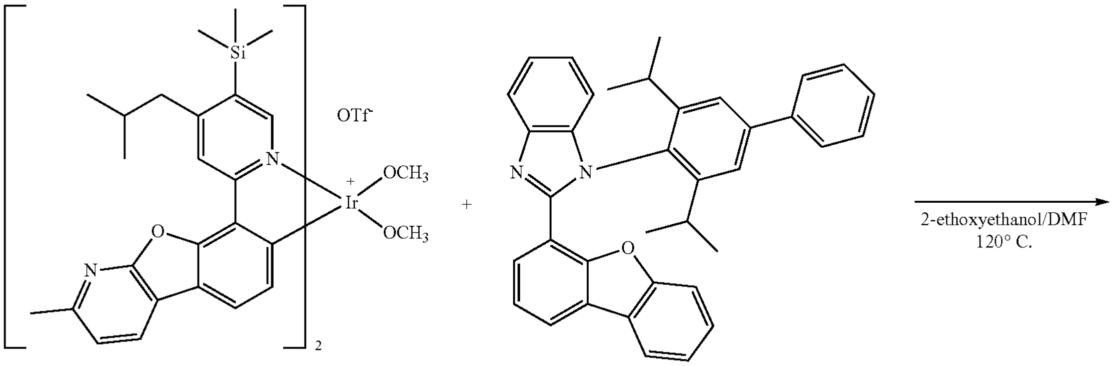

Ir1-A L1

-continued

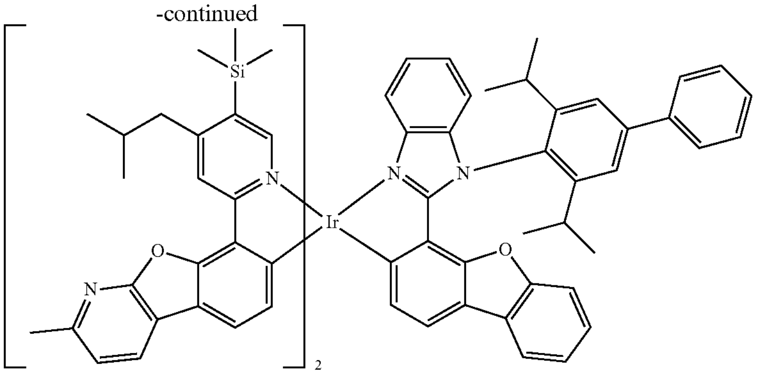

Ir1

Compound Ir1-A (4.00 g, 3.43 mmol) and Compound L1 (1.79 g, 3.43 mmol) were mixed with 50 mL of 2-ethoxyethanol and 50 mL of N,N-dimethylformamide (DMF), and then stirred while heating at reflux at 120° C. for 48 hours, and then the temperature was allowed to lower to room temperature. The solvents were removed under a reduced pressure and the product was purified by column chromatography using EA:hexane (1:8 v/v) as eluents to obtain 0.87 g (17%) of Compound Ir1. The product was identified by high resolution mass spectrometry using matrix assisted laser desorption ionization (HRMS (MALDI)) and high-performance liquid chromatography (HPLC) analysis.

HRMS (MALDI) calculated for $C_{85}H_{85}IrN_6O_3Si_2$: m/z: 1486.5851 grams per mole (g/mol), found: 1486.5847 g/mol.

Synthesis Example 2 (Compound Ir2)

Synthesis of Compound Ir2-C

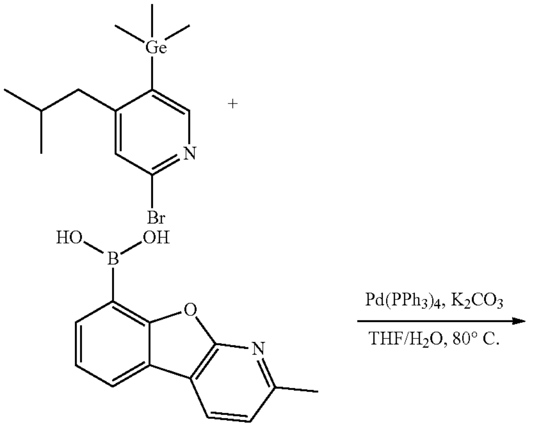

-continued

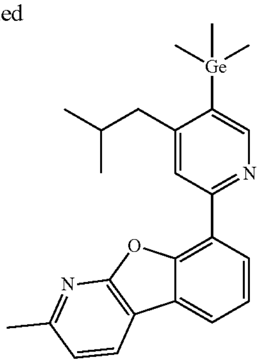

Ir2-C 2-bromo-4-isobutyl-5-(trimethylgermyl)pyridine (5.00 g, 15.11 mmol), (2-methylbenzofuro[2,3-b]pyridin-8-yl)boronic acid (3.43 g, 15.11 mmol), $Pd(PPh_3)_4$ (0.87 g, 0.76 mmol), and $K_2CO_3$ (6.27 g, 45.34 mmol) were mixed with 90 mL of THF and 30 mL of DI water, and then stirred while heating at reflux for 18 hours. The temperature was then allowed to lower to room temperature, MC was used to extract an organic layer, and the organic layer was dried with anhydrous $MgSO_4$. The solvent was removed under a reduced pressure and the residue obtained was purified by column chromatography using EA:hexane (1:4 v/v) as eluents to obtain 4.31 g (66%) of Compound Ir2-C.

Synthesis of Compound Ir2-B

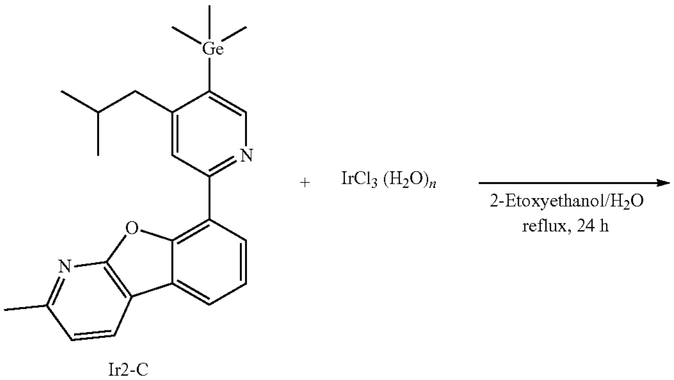

Ir2-C

-continued

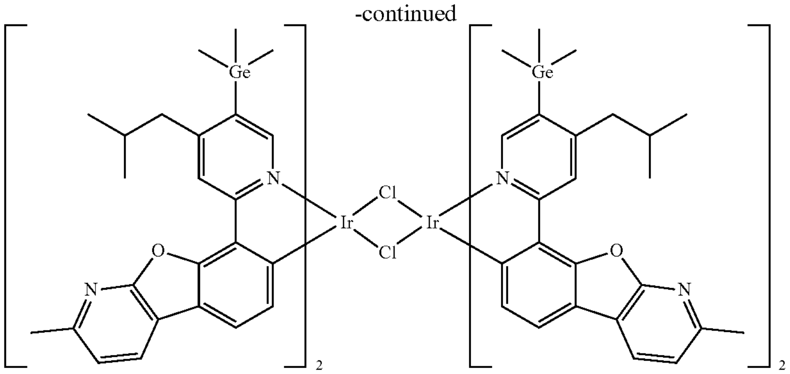

Ir2-B 4.08 g (75%) of Compound Ir2-B was obtained in a similar manner as the synthesis of Compound Ir1-B of Synthesis Example 1, except that Compound Ir2-C (4.31 g, 9.95 mmol) was used instead of Compound Ir1-C, and an amount of iridium chloride trihydrate that was used was changed to 1.75 g (4.98 mmol).

Synthesis of Compound Ir2-A

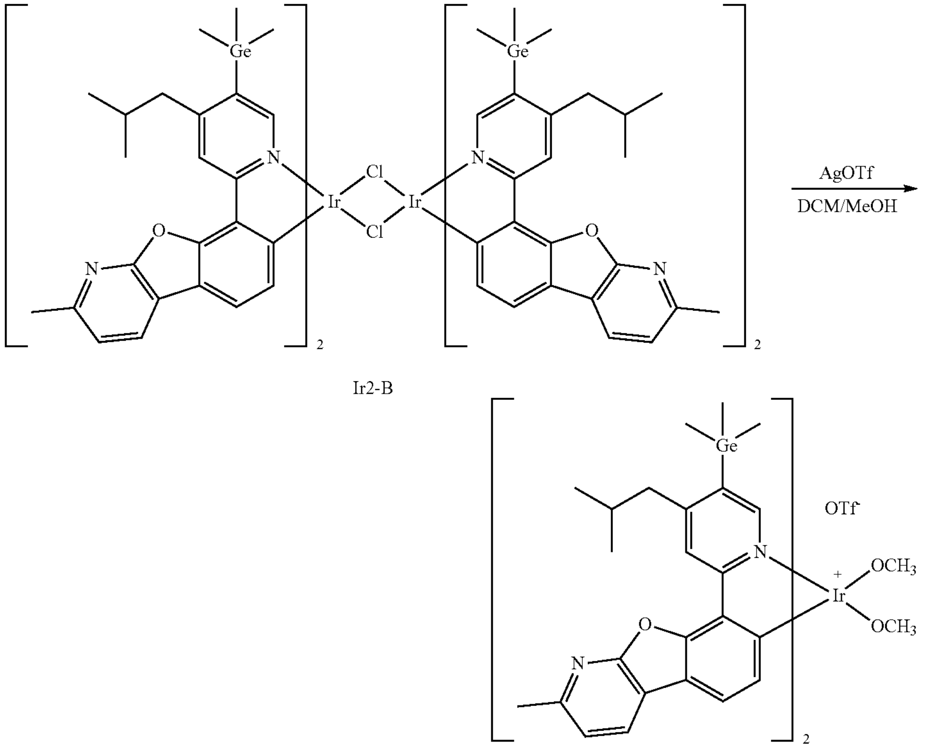

Ir2-B

Ir2-A

Compound Ir2-A was synthesized in a similar manner as the synthesis of Compound Ir1-A of Synthesis Example 1, except that Compound Ir2-B (4.08 g, 1.87 mmol) was used instead of Compound Ir1-B, and an amount of AgOTf that was used was changed to 1.01 g (3.92 mmol). Then, Compound Ir2-A was used in the next reaction step without an additional purification process.

Synthesis of Compound Ir2

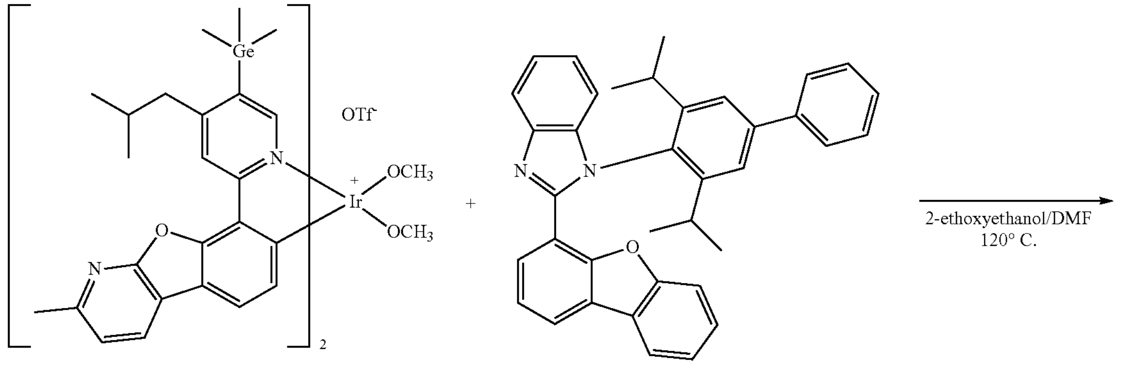

Ir2-A L1

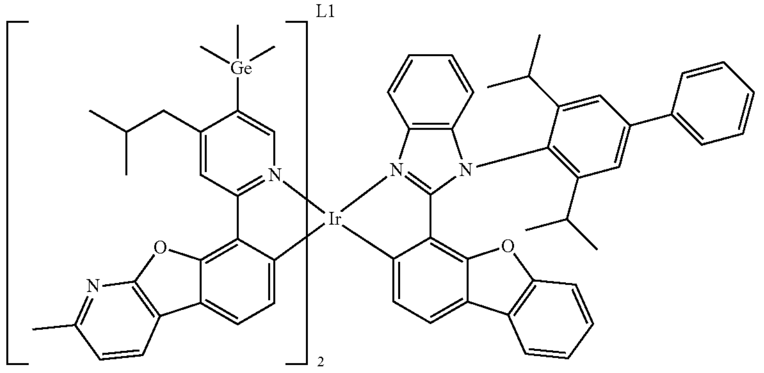

Ir2

0.60 g (16%) of Compound Ir2 was obtained in a similar manner as the synthesis of Compound Ir1 of Synthesis Example 1, except that Compound Ir2-A (3.00 g, 2.36 mmol) was used instead of Compound Ir1-A, and an amount of Compound L1 that was used was changed to 1.23 g (2.36 mmol).

HRMS (MALDI) calculated for $C_{85}H_{85}IrN_6O_3Ge_2$: m/z: 1578.4736 g/mol, found: 1578.4742 g/mol.

Synthesis Example 3 (Compound Ir3)

Synthesis of Compound L3

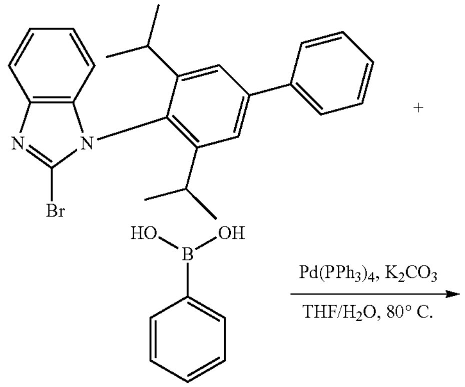

-continued

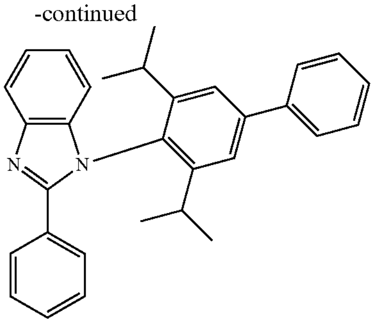

L3

4.04 g (81%) of Compound L3 was obtained in a similar manner as the synthesis of Compound L1 of Synthesis Example 1, except that phenylboronic acid (1.41 g, 11.54 mmol) was used instead of dibenzo[b,d]furan-4-ylboronic acid.

Synthesis of Compound Ir3

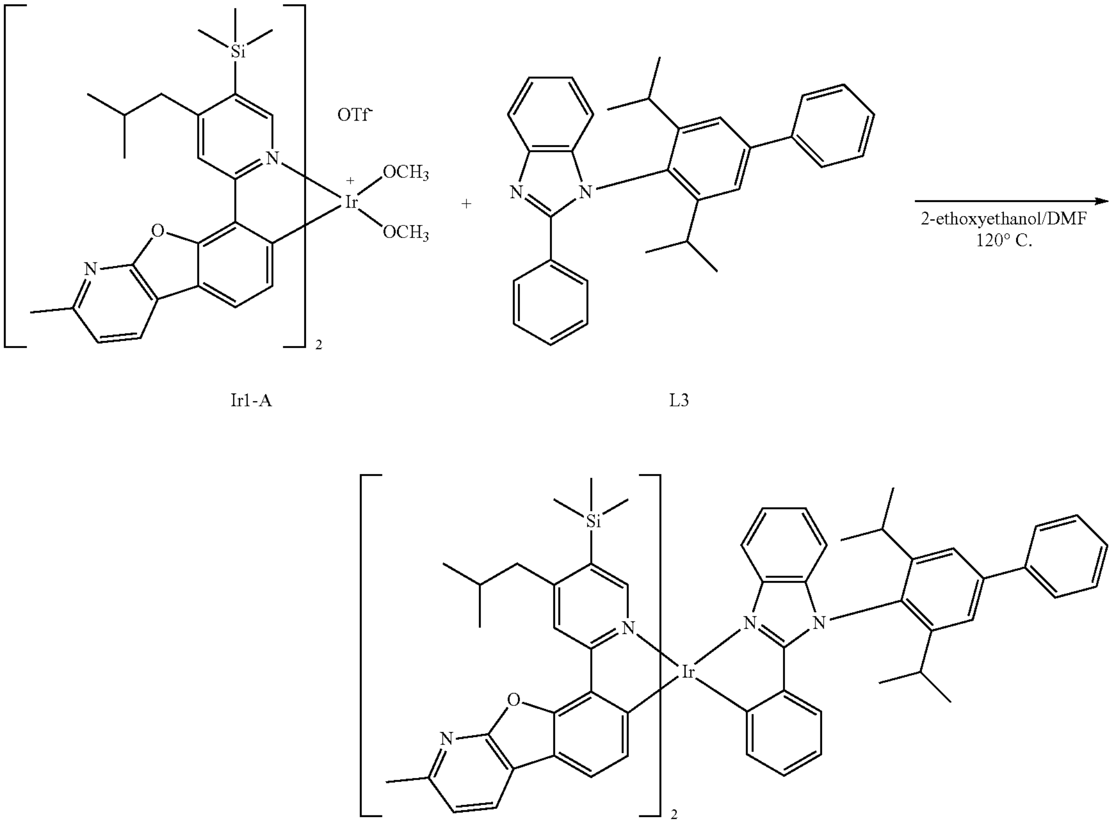

Ir1-A L3

Ir3

1.14 g (24%) of Compound Ir3 was obtained in a similar manner as the synthesis of Compound Ir1 of Synthesis Example 1, except that an amount of Compound Ir1-A used was changed to 4.00 g (3.39 mmol), and Compound L3 (1.46 g, 3.39 mmol) was used instead of Compound L1.

HRMS (MALDI) calculated for $C_{79}H_{83}IrN_6O_2Si_2$: m/z: 1396.5745 g/mol, found: 1396.5752 g/mol.

Synthesis Example 4 (Compound Ir4)

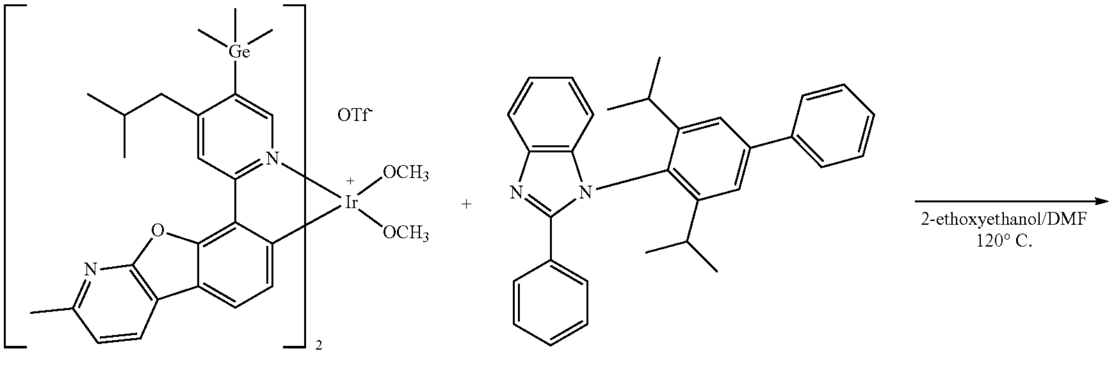

Ir2-A L3

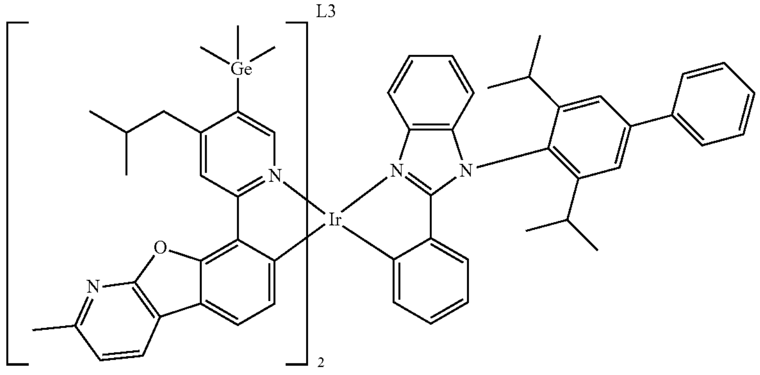

Ir4

1.02 g (24%) of Compound Ir4 was obtained in a similar manner as the synthesis of Compound Ir1 of Synthesis Example 1, except that Compound Ir2-A (3.70 g, 2.91 mmol) was used instead of Compound Ir1-A, and Compound L3 (1.26 g, 2.91 mmol) was used instead of Compound L1.

HRMS (MALDI) calculated for $C_{78}H_{83}IrN_6O_2Ge_2$: m/z: 1488.4630 g/mol, found: 1488.4629 g/mol.

Synthesis Example 5 (Compound Ir5)

Synthesis of Compound Ir5-B

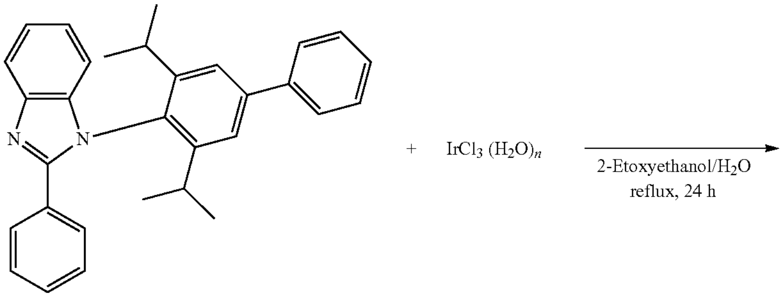

L3

-continued

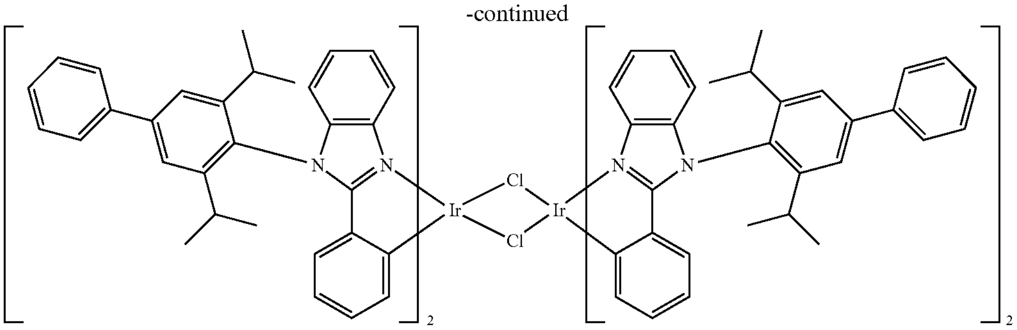

Ir5-B 4.75 g (48%) of Compound Ir5-B was obtained in a similar manner as the synthesis of Compound Ir1-B of Synthesis Example 1, except that Compound L3 (4.0 g, 9.29 mmol) was used instead of Compound Ir1-C, and an amount of iridium chloride trihydrate that was used was changed to 1.64 g (4.64 mmol).

Synthesis of Compound Ir5-A

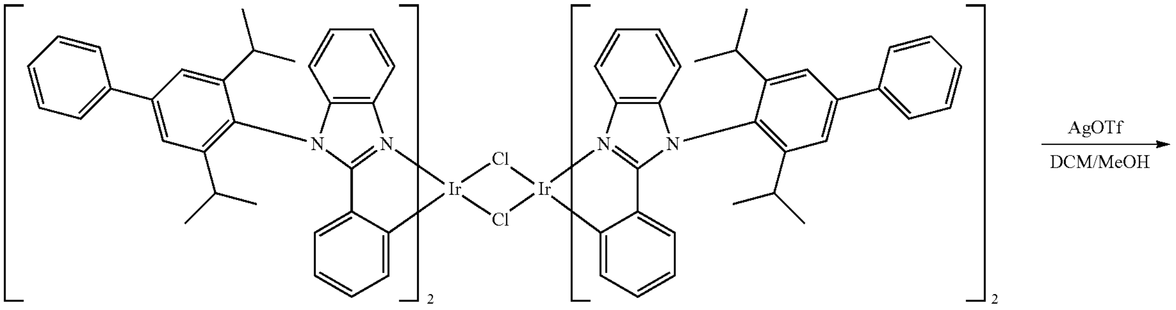

Ir5-B

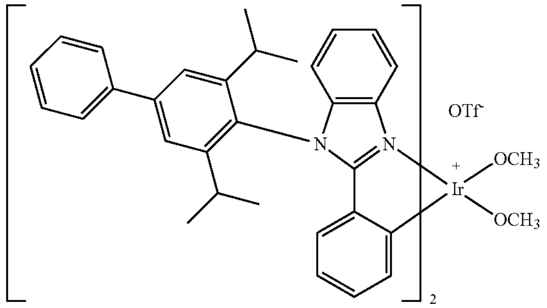

Ir5-A

Compound Ir5-A was synthesized in a similar manner as the synthesis of Compound Ir1-A of Synthesis Example 1, except that Compound Ir5-B (3.50 g, 1.61 mmol) was used instead of Compound Ir1-B, and an amount of AgOTf that was used was changed to 0.87 g (3.38 mmol). Then, Compound Ir5-A was used in the next reaction without an additional purification process.

Synthesis of Compound Ir5

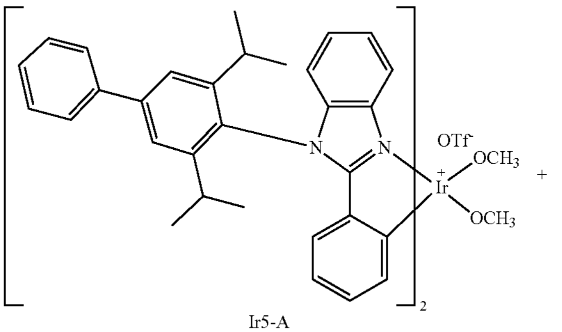

Ir5-A

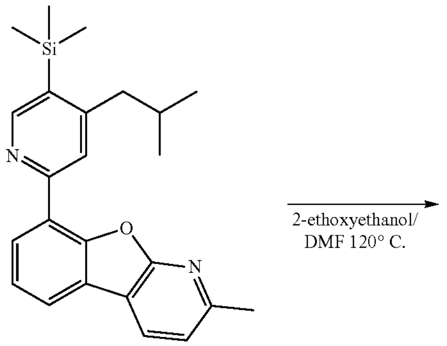

Ir1-C

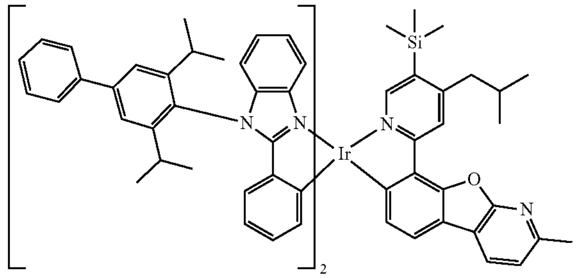

Ir5

1.13 g (28%) of Compound Ir5 was obtained in a similar manner as the synthesis of Compound Ir1 of Synthesis Example 1, except that Compound Ir5-A (3.50 g, 2.77 mmol) was used instead of Compound Ir1-A, and Compound Ir1-C (1.08 g, 2.77 mmol) was used instead of Compound L1.

HRMS (MALDI) calculated for $C_{86}H_{85}IrN_6OSi$: m/z: 1438.6183 g/mol, found: 1438.6188 g/mol.

Synthesis Example 6 (Compound Ir6)

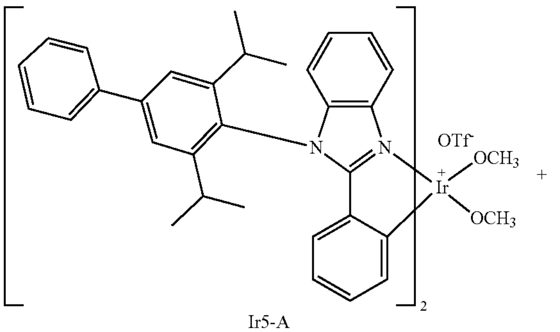

Ir5-A

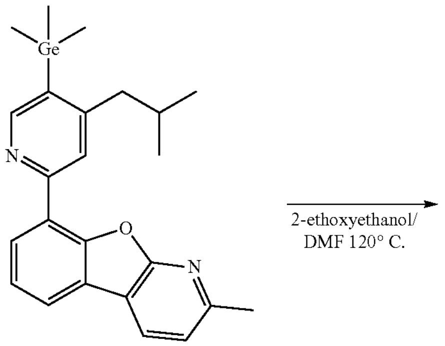

Ir2-C

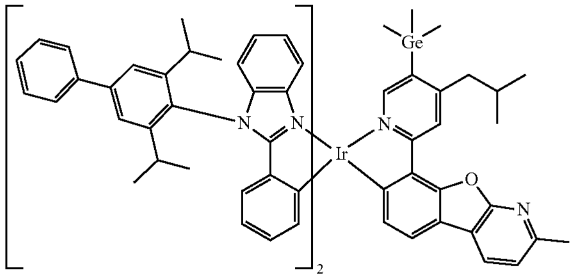

Ir6

1.00 g (24%) of Compound Ir6 was obtained in a similar manner as the synthesis of Compound Ir1 of Synthesis Example 1, except that Compound Ir5-A (3.50 g, 2.77 mmol) was used instead of Compound Ir1-A, and Compound Ir2-C (1.20 g, 2.77 mmol) was used instead of Compound L1.

HRMS (MALDI) calculated for $C_{86}H_{85}IrN_6OGe$: m/z: 1484.5526 g/mol, found: 1484.5532 g/mol.

Synthesis Example 7 (Compound Ir7)

Synthesis of Compound Ir7-C

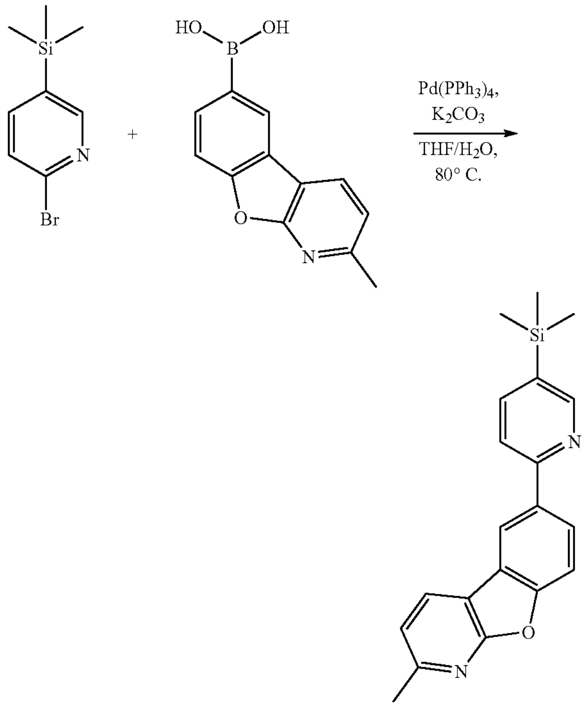

Ir7-C 2-bromo-5-(trimethylsilyl)pyridine (5.00 g, 21.84 mmol), (2-methylbenzofuro[2,3-b]pyridin-6-yl)boronic acid (3.98 g, 21.84 mmol), $Pd(PPh_3)_4$ (1.26 g, 1.09 mmol), and $K_2CO_3$ (9.05 g, 65.50 mmol) were mixed with 90 mL of THF and 30 mL of DI water, and then stirred while heating at reflux for 18 hours. The temperature was then allowed to lower to room temperature, MC was used to extract an organic layer, and the organic layer was dried with anhydrous $MgSO_4$. A residue was obtained by removing the solvent under reduced pressure from a filtrate obtained by filtration. The residue was purified by column chromatography using EA:hexane (1:4, v/v) as eluents to obtain 3.85 g (59%) of Compound Ir7-C.

Synthesis of Compound Ir7-B

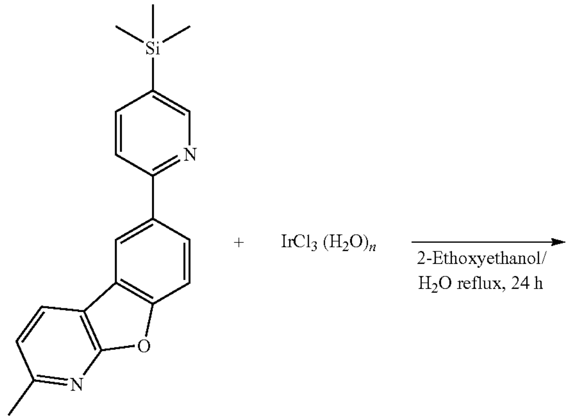

Ir7-C

-continued

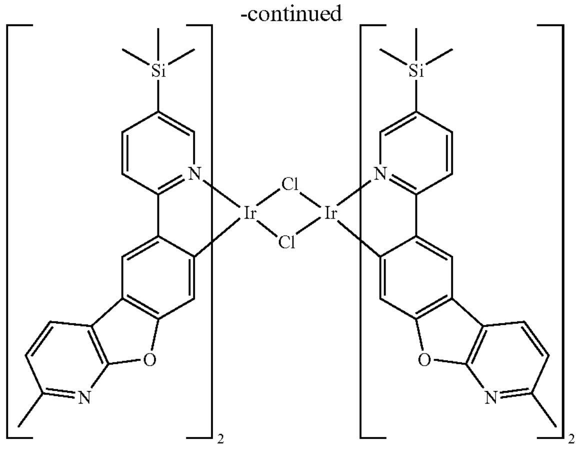

Ir7-B 4.55 g (44%) of Compound Ir7-B was obtained in a similar manner as the synthesis of Compound Ir1-B of Synthesis Example 1, except that Compound Ir7-C (3.85 g, 11.58 mmol) was used instead of Compound Ir1-C, and an amount of iridium chloride trihydrate that was used was changed to 2.04 g (5.79 mmol).

Synthesis of Compound Ir7-A

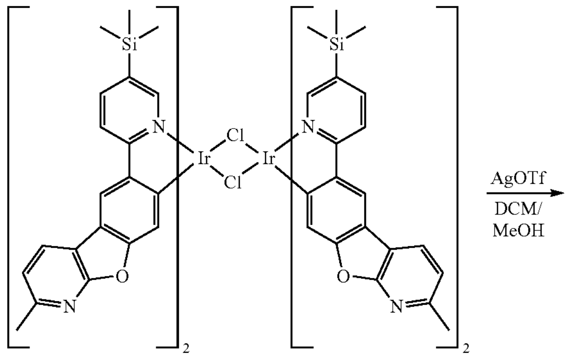

Ir7-B

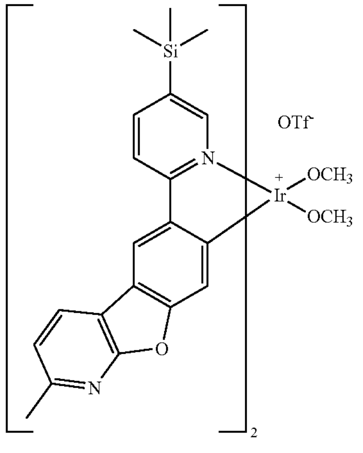

Ir7-A

Compound Ir7-A was synthesized in a similar manner as the synthesis of Compound Ir1-A of Synthesis Example 1, except that Compound Ir7-B (4.55 g, 2.56 mmol) was used instead of Compound Ir1-B, and an amount of AgOTf that was used was changed to 1.38 g (5.37 mmol). Then, Compound Ir7-A was used in the next reaction step without an additional purification process.

Synthesis of Compound Ir7

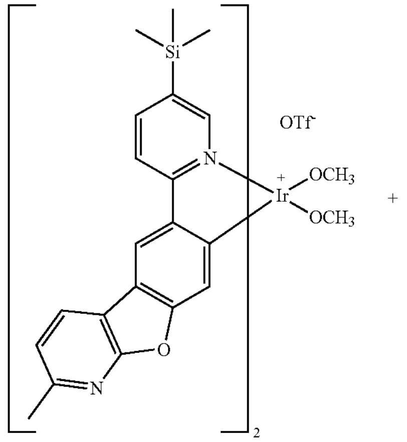

Ir7-A

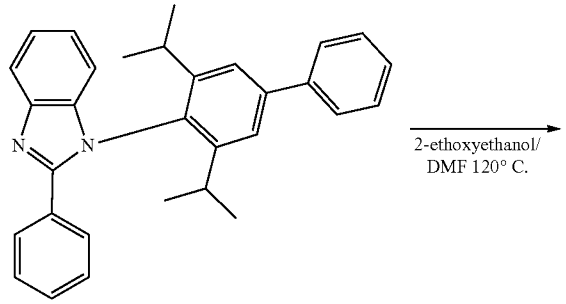

L3

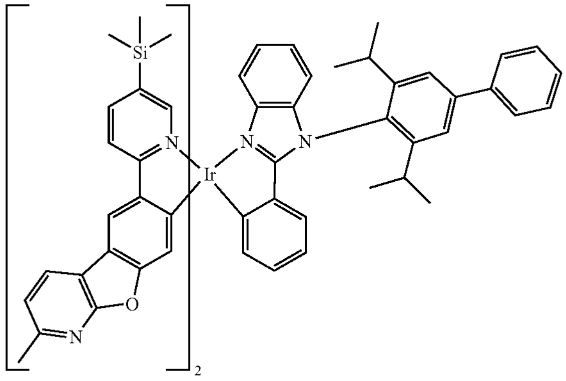

Ir7

0.95 g (23%) of Compound Ir7 was obtained in a similar manner as the synthesis of Compound Ir1 of Synthesis Example 1, except that Compound Ir7-A (3.00 g, 2.81 mmol) was used instead of Compound Ir1-A, and Compound L3 (1.22 g, 2.81 mmol) was used instead of Compound L1.

HRMS (MALDI) calculated for $C_{71}H_{67}IrN_6O_2Si_2$: m/z: 1284.7440 g/mol, found: 1284.7434 g/mol.

Synthesis Example 8 (Compound Ir8)

Synthesis of Compound Ir8-C

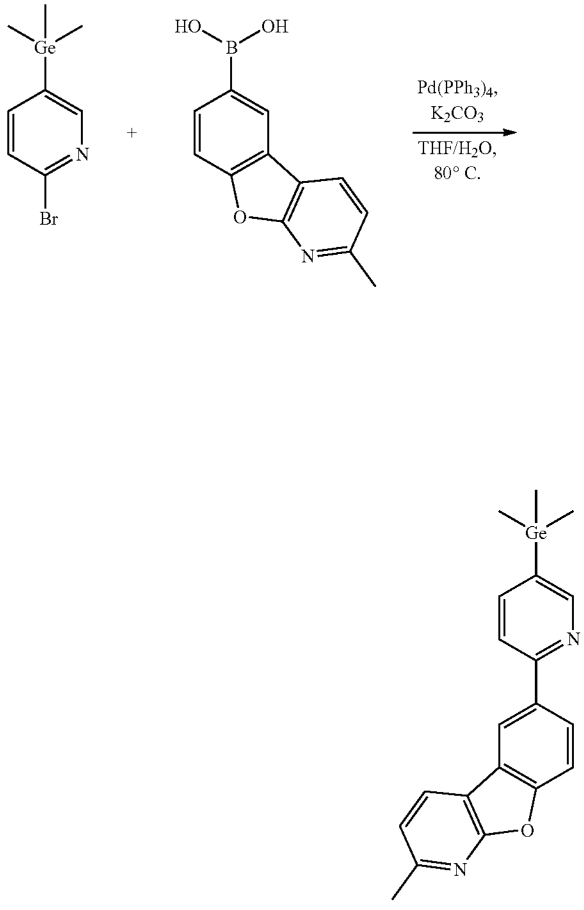

Ir8-C 2-bromo-5-(trimethylgermyl)pyridine (5.00 g, 18.19 mmol), (2-methylbenzofuro[2,3-b]pyridin-6-yl)boronic acid (4.13 g, 18.19 mmol), $Pd(PPh_3)_4$ (1.26 g, 1.09 mmol), and $K_2CO_3$ (7.54 g, 54.56 mmol) were mixed with 90 mL of THF and 30 mL of DI water, and then the reaction mixture was stirred and heated at reflux for 18 hours. The temperature was allowed to lower to room temperature, MC was used to extract an organic layer, and the organic layer was dried with anhydrous $MgSO_4$. A residue was obtained by removing the solvent under reduced pressure from a filtrate obtained by filtration. The residue was purified by column chromatography using EA:hexane (1:4 v/v) as eluents to obtain 4.77 g (70%) of Compound Ir8-C.

Synthesis of Compound Ir8-B

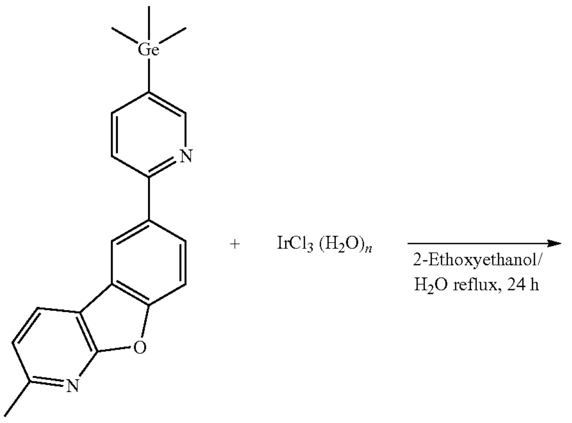

Ir8-C

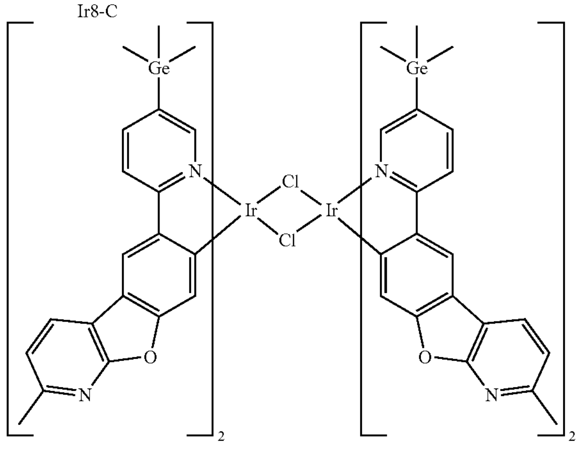

Ir8-B 4.55 g (36%) of Compound Ir8-B was obtained in a similar manner as the synthesis of Compound Ir1-B of Synthesis Example 1, except that Compound Ir8-C (4.77 g, 12.65 mmol) was used instead of Compound Ir1-C, and an amount of iridium chloride trihydrate that was used was changed to 2.23 g (6.33 mmol).

Synthesis of Compound Ir8-A

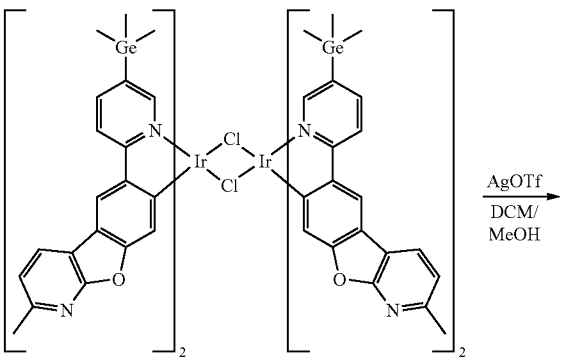

Ir8-B

-continued

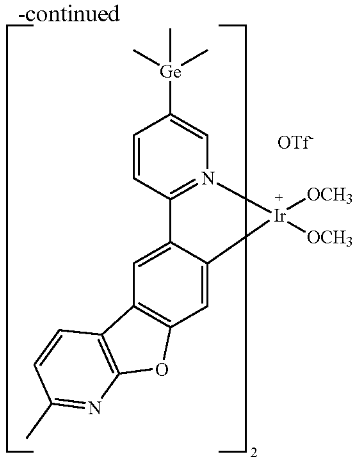

Ir8-A

Compound Ir8-A was synthesized in a similar manner as the synthesis of Compound Ir1-A of Synthesis Example 1, except that Compound Ir8-B (4.55 g, 2.32 mmol) was used instead of Compound Ir1-B, and an amount of AgOTf that was used was changed to 1.25 g (4.88 mmol). Then, Compound Ir8-A was used in the next reaction step without an additional purification process.

Synthesis of Compound Ir8

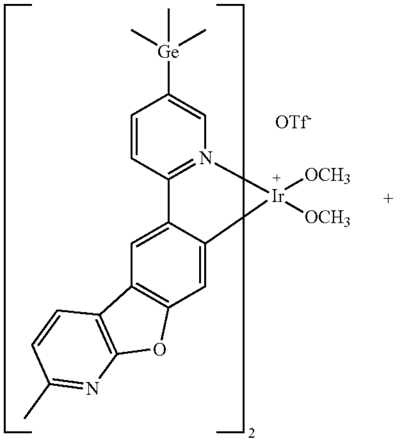

Ir8-A

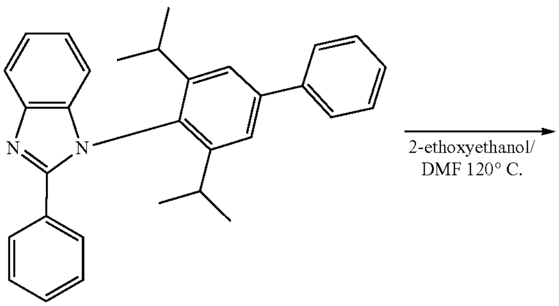

L3

-continued

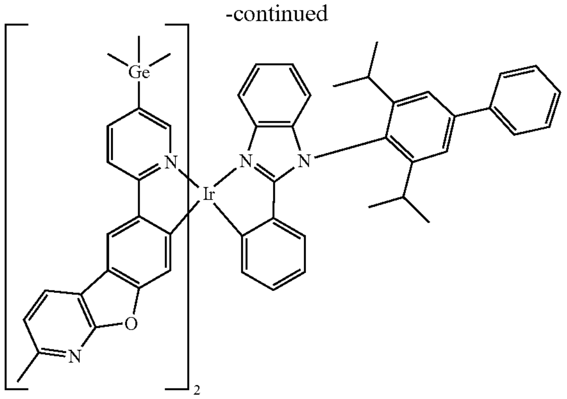

Ir8

0.89 g (25%) of Compound Ir8 was obtained in a similar manner as the synthesis of Compound Ir1 of Synthesis Example 1, except that Compound Ir8-A (3.00 g, 2.59 mmol) was used instead of Compound Ir1-A, and Compound L3 (1.12 g, 2.59 mmol) was used instead of Compound L1.

HRMS (MALDI) calculated for $C_{71}H_{67}IrN_6O_2Ge_2$: m/z: 1376.3378 g/mol, found: 1376.3377 g/mol.

Synthesis Example 9 (Compound Ir9)

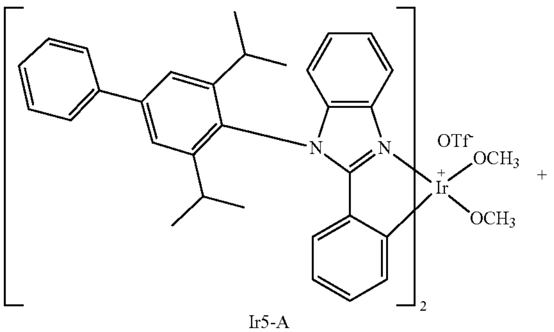

Ir5-A

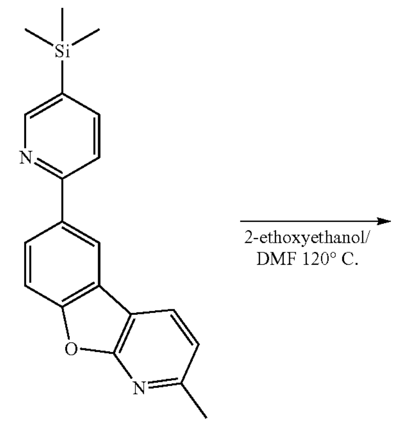

Ir7-C

-continued

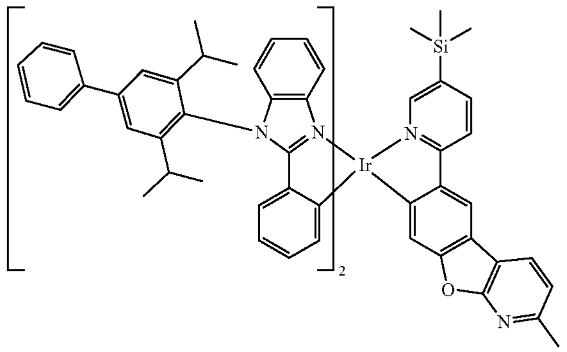

Ir9

1.11 g (30%) of Compound Ir9 was obtained in a similar manner as the synthesis of Compound Ir1 of Synthesis Example 1, except that Compound Ir5-A (3.33 g, 2.63 mmol) was used instead of Compound Ir1-A, and Compound Ir7-C (0.88 g, 2.63 mmol) was used instead of Compound L1.

HRMS (MALDI) calculated for $C_{82}H_{77}IrN_6OSi$: m/z: 1382.5557 g/mol, found: 1382.5552 g/mol.

Synthesis Example 10 (Compound Ir10)

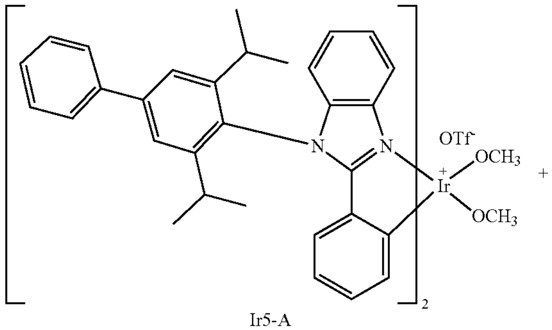

Ir5-A

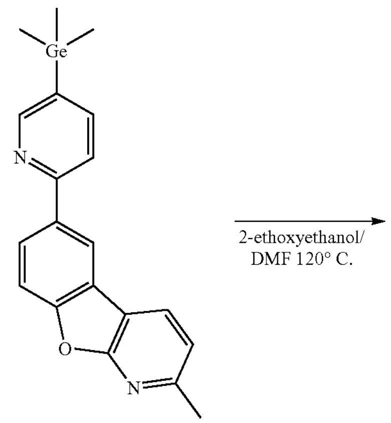

Ir8-C

-continued

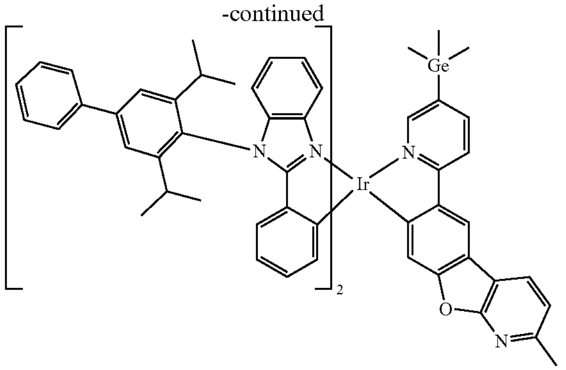

Ir10

1.00 g (35%) of Compound Ir10 was obtained in a similar manner as the synthesis of Compound Ir1-A of Synthesis Example 1, except that Compound Ir5-A (2.52 g, 1.99 mmol) was used instead of Compound Ir1-A, and Compound Ir8-C (0.66 g, 1.99 mmol) was used instead of Compound L1.

HRMS (MALDI) calculated for $C_{82}H_{77}IrN_6OGe$: m/z: 1428.5000 g/mol, found: 1428.4995 g/mol.

Synthesis Example 11 (Compound Ir11)

Synthesis of Compound Ir11-C

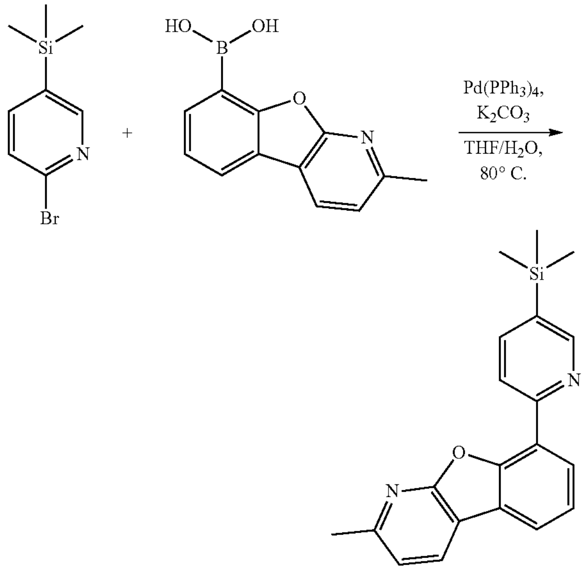

Ir11-C 2-bromo-5-(trimethylsilyl)pyridine (5.00 g, 21.72 mmol), (2-methylbenzofuro[2,3-b]pyridin-8-yl)boronic acid (4.93 g, 21.72 mmol), $Pd(PPh_3)_4$ (1.01 g, 0.88 mmol), and $K_2CO_3$ (7.27 g, 52.62 mmol) were mixed with 90 mL of THF and 30 mL of DI water, and then heated and stirred at reflux for 18 hours. The temperature was then allowed to lower to room temperature, MC was used to extract an organic layer, and the organic layer was dried over anhydrous $MgSO_4$. A residue was obtained by removing the solvents under a reduced pressure from a filtrate obtained by filtration. The residue was purified by column chromatography using EA:hexane (1:4 v/v) as eluents to obtain 5.00 g (69%) of Compound Ir11-C.

Synthesis of Compound Ir11-B

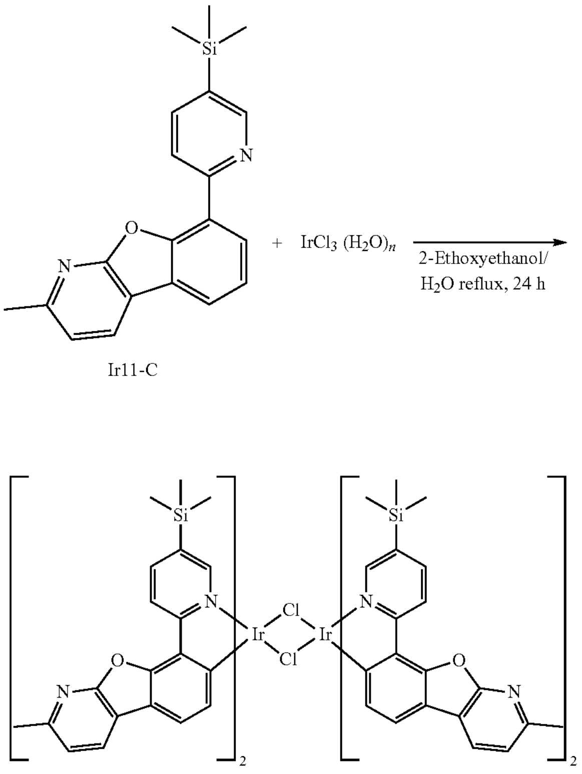

Ir11-C

Ir11-B 4.65 g (69%) of Compound Ir11-B was obtained in a similar manner as the synthesis of Compound Ir1-B of Synthesis Example 1, except that Compound Ir11-C (5.00 g, 15.04 mmol) was used instead of Compound Ir1-C, and an amount of iridium chloride trihydrate that was used was changed to 2.65 g (7.52 mmol).

Synthesis of Compound Ir11-A

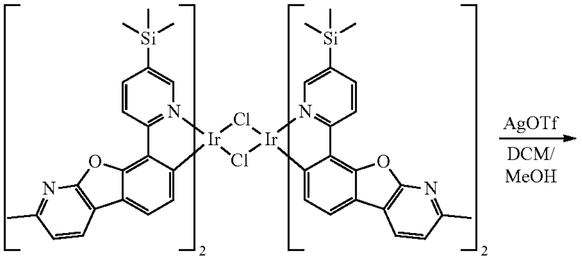

Ir11-B

-continued

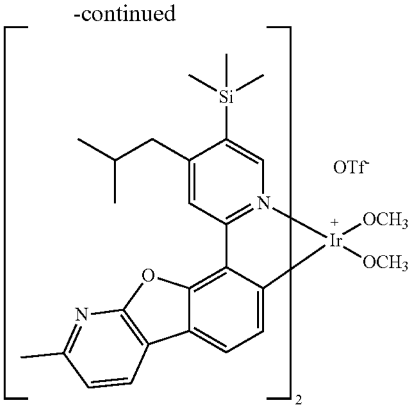

Ir11-A

Compound Ir11-A was synthesized in a similar manner as the synthesis of Compound Ir1-A of Synthesis Example 1, except that Compound Ir11-B (4.65 g, 2.61 mmol) was used instead of Compound Ir1-B, and an amount of AgOTf that was used was changed to 1.41 g (5.48 mmol). Then, Compound Ir11-A was used in the next reaction step without an additional purification process.

Synthesis of Compound L11

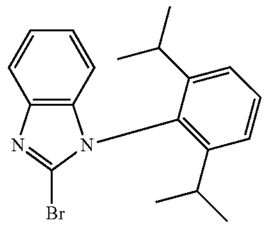

+

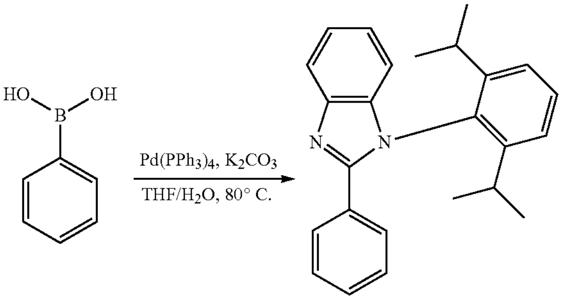

L11

2-bromo-1-(2,6-diisopropylphenyl)-1H-benzo[d]imidazole (5.00 g, 14.00 mmol), phenylboronic acid (2.47 g, 14.00 mmol), $Pd(PPh_3)_4$ (0.81 g, 0.70 mmol), and $K_2CO_3$ (5.80 g, 41.98 mmol) were mixed with 90 mL of THF and 30 mL of DI water, and then stirred and heated at reflux for 18 hours. The temperature was then allowed to lower to room temperature, MC was used to extract an organic layer, and the organic layer was dried with $MgSO_4$. A residue was obtained by removing the solvent under a reduced pressure from a filtrate obtained by filtration. The residue was purified by column chromatography using EA:hexane (1:2 v/v) as eluents to obtain 4.19 g (84%) of Compound L11.

Synthesis of Compound Ir11

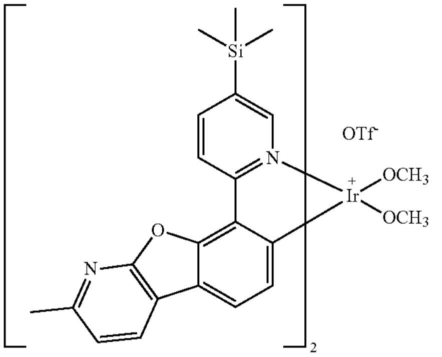

Ir11-A

+

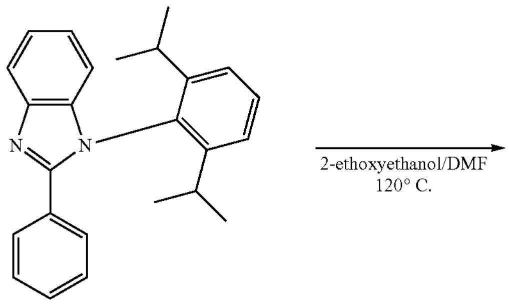

L11

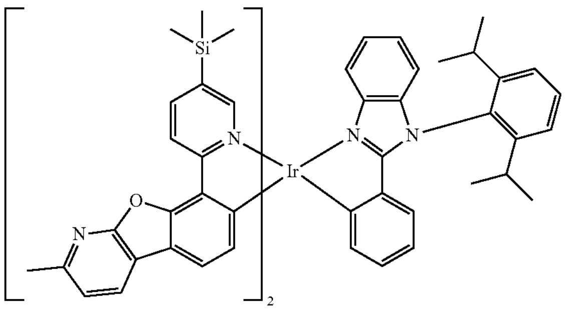

Ir11

0.99 g (29%) of Compound Ir11 was obtained in a similar manner as the synthesis of Compound Ir1 of Synthesis Example 1, except that Compound Ir11-A (3.00 g, 2.81 mmol) was used instead of Compound Ir1-A, and Compound L11 (1.00 g, 2.81 mmol) was used instead of Compound L1.

HRMS (MALDI) calculated for $C_{65}H_{63}IrN_6O_2Si_2$: m/z: 1208.4180 g/mol, found: 1208.4184 g/mol.

Synthesis Example 12 (Compound Ir12)

Synthesis of Compound Ir12-C

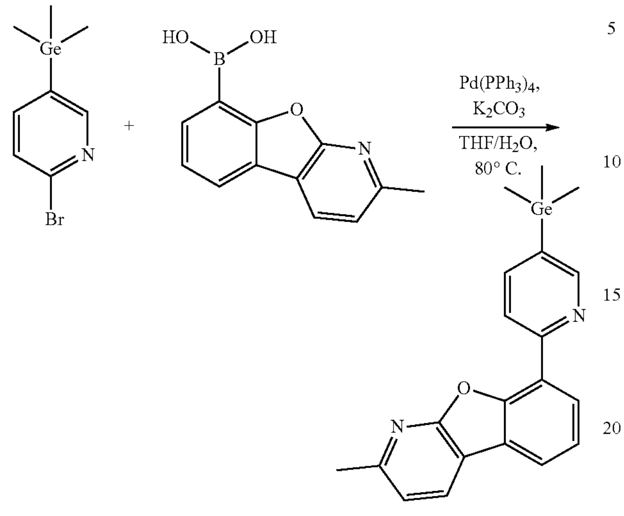

Ir12-C 2-bromo-5-(trimethylgermyl)pyridine (5.00 g, 18.20 mmol), (2-methylbenzofuro[2,3-b]pyridin-8-yl)boronic acid (4.13 g, 18.20 mmol), $Pd(PPh_3)_4$ (1.05 g, 0.91 mmol), and $K_2CO_3$ (7.55 g, 54.60 mmol) were mixed with 90 mL of THF and 30 mL of DI water, and then stirred and heated at reflux for 18 hours. The temperature was then allowed to lower to room temperature, MC was used to extract an organic layer, and the organic layer was dried with $MgSO_4$. A residue was obtained by removing the solvent under a reduced pressure from a filtrate obtained by filtration. The residue was purified by column chromatography using EA:hexane (1:4 v/v) as eluents to obtain 6.15 g (90%) of Compound Ir12-C.

Synthesis of Compound Ir12-B

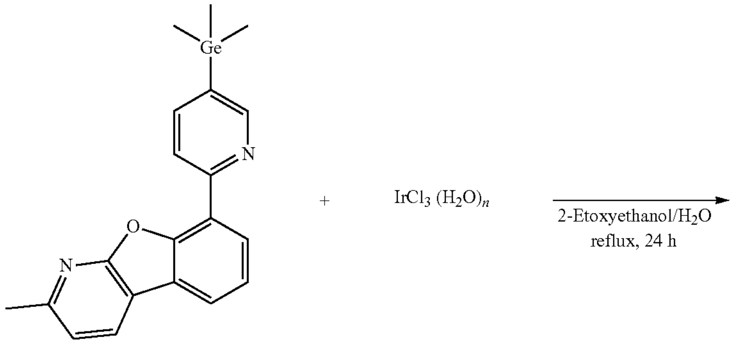

Ir12-C

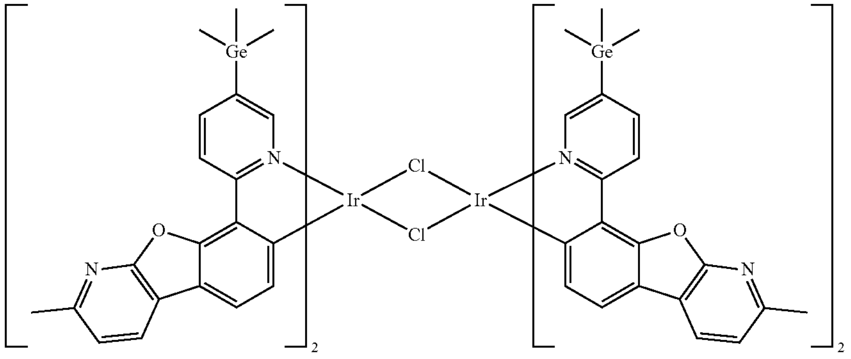

Ir12-B 5.78 g (36%) of Compound Ir12-B was obtained in a similar manner as the synthesis of Compound Ir1-B of Synthesis Example 1, except that Compound Ir12-C (6.15 g, 16.31 mmol) was used instead of Compound Ir1-C, and an amount of iridium chloride trihydrate that was used was changed to 2.65 g (7.52 mmol).

Synthesis of Compound Ir12-A

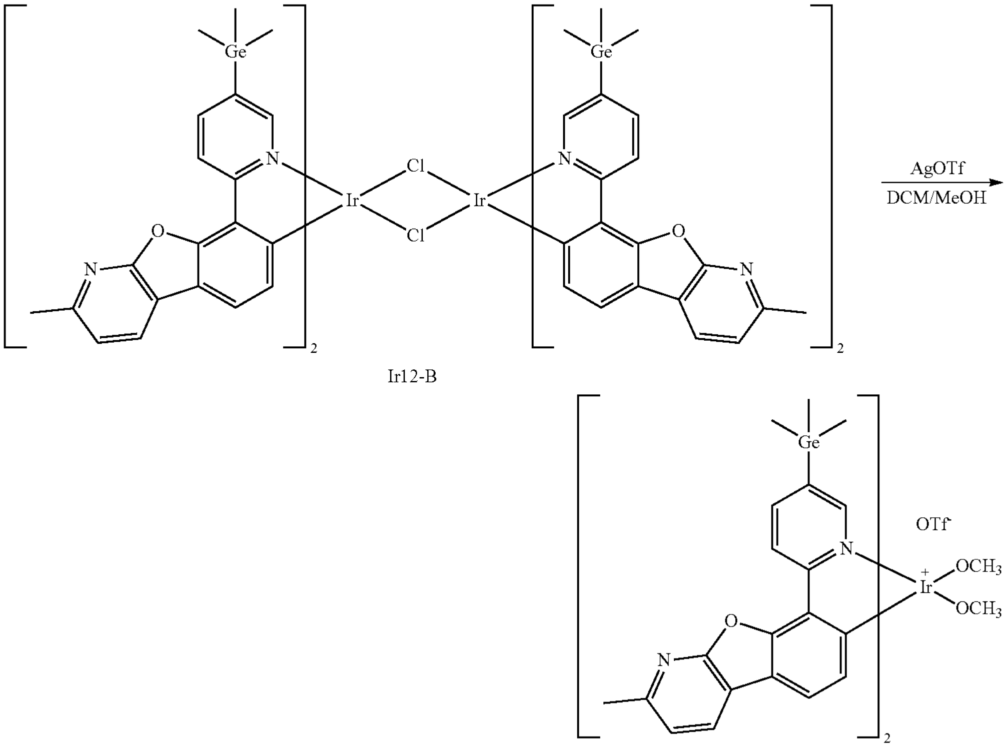

Ir12-B

Ir12-A

Compound Ir12-A was synthesized in a similar manner as the synthesis of Compound Ir1-A of Synthesis Example 1, except that Compound Ir12-B (5.78 g, 2.37 mmol) was used instead of Compound Ir1-B, and an amount of AgOTf that was used was changed to 1.28 g (4.98 mmol). Then, Compound Ir12-A was used in the next reaction step without an additional purification process.

Synthesis of Compound Ir12

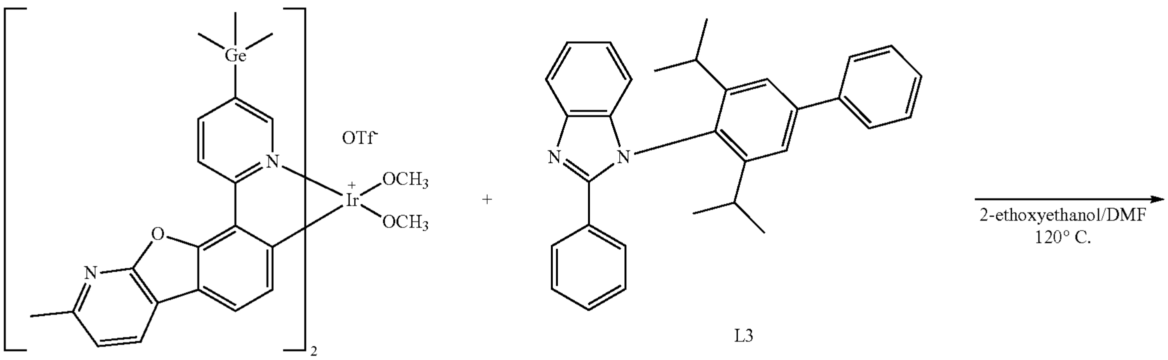

Ir12-A

L3

-continued

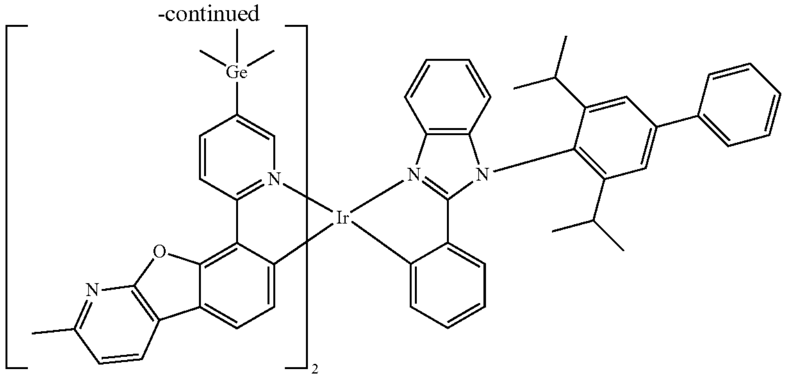

Ir12

0.74 g (21%) of Compound Ir12 was obtained in a similar manner as the synthesis of Compound Ir1 of Synthesis Example 1, except that Compound Ir12-A (3.00 g, 2.59 mmol) was used instead of Compound Ir1-A, and Compound L3 (1.12 g, 2.59 mmol) was used instead of Compound L1.

HRMS (MALDI) calculated for $C_{71}H_{67}IrN_6O_2Ge_2$: m/z: 1373.3378 g/mol, found: 1373.3382 g/mol.

Synthesis Example 13 (Compound Ir13)

Synthesis of Compound Ir13-C

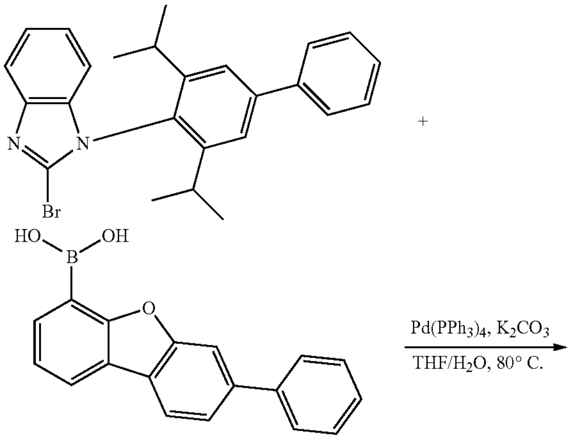

-continued

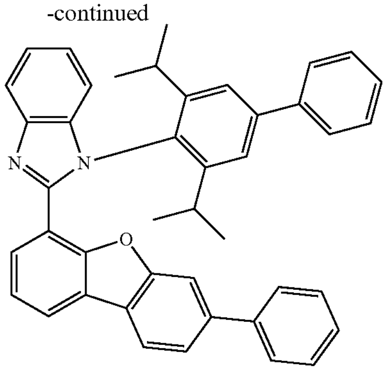

Ir13-C 2-bromo-1-(3,5-diisopropyl-[1,1'-biphenyl]-4-yl)-1H-benzo[d]imidazole (5.00 g, 11.54 mmol), (7-phenyldibenzo[b,d]furan-4-yl)boronic acid (3.32 g, 11.54 mmol), $Pd(PPh_3)_4$ (0.67 g, 0.58 mmol), and $K_2CO_3$ (4.78 g, 34.61 mmol) were mixed with 90 mL of THF and 30 mL of DI water, and then stirred while heating at reflux for 18 hours. The temperature was then allowed to lower to room temperature, MC was used to extract an organic layer, and the organic layer was dried over anhydrous $MgSO_4$. A residue was obtained by removing the solvent under a reduced pressure from a filtrate obtained by filtration. The residue was purified by column chromatography using EA:hexane (1:2 v/v) as eluents to obtain 5.12 g (74%) of Compound Ir13-C.

Synthesis of Compound Ir13-B

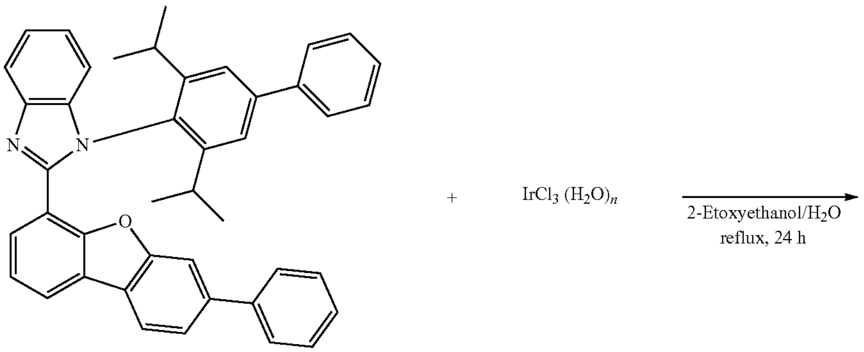

Ir13-C

-continued
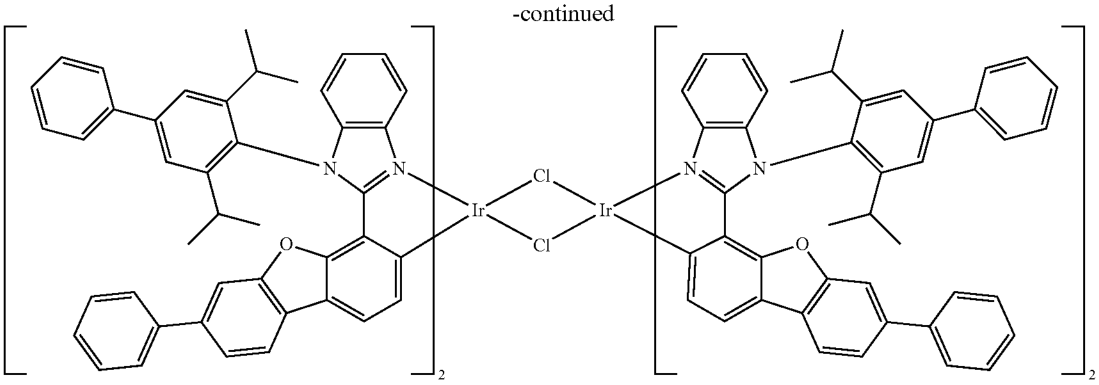
Ir13-B
5.33 g (44%) of Compound Ir13-B was obtained in a similar manner as the synthesis of Compound Ir1-B of Synthesis Example 1, except that Compound Ir13-C (5.12 g, 8.58 mmol) was used instead of Compound Ir1-C, and an amount of iridium chloride trihydrate that was used was changed to 1.51 g (4.29 mmol).
Synthesis of Compound Ir13-A
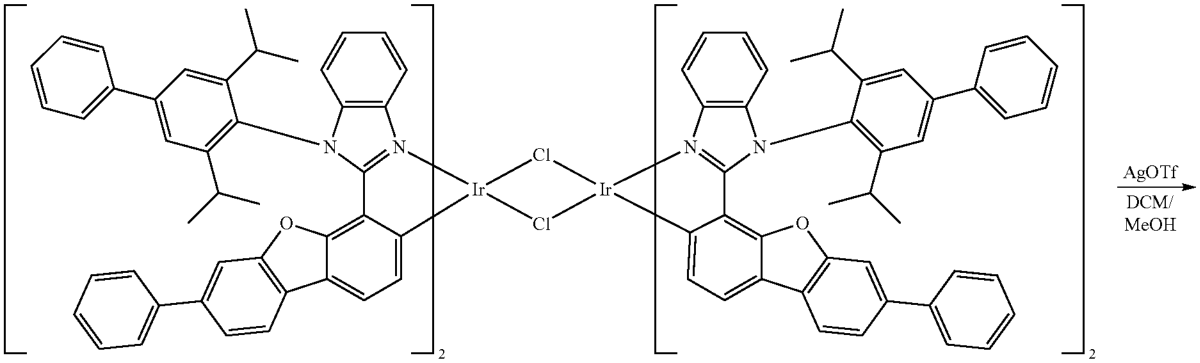
Ir13-B
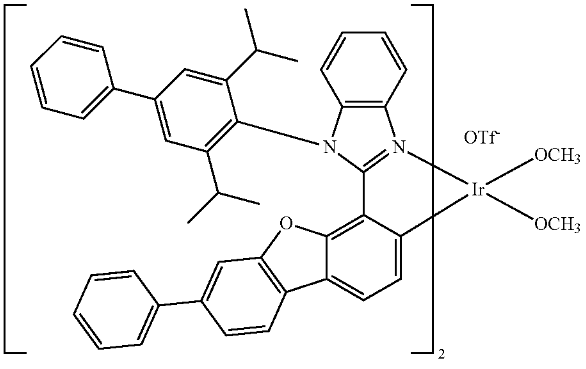
Ir13-A Compound Ir13-A was synthesized in a similar manner as the synthesis of Compound Ir1-A of Synthesis Example 1, except that Compound Ir13-B (3.53 g, 1.24 mmol) was used instead of Compound Ir1-B, and an amount of AgOTf that was used was changed to 0.67 g (2.61 mmol). Then, Compound Ir13-A was used in the next reaction step without an additional purification process.
Synthesis of Compound Ir13
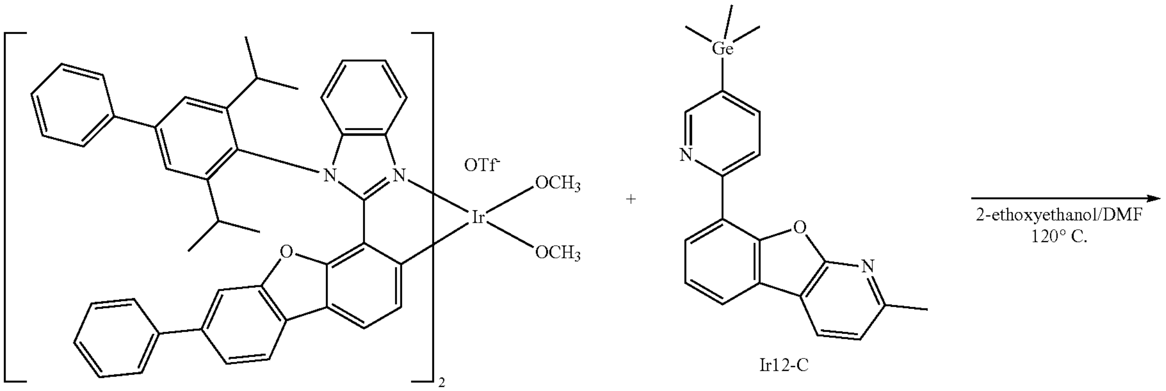
Ir13-A Ir12-C
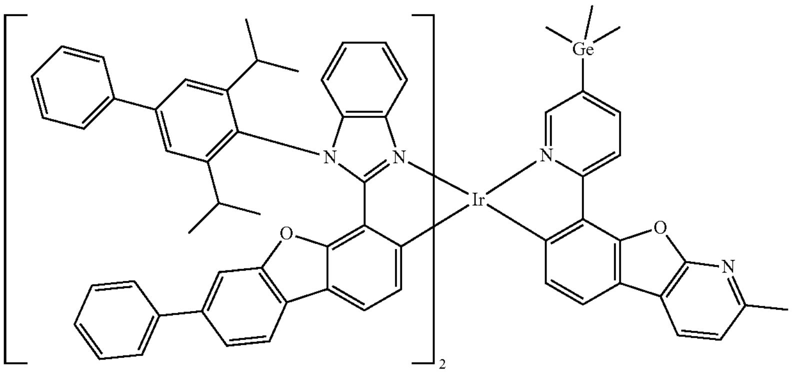
Ir13

0.55 g (17%) of Compound Ir13 was obtained in a similar manner as the synthesis of Compound Ir1 of Synthesis Example 1, except that Compound Ir13-A (3.00 g, 1.88 mmol) was used instead of Compound Ir1-A, and Compound Ir12-C (0.71 g, 1.88 mmol) was used instead of Compound L1.

HRMS (MALDI) calculated for $C_{106}H_{89}GeIrN_6O_3$: m/z: 1760.5837 g/mol, found: 1760.5832 g/mol.

Synthesis Example 14 (Compound Ir14)

Synthesis of Compound Ir14-C

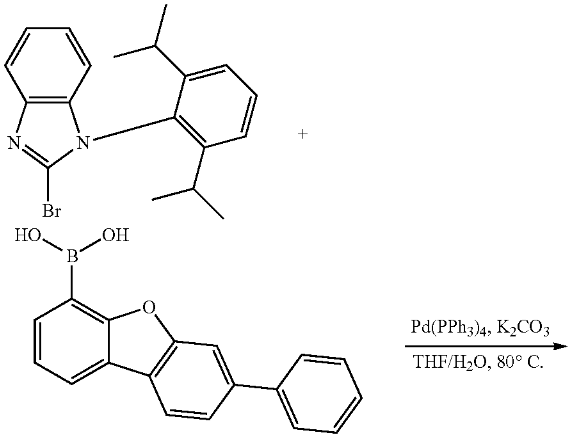

-continued

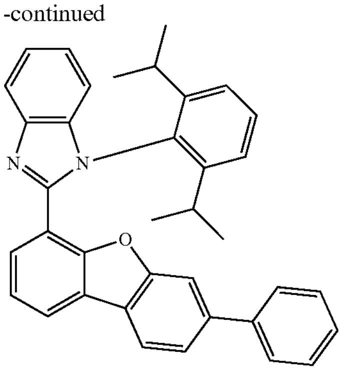

Ir14-C 2-bromo-1-(2,6-diisopropylphenyl)-1H-benzo[d]imidazole (5.00 g, 14.00 mmol), (7-phenyldibenzo[b,d]furan-4-yl)boronic acid (4.03 g, 14.00 mmol), $Pd(PPh_3)_4$ (0.81 g, 0.70 mmol), and $K_2CO_3$ (5.80 g, 41.98 mmol) were mixed with 90 mL of THF and 30 mL of DI water, and then stirred while heating at reflux for 18 hours. The temperature was then allowed to lower to room temperature, MC was used to extract an organic layer, and the organic layer was dried with anhydrous $MgSO_4$. A residue was obtained by removing the solvents under a reduced pressure from a filtrate obtained by filtration. The residue was purified by column chromatography using EA:hexane (1:2 v/v) as eluents to obtain 4.75 g (57%) of Compound Ir14-C.

Synthesis of Compound Ir14-B

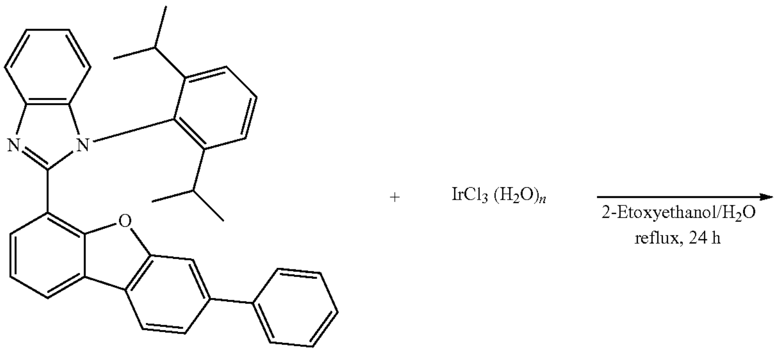

Ir14-C

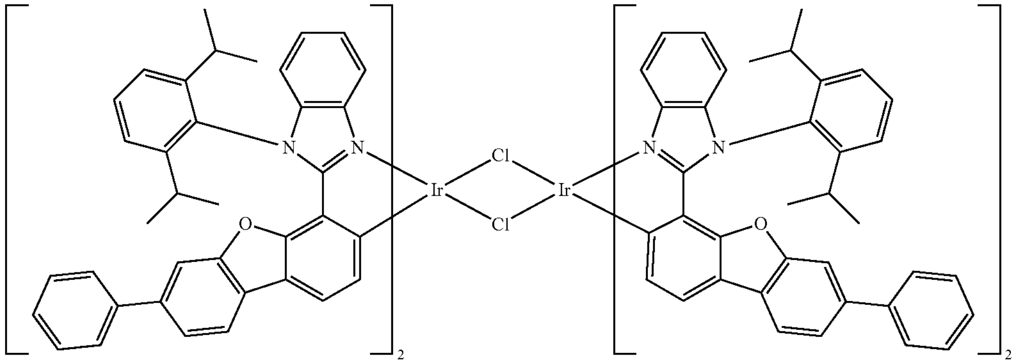

Ir14-B 5.05 g (41%) of Compound Ir14-B was obtained in a similar manner as the synthesis of Compound Ir1-B of Synthesis Example 1, except that Compound Ir14-C (5.12 g, 9.83 mmol) was used instead of Compound Ir1-C, and an amount of iridium chloride triahydrate that was used was changed to 1.73 g (4.92 mmol).

Synthesis of Compound Ir14-A

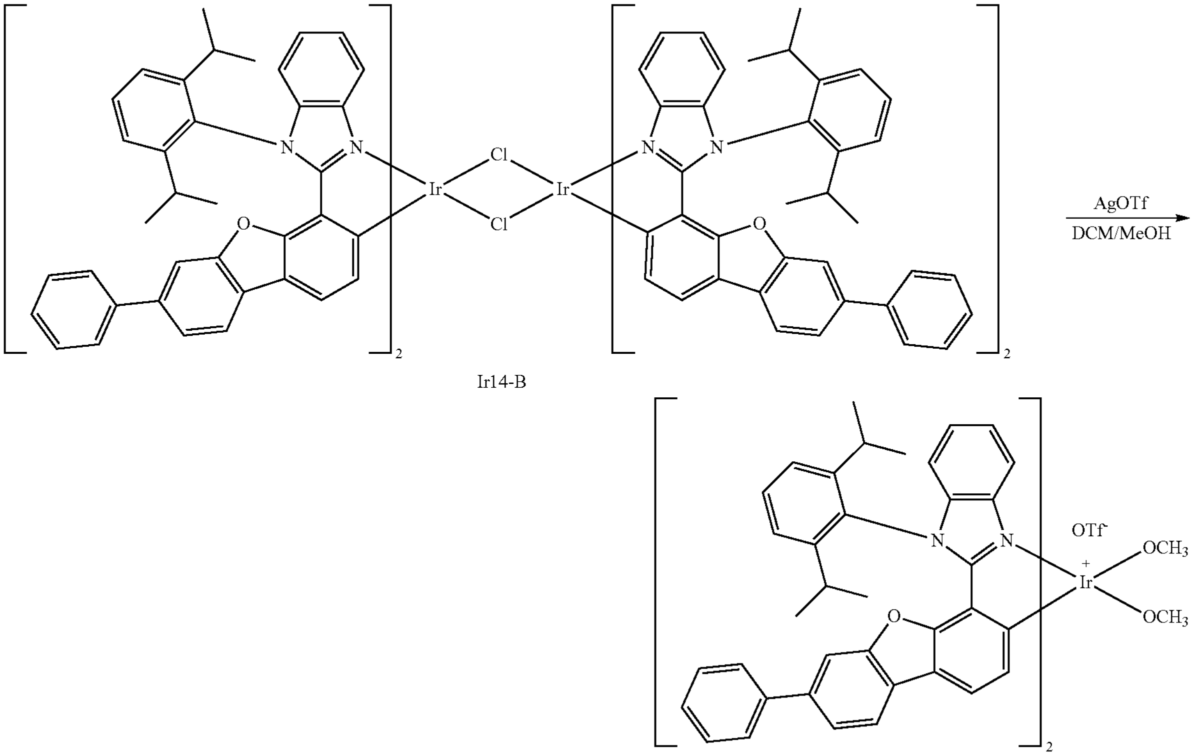

Ir14-B

Ir14-A

Compound Ir14-A was synthesized in a similar manner as the synthesis of Compound Ir1-A of Synthesis Example 1, except that Compound Ir14-B (5.05 g, 1.99 mmol) was used instead of Compound Ir1-B, and an amount of AgOTf that was used was changed to 1.08 g (4.19 mmol). Then, Compound Ir14-A was used in the next reaction step without an additional purification process.

Synthesis of Compound L14

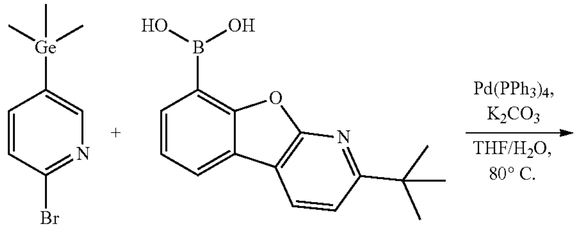

-continued

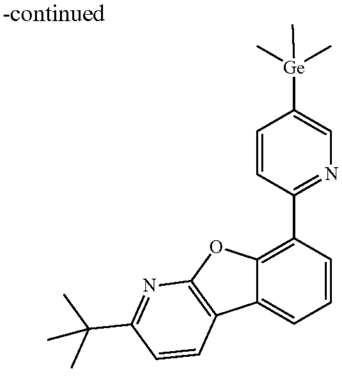

L14

2-bromo-5-(trimethylgermyl)pyridine (5.00 g, 18.20 mmol), (2-(tert-butyl)benzofuro[2,3-b]pyridin-8-yl)boronic acid (4.90 g, 18.20 mmol), $Pd(PPh_3)_4$ (1.05 g, 0.91 mmol), and $K_2CO_3$ (7.55 g, 54.60 mmol) were mixed with 90 mL of THF and 30 mL of DI water, and then stirred while heating at reflux for 18 hours. The temperature was then allowed to lower to room temperature, MC was used to extract an organic layer, and the organic layer was dried over $MgSO_4$.

A residue was obtained by removing the solvents under a reduced pressure from a filtrate obtained by filtration. The residue was purified by column chromatography using EA:hexane (1:4 v/v) as eluents to obtain 6.65 g (87%) of Compound L14.

Synthesis of Compound Ir14

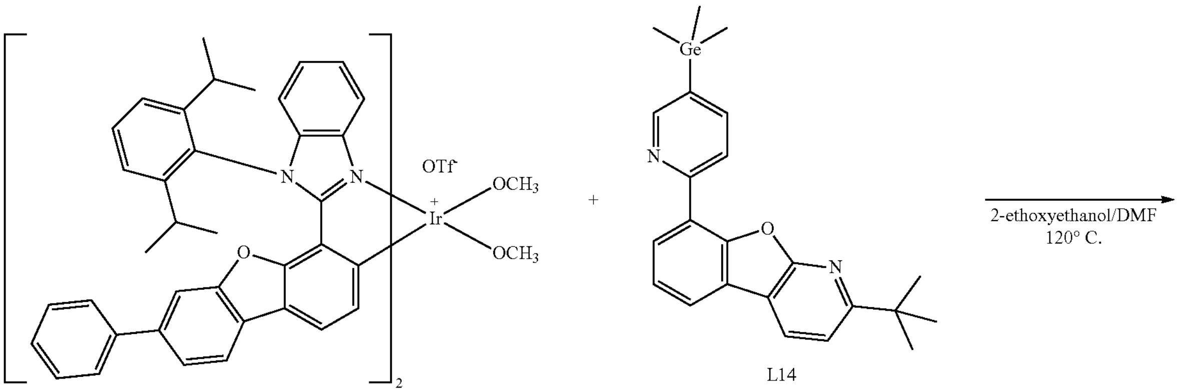

Ir14-A

L14

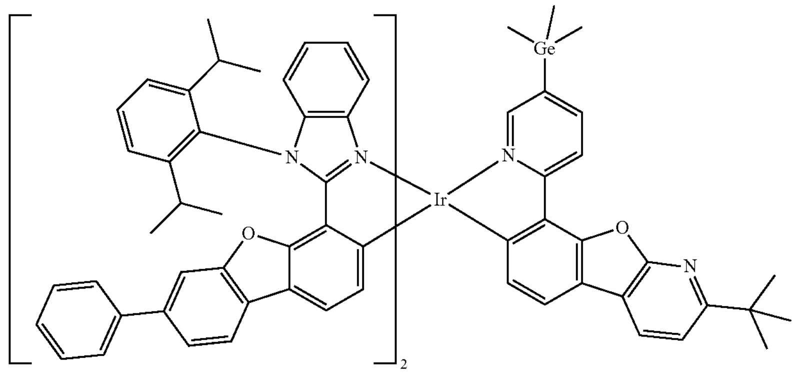

Ir14

0.77 g (22%) of Compound Ir14 was obtained in a similar manner as the synthesis of Compound Ir1 of Synthesis Example 1, except that Compound Ir14-A (3.00 g, 2.08 mmol) was used instead of Compound Ir1-A, and Compound L14 (0.87 g, 2.08 mmol) was used instead of Compound L1.

HRMS (MALDI) calculated for $C_{97}H_{87}GeIrN_6O_3$: m/z: 1650.5681 g/mol, found: 1650.5687 g/mol.

Example 1

A glass substrate with ITO/Ag/ITO (as an anode) deposited thereon to a thickness of 70 Å/1,000 Å/70 Å was cut to a size of 50 millimeters (mm)×50 mm×0.5 mm, sonicated with isopropyl alcohol and DI water each for 5 minutes, and then cleaned by irradiation of ultraviolet rays and exposure of ozone thereto for 30 minutes each. Then the resultant glass substrate was loaded onto a vacuum deposition apparatus.

Compound HT3 and F6-TCNNQ were co-deposited by vacuum on the anode at a weight ratio of 98:2 to form a hole injection layer having a thickness of 100 Å, Compound HT3 was vacuum-deposited on the hole injection layer to form a hole transport layer having a thickness of 1,350 Å, and then Compound H-H1 was vacuum-deposited on the hole transport layer to form an electron blocking layer having a thickness of 300 Å.

Next, Compound H-H1, Compound H-E43, and Compound Ir1 (dopant) were co-deposited on the electron blocking layer at a weight ratio of 57:38:5 to form an emission layer having a thickness of 400 Å.

Afterwards, Compounds ET3 and ET-D1 were co-deposited on the emission layer at a volume ratio of 50:50 to form an electron transport layer having a thickness of 350 Å, LiF was vacuum-deposited on the electron transport layer to form an electron injection layer having a thickness of 1 nm, and Mg and Ag were co-deposited on the electron injection layer at a weight ratio of 90:10 to form a cathode having a thickness of 120 Å, thereby completing manufacture of an organic light-emitting device.

HT3

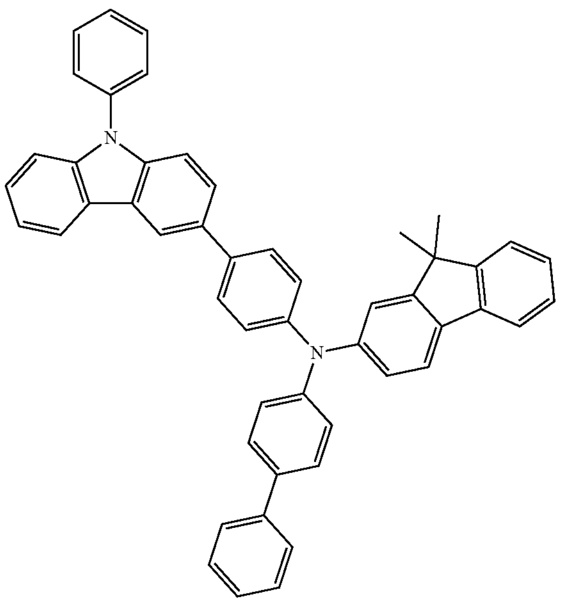

F6-TCNNQ

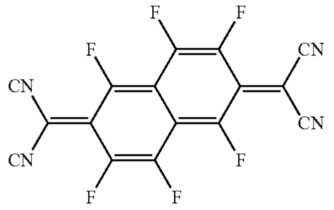

H-H1

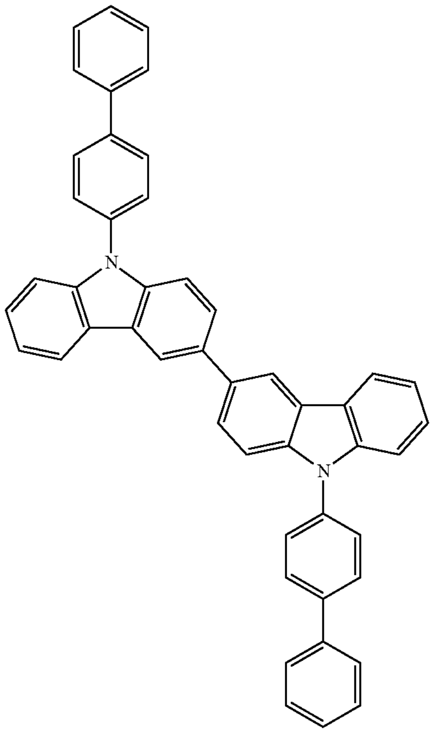

-continued

H-E43

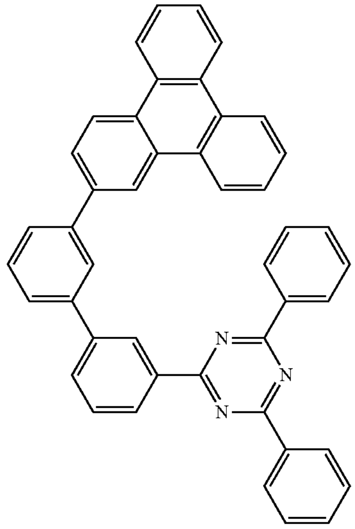

ET3

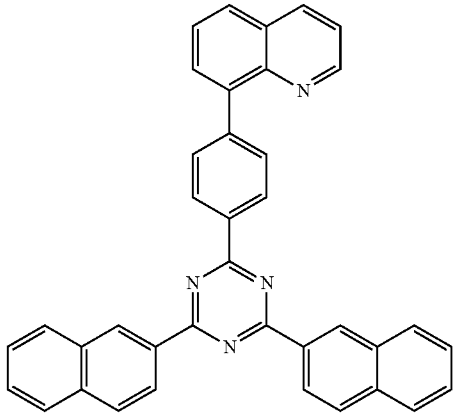

ET-D1

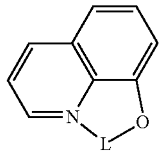

Examples 2 to 4 and Comparative Examples $R_1$ to $R_4$

Organic light-emitting devices were manufactured in a similar manner as in Example 1, except that, in forming the emission layer, the compounds shown in Table 2 were used instead of Compound Ir1 as a dopant.

Evaluation Example 1

For each of the organic light-emitting devices manufactured in Examples 1 to 4 and Comparative Examples $R_1$ to $R_4$, a maximum current efficiency (Max cd/A, %) at a target color coordinate CIEx=0.245, lifespan ($LT_{97}$, %), and a maximum emission wavelength (nm) of an electroluminescence (EL) spectrum were evaluated, and results thereof are shown in Table 2. As an evaluation device, a current-voltmeter (Keithley 2400) and a luminance meter (Minolta Cs-1000A) were used. The lifespan ($LT_{97}$) (at 15,000 candela per square meter) was evaluated as the time (hours, hr) taken for luminance to reduce to 97% of 100% of the initial luminance. The maximum current efficiency and lifespan were respectively expressed as relative values (%) with respect to the maximum current efficiency and lifespan of Comparative Example R1.

TABLE 2
| | Dopant in emission layer (Compound No.) | Max cd/A (relative %) | $LT_{97}$ (relative %) | Maximum emission wavelength (nm) |
|---|---|---|---|---|
| Example 1 | Ir1 | 103 | 100 | 531 |
| Comparative Example R1 | R1 | 100 | 87 | 532 |
| Example 2 | Ir2 | 103 | 100 | 531 |
| Comparative Example R2 | R2 | 100 | 86 | 532 |
| Example 3 | Ir3 | 103 | 103 | 530 |
| Comparative Example R3 | R3 | 96 | 100 | 529 |
| Example 4 | Ir4 | 103 | 101 | 530 |
| Comparative Example R4 | R4 | 95 | 99 | 529 |
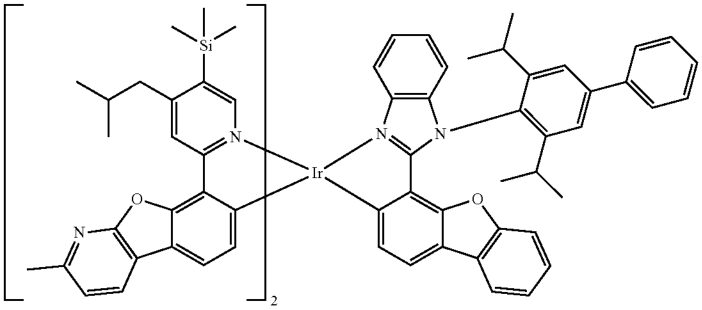
Ir1
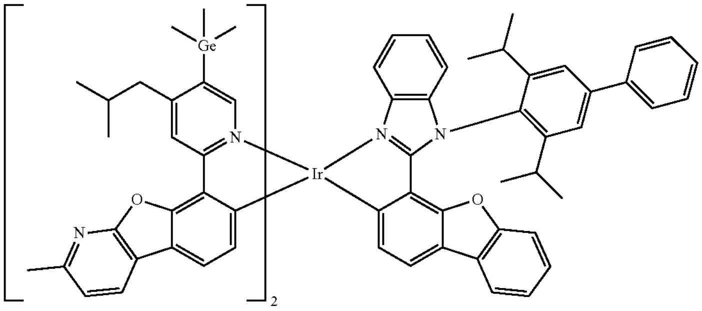
Ir2
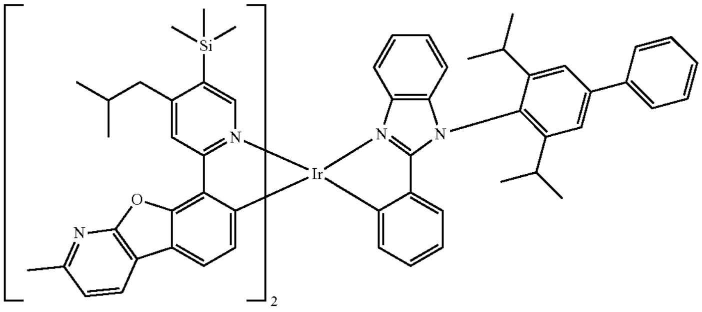
Ir3

TABLE 2-continued
| Dopant in emission layer (Compound No.) | Max cd/A (relative %) | $LT_{97}$ (relative %) | Maximum emission wavelength (nm) |
|---|---|---|---|
| 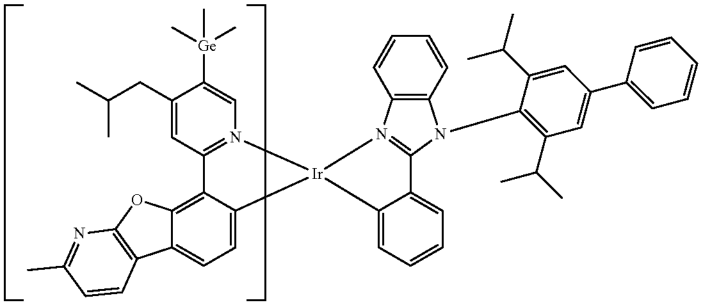 Ir4 | | | |
| 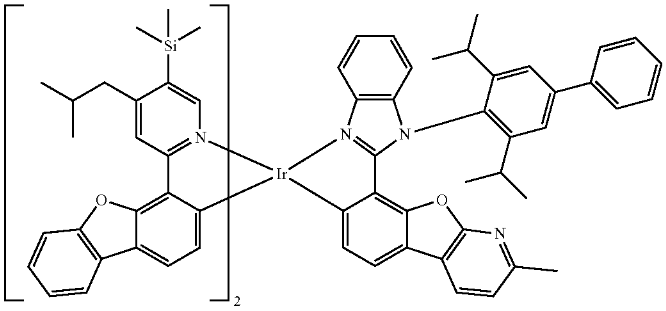 R1 | | | |
| 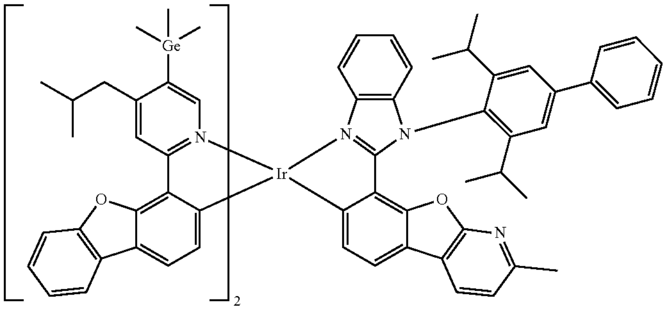 R2 | | | |
| 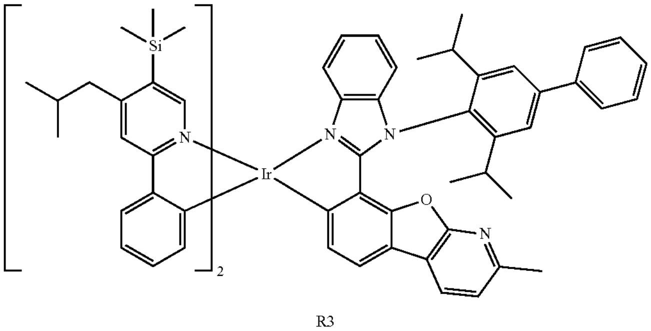 R3 | | | |

TABLE 2-continued

| Dopant in emission layer (Compound No.) | Max cd/A (relative %) | $LT_{97}$ (relative %) | Maximum emission wavelength (nm) |
|---|---|---|---|

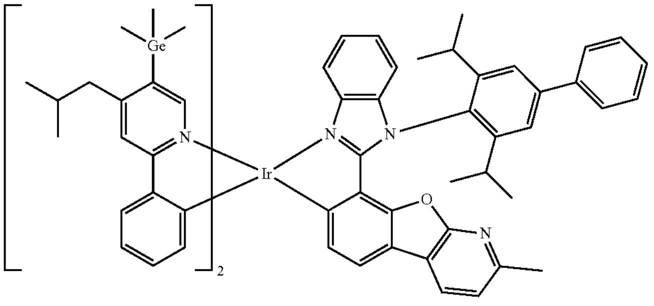

R4

From Table 2, it was confirmed that the organic light-emitting devices of Examples 1 to 4 had improved maximum current efficiency and improved lifespan characteristics compared to those of the organic light-emitting devices of Comparative Examples $R_1$ to $R_4$, while emitting a green light.

Examples 5 and 6 and Comparative Example R5

Organic light-emitting devices were manufactured in a similar manner as in Example 1, except that, in forming the emission layer, the compounds shown in Table 3 were used instead of Compound Ir1 as a dopant.

Evaluation Example 2

For each of the organic light-emitting devices manufactured in Examples 5 and 6 and Comparative Example R5, maximum current efficiency (Max cd/A, %), lifespan ($LT_{97}$, %), and a maximum emission wavelength (nm) of an EL spectrum were evaluated in the same manner as in Evaluation Example 1, and results thereof are shown in Table 3. The maximum current efficiency and lifespan were respectively expressed as relative values (%) with respect to the maximum current efficiency and lifespan of Comparative Example R5. For comparison, relative values (%) of the maximum current efficiency and lifespan of the organic light-emitting devices of Examples 3 and 4 with respect to the maximum current efficiency and lifespan of Comparative Example R5 are also shown in Table 3.

TABLE 3

| | Dopant in emission layer (Compound No.) | Max cd/A (relative %) | $LT_{97}$ (relative %) | Maximum emission wavelength (nm) |
|---|---|---|---|---|
| Example 3 | Ir3 | 110 | 119 | 530 |
| Example 4 | Ir4 | 110 | 116 | 530 |
| Example 5 | Ir5 | 110 | 110 | 531 |
| Example 6 | Ir6 | 110 | 110 | 531 |
| Comparative Example R5 | R5 | 100 | 100 | 525 |

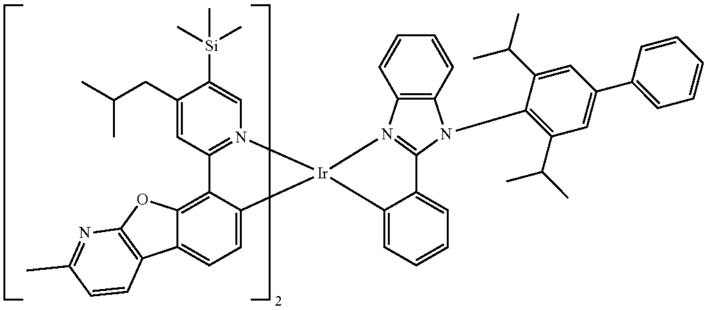

Ir3

TABLE 3-continued

| Dopant in emission layer (Compound No.) | Max cd/A (relative %) | $LT_{97}$ (relative %) | Maximum emission wavelength (nm) |
|---|---|---|---|
| 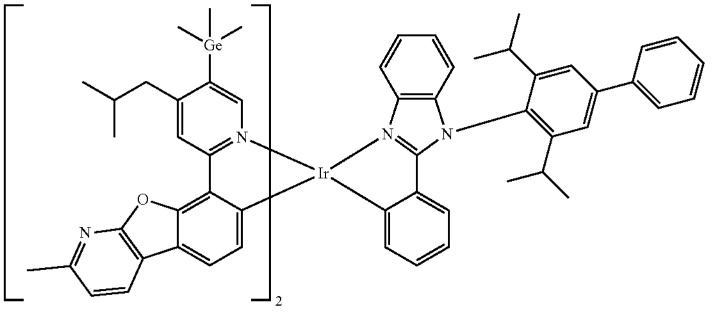 Ir4 | | | |
| 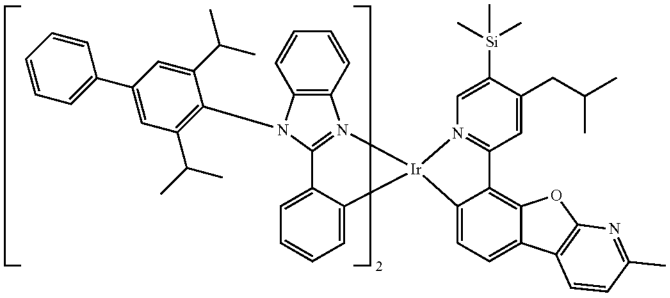 Ir5 | | | |
| 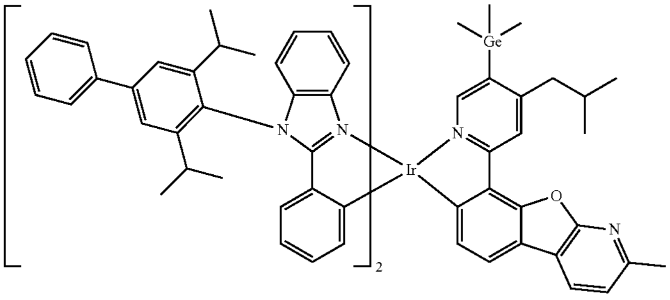 Ir6 | | | |
| 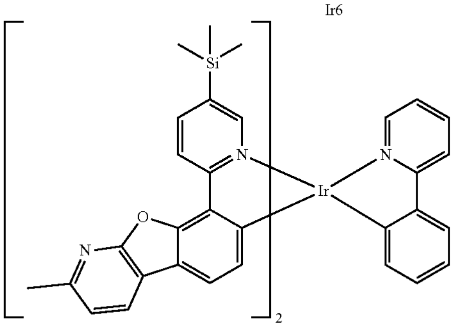 R5 | | | |

From Table 3, it was confirmed that the organic light-emitting devices of Examples 3 to 6 had improved maximum current efficiency and improved lifespan characteristics compared to those of the organic light-emitting device of Comparative Example R5 while emitting green light.

Examples 7 to 10 and Comparative Example R6

Organic light-emitting devices were manufactured in a similar manner as in Example 1, except that, in forming the emission layer, the compounds shown in Table 4 were used instead of Compound Ir1 as a dopant.

Evaluation Example 3

For each of the organic light-emitting devices manufactured in Examples 7 to 10 and Comparative Example R6, maximum current efficiency (Max cd/A, %), lifespan ($LT_{97}$, %), and a maximum emission wavelength (nm) of an EL spectrum were evaluated in the same manner as in Evaluation Example 1, and results thereof are shown in Table 4. The maximum current efficiency and lifespan were respectively expressed as relative values (%) with respect to the maximum current efficiency and lifespan of Comparative Example R6.

TABLE 4

| | Dopant in emission layer (Compound No.) | Max cd/A (relative %) | $LT_{97}$ (relative %) | Maximum emission wavelength (nm) |
|---|---|---|---|---|
| Example 7 | Ir7 | 103 | 103 | 535 |
| Example 8 | Ir8 | 103 | 103 | 535 |
| Example 9 | Ir9 | 110 | 104 | 534 |
| Example 10 | Ir10 | 112 | 103 | 534 |
| Comparative Example R6 | R6 | 100 | 100 | 534 |

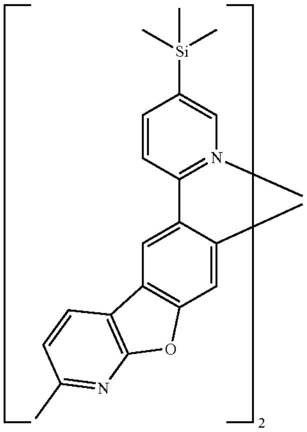

Ir7

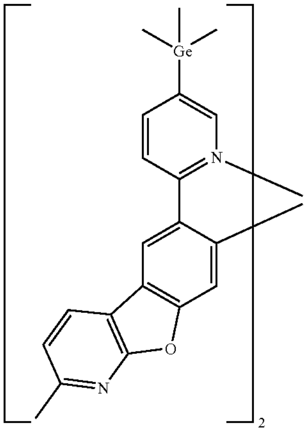

Ir8

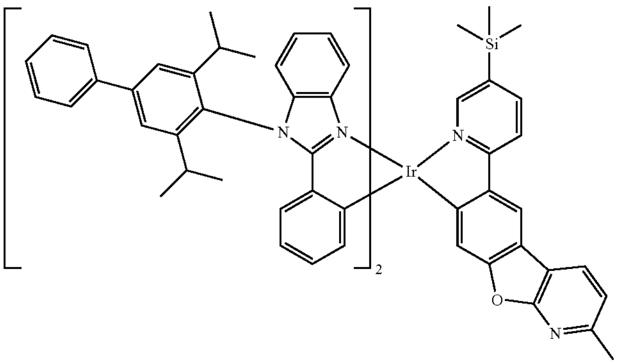

Ir9

TABLE 4-continued

| Dopant in emission layer (Compound No.) | Max cd/A (relative %) | $LT_{97}$ (relative %) | Maximum emission wavelength (nm) |
|---|---|---|---|

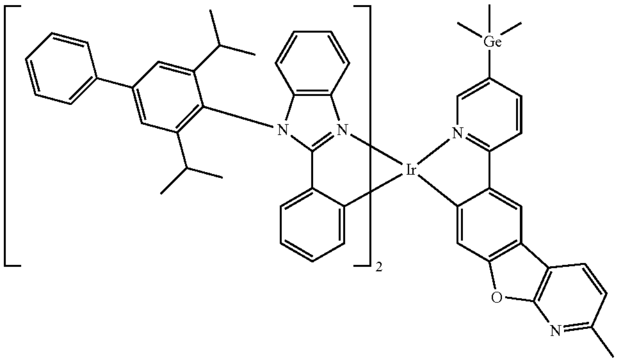

Ir10

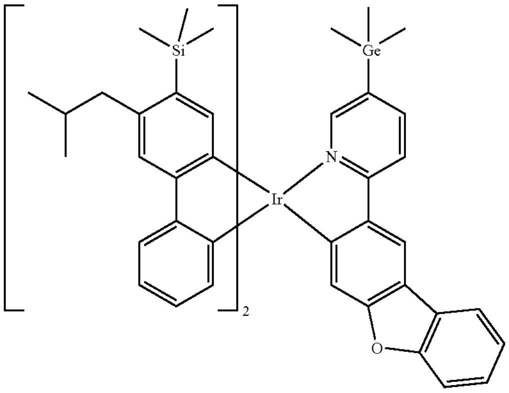

R6

From Table 4, it was confirmed that the organic light-emitting devices of Examples 7 to 10 had improved maximum current efficiency and improved lifespan characteristics compared to those of the organic light-emitting device of Comparative Example R6 while emitting green light.

Examples 11 to 14

Organic light-emitting devices were manufactured in a similar manner as in Example 1, except that, in forming the emission layer, the compounds shown in Table 5 were used instead of Compound Ir1 as a dopant.

Evaluation Example 4

For each of the organic light-emitting devices manufactured in Examples 11 to 14, maximum current efficiency (Max cd/A, %), lifespan ($LT_{97}$, %), and a maximum emission wavelength (nm) of an EL spectrum were evaluated in the same manner as in Evaluation Example 1, and results thereof are shown in Table 5. The maximum current efficiency and lifespan were respectively expressed as relative values (%) with respect to the maximum current efficiency and lifespan of Comparative Example R1.

TABLE 5

| | Dopant in emission layer (Compound No.) | Max cd/A (relative %) | $LT_{97}$ (relative %) | Maximum emission wavelength (nm) |
|---|---|---|---|---|
| Example 11 | Ir11 | 100 | 112 | 529 |
| Example 12 | Ir12 | 100 | 110 | 529 |
| Example 13 | Ir13 | 110 | 106 | 531 |

TABLE 5-continued
| | Dopant in emission layer (Compound No.) | Max cd/A (relative %) | $LT_{97}$ (relative %) | Maximum emission wavelength (nm) |
|---|---|---|---|---|
| Example 14 | Ir14 | 105 | 103 | 530 |
| Comparative Example | R1 | 100 | 100 | 532 |
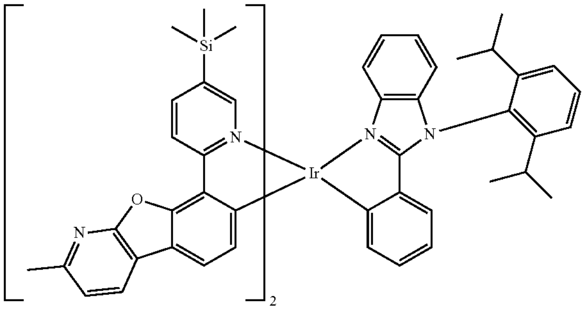
Ir11
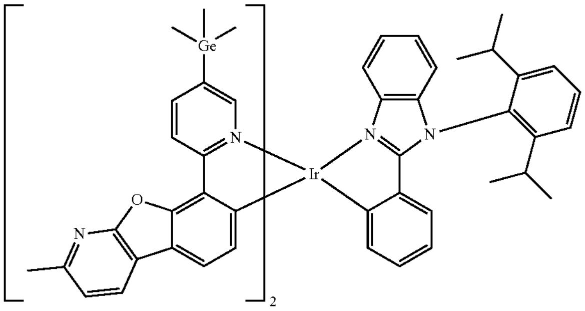
Ir12
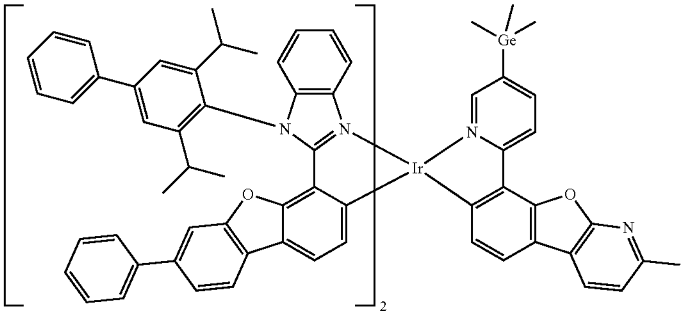
Ir13
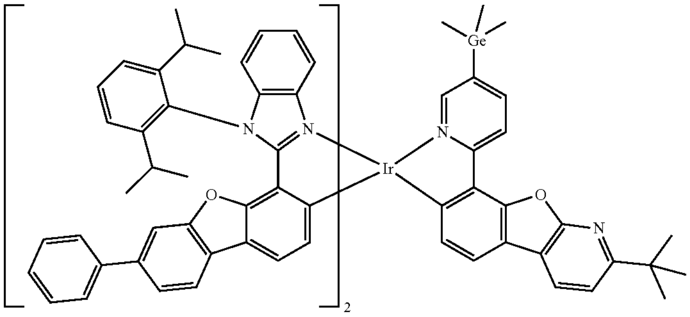
Ir14

TABLE 5-continued

| Dopant in emission layer (Compound No.) | Max cd/A (relative %) | $LT_{97}$ (relative %) | Maximum emission wavelength (nm) |
|---|---|---|---|
| 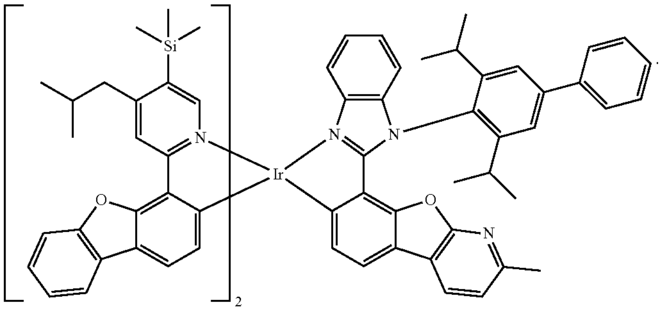 R1 | | | |

From Table 5, it was confirmed that each of the organic light-emitting devices of Examples 11 to 14 had improved maximum current efficiency and improved lifespan characteristics compared to those of the organic light-emitting device of Comparative Example R1 while emitting green light.

According to the one or more embodiments, the organometallic compound represented by Formula 1 has excellent thermal stability and/or electrical characteristics, and thus, an electronic device, for example, an organic light-emitting device, including at least one of the organometallic compounds may have an improved external quantum efficiency and an improved lifespan, and a high-quality electronic apparatus may be manufactured by using the organic light-emitting device.

It should be understood that exemplary embodiments described herein should be considered in a descriptive sense only and not for purposes of limitation. Descriptions of features or aspects within each exemplary embodiment should typically be considered as available for other similar features or aspects in other embodiments. While one or more exemplary embodiments have been described with reference to the FIGURE, it will be understood by those of ordinary skill in the art that various changes in form and details may be made therein without departing from the spirit and scope as defined by the following claims.

What is claimed is:

1. An organometallic compound represented by Formula 1:

$M(L_1)_{n1}(L_2)_{n2}$ Formula 1 wherein, in Formula 1,

M is a transition metal, $L_1$ is a ligand represented by Formula 2-1, $L_2$ is a ligand represented by Formula 2-2 or a ligand represented by Formula 2-3, n1 and n2 are each independently 1 or 2, when n1 is 2, two $L_1$ are identical to or different from each other, and when n2 is 2, two $L_2$ are identical to or different from each other, and $L_1$ and $L_2$ are different from each other, Formula 2-1

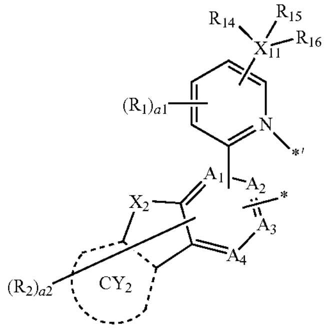

Formula 2-2

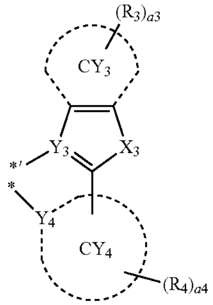

Formula 2-3

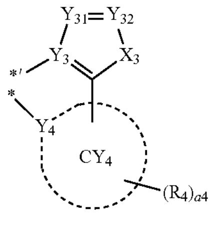

wherein, in Formulae 2-1 to 2-3, $X_{11}$ is Si or Ge, $X_2$ is O, S, Se, $N(R_{29})$, $C(R_{29a})(R_{29b})$, or $Si(R_{29a})(R_{29b})$, $A_1$ to $A_4$ are each independently C or N, wherein one of $A_1$ to $A_4$ is C bonded to a neighboring pyridine group, and another of $A_1$ to $A_4$ is C bonded to M in Formula 1, $Y_3$ is N, $Y_{31}$ is $C(R_{31})$ or N, $Y_{32}$ is $C(R_{32})$ or N, $X_3$ is O, S, or N-($T_3$-$Z_3$), $T_3$ is a single bond, a $C_1$-$C_{20}$ alkylene group that is unsubstituted or substituted with at least one $R_{10a}$, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $Y_4$ is C or N, ring $CY_2$ to ring $CY_4$ are each independently a $C_5$-$C_{30}$ carbocyclic group or a $C_1$-$C_{60}$ heterocyclic group, wherein ring $CY_2$ is a $C_3$-$C_{30}$ heterocyclic group comprising at least one N as a ring-forming atom; at least one of $A_1$ to $A_4$ is N; or ring $CY_2$ is a $C_3$-$C_{30}$ heterocyclic group comprising at least one N as a ring-forming atom, and at least one of $A_1$ to $A_4$ is N, $R_1$ to $R_4$, $R_{14}$ to $R_{16}$, $R_{29}$, $R_{29a}$, $R_{29b}$, $R_{31}$, $R_{32}$, and $Z_3$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$), a1 is an integer from 0 to 3, a2 is an integer from 0 to 6, a3 and a4 are each independently an integer from 0 to 20, two or more of a plurality of $R_1$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_2$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_3$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_4$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of $R_1$ to $R_4$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $R_{10a}$ is as described in connection with $R_2$,

* and *' each indicate a binding site to M in Formula 1, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(═O)($Q_{18}$)($Q_{19}$), —P($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, $P(Q_{28})(Q_{29})$, or a combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or a combination thereof, and $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

2. The organometallic compound of claim 1, wherein $X_2$ is O or S.

3. The organometallic compound of claim 1, wherein, in Formula 2-1, $A_1$ is C bonded to a neighboring pyridine group, and $A_2$ is C bonded to M in Formula 1; or $A_3$ is C bonded to a neighboring pyridine group, and $A_2$ is C bonded to M in Formula 1.

4. The organometallic compound of claim 1, wherein ring $CY_2$ is a pyridine group, a pyrimidine group, a pyridazine group, a pyrazine group, a quinoline group, an isoquinoline group, a quinoxaline group, a quinazoline group, a phenanthridine group, a phenanthroline group, a benzoquinoline group, a benzoisoquinoline group, an azacarbazole group, an azafluorene group, an azadibenzosilole group, an azadibenzothiophene group, an azadibenzofuran group, an azadibenzoselenophene group, an azabenzocarbazole group, an azabenzofluorene group, an azanaphthobenzosilole group, an azanaphthobenzothiophene group, an azanaphthobenzofuran group, an azanaphthobenzoselenophene group, an azadibenzocarbazole group, an azadibenzofluorene group, an azadinaphthosilole group, an azadinaphthothiophene group, an azadinaphthofuran group, an azadinaphthoselenophene group, an azanaphthocarbazole group, an azanaphthofluorene group, an azaphenanthrobenzosilole group, an azaphenanthrobenzothiophene group, an azaphenanthrobenzofuran group, or an azaphenanthrobenzoselenophene group.

5. The organometallic compound of claim 1, wherein ring $CY_3$ is a benzene group, a naphthalene group, an anthracene group, a phenanthrene group, a pyridine group, a pyrimidine group, a pyridazine group, a pyrazine group, a quinoline group, or an isoquinoline group.

6. The organometallic compound of claim 1, wherein ring $CY_4$ is a benzene group, a naphthalene group, an anthracene group, a phenanthrene group, a 1,2,3,4-tetrahydronaphthalene group, a benzene group condensed with a norbornane group, a carbazole group, a fluorene group, a dibenzosilole group, a dibenzothiophene group, a dibenzofuran group, a dibenzoselenophene group, a benzocarbazole group, a benzofluorene group, a naphthobenzosilole group, a naphthobenzothiophene group, a naphthobenzofuran group, a naphthobenzoselenophene group, a dibenzocarbazole group, a dibenzofluorene group, a dinaphthosilole group, a dinaphthothiophene group, a dinaphthofuran group, a dinaphthoselenophene group, a naphthocarbazole group, a naphthofluorene group, a phenanthrobenzosilole group, a phenanthrobenzothiophene group, a phenanthrobenzofuran group, a phenanthrobenzoselenophene group, an azacarbazole group, an azafluorene group, an azadibenzosilole group, an azadibenzothiophene group, an azadibenzofuran group, an azadibenzoselenophene group, an azabenzocarbazole group, an azabenzofluorene group, an azanaphthobenzosilole group, an azanaphthobenzothiophene group, an azanaphthobenzofuran group, an azanaphthobenzoselenophene group, an azadibenzocarbazole group, an azadibenzofluorene group, an azadinaphthosilole group, an azadinaphthothiophene group, an azadinaphthofuran group, an azadinaphthoselenophene group, an azanaphthocarbazole group, an azanaphthofluorene group, an azaphenanthrobenzosilole group, an azaphenanthrobenzothiophene group, an azaphenanthrobenzofuran group, or an azaphenanthrobenzoselenophene group.

7. The organometallic compound of claim 1, wherein $R_1$ to $R_4$, $R_{29}$, $R_{29a}$, $R_{29b}$, $R_{31}$, $R_{32}$, and $Z_3$ are each independently:

hydrogen, deuterium, —F, or a cyano group; or a $C_1$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, —Si($Q_{33}$)($Q_{34}$)($Q_{35}$), —Ge($Q_{33}$)($Q_{34}$)($Q_{35}$), or a combination thereof, and $R_{14}$ to $R_{16}$ are each independently a $C_1$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or a combination thereof.

8. The organometallic compound of claim 1, wherein a2 in Formula 2-1 is not 0, and $R_2$ is not hydrogen.

9. The organometallic compound of claim 1, wherein the organometallic compound comprises deuterium, a fluoro group, or a combination thereof.

10. The organometallic compound of claim 1, wherein a group represented by

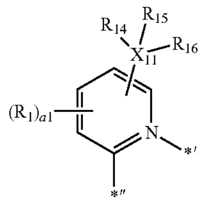

in Formula 2-1 is a group represented by one of Formulae CY1-1 to CY1-6:

CY1-1

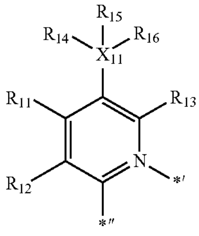

-continued

CY1-2

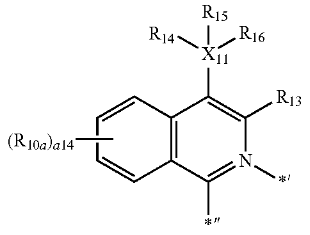

CY1-3

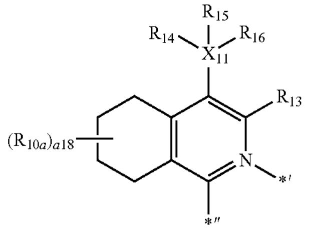

CY1-4

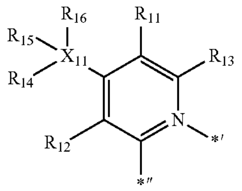

CY1-5

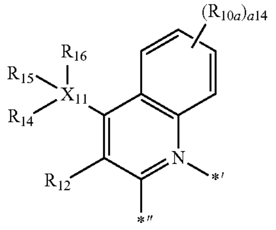

CY1-6

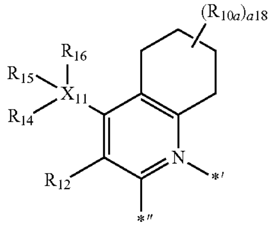

wherein, in Formulae CY1-1 to CY1-6, $X_{11}$, $R_{14}$ to $R_{16}$, and $R_{10a}$ are each as described in claim 1, $R_{11}$ to $R_{13}$ are each independently as described in connection with $R_1$ in claim 1, a14 is an integer from 0 to 4, a18 is an integer from 0 to 8,

*' indicates a binding site to M in Formula 1, and

*" indicates a binding site to one of $A_1$ to $A_4$ in Formula 2-1.

11. The organometallic compound of claim 1, wherein a group represented by

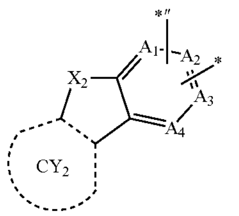
in Formula 2-1 is a group represented by one of Formulae CY2-1 to CY2-20:
CY2-1
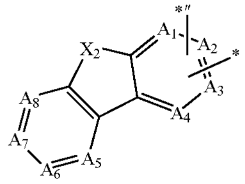
CY2-2
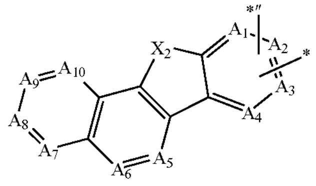
CY2-3
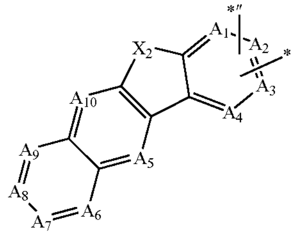
CY2-4
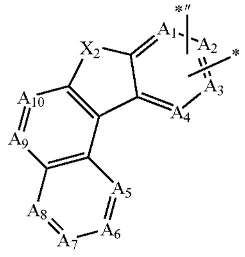
CY2-5
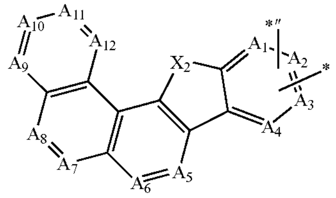
CY2-6
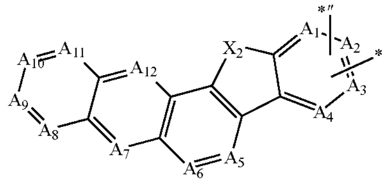
-continued
CY2-7
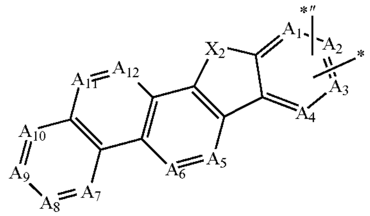
CY2-8
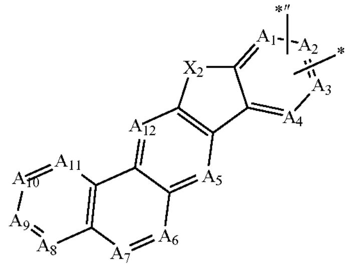
CY2-9
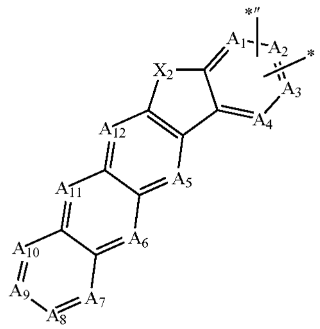
CY2-10
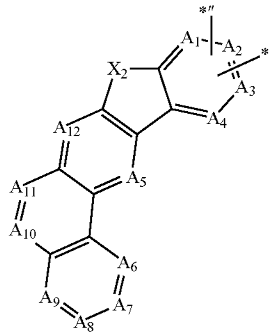
CY2-11
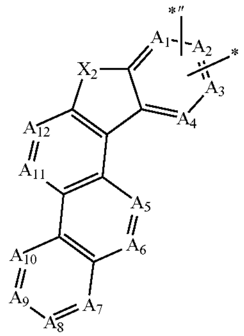

-continued

CY2-12

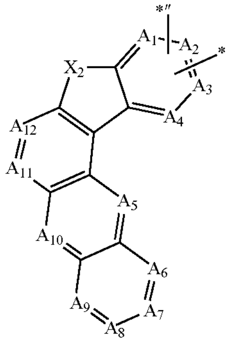

CY2-13

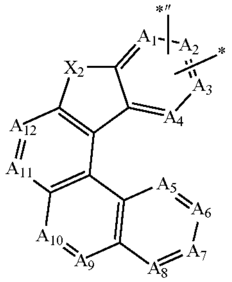

CY2-14

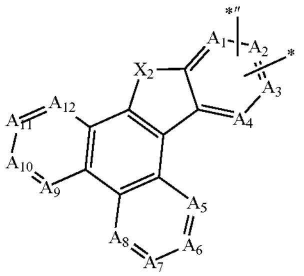

CY2-15

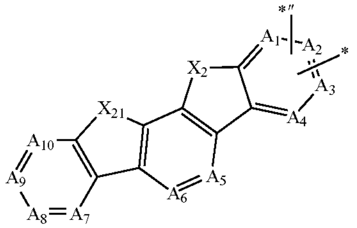

CY2-16

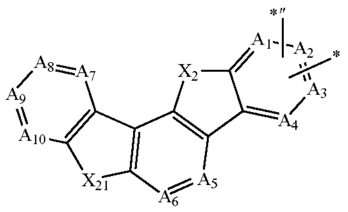

-continued

CY2-17

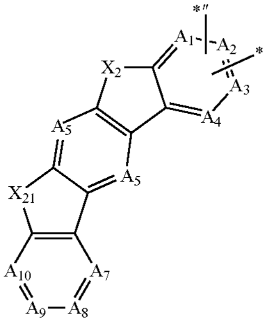

CY2-18

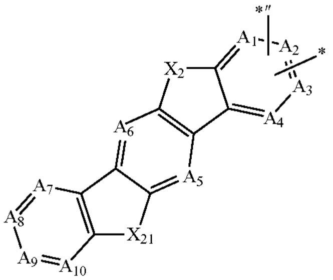

CY2-19

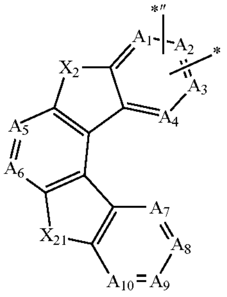

CY2-20

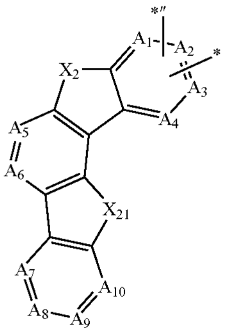

wherein, in Formulae CY2-1 to CY2-20, $X_2$ is as described in claim 1, $X_{21}$ is as described in connection with $X_2$ in claim 1, $A_1$ to $A_{12}$ are each independently C or N, wherein at least one of $A_1$ to $A_8$ in Formula CY2-1 is N, at least one of $A_1$ to $A_{10}$ in Formulae CY2-2 to CY2-4 and CY2-15 to CY2-20 is N, and at least one of $A_1$ to $A_{12}$ in Formulae CY2-5 to CY2-14 is N,

*" indicates a binding site to a neighboring pyridine group in Formula 2-1, and

* indicates a binding site to M in Formula 1.

12. The organometallic compound of claim 11, wherein at least one of $A_4$ to $A_8$ in Formula CY2-1 is N, at least one of $A_4$ to $A_{10}$ in Formulae CY2-2 to CY2-4 and CY2-15 to CY2-20 is N, and at least one of $A_4$ to $A_{12}$ in Formulae CY2-5 to CY2-14 is N.
13. The organometallic compound of claim 1, wherein a group represented by
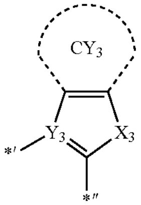
in Formula 2-2 is a group represented by one of Formulae CY3-1 to CY3-20:
CY3-1
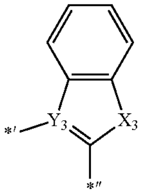
CY3-2
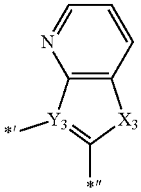
CY3-3
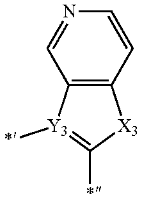
CY3-4
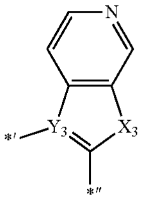
CY3-5
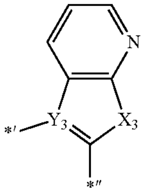
-continued
CY3-6
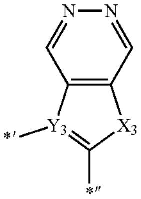
CY3-7
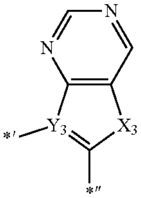
CY3-8
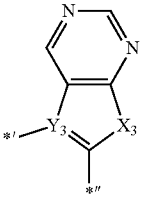
CY3-9
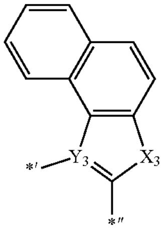
CY3-10
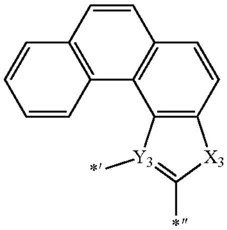
CY3-11
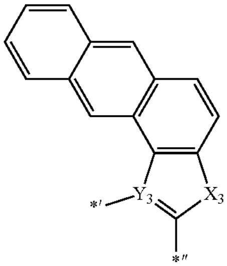

-continued
CY3-12
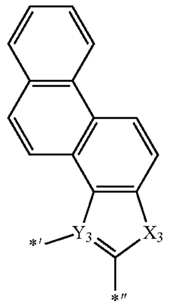
CY3-13
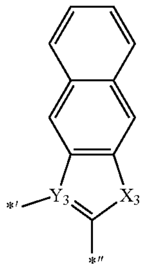
CY3-14
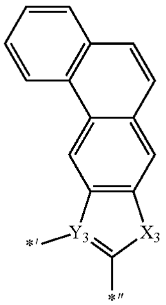
CY3-15
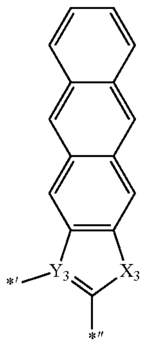
CY3-16
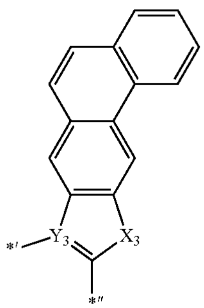
-continued
CY3-17
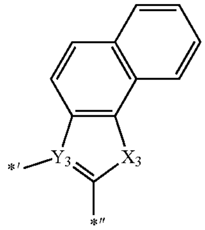
CY3-18
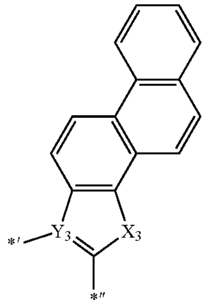
CY3-19
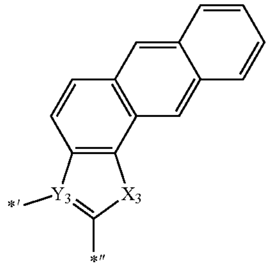
CY3-20
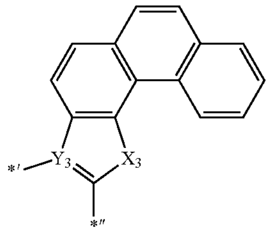
wherein, in Formulae CY3-1 to CY3-20,
$Y_3$ and $X_3$ are each as described in claim 1,
*' indicates a binding site to M in Formula 1, and
*" indicates a binding site to a neighboring atom in Formula 2-2.
14. The organometallic compound of claim 1, wherein a group represented by
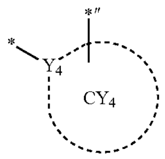
in Formulae 2-2 and 2-3 is a group represented by one of Formulae CY4-1 to CY4-21:

CY4-1
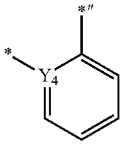
CY4-2
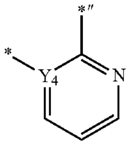
CY4-3
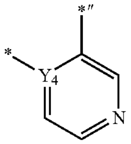
CY4-4
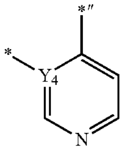
CY4-5
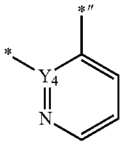
CY4-6
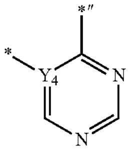
CY4-7
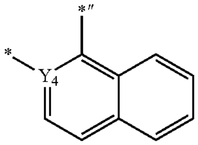
CY4-8
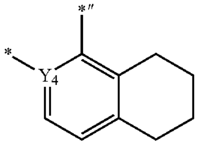
CY4-9
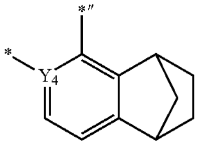
CY4-10
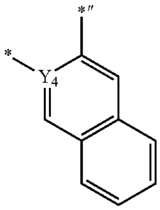
-continued
CY4-11
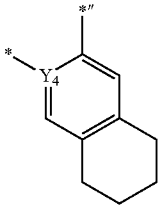
CY4-12
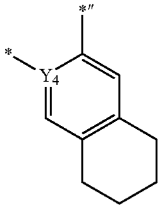
CY4-13
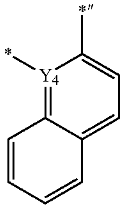
CY4-14
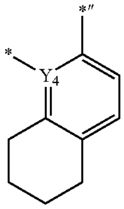
CY4-15
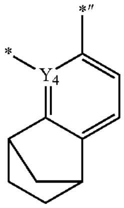
CY4-16
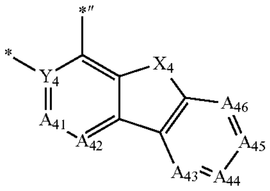
CY4-17
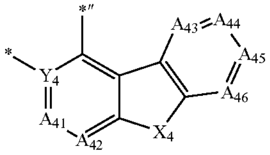

-continued

CY4-18

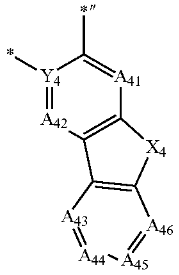

CY4-19

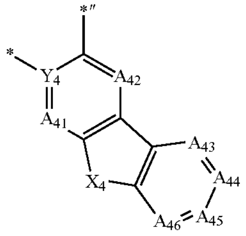

CY4-20

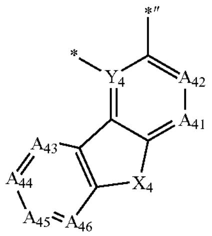

CY4-21

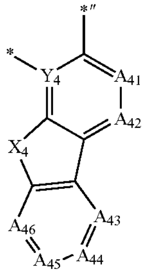

wherein, in Formulae CY4-1 to CY4-21, $Y_4$ is C, $A_{41}$ to $A_{46}$ are each independently C or N, $X_4$ is O, S, Se, $N(R_{49})$, $C(R_{49a})(R_{49b})$, or $Si(R_{49a})(R_{49b})$, $R_{49}$, $R_{49a}$, and $R_{49b}$ are each independently as described in connection with $R_4$ in claim 1,

* indicates a binding site to M in Formula 1, and

*" indicates a binding site to a neighboring atom in Formulae 2-2 and 2-3.

15. An organic light-emitting device, comprising:

a first electrode;

a second electrode; and an organic layer arranged between the first electrode and the second electrode, wherein the organic layer comprises an emission layer, and wherein the organic layer comprises at least one organometallic compound of claim 1.

16. The organic light-emitting device of claim 15, wherein the first electrode is an anode, the second electrode is a cathode, the organic layer further comprises a hole transport region arranged between the first electrode and the emission layer and an electron transport region arranged between the emission layer and the second electrode, the hole transport region comprises a hole injection layer, a hole transport layer, an electron blocking layer, a buffer layer, or a combination thereof, and the electron transport region comprises a hole blocking layer, an electron transport layer, an electron injection layer, or a combination thereof.

17. The organic light-emitting device of claim 15, wherein the emission layer comprises the at least one organometallic compound.

18. The organic light-emitting device of claim 17, wherein the emission layer emits a green light.

19. The organic light-emitting device of claim 17, wherein the emission layer further comprises a host, and an amount of the host in the emission layer is greater than an amount of the at least one organometallic compound in the emission layer.

20. An electronic apparatus, comprising the organic light-emitting device of claim 15.

* * * * *